United States Patent [19]

Ikeda et al.

[11] Patent Number: 5,239,196
[45] Date of Patent: Aug. 24, 1993

[54] SRAM WITH DUAL WORD LINES OVERLAPPING DRIVE TRANSISTOR GATES

[76] Inventors: Shuji Ikeda, 5-15-3, Midori-cho, Koganei-shi, Tokyo; Satoshi Meguro, 2196-662, Hirai, Hinode-machi; Soichiro Hashiba, 2-14-3, Sakaecho, Hamura-machi, Nishitama-gun, Tokyo; Isamu Kuramoto, 4-16-23, Mukouhara, Higashiyamato-shi, Tokyo; Atsuyoshi Koike, 2-12-23, Honda, Kokubunji-shi, Tokyo; Katsuro Sasaki, 3-8-7-301, Miyoshi-cho, Fuchuu-shi, Tokyo; Koichiro Ishibashi, 4-10-1, Ryogoku, Sumida-ku, Tokyo; Toshiaki Yamanaka, 2-12-2-301, Kasuga-cho, Iruma-shi, Saitama; Naotaka Hashimoto, 1-48-18, Akatsuki-cho, Hachioji-shi, Tokyo; Nobuyuki Moriwaki, 19-7, Sainomiya-machi, Ryoanji, Ukyo-ku, Kyoto-shi, Kyoto, all of Japan

[21] Appl. No.: 653,493

[22] Filed: Feb. 11, 1991

[30] Foreign Application Priority Data

| Feb. 9, 1990 | [JP] | Japan | 2-30451 |
| Feb. 9, 1990 | [JP] | Japan | 2-30452 |
| Feb. 9, 1990 | [JP] | Japan | 2-30453 |
| Feb. 9, 1990 | [JP] | Japan | 2-30454 |
| Mar. 2, 1990 | [JP] | Japan | 2-49312 |

[51] Int. Cl.⁵ .................................... H01L 27/11
[52] U.S. Cl. ............................ 257/385; 257/903; 257/69; 365/154
[58] Field of Search ................ 357/23.9, 59, 41; 365/154

[56] References Cited

U.S. PATENT DOCUMENTS

| 4,679,171 | 7/1987 | Logwood et al. | 357/23.9 |
| 4,890,145 | 12/1989 | Ikeda et al. | 357/41 |
| 4,951,112 | 8/1990 | Choi et al. | 357/59 |

FOREIGN PATENT DOCUMENTS

| 281711 | 9/1988 | European Pat. Off. |
| 61-85858 | 5/1986 | Japan |
| 64-61049 | 3/1989 | Japan |

OTHER PUBLICATIONS

Kertis et al, IEEE Journal of Solid State Circuits, vol. 23, No. 5, Oct. 1988, pp. 1048–1053, see p. 1049, FIG. 3.
Sasaki et al, IEEE J of Solid State Circuits, vol. 24, No. 5, Oct. 1989, pp. 1219–1225.
Ando et al, IEEE J of Solid State Circuits vol. 24, No. 5, Oct. 1989, pp. 1708–1713.
Yamanaka et al, IEEE IEDM Tech. Digest, Dec. 1988, pp. 48–51.

*Primary Examiner*—William D. Larkins
*Attorney, Agent, or Firm*—Antonelli, Terry, Stout & Kraus

[57] ABSTRACT

A MOSFET Static Random Access Memory (SRAM) cell has a symmetrical construction, with a pair of word lines. The word lines are in second level polysilicon, so that they may overlap the driving transistor gates which are in first level polysilicon.

11 Claims, 34 Drawing Sheets

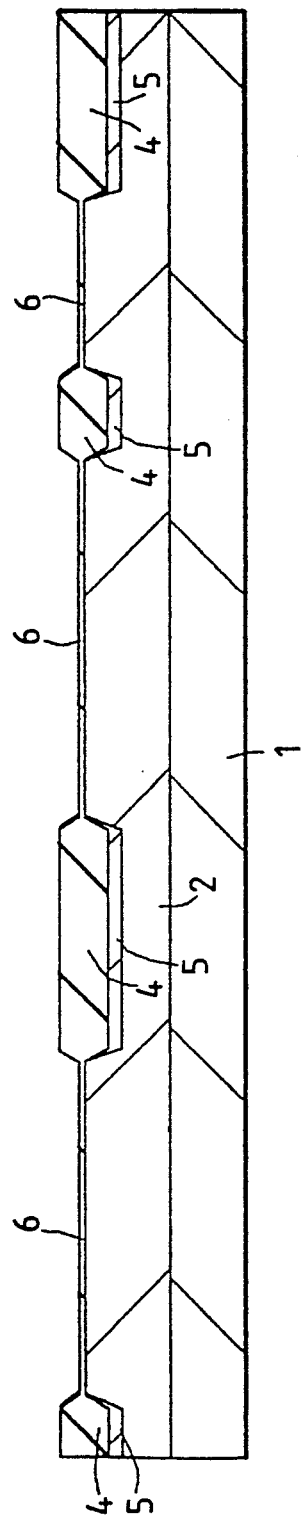
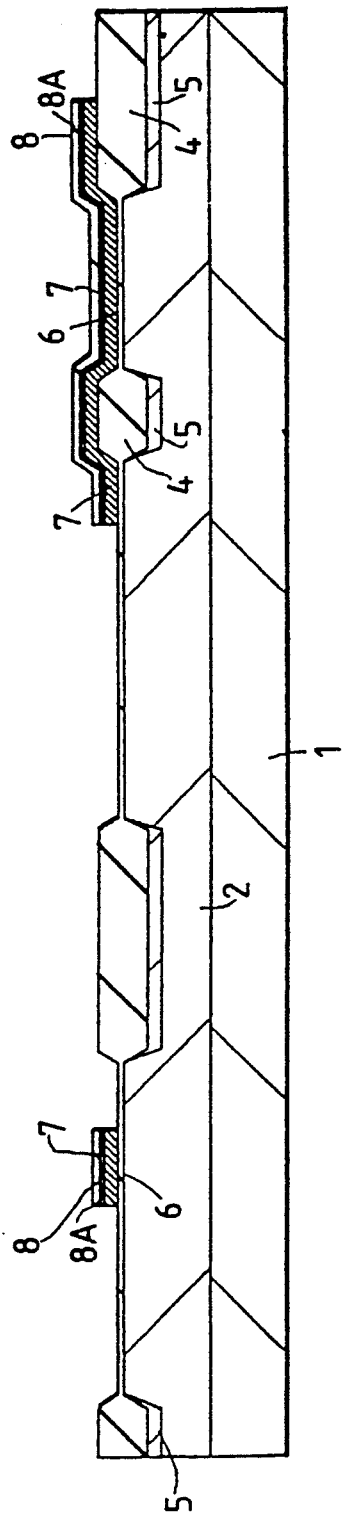

SRAM WITH DUAL WORD LINES OVERLAPPING DRIVE TRANSISTOR GATES

BACKGROUND OF THE INVENTION

The present invention relates to a semiconductor integrated circuit device and, more particularly, to a technology which is effective when applied to a semiconductor integrated circuit device having an SRAM (i.e., Static Random Access Memory).

The SRAM acting as a volatile semiconductor memory device is disclosed in U.S. Pat. No. 4,890,148, for example. The SRAM of this kind is arranged with memory cells at the intersections of complementary data lines and word lines. Each memory cell is composed of a flip-flop circuit and two transfer MISFETs (i.e., Metal Insulator Semiconductor Field Effect Transistors). Each transfer MISFET has its one semiconductor region connected with the input/output terminals of the flip-flop circuit and its other semiconductor region connected with the complementary data lines. This transfer MISFET has its gate electrode connected with the word lines, by which its conductivity and inconductivity are controlled. The flip-flop circuit is constructed, as a data storage unit, of two drive MISFETs and two resistor loads. The drive MISFET has its drain region connected with one semiconductor region of one of the transfer MISFETs and its source region connected with a reference voltage line (or source line). The drive MISFET has its gate electrode connected with one semiconductor region of the other transfer MISFET. Each resistor load has its one terminal connected with one semiconductor region of one of the transfer MISFETs and its source region connected with a supply voltage wiring line (or source line). The memory cells of the SRAM of this kind can arrange the resistor loads over the drive MISFETs to reduce the area occupied thereby so that they can highly integrate the SRAM. The memory cells can store data of 1 [bit].

SUMMARY OF THE INVENTION

In accordance with the finer structure, the SRAM is the more highly integrated by making the load of a p-MOS (i.e., Metal Oxide Semiconductor) of polycrystalline silicon and by forming the load over the drive MISFET. The SRAM of this kind is disclosed on pp. 48–51 of 1988 IEEE International Electron Devices Meeting, December 1988 and on pp. 1708–1713 of IEEE Journal of Solid-State Circuits, vol. 24, No. 6, December 1989, for example. According to these technologies, the gate electrodes of the two transfer MISFETs, the word lines to be connected with the former, and the gate electrodes of the drive MISFETs of the memory cell are formed of a first polycrystalline silicon layer which is shared thereamong as a conductive layer. This structure makes it necessary to separate the word lines and the gate electrodes of the transfer MISFETs a predetermined distance from the gate electrodes of the drive MISFETs so that the memory cell has its size enlarged.

This technology of forming the gate electrodes of the two transfer MISFETs, the word lines and the gate electrodes of the drive MISFETs of the memory cell of the identical conductive layer is also disclosed on pp. 1048–1053 of IEEE Journal of Solid-State Circuits, vol. 23, No. 5, October 1988. According to this technology, A peripheral circuit of the SRAM is constructed of a BiCMOS (i.e., Bipolar Complementary MOS) circuit, and the resistor loads are formed of a second polycrystalline silicon film by using the double-level-polySi and the double-level-metal process.

Another technology relating to the high integration of the SRAM is disclosed in Europe Patent No. 281,711, for example, which was published on Sep. 14, 1988.

According to this technology, one semiconductor region of one of the transfer MISFETs of the memory cell is integrated with the drain region of one of the drive MISFETs. One of the transfer MISFETs and one of the drive MISFETs have their individual gate length directions aligned. Likewise, one semiconductor region of the other transfer MISFET of the memory cell is integrated with the drain region of the other drive MISFET. The other transfer MISFET is arranged to face the one drive MISFET in its gate width direction. The other drive MISFET is arranged to face the one transfer MISFET in its gate width direction. In other words, the one transfer MISFET and drive MISFET and the other transfer MISFET and drive MISFET have their planar shapes constructed symmetrically with respect to the central point of the two. The gate electrode of the one drive MISFET has its one end extended in the gate width direction and connected with one semiconductor region of the other transfer MISFET and the drain region of the other drive MISFET. Likewise, the gate electrode of the other drive MISFET has its one end extended in the gate width direction and connected with one semiconductor region of the one transfer MISFET and the drain region of the one drive MISFET. The one drive MISFET and the other drive MISFET have their individual gate electrodes formed of an identical conductive layer (at an identical step of the fabrication process). These connection structures constitute the cross wiring structures in the memory cells. The aforementioned one transfer MISFET and other transfer MISFET have their individual gate electrodes formed of an identical conductive layer in an upper layer (at a different step in the fabrication process) different from the gate electrode of the aforementioned drive MISFET. The word lines to be connected with the memory cells are formed of a conductive layer shared and integrated with the gate electrodes of the transfer MISFETs. These word lines are extended between the memory cells in the same directions as the individual gate width directions of the transfer MISFETs and the drive MISFETs of the memory cells. Since one and other transfer MISFETs of the memory cells are arranged symmetrically of each other with respect to a point, the word lines are extended in the memory cells in the directions (i.e., in the gate length directions) crossing the aforementioned extended directions. These word lines are extended over an element separating insulating film between the one transfer MISFET and drive MISFET and the other transfer MISFET and drive MISFET.

Since the gate electrodes of the drive MISFETs of the memory cells and the word lines are individually formed of different layers and can be superposed one on the other, according to the technology disclosed in the Patent Publication, the area to be occupied by the memory cells can be reduced to integrate the SRAM highly.

Prior to the development of the SRAM, we have found out the following problems:

(1) The aforementioned word lines cross in the memory cell the one-end extensions of the gate electrodes of the drive MISFETs constituting the cross wiring structure. However, the regions between the one transfer MISFET and drive MISFET and the other transfer MISFET and drive MISFET of the memory cell are required for wiring the aforementioned word lines. This requirement increases the area to be occupied by the memory cells to an extent satisfying the requirement for wiring the word lines in the memory cells so that the degree of integration of the SRAM is dropped.

(2) On the other hand, the aforementioned word lines are different between the direction extending between the memory ells and the direction to wire them in the memory cells. As a result, the effective length of the word lines extended in the memory cell array is enlarged to increase the resistance of the word lines so that the data writing and reading operations of the memory cells are retarded to drop the operation speed of the SRAM.

(3) With a view to increasing the $\beta$ ratio, on the other hand, the aforementioned memory cells are ordinarily constructed to have a larger gate width of the drive MISFETs than that of the transfer MISFETs. In the memory cell, one transfer MISFET and drive MISFET and the other transfer MISFET and drive MISFET have their individual gate width separation sizes made larger in the gate width direction and regulated by the separation sizes between the individual other drive MISFETs. In other words, useless vacant regions are so established in the separation sizes between the individual one and other transfer MISFETs as to correspond to the difference from the gate width of the drive MISFETs. As a result, the area to be occupied by the memory cells is increased to drop the degree of integration of the SRAM.

The objects of the present invention are enumerated in the following:

(1) to provide a semiconductor integrated circuit device having the SRAM with a technology capable of improving the degree of integration;

(2) to provide a semiconductor integrated circuit device having the SRAM with a technology capable of speeding up the operations;

(3) to provide a semiconductor integrated circuit device having the SRAM with a technology capable of improving the reliability of the operation;

(4) to provide a semiconductor integrated circuit device having the SRAM with a technology capable of reducing the power consumption;

(5) to provide a semiconductor integrated circuit device having the SRAM with a technology capable of improving the soft error withstand voltage;

(6) to provide a semiconductor integrated circuit device having the SRAM with a technology capable of improving the electric reliability;

(7) to provide a semiconductor integrated circuit device having the SRAM with a technology capable of improving the electrostatic breakdown voltage;

(8) to provide a semiconductor integrated circuit device having the SRAM with a technology capable of improving the yield of the fabrication process;

(9) to provide a semiconductor integrated circuit device having the SRAM with a technology capable of reducing the number of steps of the fabrication process; and

(10) to provide a semiconductor integrated circuit device having the SRAM with a technology capable of achieving two of the foregoing objects (1) to (9) simultaneously.

The foregoing and other objects and novel features of the present invention will become apparent from the description to be made with reference to the accompanying drawings.

The representatives of the invention to be disclosed herein will be briefly summarized in the following.

(1) There is provided a semiconductor integrated circuit device comprising a SRAM having its memory cell composed of transfer MISFETs to be controlled through word lines and drive MISFETs, wherein the gate electrodes of the drive MISFETs and the gate electrodes of the transfer MISFETs of the memory cell, and the word lines are individually formed of different conductive layers, wherein the drive MISFETs and the transfer MISFETs are individually arranged to cross each other in the gate length direction, and wherein the word lines are extended in the gate length direction of the gate electrodes of the drive MISFETs and caused to cross the gate electrodes of the drive MISFETs partially.

(2) In the aforementioned means (1), the word lines are formed of a composite film which is composed of a film of polycrystalline silicon and a film of a silicide of a metal having a high melting point and formed over the polycrystalline silicon film, and the gate electrodes of the drive MISFETs are formed of a single film of polycrystalline silicon.

(3) There is also provided a semiconductor integrated circuit device comprising a SRAM having its memory cell composed of two transfer MISFETs to be controlled with word lines, wherein the gate electrodes of the two transfer MISFETs of the memory cell are individually connected with two word lines.

(4) There is further provided a semiconductor integrated circuit device comprising a SRAM having its memory cell composed of two transfer MISFETs to be controlled with word lines and two drive MISFETs connected with source lines, wherein the two transfer MISFETs of the memory cell have their individual gate electrodes connected with two respective word lines spaced from each other and extended in an identical direction, and wherein the region defined by the two word lines is arranged therein with the two drive MISFETs and the source lines.

(5) In the aforementioned means (4), the two word lines and the source lines are individually formed of an identical conductive layer and extended in an identical direction.

(6) There is further provided a semiconductor integrated circuit device comprising a SRAM having its memory cell composed of two transfer MISFETs to be controlled with word lines and two drive MISFETs, wherein the first transfer MISFET of the memory cell has its gate electrode connected with the first word line, wherein the second transfer MISFET has its gate electrode connected with the second word line which is spaced from the first word line and extended in the same direction, wherein the first drive MISFET, which has its drain region connected with one semiconductor region of the first transfer MISFET, and the second drive MISFET, which has its drain region connected with one semiconductor region of the second transfer MISFET, are arranged between the first word line and the second word line, and wherein the plane shapes of the first transfer MISFET and the first drive MISFET are formed symmetrically of the plane shapes of the second transfer MISFET and the second drive MISFET with respect to the central point of the memory cell.

(7) In the aforementioned means (6), the gate width of the first and second transfer MISFETs is made smaller than that of the first and second drive MISFETs.

(8) There is further provided a semiconductor integrated circuit device comprising a SRAM having its memory cell composed of a tranfer MISFET and a drive MISFET connected with a source line, wherein the gate electrode of the drive MISFET of this memory cell and the source line are formed of different conductive layers, and wherein the sources line is extended in the gate length direction of the gate electrode of the drive MISFET and across a portion of the gate electrode of the drive MISFET.

(9) There is further provided a semiconductor integrated circuit device comprising a SRAM in which arrayed memory cells are selected through word lines by a decoder circuit, comprising: a decoder circuit; a word decoder circuit extended in the extended direction of main word lines and adapted to be connected with and selected by the decoder circuit through a main word line; a first memory cell array having arrayed memory cells connected with and selected by the word decoder circuit either through the first word line or sequentially through the first sub-word line and the first word line; and a second memory cell array extended over the first memory cell array and having arrayed memory cell arrays adapted to be connected with and selected by the word decoder circuit sequentially through the second sub-word line and the second word line, which are extended in the same direction as that of the first word line and the first sub-word line.

(10) In the aforementioned means (9), the first word line and the second word line are formed of an identical conductive layer, and the main word line, the first sub-word line and the second sub-word line are formed of an identical conductive layer different from that of the first word line and the second word line and are made of a material having a lower specific resistance than that of the first word line and the second word line.

(11) There is further provided a semiconductor intergrated circuit device comprising a SRAM having its memory cell arranged in a cross region between a word line and a source line extended in one direction and a complementary data line extended in a second direction crossing the first direction, wherein the source line is formed of a conductive layer identical to that of the word line, wherein the individual data lines of the complementary data line are formed of an identical conductive layer which is different from that of the word line and the source line, and wherein the identical conductive layer between the word line and source line and the complementary data line is formed with two word lines: a main word line extended in the first direction identical to that of the word line and source line and used by adopting the divided word line system: and a sub-word line used by adopting the double word line system.

(12) In the aforementioned means (11), the main word line and the sub-word line are individulally formed of a film of a metal having a high melting point and deposited by the sputtering method, and the the interlayer insulating films underlying the main word line and the sub-word line are formed of a silicon oxide film flattened by the glass flow.

(13) In the aforementioned means (6), a memory cell is formed in a plane shape linearly symmetric to that of an adjacent other first memory cell, which is arrayed in the direction of extending first and second word lines, on a first axis crossing first and second word lines between the memory cell and the first memory cell, and the memory cell is formed in a plane shape linearly symmetric to that of an adjacent other second memory cell, which is arrayed in the direction to cross the direction of extending the first and second word lines, on a second axis parallel to the first and second word lines between the memory cell and the second memory cell.

(14) In the aforementioned means (13): one of complementary data lines is connected with one semiconductor region of a first transfer MISFET of a memory cell whereas the other complementary data line is connected with one semiconductor region of a second transfer MISFET; a first power supply wiring line is extended along the first word line and bypassing the connection between one semiconductor region of the first transfer MISFET and the one complementary data line and is connected with the other semiconductor region of the second transfer MISFET through a first load MISFET; and a second power supply wiring line is extended along the second word line and bypassing the connection between the one semiconductor region of the second transfer MISFET and the other complementary data line in the direction identical to that of the first power supply wiring line and is connected with the other semiconductor region of the first transfer MISFET through a second load MISFET.

(15) In the aforementioned means (14), the first power supply wiring line and the second power supply wiring line are individually formed symmetrically with respect to the first axis but asymmetrically with respect to the second axis.

(16) In the aforementioned means (15), the gate electrodes of the first and second load MISFETs of the memory cell have their plane shapes formed symmetrically with respect to the first axis but asymmetrically with respect to the second axis.

(17) There is further provided a semiconductor integrated circuit device comprising a SRAM having its memory cell composed of a transfer MISFET and a drive MISFET, wherein the transfer MISFET of the memory cell has its gate electrode formed of a thicker film that the upper layer of the gate electrode of the drive MISFET.

(18) There is further provided a semiconductor integrated circuit device comprising a SRAM having its memory cell composed of a transfer MISFET and a drive MISFET and connected with a word line and a data line, wherein the gate electrode of the transfer MISFET of the memory cell and the word line are formed of an identical layer overlying the gate electrode of the drive MISFET and having a larger thickness than the same.

(19) In the aforementioned means (17) or (18), the gate electrode of the drive MISFET is formed to have a shingle-layered structure of a polycrystalline silicon film, and the gate electrode of the transfer MISFET is formed to have a laminated structure composed of a polycrystalline silicon film and a film overlying the former and made of a metal silicide having a high melting point.

(20) There is further provided a semiconductor integrated circuit device comprising a SRAM having a memory cell composed of a transfer MISFET and a drive MISFET and connected with a word line, a data line and a source line, wherein the gate electrode of the transfer MISFET of the memory cell, the word line and the source line are formed of an identical conductive layer different from that of the gate electrode of the drive MISFET and having a smaller specific resistance than that of the same.

(21) There is further provided a semiconductor integrated circuit device comprising a SRAM having its memory cell composed of a transfer MISFET and a drive MISFET, wherein the transfer MISFET of the memory cell is constructed of an LDD structure, and wherein the drive MISFET is constructed of a double drain structure.

(22) In the aforementioned means (21), the LDD structure transfer MISFET of the memory cell is made such that the diffusion of the lightly doped semiconductor region from the gate electrode end to the channel forming region is set within a range of 0.05 [$\mu$m] or more and free from the short channel effect.

(23) There is further provided a semiconductor integrated circuit device comprising a SRAM having its memory cell composed of two drive MISFETs and two load MISFETs, wherein the first gate electrode of one of the drive MISFETs and the second gate electrode of one of the load MISFETs are positioned to face the upper portion of the one drive MISFET, and wherein the drain region of the one load MISFET is connected with the drain region of the other drive MISFET through an intermediate conductive layer which is formed of a conductive layer identical to that of the second gate electrode of the one or other load MISFET.

(24) In the aforementioned means (23), the drain region of the load MISFET of the memory cell is constructed of an offset structure.

(25) There is further provided a semiconductor integrated circuit device comprising a SRAM having a memory cell composed of a load MISFET which has its channel forming region, source region and drain region formed of a silicon film deposited by the CVD method, wherein the load MISFET of the memory cell has its channel forming region doped with an impurity having a conduction type reverse to the channel conduction type.

(26) There is further provided a semiconductor integrated circuit device comprising a SRAM having its memory cell composed of transfer MISFETs, over which are extended complementary data lines to be connected with one semiconductor region of the transfer MISFET, wherein one of the complementary data lines extended over the other transfer MISFET is connected through an intermediate conductive layer with one semiconductor region of one transfer MISFET of the memory cell, and wherein the other complementary data line extending over the one transfer MISFET is connected through an intermediate conductive layer with one semiconductor region of the other transfer MISFET.

(27) In the aforementioned means (26), the complementary data lines are constructed of a laminated structure of aluminum, an aluminum alloy or a barrier metal and an aluminum alloy, and the intermediate conductive layer is formed of a film of a metal having a high melting point.

(28) There is further provided a process for fabricating a semiconductor integrated circuit device comprising a SRAM having its memory cell composed of a transfer MISFET and a drive MISFET, comprising: the step of forming a first gate electrode through a gate insulating film over the principal surface of a substrate to be formed with the drive MISFET; the step of forming a drive MISFET having a double drain structure by doping the principal surface of the substrate for the drive MISFET, in self-alignment with the first gate electrode, with two kinds of impurities of a conduction type reverse to that of the substrate and having different diffusion rates; the step of forming a second gate electrode through a gate insulating film over the principal surface of the substrate for the drive MISFET; the step of doping the principal surface of the substrate for the transfer MISFET, in self-alignment with the second gate electrode, with an impurity of a conduction type reverse to that of the substrate and having a low concentration; the step of forming a side wall spacer on and in self-alignment with the side wall of the second gate electrode; and the step of forming the transfer MISFET of LDD structure by doping the principal surface of the substrate for the transfer MISFET, in self-alignment with the side wall spacer, with an impurity having a conduction type reverse to that of the substrate and having a high concentration.

(29) In the aforementioned means (28), a source line formed at the fabrication step identical to that of the second gate electrode of the transfer MISFET is connected with the source region of the double drain structure of the drive MISFET.

(30) In the aforementioned means (28), the step of forming the drive MISFET of the double drain structure forms, after the first gate electrode, the side wall spacer on and in self-alignment with the side wall of the first gate electrode, and dopes the first gate electrode with two kinds of impurities different in the diffusion rates in the self-alignment.

(31) In the aforementioned means (28) or (30), the step of forming the transfer MISFET of the LDD structure: introduces the impurity of low concentration, after the second gate electrode has been formed; subjects the impurity to an annealing for the enlarged diffusion; forms the side wall spacer; and then introduces the impurity of high concentration.

(32) There is further provided a process for fabricating a semiconductor integrated circuit device comprising a SRAM having its memory cell composed of a transfer MISFET controlled by a word line and a drive MISFET connected with a source line, comprising: the step of forming a first gate electrode of the drive MISFET of the memory cell; and the step of forming a second gate electrode of the transfer MISFET of the memory cell over the first gate electrode and the word line and the source line in a layer identical to that of the second gate electrode.

(33) There is further provided a process for fabricating a semiconductor integrated circuit device comprising a SRAM having its memory cell arranged with a capacity element which uses the gate electrode of a drive MISFET as its first electrode and has its second electrode formed over the first electrode and connected with a data storage node through a dielectric film, wherein the first electrode or the second electrode is formed of a polycrystalline silicon film which is deposited by the CVD method and doped with an impurity for reducing the resistance during the deposition.

(34) There is further provided a process for fabricating a semiconductor integrated circuit device comprising a SRAM having its memory cell arranged with a capacity element which uses the gate electrode of a drive MISFET as its first electrode and has its second electrode formed over the first electrode and connected with a data storage node through a dielectric film, wherein the first electrode or the second electrode is formed of a polycrystalline silicon film deposited with disilane as source gases by the CVD method.

(35) There is further provided a process for fabricating a semiconductor integrated circuit device comprising a SRAM having its memory cell arranged with a capacity element which uses the gate electrode of a drive MISFET as its first electrode and has its second electrode formed over the first electrode and connected with a data storage node through a dielectric film, comprising: the step of forming the first electrode of a polycrystalline silicon film deposited by the CVD method; and the step of forming a dielectric film of a silicon oxide film deposited over the first electrode by the CVD method.

(36) In the aforementioned means (35), the first electrode or the second electrode is formed of either a polycrystalline silicon film deposited by the CVD method and doped with an impurity for reducing the resistance during the deposition or a polycrystalline silicon film deposited with disilane as its source gates by the CVD method.

(37) There is further provided a process for fabricating a semiconductor integrated circuit device comprising a SRAM having its memory cell composed of a capacity element which has its first electrode connected with the gate electrode of the first drive MISFET and its second electrode connected with one semiconductor region of the first drive MISFET, comprising: the step of forming the first drive MISFET and the second drive MISFET and the first electrode of the capacity element from the gate electrode of the first drive MISFET; the step of forming a transfer MISFET having its one semiconductor region connected with one semiconductor region of the first drive MISFET; and the step of forming the second electrode of the capacity element over the first electrode of the capacity element through a dielectric film and connecting one semiconductor region of the transfer MISFET and the gate electrode of the drive MISFET by a portion of the second electrode.

(38) In the aforementioned means (37), the first electrode or the second electrode of the capacity element is formed of either a polycrystalline silicon film deposited with disilane as its source gases by the CVD method or a polycrystalline silicon film deposited by the CVD method and doped with an impurity for reducing the resistance.

(39) There is further provided a semiconductor integrated circuit device comprising a SRAM having a memory cell, in which a word line is integrated with the gate electrode of a transfer MISFET, comprising: the step of forming a gate insulating film over the principal surface of a substrate to be formed with the transfer MISFET of the memory cell; the step of forming a polycrystalline silicon film deposited all over the substrate including the gate insulating film by the CVD method and doped with an impurity for reducing the resistance during the deposition; the step of depositing a film of a metal silicide having a high melting point all over the substrate including the polycrystalline silicon film; and the step of forming the gate electrode of the transfer MISFET and the word line connected integrally with the former over the gate insulating film, from the residual polycrystalline silicon film and the metal silicide film of high melting point, by patterning the metal silicide film of high melting point and the polycrystalline silicon film.

(40) In the aforementioned means (39), the polycrystalline silicon film below the gate electrode of the transfer MISFET and the word line connected with the former is deposited with disilane as its source gases by the CVD method.

(41) In the aforementioned means (39) or (40), the polycrystalline silicon film below the gate electrode of the transfer MISFET and the word line connected with the former is formed to have a thickness within a range of 5 [nm] to 100 [nm].

(42) There is further provided a process for fabricating a semiconductor integrated circuit device comprising a SRAM having its memory cell composed of a transfer MISFET and a drive MISFET having its source region connected with a source line, comprising: the step of forming the drive MISFET by forming not only a first gate electrode over the principal surface of a substrate to be formed with the drive MISFET but also a source region and a drain region over the principal surface; the step of forming a gate insulating film over the principal surface of the substrate to be formed with the transfer MISFET; the step of depositing a silicon film all over the surface of the substrate including the gate insulating film; the step of forming a connection hole by sequentially removing the silicon film over the source region of the drive MISFET and the insulating film underlying the silicon film; the step of forming a film of a metal silicide having a high melting point, which is to be connected with the source region of the drive MISFET through the connection hole, all over the surface of the substrate including the silicon film; and the step of forming not only a second gate electrode of a silicon film and a metal silicide film having a high melting point over the gate insulating film but also a source line connected with the source region of the drive MISFET.

(43) There is further provided a process for fabricating a semiconductor integrated circuit device comprising a SRAM having a memory cell composed of a transfer MISFET and a drive MISFET, comprising: the step of forming a first gate insulating film over the principal surface of the region of a substrate to be formed with the drive MISFET; the step of forming a silicon film and a first insulating films as an oxidation resisting mask, and a second insulating film sequentially all over the surface of the substrate including the surface of the first gate insulating film; the step of forming a first gate electrode of the drive MISFET from the silicon film by patterning the second and first insulating films and the silicon film sequentially according to a substantially identical pattern; the step of forming a side wall spacer on the side wall of the first gate electrode; the step of forming the second gate insulating film by the thermal oxidation method over the principal surface of the substrate to be formed with the transfer MISFET; the step of forming a second gate electrode of the transfer MISFET over the second gate insulating film; and the step of removing the second and first insulating films sequentially from the first gate electrode by etching all over the surface of the substrate.

(44) In the aforementioned means (43), the first gate electrode of the drive MISFET is used as the first electrode of a capacity element, and a second electrode of the capacity element is formed through a dielectric film over the first gate electrode having the first and second insulating films removed.

(45) There is further provided a process for fabricating a semiconductor integrated circuit device comprising a SRAM having its memory cell, in which the gate electrode of a drive MISFET is connected with one semiconductor region of a transfer MISFET, comprising: the step of forming a first gate electrode over the principal surface of a substrate for the drive MISFET and a first insulating film over the first gate electrode; the step of forming not only both a second gate electrode over the principal surface of the substrate for the transfer MISFET and a second insulating film having a larger thickness than that of the first insulating film over the second gate electrode but also the one semiconductor region over the principal surface for the transfer MISFET; the step of forming a connection hole for exposing at least a portion of the surface of the one semiconductor region of the transfer MISFET by removing a portion of the first insulating film from the first gate electrode of the drive MISFET; and the step of connecting the one semiconductor region of the transfer MISFET and the first gate electrode of the drive MISFET through the connection hole with the conductive layer which is formed over the first and second gate electrodes.

(46) There is further provided a process for fabricating a semiconductor integrated circuit device comprising a SRAM in which the gate electrode of a drive MISFET is connected with one semiconductor region of a transfer MISFET and in which a data line is connected with the other semiconductor region of the transfer MISFET of the memory cell, comprising: the step of forming a first gate electrode over the principal surface of a substrate to be formed with the drive MISFET; the step of forming both a second gate electrode above the first gate electrode over the principal surface of the substrate for the transfer MISFET and the one semiconductor region and the other semiconductor region over the principal surface for the transfer MISFET; the step of connecting one semiconductor region of the transfer MISFET and the first gate electrode of the drive MISFET individually through a conductive layer formed above the first and second gate electrodes, and forming an intermediate layer in a layer identical to the conductive layer and over the other semiconductor region of the transfer MISFET; and the step of connecting the data line with the other semiconductor region of the transfer MISFET through the intermediate layer.

(47) There is further provided a process for fabricating a semiconductor integrated circuit device comprising a SRAM having its memory cell composed of a drive MISFET and a load MISFET, comprising: the step of forming the first gate electrode, the source region and the drain region of the drive MISFET over the principal surface of a substrate to be formed with the drive MISFET of the memory cell; the step of forming the second gate electrode of the load MISFET through a dielectric film over the first gate electrode of the drive MISFET, and connecting the second gate electrode with the drain region of the drive MISFET; and the step of forming the channel forming region, the source region and the drain region through a gate insulating film over the second gate electrode of the load MISFET.

(48) In the aforementioned means (47), the second gate electrode of the load MISFET is formed of either a polycrystalline silicon film deposited with disilane as its source gases by the CVD method or a polycrystalline silicon film deposited by the CVD method and doped with an impurity for reducing the resistance during the deposition.

(49) In the aforementioned means (48), the channel forming region of the load MISFET is formed to have a film thickness within a range of 5 [nm] to 50 [nm].

(50) In the aforementioned means (48), the gate insulating film of the load MISFET is formed of a silicon oxide film deposited by the CVD method.

(51) In the aforementioned means (48) to (50), the gate insulating film of the load MISFET is formed to have a film thickness within a range of 10 [nm] to 50 [nm].

(52) There is further provided a process for fabricating a semiconductor integrated circuit device having a multi-layered wiring structure in which an upper wiring line is formed above a lower wiring line through an inter-layer insulating film, comprising: the step of forming a first wiring line and a second wiring line as the lower wiring line over a substrate at a predetermined gap from each other; the step of depositing a first silicon oxide film having a thickness of one half or more of the gap between the first and second wiring lines of the lower wiring line all over the substrate including the lower wiring line by using the plasma CVD method using tetra ethoxy silane as its source gates; the step of applying a second silicon oxide film all over the surface of the substrate including the first silicon oxide film by the spin-on-glass method and then baking the second silicon oxide film; the step of etching all over the surface of the second silicon oxide film to remove the second silicon oxide film from the first and second wiring lines of the lower wiring line while leaving the same in the other regions; the step of depositing a third silicon oxide film by the CVD method all over the surface of the substrate including the second silicon oxide film thus left; the step of forming a connection hole by removing the first wiring line or the second wiring line of the first, second and third silicon oxide films; and the step of forming such an upper wiring line over the third silicon oxide film as to be connected with the first wiring line or the second wiring line through the connection hole.

(53) There is further provided a process for fabricating a semiconductor integrated circuit device comprising a SRAM having its memory cell composed of a transfer MISFET and a drive MISFET and formed over the principal surface in an active region defined by an element separating insulating film formed in an inactive region of a substrate, comprising: the step of arraying a plurality of oxidation resisting masks having a ring-shaped plane separately of one another and regularly over the principal surface of the substrate to be formed with the active region; and the step of forming the element separating insulating film over the principal surface of the substrate for the inactive region by the selective oxidation method using the oxidation resisting masks.

(54) In the aforementioned means (53), the oxidation resisting masks are arrayed over the principal surface of the substrate for the active region at a spacing from each other and at an identical pitch in a first direction such that they are in a subsequent array in a second direction crossing the first direction at a spacing from each other, at an identical pitch in the first direction and at a displacement of one half pitch from the previous array.

(55) In the aforementioned means (54), the memory cell is composed of two transfer MISFETs and two drive MISFETs, and the ring shape of the oxidation resisting masks has totally four memory cells: two memory cells adjacent in the first direction and two memory cells adjacent in the second direction, in which the totally four transfer MISFETs and the totally four drive MISFETs each for each of the four memory cells are connected in series.

(56) In the aforementioned means (53) to (55), of the oxidation resisting masks arrayed regularly, the oxidation resisting masks arranged at the terminal end of the memory cell array are formed of a portion of the ring formed on the basis of the layout rule, whereas the oxidation resisting masks arranged at the terminal end are formed such that the boundary region from the inactive region in the direction of extending the ring-shaped pattern is made larger than the size corresponding to the bird's beak.

(57) There is further provided a semiconductor integrated circuit device comprising: an electrostatic breakdown preventing circuit composed of a MISFET and arranged between an external terminal and an input/output circuit composed of a MISFET; and a SRAM having a memory cell composed of a drive MISFET and a transfer MISFET, wherein the transfer MISFET of the memory cell is constructed to have the LDD structure, wherein the drive MISFET is constructed to have the double drain structure, and wherein either the drain region to be connected directly with the external terminal of the MISFET of the electrostatic breakdown preventing circuit or the drain region to be connected directly with the external terminal of the MISFET of the input/output circuit is constructed to have the double drain structure.

(58) There is further provided a process for fabricating a semiconductor integrated circuit device comprising: an electrostatic breakdown preventing circuit composed of a MISFET and arranged between an external terminal and an input/output circuit composed of a MISFET; and a SRAM having a memory cell composed of a drive MISFET and a transfer MISFET, comprising: the step of forming the drive MISFET of the memory cell, a MISFET having a drain region to be connected directly with the external terminal of the electrostatic breakdown circuit of a MISFET having a drain region to be connected directly with the external terminal of the input/output circuit; and the step of forming the transfer MISFET of the memory cell.

(59) There is further provided a semiconductor integrated circuit device comprising a SRAM having its memory cell composed of a transfer MISFET to be controlled with a word line and a drive MISFET and its peripheral circuit composed of a MISFET for controlling the data writing, holding and reading operations of the memory cell, wherein the gate electrode of the transfer MISFET and the word line to be connected with the former are made of a material having a lower specific resistance than that of the gate electrode of the drive MISFET, and wherein the MISFET of the peripheral circuit has its gate electrode made of a conductive layer identical to that of the gate electrode of the transfer MISFET.

(60) In the aforementioned means (59), the transfer MISFET of the memory cell and the MISFET of the peripheral circuit are individually constructed to have the LDD structure, and the drive MISFET of the memory cell is constructed to have the double drain structure

(61) There is further provided a process for fabricating a semiconductor integrated circuit device comprising a SRAM having its memory cell composed of a transfer MISFET to be controlled with a word line and a drive MISFET and its peripheral circuit composed of a MISFET for controlling the data writing, holding and reading operations of the memory cell, comprising: the step of forming the drive MISFET of the memory cell; and the step of forming the transfer MISFET of the memory cell and the MISFET of the peripheral circuit.

(62) There is further provided a process for fabricating a semiconductor integrated circuit device comprising a SRAM in which a first power supply wiring line for supplying the electric power to a memory cell is connected in the peripheral portion of a memory cell array with a second power supply wiring line formed above the first power supply wiring line through an inter-layer insulating film, comprising: the step of forming a semiconductor region or a conductive layer in the peripheral portion of the memory cell array over a substrate; the step of forming a first interlayer insulating film all over the substrate including the semiconductor region or the conductive layer; the step of forming a first connection hole by removing the semiconductor region of the first inter-layer insulating film or the region of a portion of the conductive layer; the step of forming such a first power supply wiring line over the first inter-layer insulating film as to be connected with the semiconductor region or the region of the portion of the conductive layer through the first connection hole; the step of forming the second inter-layer insulating film all over the surface of the substrate including the first power supply wiring line; the step of forming a second connection hole by removing the semiconductor region or the region of the other portion of the conductive layer of the second inter-layer insulating film and the first inter-layer insulating film; and the step of forming such a second power supply wiring line over the second inter-layer insulating film as to be connected with the semiconductor region or the region of the other portion of the conductive layer through the second connection hole.

(63) In the aforementioned means (62), the step of forming the semiconductor region is identical to the step of forming the source region and drain region of the MISFET of the peripheral circuit arranged in the peripheral region of the memory cell array.

(64) There is further provided a semiconductor integrated circuit device comprising a memory cell of flip-flop type composed of two drive MOS transistors, two transfer MOS transistors, two load elements and a storage node, wherein, in a memory cell array having two gate wiring lines of the two transfer MOS transistors connected with different word lines, these different word lines are connected for each predetermined memory cell with one auxiliary word line.

According to the aforementioned means (1), the areas to be occupied by the drive MISFET of the memory cell and the word line are partially superposed so that the area to be occupied by the memory cell can be reduced to an extent corresponding to the superposition in the direction of the gate width of the drive MISFET. As a result, the degree of integration of the SRAM can be improved.

According to the aforementioned means (2), in addition to the effect of the aforementioned means (1), the laminated structure can give a lower specific resistance than that of the single film structure of the polycrystalline silicon film to reduce the resistance of the word line. As a result, the data writing and reading operations of the memory cell can be speeded up to accelerate the operation speed of the SRAM.

According to the aforementioned means (3), the wiring (in case of one word line for each memory cell) of the word line in the memory cell for connecting the gate electrodes of the two transfer MISFETs can be eliminated merely by connecting the two word lines individually with the gate electrodes of the two transfer MISFETs of the memory cell. Thus, the two word lines can be extended generally straight and shortened to reduce their resistances. As a result, the data writing and reading operations of the memory cell can be speeded up to accelerate the operation speed of the SRAM.

According to the aforementioned means (4), in addition to the effect of the aforementioned means (3), the source line can be arranged in the vacant region between the two word lines in the memory cell because the wiring of the word line in the memory cell is eliminated. As a result, the connection distance between each of the source regions of the two drive MISFETs and the source line can be shortened to reduce the floating of the potential of the source regions of the drive MISFETs thereby to improve the stability of the data storage of the memory cell and the operational reliability of the SRAM.

According to the aforementioned means (5), the source line and the source region of the drive MISFET can be formed of the different conductive layers to extend the source line in the occupied area of the drive MISFET. As a result, the occupied area of the memory cell can be reduced to an extent corresponding to the occupied area of the source line and the element separating region of the source line and the drive MISFET thereby to improve the degree of integration of the SRAM.

According to the aforementioned means (6), the conditions for the fabrication process such as the diffractions (or halation) during the exposure of the photolithography or the run-around of the etching liquid can be uniformalized in the memory cell, especially between the first transfer MISFET and the second transfer MISFET and between the first drive MISFET and the second drive MISFET thereby to reduce the dispersion of the sizes of the individual elements. As a result, the sizes of these elements can be reduced to reduce the occupied area of the memory cell thereby to improve the degree of integration of the SRAM.

According to the aforementioned means (7), the gap sizes between the first transfer MISFET and the first drive MISFET and between the second transfer MISFET and the second drive MISFET are determined one-to-one by the size of the element separating gap between the first drive MISFET and the second drive MISFET to eliminate the useless size (i.e., the vacant region corresponding to the difference between the gate width size of the drive MISFET and the gate width size of the transfer MISFET) from the above-specified gap sizes. As a result, the occupied area of the memory cell can be reduced to improve the degree of integration of the SRAM.

According to the aforementioned means (8), the occupied area of the drive MISFET of the memory cell and the occupied area of the source line are partially superposed so that the occupied area of the memory cell can be reduced to an extent corresponding to the superposition in the gate width direction of the drive MISFET to improve the degree of integration of the SRAM.

According to the aforementioned means (9), there is adopted the divided word line system for selecting (or accessing) only the first word line of the first memory cell array or the second word line of the second memory cell array, which is selected by the decoder circuit and connected with the word decoder circuit. As a result, the charge or discharge current of the word line thus selected can be reduced to economize the power consumption of the SRAM. At the same time, there is also adopted the double word line system in which the first word line of the first memory cell array and the second word line of the second memory cell array, which are to be selected by the word decoder circuit, are individually divided for each memory cell array and are shortened and connected with the word decoder circuit individually through the sub-word lines. As a result, the resistance between the word decoder circuit and the word line can be reduced to an extent corresponding to the sub-word line to accelerate the charge and discharge rates of the word line thus selected and accordingly the operating speed of the SRAM.

According to the aforementioned means (10), the three kinds of word lines, i.e., the main word line, the sub-word line and the word line are formed of the two-layered conductive layer so that the number of conductive layers can be reduced to simplify the multi-layered wiring structure of the SRAM. At the same time, the individual specific resistances of the main word line and the sub-word line determining the operating speed are reduced to accelerate the individual charge and discharge rates so that the operating speed of the SRAM can be accelerated.

According to the aforementioned means (11), the source line is formed of the conductive layer identical to that of the word line to establish such a vacant region in the conductive layer having the source line extended therein as to extent at least two wiring lines. As a result, the degree of integration of the SRAM can be improved to an extent corresponding to the occupied area for extending the two word lines, i.e., the main word line and the sub-word line. In other words, the main word line and the sub-ward line can be extended in the memory cell array without increasing the occupied area so that the divided word line system and the double word line system can be simultaneously adopted in the SRAM.

According to the aforementioned means (12), the metal film having the high melting point and deposited by the sputtering method has a higher bondability to the underlying inter-layer insulating film than that deposited by the CVD method so that the main word line and the sub-word line can be prevented from being separated. At the same time, the underlying inter-layer insulating film is flattened so that the individual step coverages of the main word line and the sub-word line can be improved to prevent the individual breakage failures of the main word line and the sub-word line.

According to the aforementioned means (13), the semiconductor region of one of the transfer MISFET and drive MISFET of the memory cell can be shared with each of those of the adjacent first and second memory cells to reduce the occupied areas of the memory cells so that the degree of integration of the SRAM can be improved. In each of the memory cells and the adjacent first and second memory cells, the conditions for the fabrication process, e.g., the diffraction during the exposure of the photolithography or the run-around of the etching liquid can be uniformalized to reduce the dispersion of the sizes of the individual elements. As a result, the sizes of the individual elements can be reduced to further reduce the occupied area of the memory cell so that the degree of integration of the SRAM can be improved.

According to the aforementioned means (14), at the connection between the one semiconductor region of the transfer MISFET and the complementary data line, each of the first power supply wiring line and the second power supply wiring line is bypassed only in one direction so that the second one is neither arranged between the connection and the first load MISFET not is arranged the first one between the connection and the second load MISFET. As a result, the occupied area between the connection and the first load MISFET of the memory cell or between the connection and the second load MISFET can be reduced to an extent corresponding to the absence of the second or first power supply wiring line to improve the degree of integration of the SRAM.

According to the aforementioned means (15) and (16), there can be attained effects similar to those of the aforementioned means (14).

According to the aforementioned means (17), the individual regions of the transfer MISFET and the drive MISFET of the memory cell can be superposed to reduce the occupied area of the memory cell thereby to improve the degree of integration of the SRAM. At the same time, the gate electrode (as located at the lowermost layer of the memory cell) of the drive MISFET can be thinned to reduce the growth of the stepped shape of the upper layer thereby to flatten the upper layer. As a result, the breakage failures of the upper wiring line can be reduced to improve the electric reliability of the SRAM.

According to the aforementioned means (18), in addition to the effects of the aforementioned means (17), the word line can have its sectional area increased to reduce its resistance. As a result, the data writing and reading operations of the memory cell can be speeded up to accelerate the operating speed of the SRAM.

According to the aforementioned means (19), the laminated structure has a lower specific resistance than that of the single-layered film of polycrystalline silicon film so that the operating speed of the SRAM can be accelerated.

According to the aforementioned means (20), the word line and the source line can have their individual specific resistance reduced (because the film thickness is increased thanks to the laminated structure) to speed up the data writing and reading operations of the memory cell thereby to accelerate the operating speed of the SRAM.

According to the aforementioned means (21), the mutual conductance of the drive MISFET of the memory cell can be made higher than that of the transfer MISFET to increase the effective $\beta$ ratio. As a result, the occupied area of the drive MISFET can be reduced to reduce the occupied area of the memory cell thereby to improve the degree of integration of the SRAM. Moreover, the effective $\beta$ ratio can be increased to improve the stability of the data held in the data storage node of the memory cell, the malfunction of the memory cell can be reduced to improve the operational reliability of the SRAM.

According to the aforementioned means (22), the superposition (or overlap) between the gate electrode of the transfer MISFET and the lightly doped semiconductor region (i.e., the LDD region) can be increased to weaken the intensity of the electric field to be generated in the vicinity of the drain region. As a result, the amount of hot carriers to be generated can be reduced to reduce the degradation of the aging threshold voltage of the transfer MISFET thereby to improve the electric reliability of the SRAM.

According to the aforementioned means (23), the distance between the drain region of one load MISFET of the memory cell and the drain region of the other drive MISFET can be made through the intermediate conductive layer to prevent the impurity for forming the drain region of the one load MISFET from being diffused into the drain region of the other drive MISFET. As a result, it is possible to improve the electric characteristics of the SRAM such as the prevention of the fluctuations of the threshold voltage, which might otherwise be caused by the diffusion of the impurity into the other drive MISFET.

According to the aforementioned means (24), in addition to the effects of the aforementioned means (23), the leakage current between the source region and the drain region of the load MISFET can be reduced to reduce the standby current flow of the SRAM.

According to the aforementioned means (25), the ON and OFF controls of the load MISFET of the memory cell can be ensured by enlarging the threshold voltage of the load MISFET in its absolute value and by setting the threshold voltage in the enhancement type. As a result, the supply of the power supply voltage from the power supply voltage line to the data storage node of the memory cell can be ensured to hold the data stably. At the same time, the supply of a useless current (i.e., the leakage current) can be reduced to reduce the standby current flow of the SRAM adopting the battery backup system.

According to the aforementioned means (26), the array of the transfer MISFET of the memory cell and the array of the complementary data line are reversed, and the intermediate conductive layer is extended to an extent corresponding to the reversed distance thereby to elongate the connection distance between one semiconductor region of the transfer MISFET and the complementary data line. As a result, the mutual diffusion between the silicon of one semiconductor region of the transfer MISFET and the metal of the complementary data line can be prevented to improve the electric reliability of the SRAM such as the prevention of the alloy spike.

According to the aforementioned means (27), the aluminum metal has a lower specific resistance than those of other metals having higher melting points and silicon so that it can reduce the resistance of the complementary data line. As a result, the data transmission through the complementary data line can be speeded up to accelerate the operating speed of the SRAM. At the same time, the metal film of the high melting point of the intermediate conductive layer can have the barrier properties to prevent the aforementioned alloy spike better.

According to the aforementioned means (28), the number of masks (by using totally three masks) is reduced by one from the case, in which the transfer MISFET and the drive MISFET are constructed to have the LDD structure for coping with the hot carriers (by using totally four masks), by giving the drive MISFET the double drain structure for coping with the hot carriers and increasing the unit conductance. As a result, the number of steps for fabricating the SRAM can be reduced. Moreover, the gate insulating film of the drive MISFET and the gate insulating film of the transfer MISFET are formed at different steps so that the individual thicknesses of the gate insulating films can be optimized independently of each other. For example, in case the thickness of the gate insulating film of the drive MISFET is made smaller than that of the gate insulating film of the transfer MISFET, the unit conductance of the drive MISFET can be increased to attain the $\beta$ ratio of the memory cell.

According to the aforementioned means (29), the semiconductor region (i.e., the semiconductor region for extracting the reference power supply) underlying the source line for connecting the source line and the source region of the drive MISFET can be formed at the step of forming the semiconductor region of the double drain structure of the drive MISFET. As a result, the number of steps of fabricating the SRAM can be reduced to an extent corresponding to the step of forming the connecting semiconductor region.

According to the aforementioned means (30), the run-around of the semiconductor region of the drive MISFET to the channel forming region can be reduced to an extent corresponding to the film thickness of the side wall spacer. As a result, the gate length size of the drive MISFET can be retained to reduce the occupied area of the drive MISFET while preventing the short channel effect, so that the occupied area of the memory cell can be reduced to improve the degree of integration of the SRAM.

According to the aforementioned means (31), the amount of diffusion into the channel forming region of the semiconductor region formed by doping the LDD structure of the transfer MISFET lightly with the impurity can be increased by adding the annealing. As a result, the superposition (or overlap) between the gate electrode of the transfer MISFET and the semiconductor region formed by the light doping of the impurity can be increased to weaken the intensity of the electric field to be generated in the vicinity of the drain region. As a result, the amount of the hot carriers produced can be reduced to reduce the degradation of the aging threshold voltage of the transfer MISFET thereby to improve the electric reliability of the SRAM.

According to the aforementioned means (32), the word line and the source line are formed at the step of forming the second gate electrode of the transfer MISFET of the memory cell so that the number of steps of fabricating the SRAM can be reduced to an extent corresponding to that step of forming the word line and the source line.

According to the aforementioned means (33), the surface of the polycrystalline silicon film at the side to contact with the dielectric film, i.e., the surface of the first or second electrode can be made flatter than the polycrystalline silicon film which has its resistance dropped as a result of doping with the impurity after it has been deposited by the CVD method. As a result, the electric field to be generated between the first and second electrodes of the capacity element can be prevented from being concentrated, to improve the dielectric strength of the dielectric film of the capacity element thereby to improve the electric reliability of the SRAM. Since, moreover, the dielectric strength of the dielectric film of the capacity element can be improved, the dielectric film can be thinned to increase the charge to be stored in the capacity element. As a result, the size of the capacity element can be reduced to reduce the occupied area of the memory cell thereby to improve the degree of integration of the SRAM. Since, still moreover, the charge to be stored in the capacity element can be increased, the data holding stability of the memory cell can be improved to raise the breakdown voltage of the $\alpha$ ray soft errors.

According to the aforementioned means (34), the surface of the polycrystalline silicon film at the side to contact with the dielectric film, i.e., the surface of the first or second electrode can be flattened more than the polycrystalline silicon film (i.e., doped poly-Si) deposited merely by the CVD method. As a result, the effects obtainable are similar to those of the aforementioned means (33).

According to the aforementioned means (35), unlike the case in which the dielectric film is formed of the silicon oxide film formed by the thermal oxidation method on the surface of the polycrystalline silicon film acting as the first electrode, the silicon oxide film can be deposited independently of the crystal plane (in which a plurality of different crystal planes are present to have different growing rates of thermal oxidation) of the crystal particles (or grains) of the surface of the underlying polycrystalline silicon film so that the thickness of the silicon oxide film, i.e., the dielectric film can be uniformalized. As a result, the dielectric strength of the dielectric film can be improved while preventing the electric field from being concentrated between the first electrode and the second electrode, to improve the electric reliability of the SRAM. Like the effects of the aforementioned means (33), moreover, the size of the capacity element can be reduced to reduce the occupied area of the memory cell thereby to improve the degree of integration of the SRAM. Still moreover, the data holding stability of the memory cell can be improved to raise the breakdown voltage of the $\alpha$ ray soft errors.

According to the aforementioned means (36), the effects of the aforementioned means (33) or (34) can be attained in addition to the effects of the aforementioned means (35).

According to the aforementioned means (37), the first electrode of the capacity element is formed of the gate electrode of the first drive MISFET so that the number of steps of fabricating the SRAM can be reduced to an extent corresponding to the step of forming the first electrode. At the same time, one semiconductor region of the transfer MISFET and the gate electrode of the second drive MISFET are connected at the step of forming the second electrode of the capacity element (by using the conductive layer identical to that of the second electrode) so that the number of steps of fabricating the SRAM can be reduced to an extent corresponding to the step of connecting the two.

According to the aforementioned means (38), the effects of the aforementioned means (33) or (34) can be attained in addition to the effects of the aforementioned means (37).

According to the aforementioned means (33), the polycrystalline silicon film underlying the gate electrode of the transfer MISFET is doped with the impurity during the deposition but abolishes the thermal diffusion of P after the deposition and accordingly the use of hydrofluoric acid for removing the phosphor glass film to be formed on the surface of the polycrystalline silicon film by the thermal diffusion, and the polycrystalline silicon film to be doped with the impurity during the deposition can be made denser than the polycrystalline silicon film having no impurity introduced during the deposition, to reduce the degradation of that dielectric strength of the gate insulating film, which might otherwise be caused by the soaking the hydrofluoric acid into the polycrystalline silicon film. As a result, the resistance can be reduced to thin the polycrystalline silicon film underlying the two-layered word line for accelerating the operating speed of the SRAM so that the total thickness of the word line can be reduced to flatten the underlying surface of the conductive layer (e.g., a data line) to be arranged over the word line.

According to the aforementioned means (40), the surface of the polycrystalline silicon film at the side of the gate insulating film can be flattened to prevent the electric field from being concentrated between the substrate and the gate electrode thereby to reduce the deterioration of the dielectric strength of the gate insulating film of the transfer MISFET.

According to the aforementioned means (41), the thickness of the gate electrode of the transfer MISFET can be reduced, and the degradation of the dielectric strength of the gate insulating film can be reduced.

According to the aforementioned means (42), the gate insulating film of the transfer MISFET is formed and then covered directly with the silicon film (i.e., the lower layer of the second gate electrode). After this, the silicon film and the underlying insulating film are removed to form the connection hole in the surface of the source region of the drive MISFET. As a result, the photo resist mask for forming that connection hole can be kept away from direct contact with the gate insulating film of the transfer MISFET to reduce the contamination or degradation of the dielectric strength of the gate insulating film of the transfer MISFET.

According to the aforementioned means (43), the first insulating film over the first gate electrode can reduce the phenomenon that the first gate electrode of the drive MISFET has its end portion peeled up at the thermal oxidation step for forming the second gate insulating film on the basis of the phenomenon that the oxidation rate of the corner portions is lower than that of the surface portion of the first gate electrode of the drive MISFET. As a result, the thickness of the second insulating film over the first gate electrode can be uniformalized to reduce the etching at the step of removing the second insulating film. At this step of removing the second insulating film, moreover, the first insulating film over the first gate electrode can be used as the etching stopper film to avoid the short or excessive etching thereby to improve the etching controllability. At the thermal oxidation step of forming the second gate insulating film, still moreover, the first insulating film over the first gate electrode can be used as the thermal oxidation resisting mask to reduce the growth of the crystal particles of the silicon film at the surface portion of the first gate electrode thereby to flatten the surface of the first gate electrode.

According to the aforementioned means (44), the surface of the first gate electrode, i.e., the first electrode of the capacity element is coated with the first insulating film at the thermal oxidation step and is flattened so that the concentration of the electric field between the first electrode and the second electrode of the capacity element can be reduced to improve the dielectric strength of the dielectric film of the capacity element.

According to the aforementioned means (45), the second insulating film over the second gate electrode of the transfer MISFET can be made thicker than the first insulating film over the first gate electrode of the drive MISFET to leave the second insulating film over the second gate electrode at the time of forming the connection hole. As a result, the second gate electrode and the conductive layer can be prevented from being short-circuited, to improve the yield of the fabrication process.

According to the aforementioned means (46), the intermediate conductive layer can be formed at the step of forming the conductive layer for connecting one semiconductor region of the transfer MISFET and the first gate electrode of the drive MISFET. As a result, the number of steps of fabricating the SRAM can be reduced to an extent corresponding to the step of forming that intermediate conductive layer.

According to the aforementioned means (47), the first electrode of the capacity element to be inserted between the data storage nodes can be formed at the step of forming the first gate electrode of the drive MISFET, and the second electrode of the capacity element can be formed at the step of forming the second gate electrode of the load MISFET. As a result, the number of steps of fabricating the SRAM can be reduced to an extent corresponding to the step of forming the capacity element. Since, moreover, the load MISFET and the capacity element are superposed over the drive MISFET of the memory cell, the occupied area of the memory cell can be reduced to an extent corresponding to the superposition thereby to improve the degree of integration of the SRAM.

According to the aforementioned means (48), the surface of the polycrystalline silicon film at the side to contact with the gate insulating film, i.e,. the surface of the second gate electrode or the channel forming region can be made flatter than the polycrystalline silicon film which has its resistance reduced by doping with the impurity after having been deposited by the CVD method. As a result, the concentration of the electric field to be generated between the second gate electrode of the load MISFET and the channel forming region (or the source region) can be prevented to improve the dielectric strength of the gate insulating film thereby to reduce the thickness of the gate insulating film of the load MISFET. The gate insulating film of the load MISFET thus thinned can improve the electric characteristics such as the ON characteristics.

According to the aforementioned means (49), the leakage current in the channel forming region of the load MISFET can be remarkably reduced to reduce the useless current to be supplied from the power source to the data storage node of the memory cell so that the standby current of the SRAM adopting the battery backup system can be reduced.

According to the aforementioned means (50), the surface of the second gate electrode of the load MISFET at the side of the gate insulating film can be flattened to improve the dielectric strength of the gate insulating film thereby to reduce the thickness of the gate insulating film. As a result, the electric characteristics of the load MISFET can be improved.

According to the aforementioned means (51), the gate insulating film of the load MISFET can be thinned to improve the electric characteristics of the load MISFET.

According to the aforementioned means (52), the film thicknesses at the flat and stepped portions of the first silicon oxide film can be uniformalized to reduce the cavity which might otherwise be formed in the region between the first and second wiring lines of the lower wiring line on the basis of the overhang shape of the first silicon oxide film. As a result, the insulation failures of the inter-layer insulating film such as the extension of the cavity at the time of etching the whole surface of the second silicon oxide film can be reduced to improve the fabrication yield of the semiconductor integrated circuit device. Moreover, the surface of the third silicon oxide film can be flattened by leveling the steep step shape of the surface of the first silicon oxide film with the second silicon oxide film. As a result, the breakage failures of the upper wiring line can be reduced to improve the fabrication yield of the semiconductor integrated circuit device. Since, still moreover, the second silicon oxide film is not left in the connection hole between the lower wiring line and the upper wiring line by the whole surface etching, the upper wiring line can be prevented from being corroded by the moisture contained in the second silicon oxide film, to improve the fabrication yield of the semiconductor integrated circuit device. Furthermore, the second silicon oxide film has its lower layer coated with the first silicon oxide film and its upper layer coated with the second silicon oxide film to reduce the absorption of the moisture of the second silicon oxide film so that the film quality of the second silicon oxide film can be improved. As a result, the second silicon oxide film can be prevented from being cracked, to improve the fabrication yield of the semiconductor integrated circuit device.

According to the aforementioned means (53), the oxide mask having its planar shape formed into the ring shape has its boundary region between the active and inactive regions formed the inside and outside of the ring-shaped frame facing each other. In this boundary region, the occupied area of the active region is reduced on the basis of the bird's beak when the element separating insulating film is to be formed by the selective oxidation method. However, the pattern is closed or has no terminal end in the direction in which the pattern other than the inside and outside of the ring-shaped frame of the oxidation resisting mask is extended, so that the boundary region does not exist. As a result, the decrease in the occupied area of the active region on the basis of the bird's beak can be reduced to reduce the size transformation of the pattern of the active region in the fabrication process of the SRAM to an extent corresponding to that reduction.

According to the aformentioned means (54), the array of the oxidation resisting masks is staggered so that the gap sizes between the adjacent oxidation resisting masks in each of the first and second directions can be equalized and minimized to enhance the array density of the oxidation resisting masks. In other words, the occupied area of the element separating insulating film or the area between the oxidation resisting masks can be reduced to improve the degree of integration of the SRAM.

According to the aforementioned means (55), of the totally four memory cells adjoining in the first and second directions, one semiconductor region of each of the totally eight MISFETs, i.e,. the four transfer MISFETs and the four drive MISFETs can be made integral with the other semiconductor region of another MISFET and can be used together. As a result, the occupied area of the memory cell can be reduced to an extent corresponding to the semiconductor region used together, to improve the degree of integration of the SRAM.

According to the aforementioned means (56), a spare size is left in advance in the oxidation resisting masks arrayed at the trailing end of the memory cell array. In the fabrication process of the SRAM, therefore, the difference in the size transformations of the patterns between the active region at the central portion of the memory cell array and the active regions at the trailing end of the memory cell array can be reduced. In short, in the memory cell array (including the central portion and the trailing ends), the electric characteristics of the memory cell can be uniformalized to improve the electric reliability of the SRAM.

According to the aforementioned means (57), the unit conductance of the drive MISFET of the memory cell can be made higher than that of the transfer MISFET to increase the effective $\beta$ ratio. As a result, the occupied area of the drive MISFET can be reduced to reduce the occupied area of the memory cell thereby to improve the degree of integration of the SRAM. At the same time, the pn junction withstand voltage at the drain region of the MISFET of the electrostatic breakdown preventing circuit can be made higher than that of the LDD structure so that the electrostatic breakdown voltage of the electrostatic breakdown preventing circuit can be raised to prevent the electrostatic breakdown of the SRAM. Moreover, the effective $\beta$ ratio can be increased to improve the stability of the data stored in the data storage node of the memory cell. As a result, the malfunctions of the memory cell can be reduced to improve the operational reliability of the SRAM.

According to the aforementioned means (58), the MISFET of the electrostatic breakdown preventing circuit or the MISFET of the input/output circuit can be formed at the step identical to that of forming the drive MISFET adopting the double drain structure of the memory cell. As a result, the number of steps of fabricating the SRAM can be reduced to an extent corresponding to the step of forming the MISFET of the electrostatic breakdown preventing circuit or the MISFET of the input/output circuit.

According to the aforementioned means (59), the resistances of the gate electrode of the transfer MISFET of the memory cell and the word line can be reduced to speed up the data writing and reading operations of the memory cell so that the operating speed of the SRAM can be accelerated. At the same time, the resistance of the gate electrode of the MISFET of the peripheral circuit can be reduced to accelerate the operating speed of the MISFET thereby to accelerate the operating speed of the SRAM.

According to the aforementioned means (60), in addition to the effects of the aforementioned means (57), the MISFET of the LDD structure of the peripheral circuit can make the intensity of the electric field in the vicinity of the drain region weaker than that of the drive MISFET of the double drain structure to reduce the number of hot carriers generated. As a result, the fluctuations of the aging threshold voltage of the MISFET of the peripheral circuit can be reduced to improve the electric reliability of the SRAM.

According to the aforementioned means (61), the step of forming the transfer MISFET of the memory cell can form the MISFET of the peripheral circuit so that the number of steps of fabricating the SRAM can be reduced to an extent corresponding to the step of forming the MISFET of the peripheral circuit.

According to the aforementioned means (62), the second connection hole is formed not over the first power supply wiring line but either in the semiconductor region different from the first power supply wiring line or over the conductive layer (in which the semiconductor region or the conductive layer is formed as a buffer layer for forming the second connection hole) so that the through failure of the first power supply wiring line due to the over-etching can be prevented for the second connection hole, to improve the fabrication yield of the SRAM.

According to the aforementioned means (63), the semiconductor region can be formed at the step indentical to that of forming the source region and the drain region of the MISFET of the peripheral circuit so that the number of steps of fabricating the SRAM can be reduced to an extent corresponding to the step of forming the semiconductor region.

According to the aforementioned means (64), since the connection with the auxiliary word line of low resistance is made at a frequency of several bits, the access time difference (i.e., the C-R product) can be reduced to eliminate the malfunctions in the common memory cell thereby to improve the electric reliability.

The structure of the present invention will be described in connection with embodiments, in which the present invention is applied to the SRAM constructed of memory cells having the complete CMOS structure.

Incidentally, throughout all the Figures for describing the embodiments, the parts having the identical functions are designated at identical reference numerals, and their repeated descriptions will be omitted.

BRIEF DESCRIPTION OF THE DRAWINGS

FIGS. 23 to 32 are sections showing the memory cell at the individual steps of fabricating the SRAM;

FIG. 41 is to be specifically formed;

DESCRIPTION OF THE PREFERRED EMBODIMENTS

Embodiment 1

Figure 1:
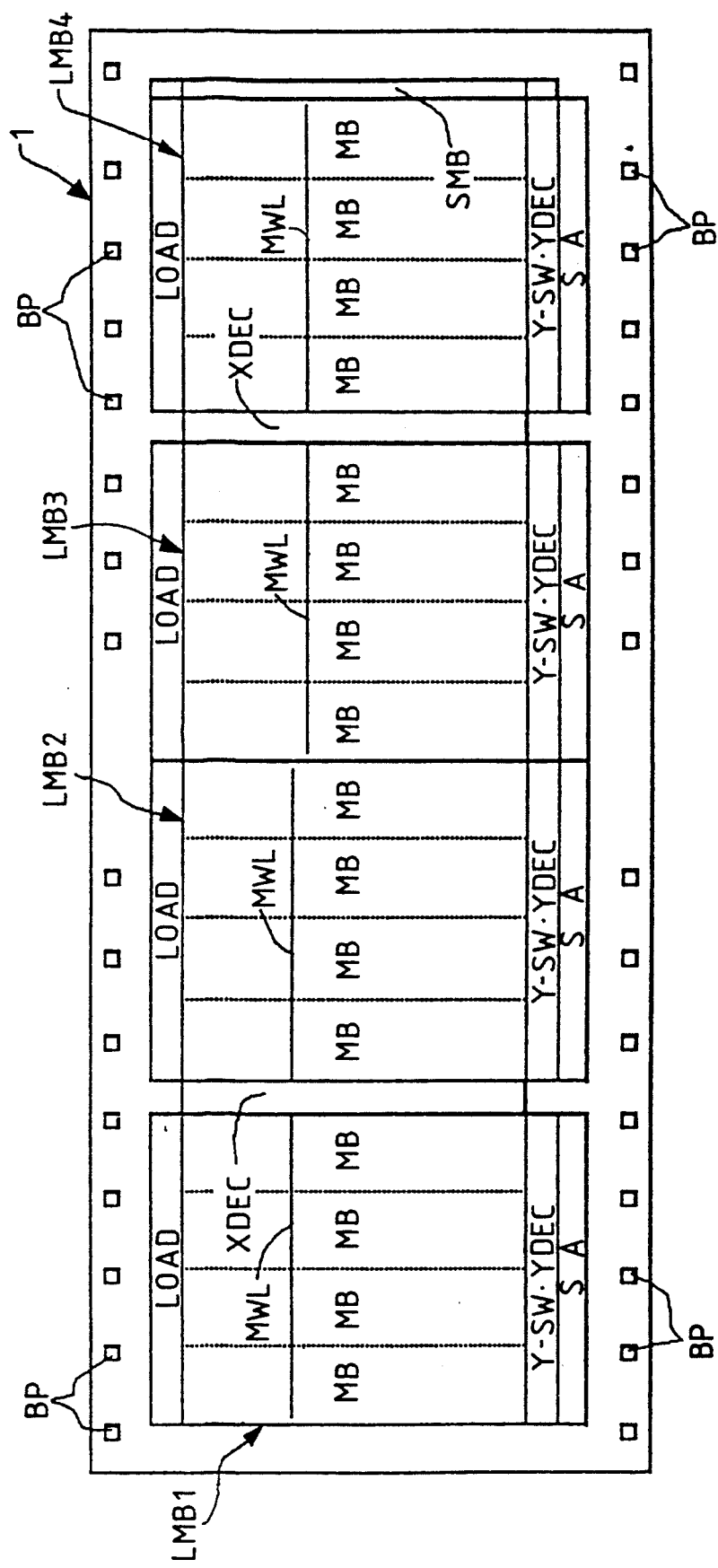
FIG. 1 is a layout showing the chip of a SRAM according to one embodiment of the present invention.

The schematic structure of the whole SRAM according to a first embodiment of the present invention is shown in FIG. 1 (presenting a chip layout).

The SRAM (i.e., semiconductor pellet) 1, as shown in FIG. 1, is constructed to have a large capacity of 4 [Mbits] by adopting the structure of 512 [Kbits]×8 [bits]. This SRAM 1 is sealed, although not shown, by a resin-sealed type semiconductor device adopting the dual in-line system such as the DIP (i.e., Dual InLine Package), the SOJ (i.e., Small Outline J-bend Package) or TSOP (Thin Small Outline Package), in which the leads are opposed to each other. The SRAM 1 is constructed to have a top plan shape of a slim rectangle. For example, the SRAM 1 is formed into a rectangular shape having a longer side of 17 [mm] and a shorter side of 7 [mm].

The rectangular peripheral regions extended along the opposed longer sides of the rectangle of the SRAM 1 are individually arranged with a plurality of external terminals (i.e., bonding pads) BP. These external terminals BP are connected with the aforementioned (inner) leads. The plural external terminals BP are individually fed with an address signal, a chip select signal, an output enable signal, a write enable signal, an input/output data signal and so on. The external terminals BP are further fed with a power supply voltage Vcc and a reference voltage Vss. The power supply voltage Vcc is exemplified by the operating voltage 5 [V] of the circuit, and the reference voltage Vss is exemplified by the ground voltage 0 [V] of the circuit.

The SRAM 1 is arranged at its central portion with four memory blocks LMB1 to LMB4. These four memory blocks LMB1 to LMB4 are individually arrayed along the longer sides of the rectangle of the SRAM 1 (in the column direction from the lefthand shorter side to the righthand shorter side, as shown in FIG. 1). Each of the four memory blocks LMB1 to LMB4 is divided into four memory blocks MB, as shown in FIG. 1. The four memory blocks MB thus divided are arrayed in the column direction in each memory block LMB.

As shown in FIG. 1, each of the four memory blocks LMB1 to LMB4 of the SRAM 1 is arranged with a load circuit LOAD at its upper side. Each of the four memory blocks LMB1 to LMB4 is arranged at its lower side with a Y-decoder circuit YDEC, a Y-switch circuit Y-SW and a sense amplifier circuit SA. An X-decoder circuit XDEC is arranged between those two of the memory blocks LMB1 and LMB2 of the four memory blocks LMB1 to LMB4, which are arranged at the lefthand side of the rectangle of the SRAM 1. Likewise, another X-decoder circuit XDEC is arranged between the two memory blocks LMB3 to LMB4 which are arranged at the righthand side.

A redundancy circuit SMB is arranged at the righthand side of that memory block LMB4 of the four memory blocks LMB1 to LMB4, which is arranged at the rightmost side.

Figure 2:
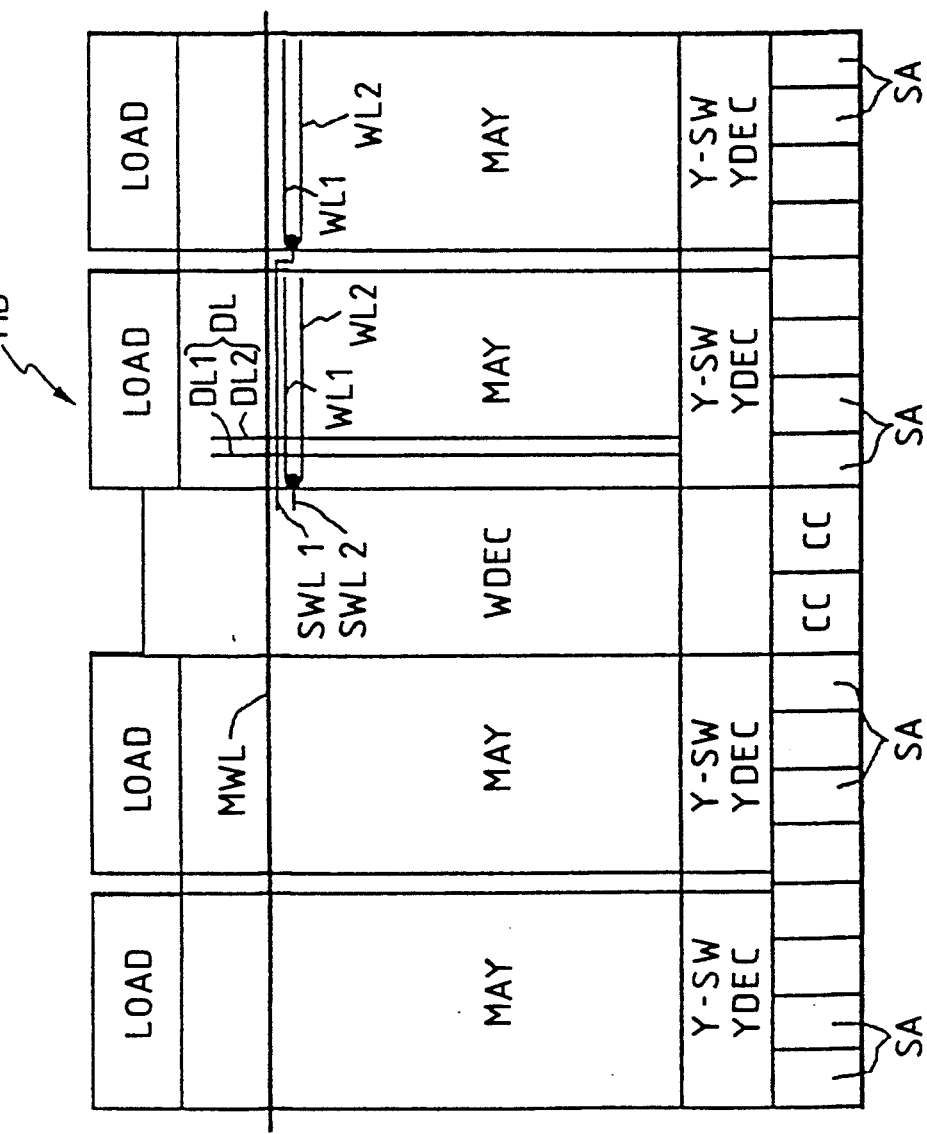

Each of the four memory blocks MB of each memory block LMB is composed of four memory cell arrays MAY, as shown in FIG. 2 (presenting an enlarged block diagram of the essential portion). These four memory cell arrays MAY are individually arrayed in the column direction in the memory block MB. In short, the SRAM 1 has its four memory blocks LMB divided individually into the four memory blocks MB, each of which in turn is composed of the four memory cell arrays MAY. As a result, the SRAM 1 is arranged with the totally sixty four memory cell arrays MAY. These sixty four memory cell arrays MAY are arrayed in the column direction.

Figure 4:
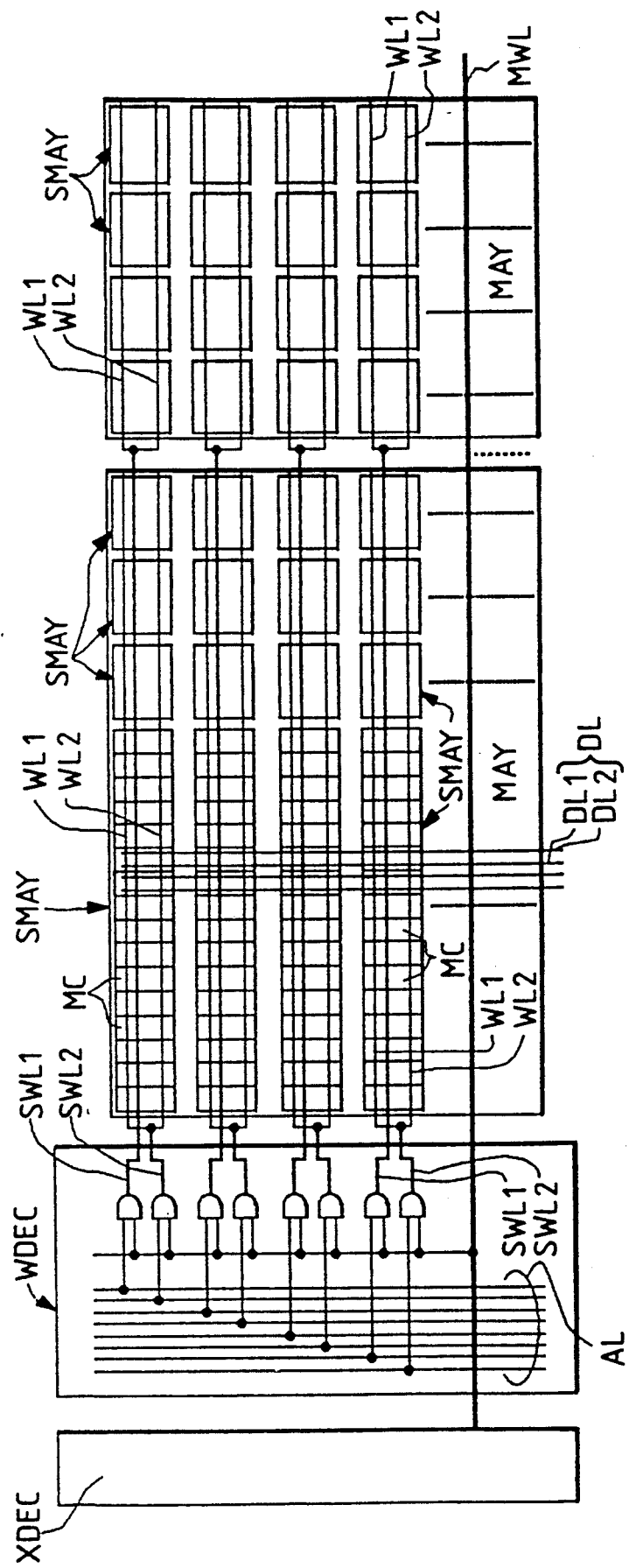

One of the memory cell arrays MAY is further divided into four memory cell arrays SMAY, as shown in FIG. 4 (presenting an enlarged block diagram of the essential portion). The four memory cell arrays SMAY thus divided are individually arrayed in the column direction. Each of the memory cell arrays SMAY is composed of sixteen memory cells MC which are arrayed in the column direction (i.e., in the direction of extending the word lines). In short, each memory cell array MAY is arranged with the four memory cell arrays SMAY, each of which is arrayed with the sixteen memory cells MC in the column direction, so that it is arrayed with the totally sixty four (i.e., 64 [bits]) memory cells MC. On the other hand, each memory cell array MAY is arrayed with 1,028 (i.e., 1,028 [bits]) memory cells in the row direction (i.e., in the direction to extend the complementary data lines). Of the 1,028 memory cells MC arrayed in the row direction, the 1,024 (i.e., 1,024 [bits]) memory cells MC are constructed into the normal memory cells MC whereas the remaining four (i.e., 4 [bits]) are constructed into the redundant memory cells MC.

As shown in FIG. 2, a word decoder circuit WDEC is arranged between the lefthand two memory cell arrays MAY and the righthand two memory cell arrays MAY in the memory block MB. The word decoder circuits WDEC of the totally eight memory blocks MB in the two memory blocks LMB1 and LMB2 arranged at the lefthand side of the SRAM 1 shown in FIG. 1 are selected by the X-decoder circuit XDEC which is arranged between those two memory blocks LMB1 and LMB2. Likewise, the word decoder circuits WDEC of the totally eight memory blocks MB in the two memory blocks LMB3 and LMB4 arranged at the righthand side are selected by the X-decoder circuit XDEC which is arranged between those two memory blocks LMB3 and LMB4. In short, one X-decoder circuit XDEC selects one of the totally eight word decoder circuits WDEC of the eight memory blocks MB.

As shown in FIG. 4, the word decoder circuits WDEC are selected by the X-decoder circuit XDEC through a main word line MWL. The word decoder circuits WDEC are further selected by address signal lines AL which are individually arranged therefor. A plurality of main word lines MWL are so arranged for every four (i.e., 4 [bits]) memory cells MC in the row directions as to extend in the column direction over the memory cell arrays MAY. In short, for each memory block MB, the main word line MWL selects the totally 1,024 memory cells MC: the 512 memory cells MC of the two memory cell arrays MAY arranged at the righthand side of the word decoder circuits WDEC; and the 512 memory cells MC of the two memory cell arrays MAY arranged at the lefthand side. A plurality of address signal lines AL are so arranged in the column direction as to extend in the row direction. The memory block MB is arranged with the totally sixteen address signal lines AL: the eight address signal lines AL for selecting the memory cells MC of the two memory cell arrays MAY arranged at the righthand side of the word decoder circuits WDEC; and the eight address signal lines AL for selecting the memory cells MC of the two memory cell arrays MAY arranged at the lefthand side.

In the memory block MB, as shown in FIGS. 2 and 4, the word decoder circuit WDEC selects a first word line WL1 and a second word line WL2 which are extended over one of the four memory cell arrays MAY. The first word line WL1 and the second word line WL2 are arranged for each memory cell array MAY (or every four memory cell arrays SMAY). The first word line WL1 and the second word line WL2 are extended in the column direction at a gap from each other and substantially in parallel with each other. These first word line WL1 and second word line WL2 are arranged for each of the memory cells MC arrayed in the row direction. In other words, the two first word line WL1 and second word line WL2 adapted to be fed with an identical selection signal are extended in one memory cell MC.

The first word line WL1 and the second word line WL2 extended in that memory cell array MAY of the two memory cell arrays MAY arranged at the righthand side of the word decoder circuit WDEC, which is located at the side of the word decoder circuit WDEC, are selected by the word decoder circuit WDEC through a second sub-word line SWL2. The first word line WL1 and the second word line WL2 extended in the memory cell array MAY apart from the word decoder circuit WDEC are selected by the word decoder circuit WDEC through a first sub-word line SWL1. The first sub-word line SWL1 and the second sub-word line SWL2 are extended in the column direction at a gap from each other and in parallel with each other. The first sub-word line SWL1 and the second sub-word line SWL2 are arranged in each of the memory cells MC which are arrayed in the row direction like the first sub-word line SWL1 and the second sub-word line SWL2. The first sub-word line SWL1 is extended over one memory cell array MAY to connect the first sub-word line SWL1 and the second sub-word line SWL2, which are arranged over another memory cell array MAY, and the word decoder circuit WDEC. The two memory cell arrays MAY arranged at the lefthand side of the word decoder circuit WDEC are individually arranged with the first word line WL1 and the second word line WL2 like those of the righthand side. These first word line WL1 and second word line WL2 are connected with the word decoder circuit WDEC through the first sub-word line SWL1 or the second sub-word line SWL2. Incidentally, since the second sub-word line SWL2 is shorter than the first sub-word line SWL1, the present invention may be modified such that the second sub-word line SWL2 is eliminated to connect the first word line WL1 and the second word line WL2 directly with the word decoder circuit WDEC.

As shown in FIG. 2, each memory block MB is arranged with the divided load circuits LOAD, respectively, above the four memory cell arrays MAY. Below the four memory cell arrays MAY, respectively, there are arranged the divided Y-decoder circuits YDEC and Y-switch circuits Y-SW. Below the four memory cell arrays MAY, respectively, there are arranged the divided sense amplifier circuits SA. Four sense amplifier circuits SA are arranged for each memory cell array MAY so that they can output data of 4 [bits] at one time. Below the word decoder circuit WDEC, there are arranged control circuits CC. In the memory block MB shown in FIG. 2, on the other hand, not-shown connection cells for connecting the memory cell arrays MAY are arranged between the two memory cell arrays MAY which are arranged at the lefthand and righthand sides of the word decoder circuit WDEC.

In the memory block MB, as shown in FIGS. 2 and 4, the memory cell array MAY is arranged with complementary data lines DL. The complementary data lines DL are extended in the row direction to cross the main word lines MWL, the sub-word lines SWL and the word lines WL (substantially orthogonally). The complementary data lines DL are composed of two lines: the first data line DL1 and the second data line DL2 which are extended in the row direction at a gap from each other and in parallel with each other. These complementary data lines DL are arranged, as shown in FIG. 4, for each of the memory cells MC arrayed in the column direction. The complementary data lines DL have their upper one-end terminals connected with the load circuits LOAD. The other lower end terminals of the complementary data lines DL are connected through the Y-switch circuits Y-SW with the sense amplifier circuits SA.

The circuit structure of the sense amplifier circuit SA is disclosed on pp. 1219 to 1225 of IEEE Journal of Solid-State Circuits, vol. 24, No. 5, October 1989, for example. This Publication discloses a three-stage PMOS cross-coupled sense amplifier with a CMOS preamplifier. The content of this Publication is inserted here as the reference.

Figure 3:
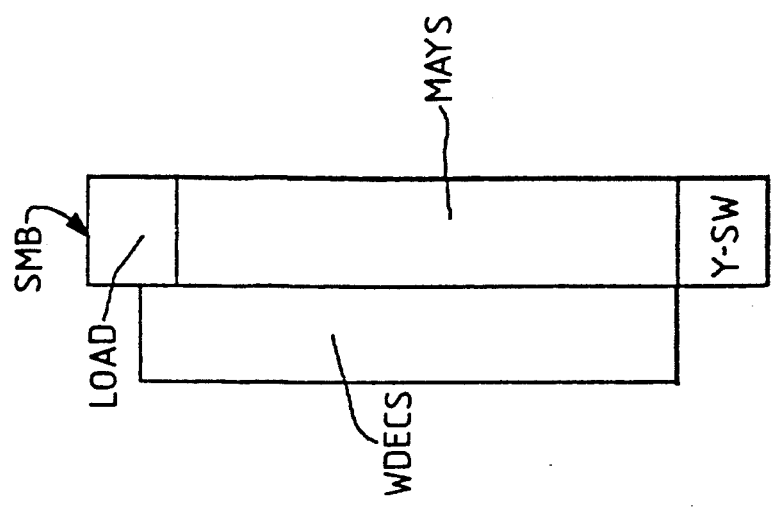
FIGS. 2 to 4 are enlarged block diagram showing the essential portions of the aforementioned SRAM.

The redundant circuit SMB arranged at the righthand side of the memory block LMB of the SRAM 1 shown in FIG. 1 is arranged with redundant memory cell arrays MAYS, as shown in FIG. 3 (presenting an enlarged block diagram of the essential portion). This redundant memory cell array MAYS is arranged with a plurality of memory cells MC which have a structure identical to that of the memory cells MC arranged in the aforementioned memory cell array MAY. Although not limitative, the redundant memory cell array MAYS is arrayed with thirty two (i.e., 32 [bits]) memory cells MC in the column direction and 1,028 (i.e., 1,028 [bits]) memory cells MC in the row direction.

Above the redundant memory cell array MAYS, there is arranged a redundant load circuit LOAD, as shown in FIG. 3. A redundant word decoder circuit WDECS is arranged at the lefthand side of the redundant memory cell array MAYS. A redundant Y-switch circuit Y-SW is arranged below the redundant memory cell array MAYS.

Figure 5:
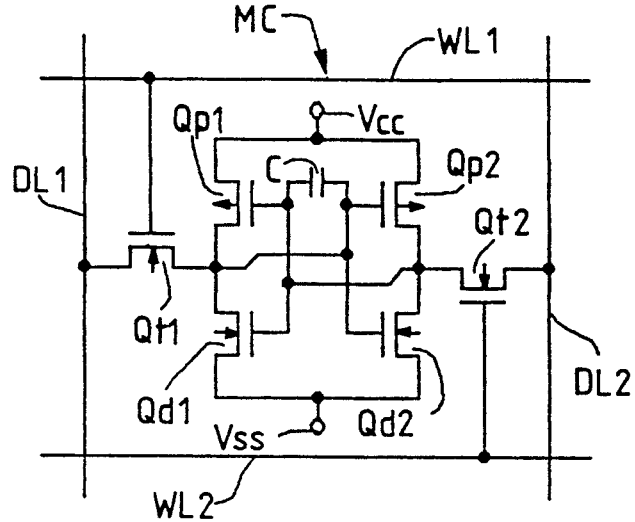
FIG. 5 is a circuit diagram showing memory cell of the SRAM.

The memory cells MC arranged in the memory cell array MAY are arranged, as shown in FIG. 5, at the intersections between the word lines WL and the complementary data lines DL. In short, the memory cells MC are arranged at the intersections between the first and second word lines WL1 and WL2 and the first and second data lines DL1 and DL2. Each of the memory cell MC is composed of a flip-flop circuit and two transfer MISFET Qt1 and Qt2. The flip-flop circuit is constructed as a data storage unit, and the memory cell MC stores the data of "1" or "0" of 1 [bit].

Each of the two transfer MISFET Qt1 and Qt2 of the memory cell MC has its one semiconductor region connected with each of the paired input/output terminals of the flip-flop circuit. The transfer MISFET Qt1 has its other semiconductor region connected with the data line DL1 and its gate electrode connected with the first word line WL1. The transfer MISFET Qt2 has its other semiconductor region connected with the data line DL2 and its gate electrode connected with the second word line WL2. Each of the two transfer MISFETs Qt1 and Qt2 is constructed of the n-channel type.

The aforementioned flip-flop circuit is composed of two drive MISFETs Qd1 and Qd2 and two load MISFETs Qp1 and Qp2. Each of the drive MISFETs Qd1 and Qd2 is composed of the n-channel type. Each of the load MISFETs Qp1 and Qp2 is composed of the p-channel type. In short, the memory cells MC of the SRAM 1 of the present embodiment are constructed to have a complete CMOS structure.

The drive MISFET Qd1 and the load MISFET Qp1 have their drain regions connected with each other and their gate electrodes connected with each other to construct the CMOS. Likewise, The drive MISFET Qd2 and the load MISFET Qp2 have their drain regions connected with each other and their gate electrodes connected with each other to construct the CMOS. The individual drain regions (or input/output terminals) of the drive MISFET Qd1 and the load MISFET Qp1 are connected with one semiconductor region of the transfer MISFET Qt1 and the individual gate electrodes of the drive MISFET Qd2 and the load MISFET Qp2. The individual drain regions (or input/output terminals) of the drive MISFET Qd2 and the load MISFET Qp2 are connected with one semiconductor region of the transfer MISFET Qt2 and the individual gate electrodes of the drive MISFET Qd1 and the load MISFET Qp1. The individual source regions of the drive MISFETs Qd1 and Qd2 are connected with the reference voltage Vss (e.g., 0 [V]). The individual source regions of the load MISFETs Qp1 and Qp2 are connected with the power supply voltage Vcc (e.g., 5 [V]).

A capacity element C is connected between the paired input/output terminals, i.e., the two data storage node regions of the flip-flop circuit of the memory cell MC. This capacity element C has its one electrode connected with one data storage node region and its other electrode connected with the other data storage node region. The capacity element C is basically constructed to increase the charge storage of the data storage node regions and enhance the α-ray soft error withstand voltage. Moreover, the capacity element C has its electrodes connected between the two data storage node regions so that it can be constructed to have an about half top plan area as large as that of the case in which two capacity elements are independently constructed in the two data storage node regions. In short, this capacity element C can reduce the occupied area of the memory cell MC to improve the degree of integration of the SRAM 1.

As shown in FIGS. 1, 2 and 4, the SRAM 1 thus constructed selects one of the word decoder circuits WDEC, which are arranged in the plural memory blocks MB of the memory block LMB, by the X-decoder circuit XDEC through the main word line MWL, and selects the first word line WL1 and second word line WL2 of the memory cell array MAY by the selected word decoder WDEC. In short, the SRAM 1 adopts the divided word line system, in which the first word line WL1 and the second word line WL2 are divided in plurality in their extending direction so that one set of the first word line WL1 and second word line WL2 thus divided is selected by the word decoder circuit WDEC and the X-decoder circuit XDEC.

As shown in FIGS. 2 and 4, moreover, the SRAM 1 connects the first word line WL1 and second word line WL2, which are extended in one of the two memory cell arrays MAY arranged at one end side of the word decoder circuit WDEC, with the word decoder circuit WDEC through the second sub-word line SWL2, and connects the first word line WL1 and second word line WL2, which are extended in the other memory cell arrays MAY, with the word decoder circuit WDEC through the first sub-word line SWL1. In short, the SRAM 1 adopts the double word line system, in which the memory cell array MAY is arranged with the sub-word lines SWL for connecting the individually divided word lines WL and the divided word lines WL.

(A-9): In the SRAM 1 thus constructed, the memory cells MC arrayed in the memory cell array MAY are selected through the word lines WL by the X-decoder circuit XDEC. This SRAM 1 is constructed of: the X-decoder circuit XDEC: the word decoder circuit WDEC connected with and selected by the X-decoder circuit XDEC through the main word line MWL and arranged in the extending direction of the main word line MWL; the first memory cell array MAY arrayed with the memory cells MC to be connected with and selected by the word decoder circuit WDEC through either the first word lines WL (i.e., WL1 and WL2) or sequentially the second sub-word line SWL2 and the first word lines WL; and the second memory cell array MAY arrayed with the memory cells MC to be connected with and selected by the word decoder circuit WDEC through either the first word lines WL or sequentially the first sub-word line SWL1 and the second word lines WL (i.e., WL1 and WL2) extending over the first memory cell array MAY in the direction identical to that of the second sub-word line SWL2. This structure adopts the divided word line system, in which only the first word line WL of the first memory cell array MAY or the second word line WL of the second memory cell array MAY connected with the word decoder circuit WDEC is selected (or started). As a result, the word line WL thus selected can have its charge and discharge current flows reduced to drop the power consumption of the SRAM 1. There is also adopted the double word line system, in which the first word line WL of the first memory cell array MAY and the second word line WL of the second memory cell array MAY selected by the word decoder circuit WDEC are individually divided for each memory cell array MAY and in which the first word line WL and the second word line WL are individually shortened and connected through the sub-word lines SWL with the word decoder circuit WDEC. As a result, there can be attained another effect that the resistance between the word decoder circuit WDEC and the word line WL can be reduced to an extent corresponding to the sub-word line SWL to speed up the charge and discharge of the selected word line WL and to accelerate the operating speed of the SRAM 1.

The X-decoder circuit XDEC, the Y-decoder circuit YDEC, the Y-switch circuit Y-SW, the sense amplifier SA, the load circuit LOAD and so on thus arranged in the peripheral region of the memory cell array MAY of the SRAM 1 constitute altogether the peripheral circuits. These peripheral circuits control the data writing, holding and reading operations of the memory cells MC.

An electrostatic breakdown preventing circuit is arranged between the external terminal BP of the SRAM 1 and each of the input stage circuit and output stage circuit of one of the aforementioned peripheral circuits. The SRAM 1 has its input stage side constructed, as shown in FIG. 6 (presenting an equivalent circuit) and its output stage side constructed, as shown in FIG. 7 (presenting an equivalent circuit).

Figure 6:
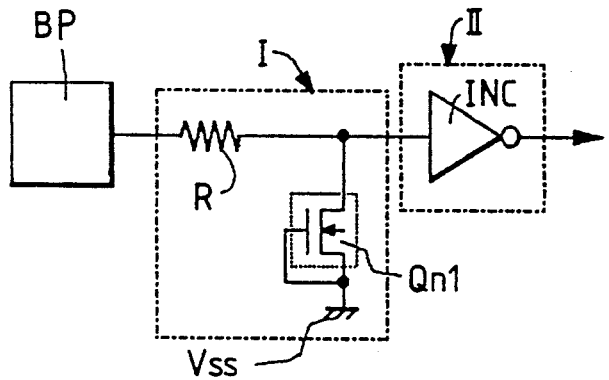
FIGS. 6 and 7 are equivalent circuit diagrams showing the input/output of the SRAM.

At the input stage side of the SRAM 1, as shown in FIG. 6, an electrostatic breakdown preventing circuit I is arranged between the external terminal (i.e., the inputting external terminal) BP and an input stage circuit II. This input stage circuit II is constructed of a CMOS (Complementary Metal Oxide Semiconductor) inverter circuit INC which is composed of an n-channel MISFET and a p-channel MISFET. The electrostatic breakdown preventing circuit II is composed of a protective resistance element R and a clamping MISFET Qn1. The protective resistance element R is inserted in series between the external terminal BP and the input stage circuit II. The clamping MISFET Qn1 is formed of an n-channel MISFET. This clamping MISFET Qn1 is arranged to have its drain region connected between the protective resistance element R and the input stage circuit II and its gate electrode and source region connected with the reference voltage Vss. The electrostatic breakdown preventing circuit I is enabled to round an excessive current inputted to the external terminal BP and to absorb the same to the reference voltage Vss thereby to prevent the electrostatic breakdown of the input stage circuit II.

Figure 7:
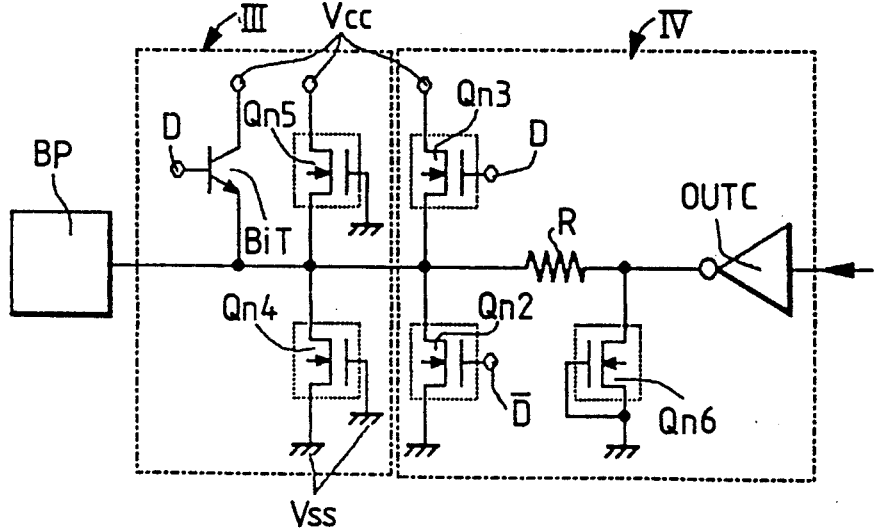

At the output stage side of the SRAM 1, as shown in FIG. 7, an electrostatic breakdown preventing circuit III is arranged between the external terminal (i.e., an outputting external terminal) BP and an output stage circuit IV. This output stage circuit IV is composed of an outputting n-channel MISFETs Qn2 and Qn3, a resistance element R, an n-channel MISFET Qn6 and a CMOS inverter circuit OUTC. The drain region of the outputting n-channel MISFET Qn2 and the source region of the n-channel MISFET Qn3 of the output stage circuit IV are individually connected with the external terminal BP. The outputting n-channel MISFET Qn2 has its gate electrode fed with an input/output data signal D and its source region fed with the reference voltage Vss. The outputting n-channel MISFET Qn3 has its gate electrode fed with an input/output data signal D and its drain region fed with the power supply voltage Vcc. The outputting n-channel MISFETs Qn2 and Qn3 have their respective drain region and source region connected with the CMOS inverter circuit OUTC through the resistance element R connected in series and the n-channel MISFET Qn6 connected in parallel. This n-channel MISFET Qn6 has its drain region connected with the drain region of the outputting n-channel MISFET Qn2 and the source region of the outputting n-channel MISFET Qn3 and its gate electrode and source region connected with the reference voltage Vss. The electrostatic breakdown preventing circuit III is composed of clamping MISFETs Qn4 and Qn5 and a bipolar transistor Bit. The clamping MISFETs Qn4 nd Qn5 of the electrostatic breakdown preventing circuit III are individually constructed of the n-channel type. The clamping MISFETs Qn4 and Qn5 have their respective drain region and source region arranged and connected between the external terminal BP and the respective drain region and source region of the outputting MISFETs Qn2 and Qn3 of the output stage circuit IV. The clamping MISFET Qn4 has its gate electrode and source region individually connected with the reference voltage Vss. The clamping MISFET Qn5 has its gate electrode connected with the reference voltage Vss and its drain region connected with the power supply voltage Vcc. The bipolar transistor BiT is constructed of the npn type. The bipolar transistor MiT has its emitter region arranged and connected the external terminal BP and the respective drain region and source region of the clamping MISFETs Qn4 and Qn5. The base region is fed with the input/output signal D. The emitter region is connected with the power supply voltage Vcc. The electrostatic breakdown preventing circuit III thus constructed is enabled to absorb the excessive current inputted to the external terminal BP to the reference voltage Vss or the power source voltage Vcc thereby to prevent the electrostatic breakage of the output stage circuit IV.

Figure 8:
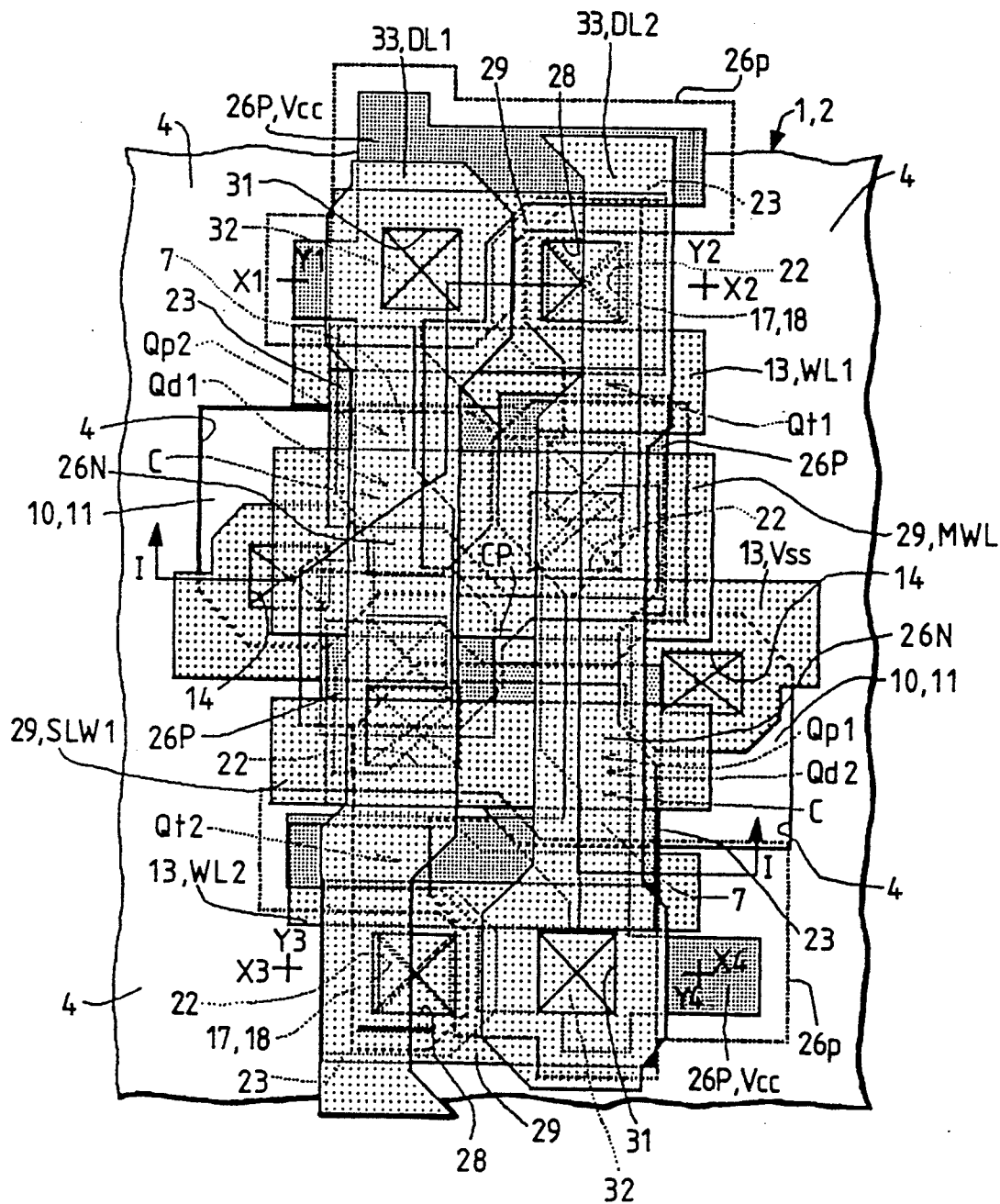
FIG. 8 is a top plan view of the memory cell of the SRAM.
Figure 9:
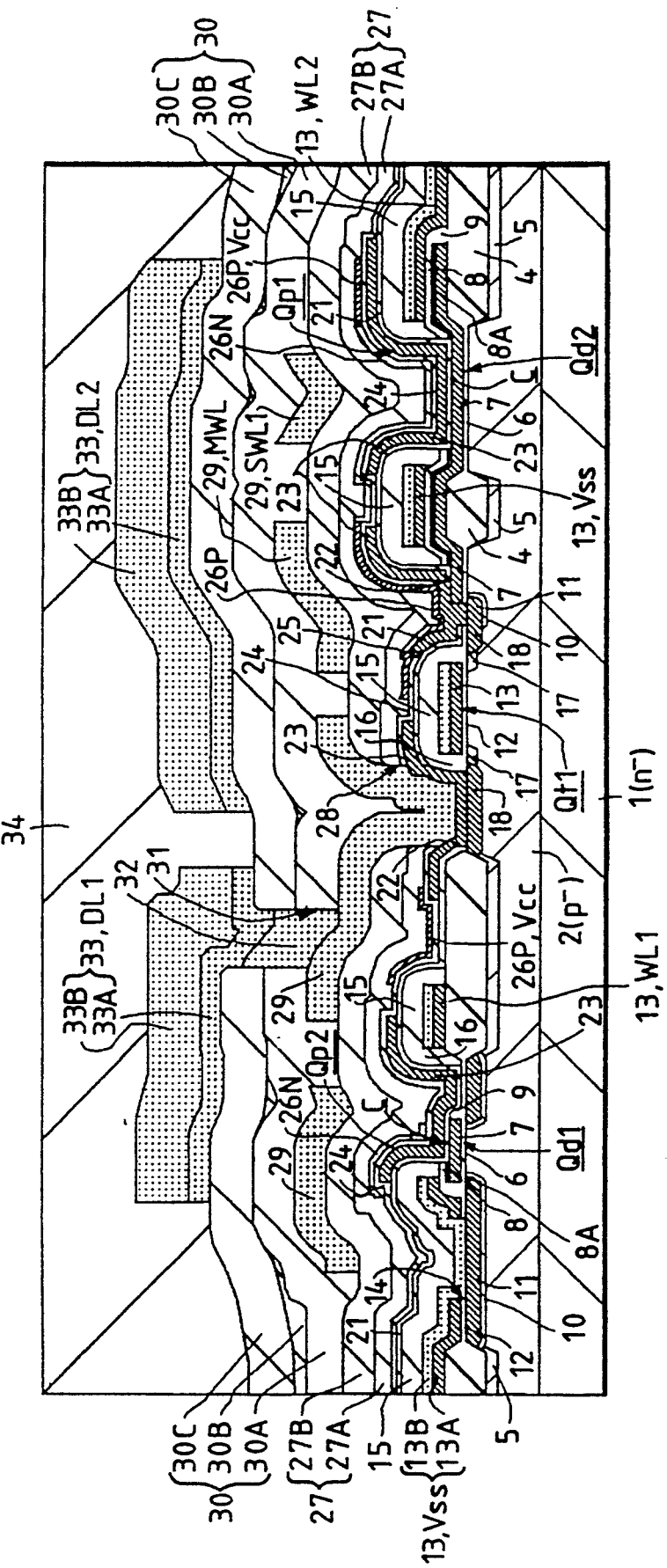
FIG. 9 is a section showing the memory cell of the SRAM.

Next, the specific structures of the memory cells MC and the memory cell array MAY of the SRAM 1 will be described in the following. The plane structure of the memory cell MC in the completed state is shown in FIG. 8 (presenting a top plan view), and the plane structures at the individual steps of the fabrication process are shown in FIGS. 10 to 14 (presenting top plan views). The sectional structure of the memory cell MC in the completed stage is shown in FIG. 9 (presenting a section taken along line I—I of FIG. 8). In the memory cell array MAY, moreover, the plane structure of the layers to be formed at the individual steps of the fabrication process are shown in FIGS. 15 to 20 (presenting top plan views).

Figure 21:
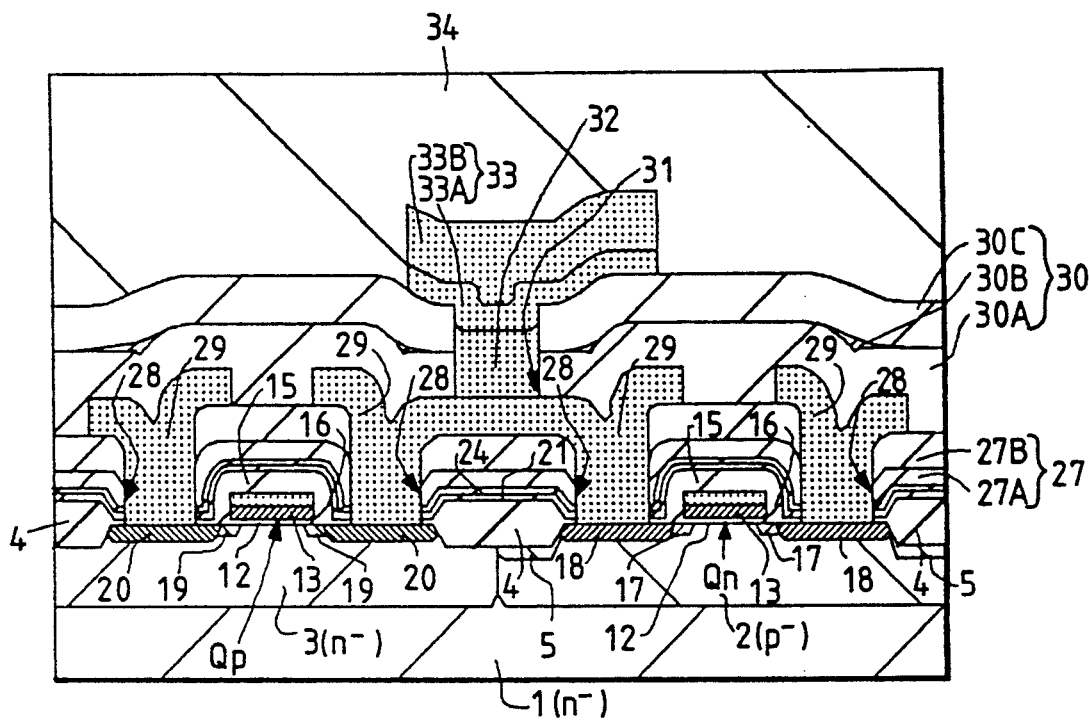
FIGS. 21 and 22 are sections showing the peripheral circuit of the SRAM.

As shown in FIGS. 8 and 9, the SRAM 1 is constructed of an $n^-$-type semiconductor substrate 1 of single crystal silicon. This $n^-$-type semiconductor substrate 1 has its partial region formed over its principal surface with a $p^-$-type well region 2. The $n^-$-type semiconductor substrate 1 has its other region formed over its principal surface with an $n^-$-type well region 3 (as shown in FIG. 21). The $p^-$-type well region 2 is formed in the region forming the n-channel MISFET Qn, i.e., the region forming the memory cell array MAY and a partial region of the peripheral circuits. The $n^-$-type well region 3 is formed in the region forming the p-channel MISFET Qp, i.e., the other region of the peripheral circuits.

The inactive region of the $p^-$-type well region 2 is formed over its principal surface with an element separating insulating film (or a field oxide film) 4. On the other hand, the inactive region of the $p^-$-type well region 2 is formed over its principal surface, i.e., below the element separating insulating film 4 with a p-type channel stopper region 5. Likewise, the inactive region of the $n^-$-type well region 3 is formed over its principal surface with the element separating insulating film 4 (as shown in FIG. 21). Since the inactive region of the $n^-$-type well region 3 is more reluctantly formed with a reverse region than that of the $p^-$-type well region 2, no channel stopper region is basically formed so as to simplify the fabrication process.

One memory cell MC of the SRAM 1 is formed over the principal surface of the active region of the $p^-$-type well region 2. In the memory cell MC, the two drive MISFETs Qd1 and Qd2 are individually formed over the principal surface of the $p^-$-type well region 2 in the region defined by the element separating insulating film 4, as shown in FIGS. 8, 9, 10 and 16. Each of the drive MISFETs Qd1 and Qd2 is formed mainly of the $p^-$-type well region 2, a gate insulating film 6 and a gate electrode 7, a source region and a drain region.

The drive MISFETs Qd1 and Qd2 are individually arranged to have their gate length (Lg) direction aligned with the column direction (i.e., the extending direction of the word lines WL or the X direction). The element separating insulating film 4 (and the p-channel stopper region 5) is positioned to mainly define the individual gate width (Lw) direction of the drive MISFETs Qd1 and Qd2.

The $p^-$-type well region 2 forms the individual channel forming regions of the drive MISFETs Qd1 and Qd2.

The gate electrode 7 is formed in the active region over the channel forming region of the $p^-$-type well region 2 through the gate insulating film 6. The gate electrode 7 has its one end projected in the row direction over the element separating insulating film 4 by an extend corresponding to at least the masking allowance in the fabrication process. The other end of the gate electrode of the drive MISFET Qd1 is projected in the row direction through the element separating insulating film 4 to over the drain region of the drive MISFET Qd2. Likewise, the other end of the gate electrode of the drive MISFET Qd2 is projectd in the row direction through the element separating insulating film 4 to over the drain region of the drive MISFET Qd1.

The gate electrode 7 is formed of a polycrystalline silicon film of a single-layered structure, for example, at the step of forming the first-layered gate material. This polycrystalline silicon film is doped with an n-type impurity such as phosphor (P) (or arsenic (As)) for reducing the resistance. The gate electrode 7 thus formed of the single-layered structure can be thinned to flatten the surface of the inner-layer insulating film underlying the upper conductive layer.

The source region and the drain region are respectively formed of a lightly doped n-type semiconductor region 10 and a heavily doped $n^+$-type semiconductor region 11 formed over the principal surface of the former. These two kinds of n-type semiconductor region 10 and $n^+$-type semiconductor region 11 having different concentrations are formed at the side of the gate length direction of the gate electrode 7 and in self-alignment with the gate electrode 7 (i.e., the gate electrode 7 and a later-described side wall spacer 9). In short, the drive MISFETs Qd1 and Qd2 have their individual source region and drain region constructed to have the so-called double diffused drain (i.e., DDD: Double Diffused Drain) structure. The individual source and drain regions of this double diffused drain structure are formed in the principal surface of the active region of the $p^-$-type well region 2 in the region enclosed by single-dotted lines, as indicated at letters DDD in FIG. 10.

The source region and the drain region have their n-type semiconductor regions 10 individually formed of an n-type impurity such as phosphor (P). The $n^+$-type semiconductor region 11 is formed of an n-type impurity such as arsenic (As) having a lower diffusion rate than that of phosphor (P). In case, in the fabrication process, two kinds of n-type impurities are introduced at an identical step using an identical mask, the individual diffusion distances of the $n^+$-type semiconductor region 11 and the n-type semiconductor region 10 are determined by the individual diffusion rates of the n-type impurities of the two kinds. In each of the drive MISFETs Qd1 and Qd2 adopting the double diffused drain structure, the substantial size of the n-type semiconductor region 10 in the gate length direction between the n+-type semiconductor region 11 and the channel forming region corresponds to the size which is calculated by subtracting the diffusion distance of the n+-type semiconductor region 11 from the diffusion distance of the n-type semiconductor region 10. This n-type semiconductor region 10 has a smaller size in the gate length and a higher impurity concentration than those of a lightly doped n-type semiconductor region (17) having the later-described LDD (i.e., Lightly Doped Drain) structure. In short, the individual drive MISFETs Qd1 and Qd2 have lower parasitic resistances to be added to the n-type semiconductor regions 10 in the current passage between the source and drain region than those of the n-type semiconductor region. (17) having the LDD structure so that they can have higher drivabilities than those of the transfer MISFETs Qt1 and Qt2 having the later-described LDD structure.

The gate electrode 7 has its gate length side wall formed with the side wall spacer 9. This side wall spacer 9 is formed of an insulating film of silicon oxide, for example, in self-alignment with the gate electrode 7. The side wall spacer 9 flattens the grounds of a later-described upper conductive layer 13 and the load MISFET Qp to smooth the (surfacing) step.

On the region arranged with the upper conductive layer (13) over the gate electrode 7, there are sequentially laminated insulating films 8A and 8. The upper insulating film 8 is formed of a silicon oxide film, for example, to isolate the lower gate electrode 7 and the upper conductive layer (13) electrically. The lower insulating film 8A is formed of a silicon nitride film, for example, as an oxidation resisting mask for prevent the oxidation of the surface of the gate electrode 7.

Figure 10:
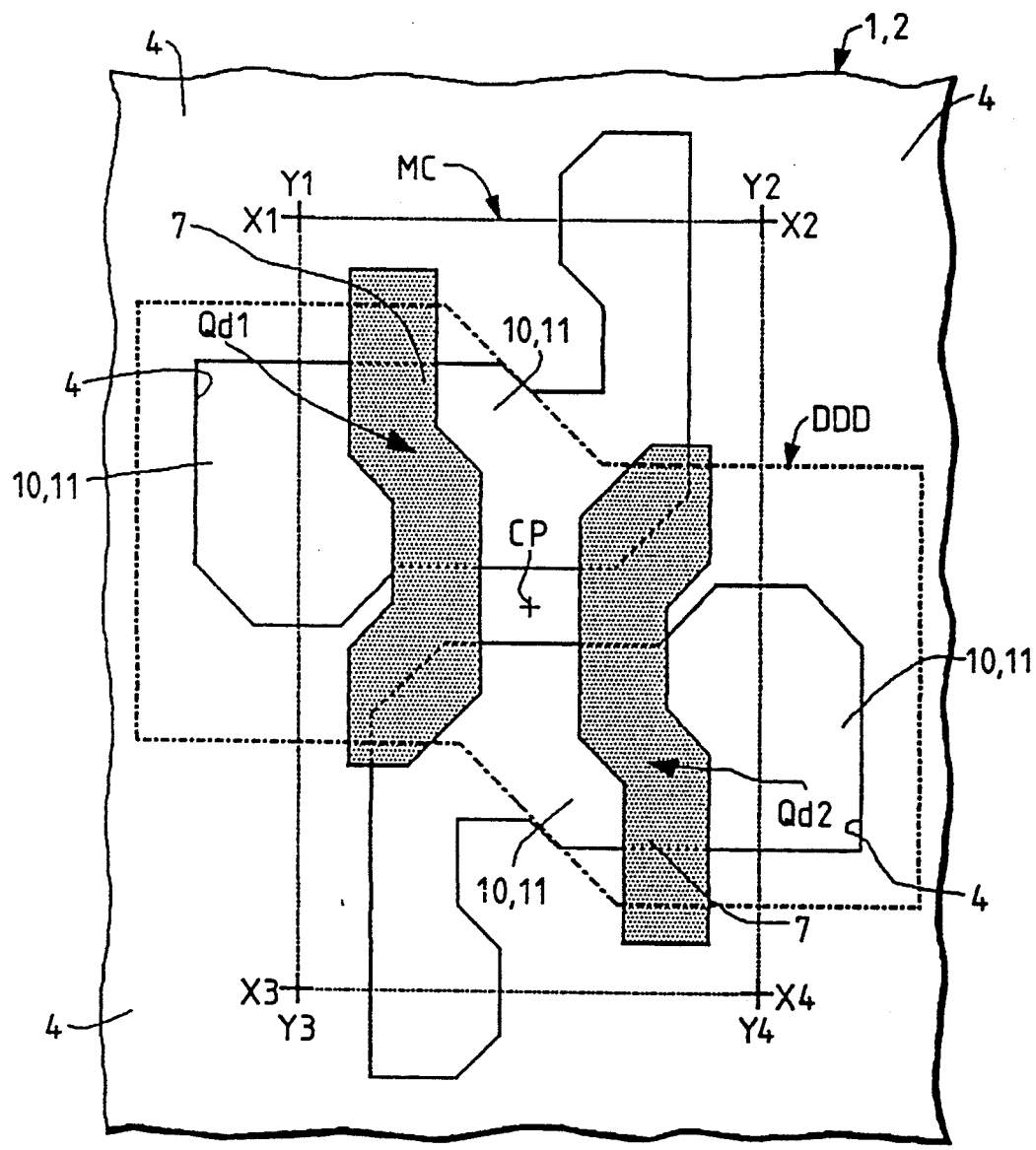
FIGS. 10 to 14 are top plan views showing the memory cell at the individual steps of fabricating the SRAM.

The memory cell MC is arranged within a region which has its top plan shape defined by a rectangle enclosed by double-dotted lines, as indicated at MC in FIG. 10. The top plan shape of one drive MISFET Qd1 of the memory cell MC is formed symmetrically of the drive MISFET Qd2 with respect to the central point CP (or the intersection of the diagonals of the rectangle) of the memory cell MC. Here, the central point CP is presented only for conveniences of explanation and is not actually formed in the memory cell MC of the SRAM 1.

Figure 16:
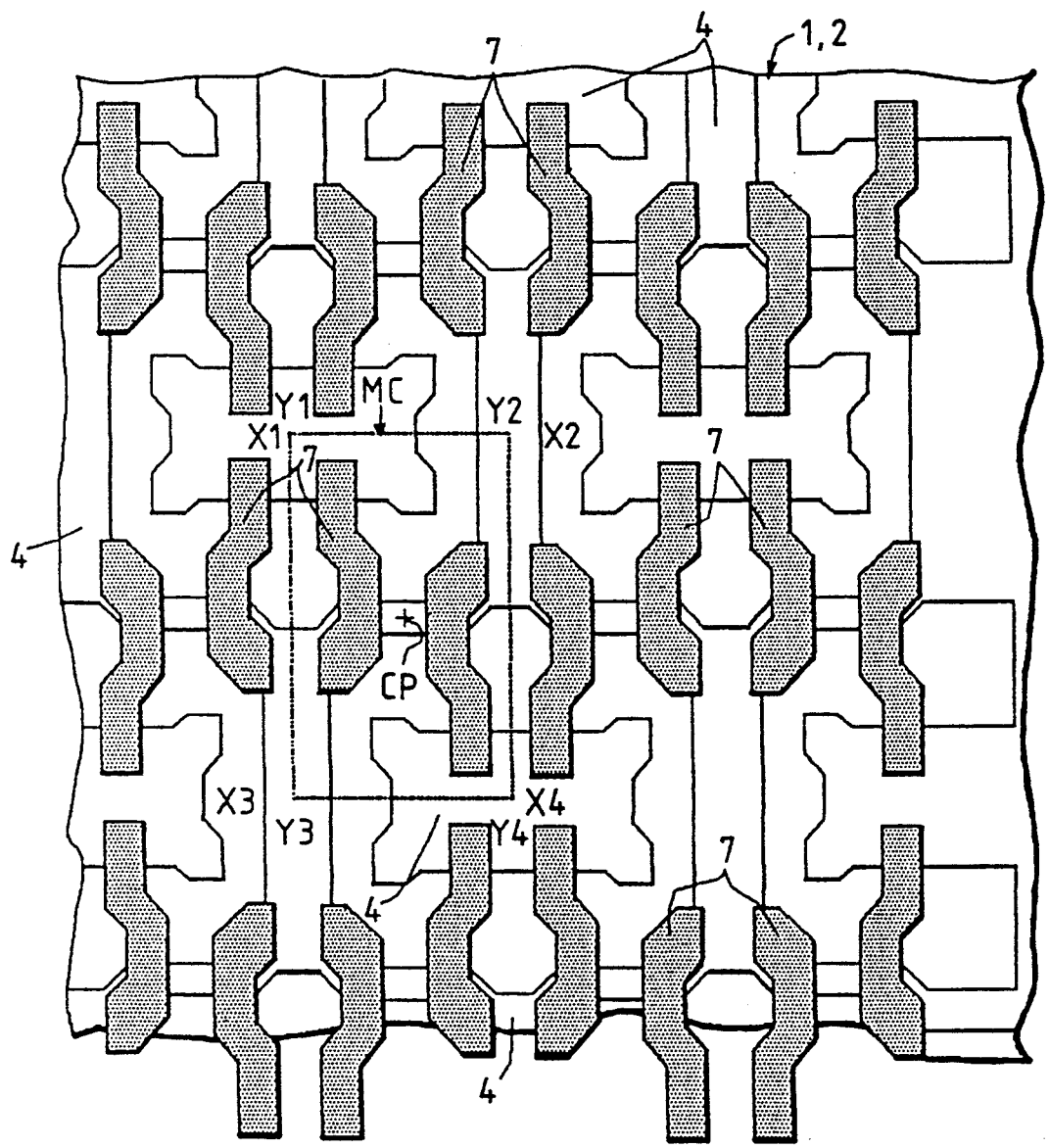

In the array of the memory cells MC in the memory cell array MAY, as shown in FIG. 16, the top plan shape of each of the drive MISFETs Qd1 and Qd2 of each memory cell MC is formed symmetrically of that of each of the drive MISFETs Qd1 and Qd2 of another memory cell MC adjacent to the former in the column direction, with respect to an axis Y1–Y3 or Y2–Y4 taken between the two memory cells MC. Likewise, the top plan shape of each of the drive MISFETs Qd1 and Qd2 of each memory cell MC is formed symmetrically of that of each of the drive MISFETs Qd1 and Qd2 of another memory cell MC adjacent to the former in the row direction, with respect to an axis X1–X2 or X3–X4 taken between the two memory cells MC. In short, the drive MISFET Qd of the memory cell MC is formed symmetrically in both the column and row directions.

Of the drive MISFETs Qd of the memory cells MC arrayed in the column direction, the drive MISFETs Qd of the adjacent memory cells MC have their individual facing source regions made integral. In other words, the source region of the drive MISFET Qd of one of the adjacent memory cells MC forms the source region of the drive MISFET Qd of the other memory cell MC to reduce the occupied area of the source regions of the drive MISFETs Qd. Moreover, the element separating insulating film 4 is not interposed between the source region of the drive MISFET Qd of one memory cell MC and the source region of the drive MISFET Qd of the other memory cell MC facing the former, so that the occupied area of the memory cells MC can be reduced to an extent corresponding to that element separating insulating film 4.

The two transfer MISFETs Qt1 and Qt2 of the memory cell MC are formed, as shown in FIGS. 8, 9, 11 and 17, over the principal surface of the p−-type well region 2 in the region which is defined by the element separating insulating film 4. Each of the transfer MISFETs Qt1 and Qt2 is composed mainly of the p−-type well region 2, a gate insulating film 12, a gate electrode 13, a source region and a drain region.

The transfer MISFETs Qt1 and Qt2 are individually arranged to have their gate length direction aligned to the row direction (i.e., the extending direction of the complementary data lines DL or the Y direction). In other words, the gate length direction of the transfer MISFETs Qt1 and Qt2 intersects the gate length direction of the drive MISFETs Qd1 and Qd2 generally orthogonally. The element separating insulating film 4 (and the p-type channel stopper region 5) is positioned mainly to define the individual gate width (Lw) of the transfer MISFETs Qt1 and Qt2.

The p−-type well region 2 forms the individual channel forming regions of the transfer MISFETs Qt1 and Qt2.

The gate electrode 13 is formed in the active region over the channel forming region of the p−-type well region 2 through the gate insulating film 12. The gate electrode 13 is formed at the step of forming the second-layered gate material and is constructed to have a laminar structure (or poly-cilicide structure) composed of a polycrystalline silicon film 13A and an overlying film 13B of a metal silicide having a high melting point. The lower polycrystalline silicon film 13A is doped with an n-type impurity such as phosphor (P) (or arsenic (As)) for reducing the resistance. The upper metal silicide film 13B of high melting point is formed of a tungsten silicide (WSix: x=2, for example). Since the specific resistance of the upper refractory metal silicide film 13B is lower than that of the lower polycrystalline silicon film 13A, the gate electrode 13 can accelerate the signal transmission rate. On the other hand, the gate electrode 13 is constructed of the laminated structure of the polycrystalline silicon film 13A and the refractory metal silicide film 13B and can have its total sectional area increased to reduce the resistance so that it can accelerate the signal transmission rate. Incidentally, the upper refractory metal silicide film 13B of the gate electrode 13 may be made of not only WSix bus also molybdenum silicide MoSix, titanium silicide TiSix or tantalum silicide TaSix.

The gate electrode 13 has its gate width made smaller than that of the gate electrode 7 of the drive MISFET Qd. In other words, the transfer MISFET Qt can have its drivability made lower than that of the drive MISFET Qd to increase the β ratio so that the memory cell MC can stably hold the data in the data storage node region.

The source region and the drain region are individually formed of a heavily doped n+-type semiconductor region 18 and a lightly doped n-type semiconductor region 17 interposed between the former region 18 and the channel forming region. Of these two kinds of regions having the different impurity concentrations, the n-type semiconductor region 17 is formed at the side of the gate electrode 13 in the gate length direction and in self-alignment with the gate electrode 13. The n-type semiconductor region 17 is made of an n-type impurity such as P for making the impurity concentration gradient gentle at the pn junction to the channel forming region. The n+-type semiconductor regions 18 is formed at the side of the gate electrode 13 in the gate length direction and in self-alignment with a side wall spacer 16. The n+-type semiconductor region 18 is formed of an n-type impurity such as As for reducing the depth of the junction (i.e., the junction depth: xj) to the p⁻-type well region 2. In short, the transfer MISFETs Qt1 and Qt2 are individually constructed to have the LDD structure. The transfer MISFETs Qt1 and Qt2 adopting the LDD structure can weaken the intensity of the electric field individually in the vicinity of the drain region so that they can reduce the number of hot carriers to be generated thereby to reduce the aging fluctuations of the threshold voltage.

The side wall spacer 16 is formed at the side wall of and in self-alignment with the gate electrode 13. This side wall spacer 16 is formed of an insulating film such as a silicon oxide film. The side wall spacer 16 flattens the ground of the later-described load MISFET Qp to reduce the step.

The gate electrode 13 is overlain by an insulating film 15. This insulating film 15 is formed of a silicon oxide film, for example, mainly to separate the lower gate electrode 13 and an upper conductive layer (23) electrically. The insulating film 15 is made thicker than the insulating film 8 formed over the gate electrode 7.

Figure 11:
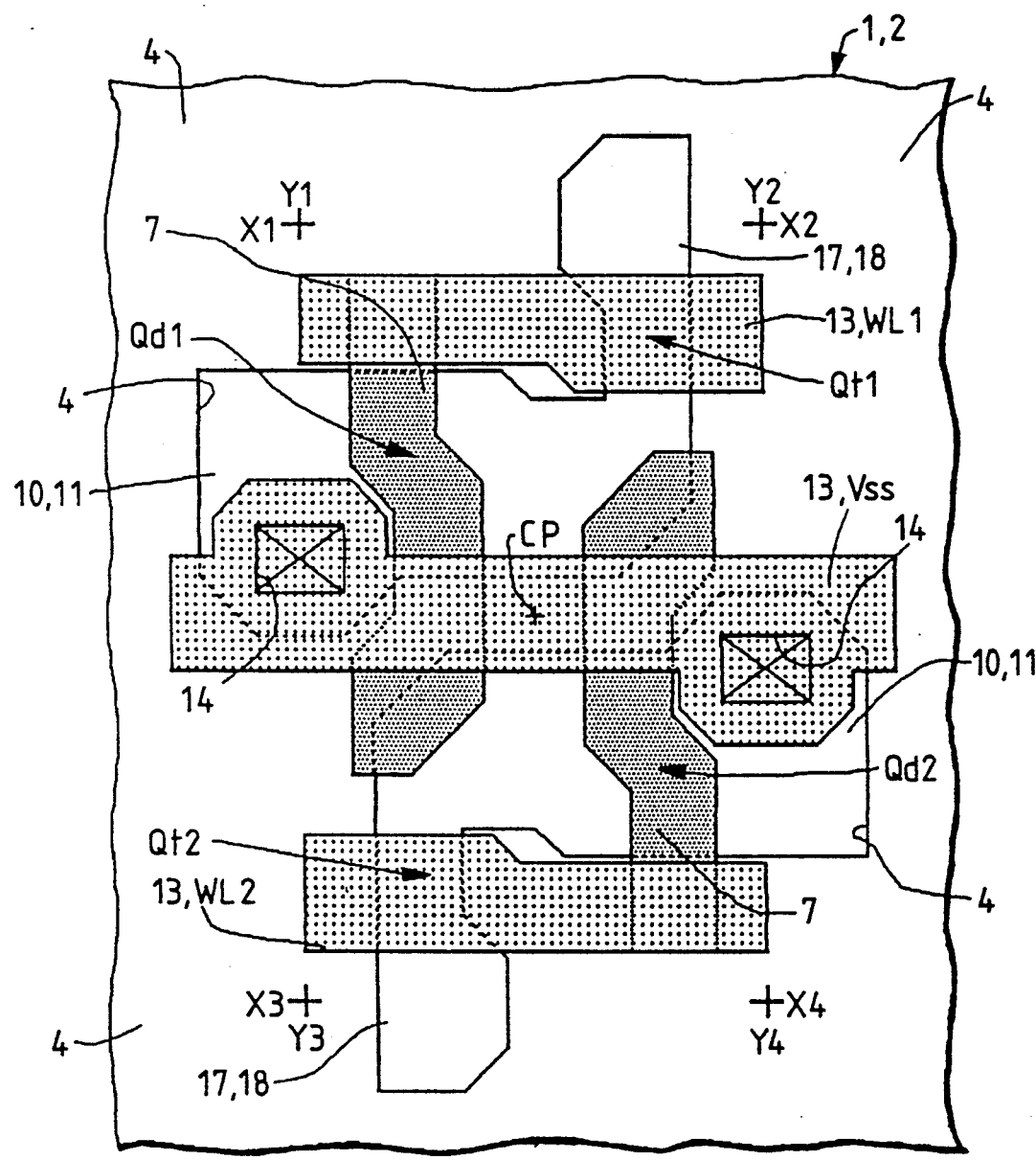
Figure 12:
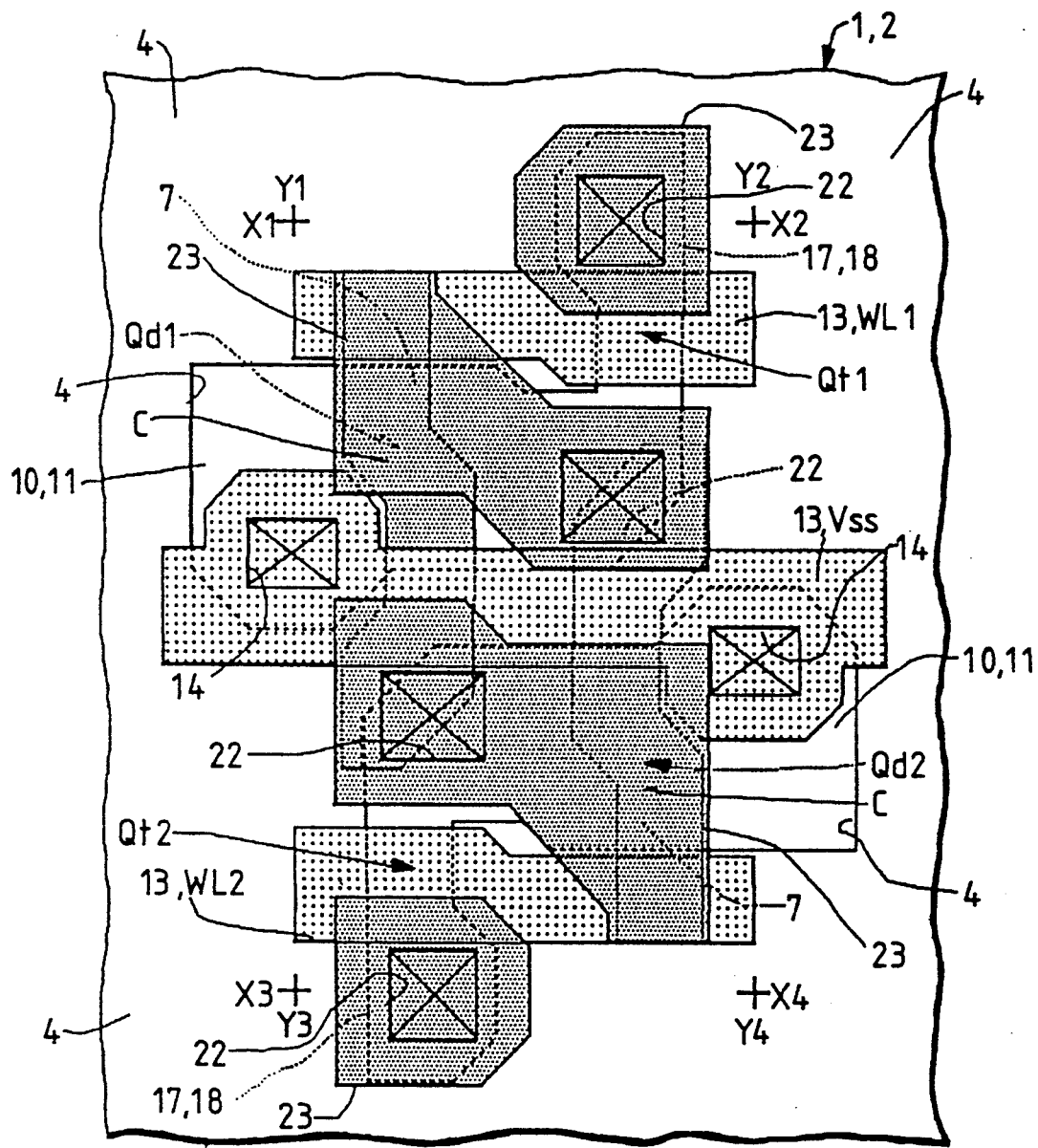

The transfer MISFET Qt1 has its one source region or drain region is formed integrally with the drain region of the drive MISFET Qd1, as shown in FIG. 11. Since the transfer MISFET Qt1 and the drive MISFET Qd1 individually intersect each other in the gate length direction, the active region of the drive MISFET Qd1 and the active region of the transfer MISFET Qt1 are formed in the column direction (i.e., the gate length direction) and in the row direction (i.e., the gate length direction), respectively, with respect to the center of their integral portions. In other words, the transfer MISFET Qt1 and the drive MISFET Qd1 have their individual active regions formed generally into a shape of letter "L", as viewed in the top plan. Likewise, the transfer MISFET Qt2 has its one source region or drain region formed integrally with the drain region of the drive MISFET Qd2. In other words, the transfer MISFET Qt2 and the drive MISFET Qd2 have their individual active regions formed generally into a shape of letter "L", as viewed in the top plan.

The individual top plan shapes of the transfer MISFETs Qt1 and Qt2 are formed symmetric in the memory cell MC with respect to the central point CP, like the drive MISFETs Qd1 and Qd2. In other words, as shown in FIG. 11, the memory cell MC is constructed such that the transfer MISFET Qt1 and the drive MISFET Qd1 integrated with the former, and the transfer MISFET Qt2 and the drive MISFET Qd2 integrated with the former are arranged symmetric (in the memory cell) with respect to the central point CP. In the memory cell MC, the drive MISFETs Qd1 and Qd2 are so arranged between the transfer MISFETs Qt1 and Qd2 as to face each other. In other words, the transfer MISFET Qt1 and the drive MISFET Qd1, and the transfer MISFET Qt2 and the drive MISFET Qd 2 of the memory cell MC determine the gap size exclusively by the gap size between the drive MISFETs Qd1 and Qd2. This gap region is arranged with the element separating insulating film 4 and the p-type channel stopper region 5.

Figure 17:
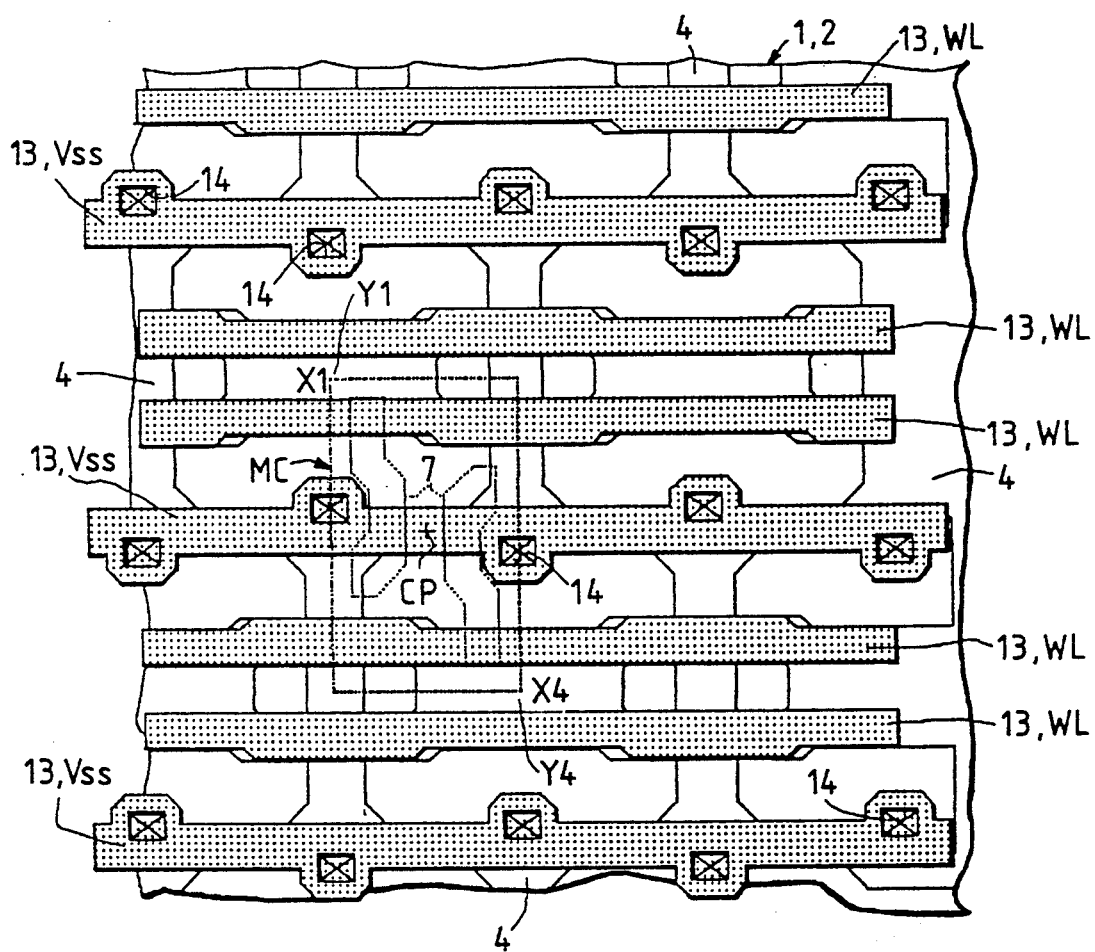

In the array of the memory cells MC in the memory cell array MAY, as shown in FIG. 17, the top plan shape of each of the transfer MISFETs Qt1 and Qt2 of each memory cell MC is formed symmetrically of that of each of the transfer MISFETs Qt1 and Qt2 of another memory cell MC adjacent to the former in the column direction, with respect to an axis Y1-Y3 or Y2-Y4 taken between the two memory cells MC. Likewise, the top plan shape of each of the transfer MISFETs Qt1 and Qt2 of each memory cell MC is formed symmetrically of that of each of the transfer MISFETs Qt1 and Qt2 of another memory cell MC adjacent to the former in the row direction, with respect to an axis X1-X2 or X3-X4 taken between the two memory cells MC. In short, the transfer MISFET Qt of the memory cell MC is formed symmetrically in both the column and row directions.

Of the transfer MISFETs Qt of the memory cells MC arrayed in the row direction, the transfer MISFETs Qt of the adjacent memory cells MC have their individual facing other drain regions or source regions made integral. In other words, the other drain region or source region of the transfer MISFET Qt of one of the adjacent memory cells MC forms the other drain region or source region of the transfer MISFET Qt of the other memory cell MC to reduce the occupied area of the other drain regions or source regions of the transfer MISFETs Qt. Moreover, the element separating insulating film 4 is not interposed between the other drain region or source region of the transfer MISFET Qt of one memory cell MC and the other drain region or source region of the transfer MISFET Qt of the other memory cell MC facing the former, so that the occupied area of the memory cells MC can be reduced to an extent corresponding to that element separating insulating film 4.

Figure 15:
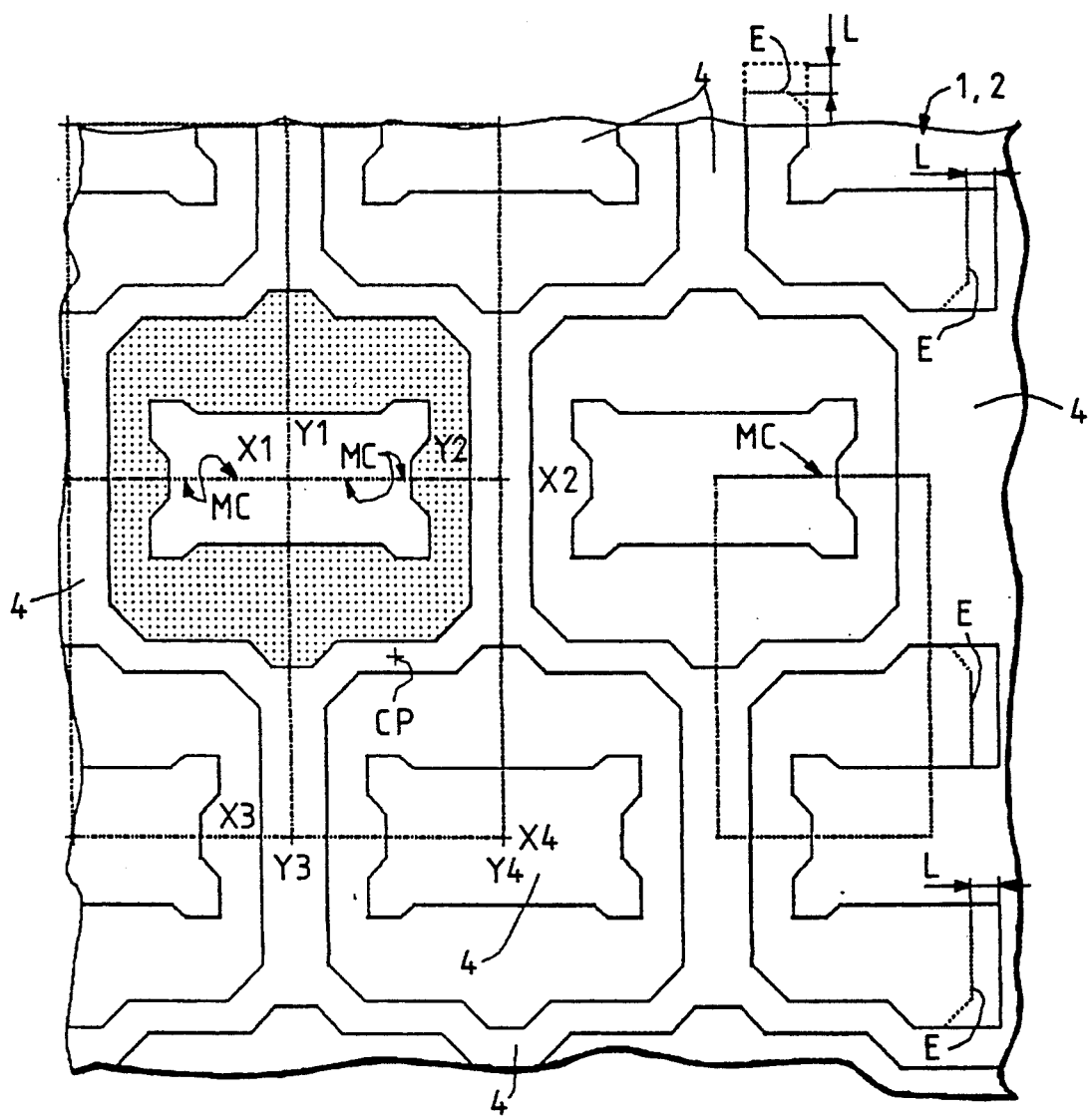
FIGS. 15 to 20 are top plan views showing the memory cell array at the individual steps of fabricating the SRAM.

In the memory cell array MA, as shown in FIGS. 11 and 15 to 17, the four memory cells MC adjoining in the column and row directions have their partial active regions integrated to form a ring-shaped top plan. As shown in FIG. 15, more specifically, in the totally four memory cells MC: the two memory cells MC arrayed in the column direction and adjoining each other at the center of coordinates (X1, Y1), for example; and the two memory cells MC arrayed in the row direction and adjoining each other, the totally four transfer MISFETs Qt and four drive MISFETs Qd, i.e., one transfer MISFET Qt and one drive MISFET Qd of each of the four memory cells MC have their individual active regions integrated to form the ring-shaped active region (as made partially solid). In other words, the four transfer MISFETs Qt and the four drive MISFETs Qd (i.e., the totally eight MISFETs) have their facing source regions or drain regions integrated to form ring shapes connected in series. In other words, in the four memory cells MC adjoining one another in the column and row directions, the one-side L-shaped active regions formed of the one-side transfer MISFETs Qt and drive MISFETs Qd of the memory cells MC are connected to one another to form the ring shapes which have no terminal end in the extending direction (i.e., the gate length direction) of the active regions and are closed of the active region patterns. The facing individual inner and outer frames of the ring-shaped active regions (i.e., the regions defining the gate width direction of the transfer MISFETs Qt and the drive MISFETs Qd are defined by the element separating insulating film 4 and the p-channel stopper region 5. The individual transfer MISFETs Qt of the four memory cells MC have their gate length direction aligned with the row direction, and the drive MISFETs Qd have their gate length direction aligned with the column direction, so that the ring shape is formed in a square (or rectangular) shape in the top plan view.

The active regions formed in the ring shape are arrayed in plurality with the identical shape and pitch in the column direction, and the active regions adjoining in the column direction are isolated from each other through the element separating insulating film 4. The ring-shaped active regions subsequently adjoining in the row direction to the former ring-shaped active regions are arrayed in plurality in the column direction with the identical shape and pitch, like the preceding array, and at a displacement of half pitch in the column direction from the preceding array. In other words, the ring-shaped active regions are staggered in the memory cell array MAY, as shown in FIG. 15.

In the trailing end of the memory cell array MAY, i.e., in the periphery providing the boundary region of the memory cell array MAY from the peripheral circuits, the top plan shape of the ring-shaped active region has an excess size L retained, as shown in FIG. 15. The ring-shaped active region of the memory cell array MAY is formed into a half ring shape of the ring-shaped active regions arrayed at the central portion of the memory cell array MAY, This half ring-shaped active region is formed, in case it is formed simply on the basis of the layout rule, into the shape including the region shared with the adjacent memory cell MC (i.e., the connecting region with the source line or the complementary data line DL, for example), as indicated by dotted lines. The half ring-shaped active region at the trailing end of the memory cell array MAY has its trailing end existing in its extending direction (i.e., the gate length direction), and the pattern of the active region is not closed so that the excess size L larger than that indicated by the dotted lines E is added to that region. This excess size L is the size equal to or larger than the size of such a bird's beak in the gate length direction as is caused when the element separating insulating film 4 is formed in the fabrication process.

The individual gate electrodes 13 of the transfer MISFETs Qt1 and Qt2 of the memory cell MC are connected, as shown in FIGS. 8, 9, 11 and 17, with word lines (WL) 13 in the gate width direction. The word lines 13 are integrated with the gate electrodes 13 and formed of the identical layer. In the memory cell MC, the gate electrode 13 of the transfer MISFET Qt1 is connected with the first word line (WL1) 13, which is extended substantially straight in the column direction over the element separating insulating film 4, as shown in FIG. 17. The gate electrode of the transfer MISFET Qt2 is connected with the second word line (WL2) 13, which is extended substantially straight in the column direction, as shown in FIG. 17. In short, one memory cell Mc is arranged with two first word lines 13 and second word lines 13, which are extended at a gap from each other and in parallel in the identical column direction. In the memory cell array MAY, the first word lines 13 and the second word lines 13 have their top plan shapes made symmetric in the column direction with respect to the aforementioned axis Y1–Y3 and the axis Y2–Y4. Moreover, the first word lines 13 and the second word lines 13 have their top plan shapes made symmetric in the row direction with respect to the axis X1–X2 and the axis X3–X4.

The first word lines (WL1) 13 are extended, as shown in FIGS. 8, 9 and 11, over the portions of the gate electrode 7 of the drive MISFET Qd1 of the memory cell MC projected in the gate width direction over the element separating insulating film 4 and made to cross the projected portions. Likewise, the second word lines (WL2) 13 are extended over the portions of the gate electrode 7 of the drive MISFET Qd2 of the memory cell MC projected in the gate width direction over the element separating insulating film 4 and made to cross the projected portions. Thanks to this structure, the ground of the word lines 13 can be flattened to reduce the underlying step more than the case, in which the ends of the projected portions are below the word lines 13, so that the dispersion of the resistances of the word lines 13 can be reduced. Moreover, the side wall spacer 9 formed at the side wall of the gate electrode 7 further reduces the underlying step of the word lines.

On the other hand, a reference voltage line (i.e., the source line: Vss) is arranged between the first word lines (WL1) 13 and the second word lines (WL2) 13, which are arranged in the memory cell MC. One reference voltage line 13 is arranged in the memory cell MC and constructed as the common source line shared between the drive MISFETs Qd1 and Qd2 of the memory cell MC. The reference voltage line 13 is formed of a conductive layer identical to that of the word line 13 and is extended at a gap from the word line 13 and substantially straight in the column direction and in parallel over the element separating insulating film 4. In the memory cell array MAY, the reference voltage line has its top plan shape made symmetric in the column direction with respect to the axis Y1–Y3 and the axis Y2–Y4. Moreover, the top plan shape of the reference voltage line 13 is made symmetric in the row direction with respect to the axis X1–X2 and the axis X3–X4.

The reference voltage line 13 is caused, as shown in FIGS. 8, 9 and 11, to cross the projecting portions of the individual gate electrodes 7 of the drive MISFETs Qd1 and Qd2 of the memory cell MC projected in the gate width direction over the element separating insulating film 4. Moreover, the side wall spacer 9 formed at the side wall of the gate electrode 7 reduces the underlying step of the reference voltage line 13 to reduce the dispersion of the resistance of the reference voltage line and the contact resistance.

The reference voltage line 13 is connected, as shown in FIGS. 8, 9, 11 and 17, with the individual source regions (i.e., the n+-type semiconductor region 11) of the drive MISFETs Qd1 and Qd2. The reference voltage line 13 is connected with the gate insulating film 12 over the source region through a connection hole 14 formed in the insulating film 12 of the identical layer. The reference voltage line 13 connects the overlying refractory metal silicide film 13B directly with the n+-type semiconductor region 11 acting as the source region through the connection hole 14 formed in the underlying polycrystalline silicon film 13A and the connection hole 14 formed in the insulating film 12.

(A-1): In the SRAM 1 having its memory cell composed of transfer MISFETs Qt to be controlled through word lines (WL) 13 and drive MISFETs Qd: the gate electrodes 7 of the drive MISFET Qd and the gate electrodes 13 of the transfer MISFETs Qt of the memory cell MC, and the word lines 13 are individually formed of different conductive layers; the drive MISFETs Qd and the transfer MISFETs Qt are individually arranged to cross each other in the gate length direction; and the word lines 13 are extended in the gate length direction of the gate electrodes 7 of the drive MISFETs Qd and caused to cross the gate electrodes 7 of the drive MISFETs Qd partially. The areas to be occupied by the drive MISFET Qd of the memory cell MC and the word line 13 are partially superposed so that the area to be occupied by the memory cell MC can be reduced to an extent corresponding to the superposition in the direction of the gate width of the drive MISFET Qd. As a result, the degree of integration of the SRAM 1 can be improved.

(A-2): In addition to the structure (A-1), the word lines 13 are formed of a laminated structure (or a composite film) which is composed of a film 13A of polycrystalline silicon and a film 13B of a silicide of a metal having a high melting point and formed over the polycrystalline silicon film, and the gate electrodes 7 of the drive MISFETs Qd are formed of a single-layered structure (or film) of polycrystalline silicon. Thanks to this structure, in addition to the aforementioned effect, the laminated structure can give a lower specific resistance than that of the single film structure of the polycrystalline silicon film (or the specific resistance of the refractory metal silicide film 13B is lower than that of the polycrystalline silicon film) to reduce the resistance of the word line 13B. As a result, the data writing and reading operations of the memory cell can be speeded up to accelerate the operation speed of the SRAM 1. Moreover, the laminated structure can have a larger sectional area than the single-layered structure of the polycrystalline silicon film to reduce the resistance of the word line 13 so that the operation speed of the SRAM 1 can also be accelerated.

(A-3): In the SRAM 1 having its memory cell MC composed of two transfer MISFETs Qt to be controlled with word lines (WL) 13, the gate electrodes 13 of the two transfer MISFETs Qt1 and the gate electrodes 13 of the transfer MISFETs Qt2 of the memory cell MC are individually connected with two word lines (WL1) 13 and second word lines (WL2) 13. The wiring (in case of one word line for each memory cell) of the word line 13 in the memory cell MC for connecting the gate electrodes 13 of the two transfer MISFETs Qt1 and the gate electrodes 13 of the transfer MISFETs Qt2 can be eliminated merely by connecting the two first word lines 13 and second word lines 13 individually with the gate electrodes 13 of the two transfer MISFETs Qt1 and the gate electrodes 13 of the transfer MISFETs Qt2 of the memory cell MC. Thus, the two first word lines 13 and second word lines 13 can be extended generally straight and shortened in the memory cell array MAY to reduce their individual resistances. As a result, the data writing and reading operations of the memory cell MC can be speeded up to accelerate the operation speed of the SRAM 1.

(A-4): In the SRAM 1 having its memory cell MC composed of two transfer MISFETs Qt to be controlled with word lines (WL) 13 and two drive MISFETs Qd connected with the reference voltage lines 13 (or source lines: Vss), the two transfer MISFETs Qt1 and Qt2 of the memory cell MC have their individual gate electrodes 13 connected with two first word lines (WL1) 13 and second word lines (WL2) 13 spaced from each other and extended in an identical direction, and the region defined by the two first word lines 13 and second word lines 13 is arranged therein with the two drive MISFETs Qd1 and Qd2 and the reference voltage lines 13. Thanks to this structure, in addition to the effect of the aforementioned structure (A-3), the reference voltage lines 13 can be arranged in the vacant region between the two first word lines 13 and second word lines 13 in the memory cell MC because the wiring of the word lines 13 in the memory cell MC is eliminated. As a result, the connection distance between each of the source regions of the two drive MISFETs Qd1 and Qd2 and the reference voltage lines 13 can be shortened to reduce the floating of the potential of the source regions of the drive MISFETs Qd1 and Qd2 thereby to improve the stability of the data storage of the memory cell MC and the operational reliability of the SRAM 1. Moreover, the single reference voltage line 13 is arranged between the two drive MISFET Qd1 and Qd2 of the memory cell MC and is used as the common wiring line of the drive MISFET Qd1 and Qd2 so that the occupied area of the memory cell MC can be reduced to an extent corresponding to the single reference voltage line 13 to improve the degree of integration of the SRAM 1.

(A-5): The two word lines (WL1 and WL2) 13 of the aforementioned structure (A-4) and the reference voltage lines 13 are individually formed of an identical conductive layer and extended in an identical direction. Thanks to this structure, the reference voltage line 13 and the source regions (i.e., the n-type semiconductor regions 11) of the drive MISFETs Qd can be formed of the different conductive layers to extend the reference voltage lines 13 in the occupied area of the drive MISFETs Qd. As a result, the occupied area of the memory cell MC can be reduced to an extent corresponding to the occupied area of the reference voltage lines (or the source lines) and the element separating region (i.e., the element separating insulating film 4) of the reference voltage lines (or the source lines) and the drive MISFETs Qd thereby to improve the degree of integration of the SRAM 1.

(A-6): In the SRAM 1 having its memory cell MC composed of two transfer MISFETs Qt to be controlled with word lines (WL) 13 and two drive MISFETs Qd: the transfer MISFET Qt of the memory cell MC has its gate electrode 13 connected with the first word line (WL) 13; the transfer MISFET Qt has its gate electrode 13 connected with the second word line (WL2) 13 which is spaced from the first word line 13 and extended in the same direction; the drive MISFET Qd1, which has its drain region connected with one semiconductor region of the transfer MISFET Qt1; and the drive MISFET Qd2, which has its drain region connected with one semiconductor region of the transfer MISFET Qt2, are arranged between the first word line 13 and the second word line 13; and the plane shapes of the transfer MISFET Qt1 and the drive MISFET Qd1 are formed symmetrically of the plane shapes of the transfer MISFET Qt2 and the drive MISFET Qd2 with respect to the central point CP of the memory cell MC. Thanks to this structure, the fabrication process conditions such as the diffraction (or halation) during the exposure of the photolithography technology or the run-around of the etching liquid can be uniformalized in the memory cell MC, especially between the transfer MISFET Qt1 and the transfer MISFET Qt2 and between the drive MISFET Qd1 and the drive MISFET Qd2, to reduce the dispersions of the sizes of the individual elements. As a result, the sizes of the individual elements can be reduced to reduce the occupied area of the memory cell MC thereby to improve the degree of integration of the SRAM 1.

(A-7): The gate widths of the transfer MISFETs Qt1 and Qt2 are made smaller than the individual ones of the drive MISFETs Qd1 and Qd2. Thanks to this structure, the gap sizes between the transfer MISFET Qt1 and the drive MISFET Qd1 and between the transfer MISFET Qt2 and the drive MISFET Qd2 are determined one-to-one by the size of the element separating gap between the drive MISFET Qd1 and the drive MISFET Qd2 to eliminate the useless size (i.e., the vacant region corresponding to the difference between the gate width size of the drive MISFET Qd and the gate width size of the transfer MISFET Qt) from the above-specified gap sizes. As a result, the occupied area of the memory cell MC can be reduced to improve the degree of integration of the SRAM 1.

(A-8): In the SRAM 1 having its memory cell MC composed of the transfer MISFET Qt and the drive MISFET Qd connected with the reference voltage line (the source line) 13, the gate electrode 7 of the drive MISFET Qd of the memory cell MC and the reference voltage line 13 are formed of different conductive layers, and the reference voltage line 13 is extended in the gate length direction of the gate electrode 7 of the drive MISFET Qd and across a portion of the gate electrode 7 of the drive MISFET Qd. Thanks to this structure, the occupied area of the drive MISFET Qd of the memory cell MC and the occupied area of the reference voltage line 13 partially superposed so that the occupied area of the memory cell MC can be reduced to an extent corresponding to the superposition in the gate width direction of the drive MISFET Qd to improve the degree of integration of the SRAM 1.

(A-13): The memory cell MC of the aforementioned structure (A-6) is formed in a plane shape linearly symmetric to that of an adjacent other first memory cell MC, which is arrayed in the direction of extending the first word lines (WL) 13 and the second word lines (WL) 13, on the first axis (Y1-Y3 or Y2-Y4) crossing the first and second word lines 13 between the memory cell MC and the first memory cell MC, and the memory cell MC is formed in a plane shape linearly symmetric to that of an adjacent other second memory cell MC, which is arrayed in the direction to cross the direction of extending the first and second word lines 13, on the second axis (X1-X2 or X3-X4) parallel to the first and second word lines 13 between the memory cell 13 and the second memory cell 13. Thanks to this structure, the semiconductor region of one of the transfer MISFET Qt and drive MISFET Qd of the memory cell MC can be shared with each of those of the adjacent first and second memory cells MC to reduce the occupied areas of the memory cells MC so that the degree of integration of the SRAM 1 can be improved. In each of the memory cells MC and the adjacent first and second memory cells MC, the conditions for the fabrication process, e.g., the diffraction during the exposure of the photolithography or the run-around of the etching liquid can be uniformalized to reduce the dispersion of the sizes of the individual elements. As a result, the sizes of the individual elements can be reduced to further reduce the occupied area of the memory cell MC so that the degree of integration of the SRAM 1 can be improved.

(B-1): In the SRAM 1 having its memory cell MC composed of the transfer MISFET Qt and the drive MISFET Qt, the transfer MISFET Qt of the memory cell MC has its gate electrode 13 formed of a thicker film that the upper layer of the gate electrode 7 of the drive MISFET Qd. Thanks to this structure, the individual regions of the transfer MISFET Qt and the drive MISFET Qd of the memory cell MC can be superposed to reduce the occupied area of the memory cell MC thereby to improve the degree of integration of the SRAM 1. At the same time, the gate electrode 7 (as located at the lowermost layer of the memory cell MC) of the drive MISFET Qd can be thinned to reduce the growth of the stepped shape of the upper layer thereby to flatten the upper layer. As a result, the breakage failures of the upper wiring line can be reduced to improve the electric reliability of the SRAM 1.

(B-2): In the SRAM having its memory cell MC composed of the transfer MISFET Qt and the drive MISFET Qd and connected with the word line (WL) 13 and the data line (DL: 33), the gate electrode 13 of the transfer MISFET Qt of the memory cell MC and the word line 13 are formed of an identical layer overlying the gate electrode 7 of the drive MISFET Qd and having a larger thickness than the same. Thanks to this structure, in addition to the effects of the aforementioned structure (B-1), the word line 13 can have its sectional area increased to reduce its resistance. As a result, the data writing and reading operations of the memory cell MC can be speeded up to accelerate the operating speed of the SRAM 1.

(B-3): The gate electrode 7 of the drive MISFET Qd of the aforementioned structure (B-1) or (B-2) is formed to have a shingle-layered structure of a polycrystalline silicon film, and the gate electrode 13 of the transfer MISFET Qt is formed to have a laminated structure composed of a polycrystalline silicon film 13A and a film 13B overlying the former and made of a metal silicide having a high melting point. Thanks to this structure, the laminated structure of the gate electrode 13 has a lower specific resistance than that of the single-layered film of polycrystalline silicon of the gate electrode 13 so that the operating speed of the SRAM 1 can be accelerated.

(B-4): In the SRAM having a memory cell composed of the transfer MISFET Qt and the drive MISFET Qd and connected with the word line (WL) 13, the data line (DL: 13) and the reference voltage line (or the source line: Vss) 13, the gate electrode 13 of the transfer MISFET Qt of the memory cell MC, the word line 13 and the reference voltage line 13 are formed of an identical conductive layer different from that of the gate electrode 7 of the drive MISFET MC and having a smaller specific resistance than that of the same. Thanks to this structure, the word line 13 and the reference voltage line 13 can have their individual specific resistances reduced (becuase the film thickness is increased thanks to the laminated structure) to speed up the data writing and reading operations of the memory cell MC thereby to accelerate the operating speed of the SRAM 1.

(B-5): In the SRAM having its memory cell MC composed of the transfer MISFET Qt and the drive MISFET Qd, the transfer MISFET Qt of the memory cell MC is constructed of the LDD structure, and the drive MISFET Qd is constructed of the double diffused drain (DDD) structure. Thanks to this structure, the drivability (i.e., the unit conductance gm) of the drive MISFET Qd of the memory cell MC can be made higher than the drivability (at the unit of gm) of the transfer MISFET Qt to increase the effective β ratio of the memory cell MC. As a result, the occupied area of the drive MISFET Qd can be reduced to reduce the occupied area of the memory cell MC thereby to improve the degree of integration of the SRAM 1. Moreover, the effective β ratio of the memory cell MC can be increased to improve the stability of the data held in the data storage node of the memory cell MC, the malfunction of the memory cell MC can be reduced to improve the operational reliability of the SRAM 1.

The capacity element C arranged in the memory cell MC is composed mainly of the first electrode 7, a dielectric film 21 and a second electrode 23, which are sequentially laminated, as shown in FIGS. 8, 9, 12 and 18. In short, the capacity element C is constructed to have the stacked (or laminated) structure. The memory cell MC is arranged mainly with the two capacity elements C, which are connected and arranged in series between the data storage node regions of the memory cell MC.

The first electrode 7 is formed of a portion of the gate electrode (i.e., the polycrystalline silicon film formed at the gate material forming step of the first layer) of the drive MISFET Qd. The gate electrode 7 of one drive MISFET Qd1 of the memory cell MC forms the first electrode 7 of one of the two capacity elements C. The gate electrode 7 of the other drive MISFET Qd2 forms the first electrode 7 of the other capacity element C.

The dielectric film 21 is formed over the first electrode (or the gate electrode) 7. This dielectric film 21 is formed in regions other than the first electrode 7. Over the first electrode 7, however, the regions defined by the first word line (WL1) 13 and the reference voltage line 13 and the regions defined by the second word line (WL2) 13 and the reference voltage line 13 are substantially used as the dielectric film of the capacity element C. This dielectric film 21 is formed of a silicon oxide film, for example.

The second electrode 23 is formed over the first electrode 7 through the dielectric film 21. Like the dielectric film 21, the regions of the second electrode 23, which are defined by the word lines (WL) 13 and the reference voltage line 13, are used substantially as the second electrode of the capacity element C. The second electrode 23 is formed of a single-layered polycrystalline silicon film, for example, at the gate material forming step of the third layer. This polycrystalline silicon film is doped with an n-type impurity such as P (or As) for reducing the resistance.

In other words, the capacity element C is composed of: a capacity element C using the gate electrode 7 of the drive MISFET Qd1 as the first electrode 7 and arranged in the region of the drive MISFET Qd1; and a capacity element C using the gate electrode 7 of the drive MISFET Qd2 and arranged in the region of the drive MISFET Qd2. The second electrode 23 of the capacity element C thus constructed is also formed into the gate electrode 23 of the load MISFET Qp, as will be described hereinafter. Moreover, the second electrode 23 of the capacity element C is also constructed as the conductive layer (or intermediate conductive layer) 23 for connecting the drain region (actually an n-type channel forming region 26N) of the load MISFET Qp, one semiconductor region of the transfer MISFET Qt, the drain region of the drive MISFET Qd, and the gate electrode 7 of the drive MISFET Qd.

The second electrode 23 of one capacity element C arranged in the region of the drive MISFET Qd1 is connected with a drain region (11) of the drive MISFET Qd1, one semiconductor region (18) of the transfer MISFET Qt1 and the gate electrode 7 of the drive MISFET Qd2. These connections are carried out by that conductive layer 23 formed of the layer identical to that of the second electrode 23 and integrally therewith, which is extracted from the second electrode 23 of the capacity element C in the gate length direction (i.e., the column direction) of the drive MISFET Qd1. The conductive layer 23 is connected with the aforementioned region, the one semiconductor region and the gate electrode 7 through the connection holes 22 which are formed by removing the insulating film (identical to the dielectric film 21), the insulating film 8 and the insulating film 12. Likewise, the second electrode 23 of the other capacity element C arranged in the region of the drive MISFET Qd2 is connected with the drain region (11) of the drive MISFET Qd2, the one semiconductor region (18) of the transfer MISFET Qt2, and the gate electrode 7 of the drive MISFET Qd1. These connections are carried out by the conductive layer 23 which is formed by extracting the second electrode 23 of the capacity element C in the gate length direction of the drive MISFET Qd2. The conductive layer 23 is connected through the connection holes 22 with the aforementioned drain region, one semiconductor region and gate electrode 7.

Figure 18:
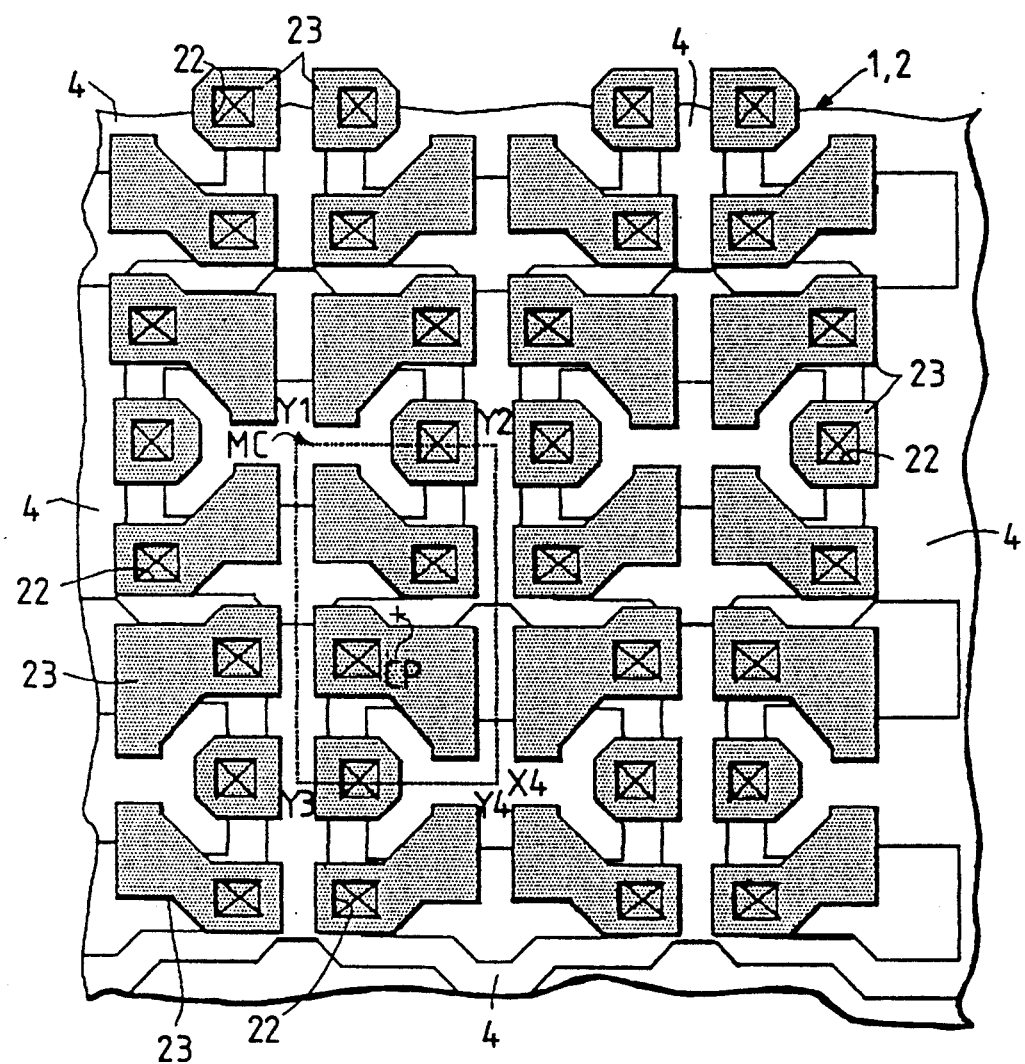

In the memory cell array MAY, the capacity elements C of the memory cells MC arrayed in the column direction are made to have the plane shapes of the second electrodes 23 (and the conductive layers 23) arranged symmetrically with reference to the axis Y1–Y3 or Y2–Y4, as shown in FIG. 18. On the other hand, the capacity elements C of the memory cells MC arrayed in the row direction have the plane shapes the second electrodes 23 arranged asymmetrically, unlike the aforementioned linear symmetry of the drive MISFETs Qd and transfer MISFETs Qt. Contrary to the array of the second electrodes 23 of the capacity elements C of the memory cells C arrayed in the column direction, the capacity elements C of the memory cells MC adjoining in the row direction and arrayed in next column direction have the plane shapes of the second electrodes 23 arranged linearly symmetrically like the second electrodes 23 of the previous column and displaced in the column direction at a distance corresponding to one memory cell MC (i.e., one memory cell pitch) from the array of the memory cells MC of the previous column. In the memory cell array MAY, the array of the second electrodes 23 (and the conductive layer 23) of the capacity elements C of the memory cells MC is determined, as will be described hereinafter, by the asymmetry, in which the plane shapes of the power supply voltage lines (Vcc: 26P) and the load MISFETs Qp formed over the second electrodes 23 and the load MISFETs Qp.

The two load MISFETs Qp1 and Qp2 of the memory cell MC are individually formed over the regions of the drive MISFETs Qd, as shown in FIG. 8, 9, 13 and 19. The load MISFET Qp1 is formed over the region of the drive MISFET Qd2, and the load MISFET Qp2 is formed over the region of the drive MISFET Qd1. The load MISFETs Qp1 and Qp2 are individually arranged to have their gate length direction crossing the gate length direction of the drive MISFET Qd1 and Qd2 generally orthogonally. Each of these load MISFETs Qp1 and Qp2 is composed mainly of an n-channel type forming region 26N, a gate insulating film 24, a gate electrode 23, a source region 26P and a drain region 26P.

The gate electrode 23 is formed of the second electrode (i.e., the polycrystalline silicon film formed at the gate material forming step of the third layer) of the capacity element C. In other words, the second electrode 23 of one capacity element C arranged in the region of the drive MISFET Qd1 forms the gate electrode 23 of the load MISFET Qp2. The second electrode 23 of the other capacity element C arranged in the region of the drive MISFET Qd2 forms the gate electrode 23 of the load MISFET Qp1.

The gate insulating film 24 is formed over the gate electrode 23. The gate insulating film 24 is formed of a silicon oxide film, for example.

The n-channel forming region 26N is formed over the gate electrode 23 through the gate insulating film 24. The n-channel forming region 26N has its gate length direction generally aligned with the gate width direction of the drive MISFET Qd. The n-channel forming region 26N is formed of a polycrystalline silicon film, for example, at the gate material forming step of the fourth layer. This polycrystalline silicon film is doped with an n-type impurity (e.g., phosphor (P)) for setting the threshold voltage of the load MISFET Qp in the enhancement type. The load MISFET Qp can hold the data stably because the power supply voltage Vcc can be sufficiently supplied to the data storage node region when in the (ON) operation. Moreover, the load MISFET Qp can reduce the standby current and accordingly the power consumption because the supply of the power supply voltage Vcc to the data storage node region can be substantially reliably blocked when out of (OFF) operation. In this respect, the load MISFET Qp is different from a loading high-resistance element.

The source region 26P is formed of a p-type conductive layer (26P) which is formed of an identical conductive layer integrally with one end (i.e., the source region) of the n-channel forming region 26N. In other words, the source region (of the p-type conductive layer) 26P is formed of a polycrystalline silicon film, which is formed at the gate material forming step of the fourth layer and which is doped with a p-type impurity (such as BF$_2$). The source region 26P is formed in the region (which is partially formed as the power supply voltage line 26P) defined by double-dotted lines, as indicated at 26P in FIGS. 9, 13 and 19. The drain region 26P is formed of a p-type conductive layer (26P) which is formed of an identical conductive layer integrally with the other end (at the drain side) of the n-channel forming region 26N, like the source region 26P. The drain region 26P is formed in the region which is defined by double-dotted lines, as indicated at 26p. In a later-described fabrication process, more specifically, the region 26p defined by the double-dotted lines is doped with a p-type impurity for forming the source region and the drain region 26P, and the remaining region is formed into the n-channel forming region 26N.

The drain region 26P of the load MISFET Qp1 is connected with one semiconductor region of the transfer MISFET Qt1, the drain region of the drive MISFET Qd1 and the gate electrode 7 of the drive MISFET Qd2. Likewise, the drain region 26P of the load MISFET Qp2 is connected with one semiconductor region of the transfer MISFET Qt2, the drain region of the drive MISFET Qd2 and the gate electrode 7 of the drive MISFET Qd1. These connections are carried out through the conductive layer 23.

Moreover, the drain region 26P of the load MISFET Qp is spaced from the gate electrode 23 through the n-channel forming region 26N. In other words, the load MISFET Qp is spaced without being superposed on the gate electrode 23 and the drain region 26P. In short, the drain region 26P of the load MISFET Qp is constructed to have the offset structure. This load MISFET Qp having the offset structure can improve the breakdown voltage between the n-channel forming region 26N and the drain region 26P. In short, this offset structure is enabled to improve the dielectric strength of the pn junction between the drain region 26P and the n-channel forming region 26N by spacing the drain region 26P and the n-channel forming region 26N whose charge is to be induced by the gate electrode 23. In the present embodiment, the load MISFET Qp is constructed to have an offset (or spacing) size of about 0.6 [μm] or more.

The conductive layer 23 is formed by extracting the second electrode 23 (i.e., the polycrystalline silicon film formed at the gate material forming step of the third layer) of the capacity element C, as has been described hereinbefore. The conductive layer 23 is formed of the conductive layer identical to the gate electrode 23 of the load MISFET Qp. This conductive layer 23 is connected with the p-type drain region 26P of the overlying load MISFET Qp through a connection hole 25 formed in the inter-layer insulating film 24. As has been described hereinbefore, the conductive layer 23 is further connected through the connection holes 22 through the one semiconductor region of the transfer MISFET Qt, and the drain region and the gate electrode 7 of the drive MISFET Qd. The conductive layer 23 thus constructed can enlarge the spaces among the other end of the drain region 26P of the load MISFET Qp, the one semiconductor region (18) of the transfer MISFET Qt and the drain region (11) of the drive MISFET Qd, to an extents corresponding to the film thickness of the conductive layer, and the size between the position of the upper connection hole 25 and the lower connection hole 22 of the conductive layer 23. Since the conductive layer 23 is formed of the polycrystalline silicon film doped with the n-type impurity, it can increase the diffusion distances to the one semiconductor region (18) of the p-type impurity forming the p-type drain region 26P and the drain region (11). In other words, the conductive layer 23 can reduce the diffusions of the p-type impurity of the drain region 26P of the load MISFET Qp into the individual channel forming regions of the transfer MISFET Qt and the drive MISFET Qd to prevent the fluctuations of the individual threshold voltages of the transfer MISFET Qt and the drive MISFER Qd. The conductive layer 23 can also reduce the number of conductive layers structurally because it is formed of the gate electrode 23 of the load MISFET Qp, the second electrode 23 of the capacity element C or the conductive layer identical to the conductive layer (at the identical step) extracted from the second electrode 23. Moreover, the conductive layer 23 can reduce the number of steps of the fabrication process.

(B-7): In the SRAM 1 having its memory cell MC composed of the two drive MISFETs Qd and the two load MISFETs Qp, the gate electrode 7 of one of the drive MISFETs Qd and the gate electrode 23 of one of the load MISFETs Qp are positioned to face the upper portion of the one drive MISFET Qd, and the drain region 26P of the one load MISFET Qp is connected with the drain region (11) of the other drive MISFET Qd through the conductive layer (or the intermediate conductive layer) 23 which is formed of the conductive layer identical to that of the gate electrode 23 of the one or other load MISFET Qp. Thanks to this structure, the distance between the drain region 26P of the one load MISFET Qp of the memory cell MC and the drain region of the other drive MISFET Qd can be made through the intermediate conductive layer 23 to prevent the p-type impurity for forming the drain region 26P of the one load MISFET Qd from being diffused into the drain region of the other drive MISFETs. As a result, it is possible to improve the electric characteristics of the SRAM 1 such as the prevention of the fluctuations of the threshold voltage, which might otherwise be caused by the diffusion of the aforementioned p-type impurity into the other drive MISFET Qd. Likewise, moreover, the p-type drain region 26p of the one load MISFET Qp is also connected with the one semiconductor region (18) of the other transfer MISFET Qt thereby to prevent the fluctuations of the threshold voltage of the transfer MISFET Qt.

(B-8): The drain region 26P of the load MISFET Qp of the memory cell MC of the aforementioned structure (B-7) is constructed to have the offset structure. Thanks to this structure, the dielectric strength between the drain region 26P of the load MISFET Qp and the n-channel forming region 26N can be improved to reduce the occupied area of the load MISFET Qp so that the occupied area of the memory cell MC can be reduced to improve the degree of integration of the SRAM 1.

The source region (i.e., the p-type conductive layer 26P) of the load MISFET Qp is connected with the power supply voltage line (Vcc) 26P. This power supply voltage line 26P is formed of an identical conductive layer integrally with the p-type conductive layer 26P acting as the aforementioned source region. In short, the power supply voltage line 26P is formed of the polycrystalline silicon film which is formed at the gate material forming step of the fourth layer and doped with a p-type impurity (e.g., boron or $BF_2$) for reducing the resistance.

Two power supply voltage lines 26P are arranged in the memory cell MC. These two power supply voltage line 26P are extended in the memory cell array MAY at a spacing from each other and generally in parallel with each other in the identical column direction. One power supply voltage line 26P arranged in the memory cell MC is made integral with the source region of the load MISFET Qp2 and extended over and along the first word lines (WL1) 13. The other power supply voltage line 26P is made integral with the source region of the load MISFET Qp1 and extended over and along the second word lines (WL2) 13.

Figure 13:
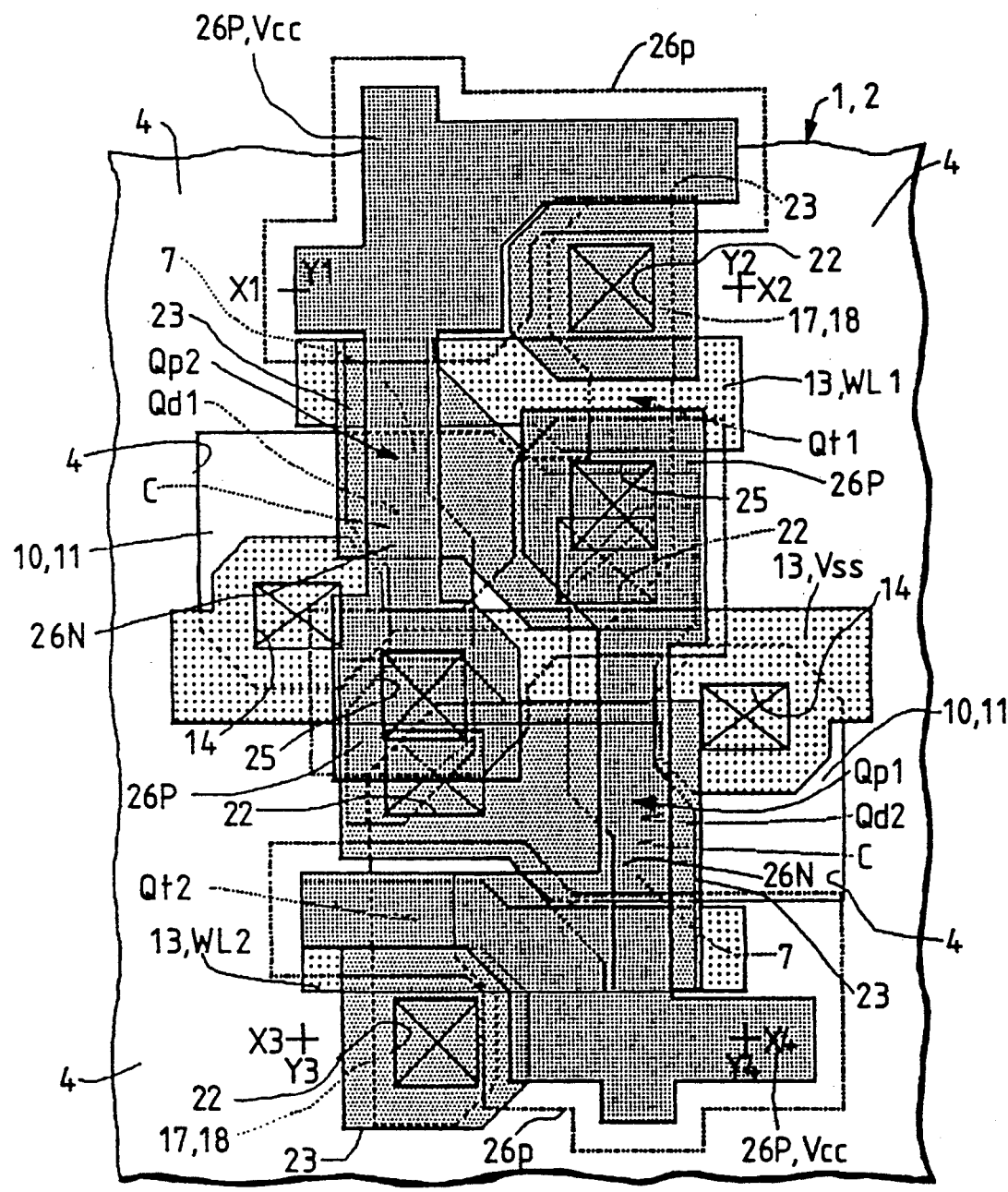
Figure 14:
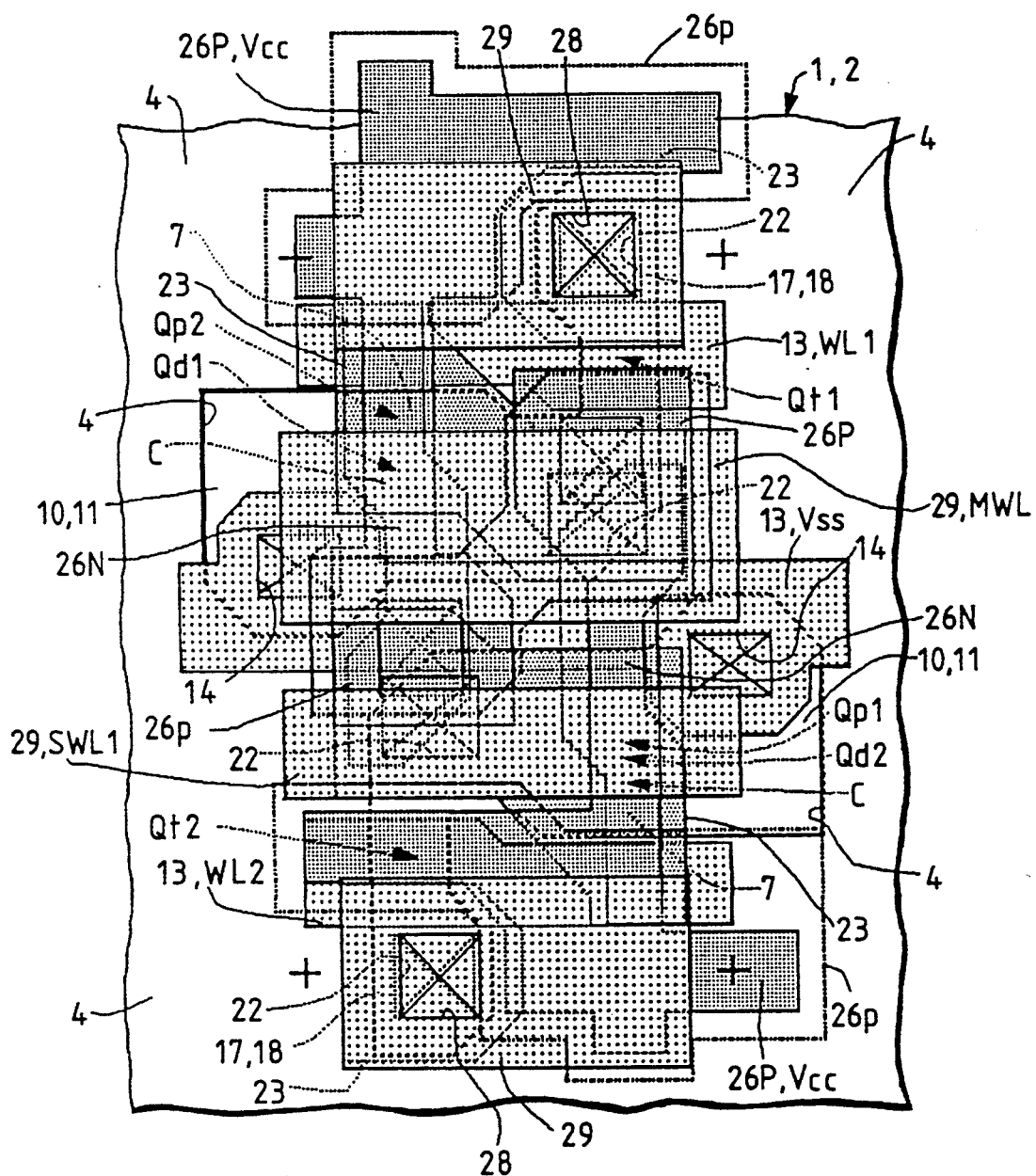
Figure 19:
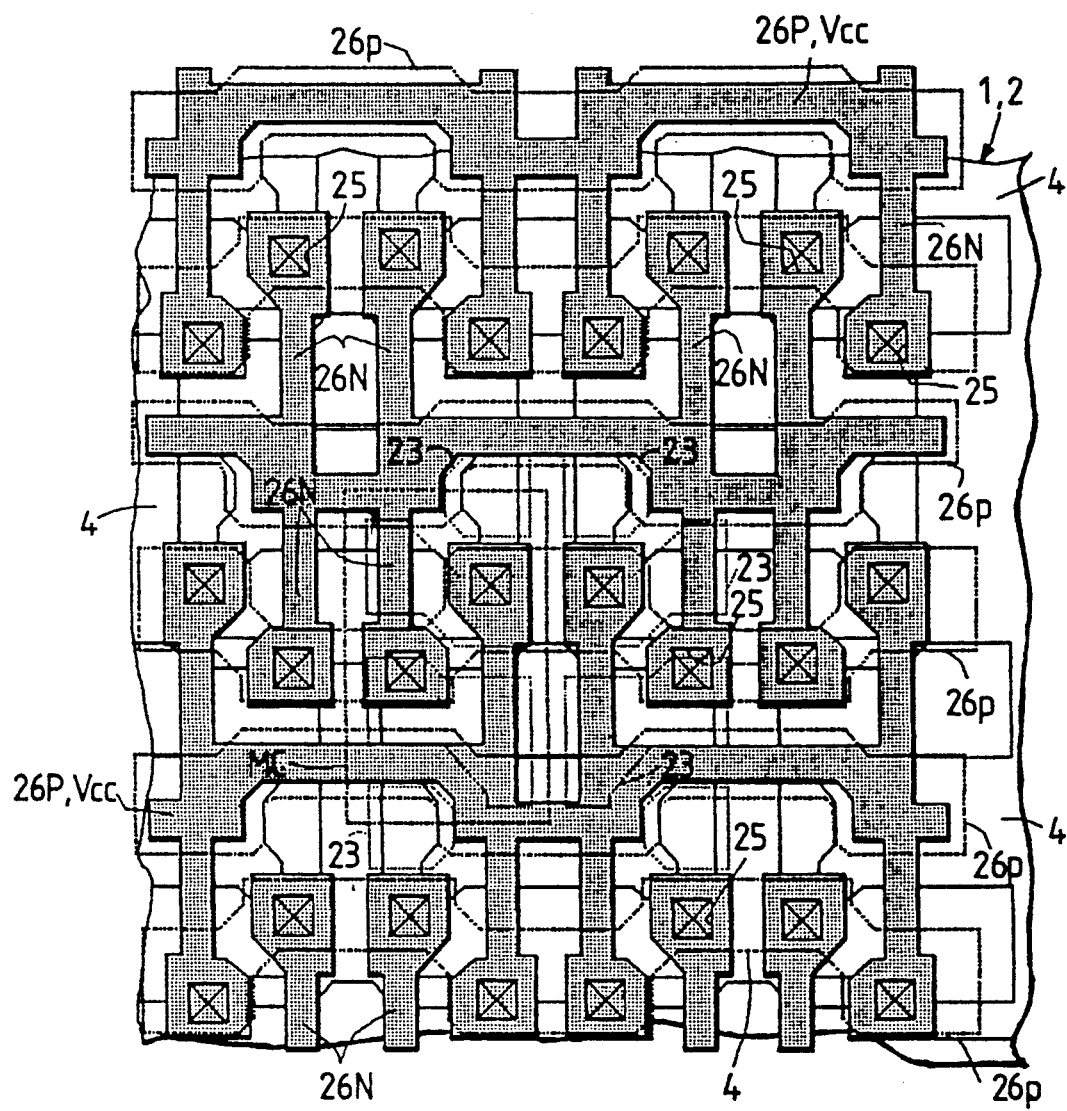

In the memory cell MC, as shown in FIGS. 13 and 19, one power supply voltage line 26P extends in the column direction and bypasses in the column direction the connection (i.e., the later-described intermediate conductive layer 23) between the other semiconductor region (18) of the transfer MISFET Qt1 and the first data line (DL1: 33) of the complementary data line DL. In other words, the one power supply voltage line 26P does not pass the gap between the load MISFET Qp1 of the memory cell MC and the aforementioned connection but bypasses the gap between the connection and the load MISFET Qp1 of another memory cell MC adjacent (or arranged above) in the row direction. On the other hand, the one power supply voltage line 26P is used commonly as the one power supply voltage line 26P of another memory cell MC adjacent (or arranged above) in the row direction. The other power supply voltage line 26P likewise extends in the column direction and bypasses in the column direction the connection (i.e., the later-described intermediate conductive layer 23) between the other semiconductor region (18) of the transfer MISFET Qt2 and the second data line (DL2: 33) of the complementary data line DL. The other power supply voltage line 26P bypasses the gap between the load MISFET Qp of the memory cell MC and the aforementioned connection but not the gap between the connection and the load MISFET Qp2 of another memory cell MC adjacent (or arranged below) in the row direction. Likewise, the other power supply voltage line 26P is used commonly as the other power supply voltage line 26P of another memory cell MC adjacent (or arranged below) in the row direction. In short, one memory cell MC is arranged with the two power supply voltage lines 26P, which are used commonly as the power supply voltage lines 26P of other upper and lower memory cells MC adjacent in the column direction so that one memory cell MC is substantially arranged with one power supply voltage line 26P.

The two power supply voltage lines 26P arranged in the memory cell MC are constructed to have their plane shapes made symmetric in the column direction of the memory cell array MAY with respect to the axis Y1-Y3 or Y2-Y4, as shown in FIG. 19. Moreover, the two power supply voltage lines 26P arranged in the memory cell MC are constructed to have asymmetric plane shapes in the row direction of the memory cell array MAY unlike the aforementioned symmetric array of the drive MISFET Qd and the transfer MISFET Qt but like the array of the second electrode 23 of the capacity element C. Contrary to the plan shapes of the power supply voltage lines 26P extending in the memory cells MC arrayed in the column direction, the power supply voltage lines 26P extending in the memory cells MC arrayed in the column direction and adjoining in the row direction are linearly symmetric in the column direction like the power supply voltage lines 26P extending in the memory cells MC of the previous array and are displaced in the column direction to an extent corresponding to one memory cell MC (i.e., one memory cell pitch) from the power supply voltage lines 26P extending in the memory cells MC of the previous array. In the memory cell array MAY, the bypass of the connection (i.e., the intermediate conductive layer 23) of the power supply voltage lines 26P between the other semiconductor region of the transfer MISFET Qt and the complementary data lines DL is accomplished in the identical row direction or at an upper side. In short, the power supply voltage lines 26P bypass the upper side of the aforementioned connection, as shown in FIG. 19.

(A-14): In the aforementioned structure (A-13): the first data line (DL1: 33) of the complementary data lines DL is connected with the other semiconductor region (18) of the transfer MISFET Qt1 of the memory cell MC whereas the second data line (DL2: 33) of the complementary data lines DL is connected with the other semiconductor region of the transfer MISFET Qt2; the first power supply voltage line (or the source line) 26P is extended along the first word line (WL1) 13 and bypassing the connection (or the intermediate conductive layer 23) between the other semiconductor region of the transfer MISFET Qt1 and the first data line (DL1) and is connected with the one semiconductor region (18) of the transfer MISFET Qt2 through the load MISFET Qp2; and the second power supply voltage line (or the source line) 26 is extended along the second word line (WL2) 13 and bypassing the connection (i.e., the intermediate conductive layer) between the other semiconductor region of the transfer MISFET Qt2 and the second data line (DL2) in the direction identical to that of the first power supply voltage line 26P and is connected with the one semiconductor region of the transfer MISFET Qt1 through the load MISFET Qp1. More specifically, (A-15) the two power supply voltage lines 26P arranged in the memory cell MC of the aforementioned structure (A-14) are individually formed symmetrically in the memory cell array MAY in the column direction with respect to the axis (Y1–Y3 or Y2–Y4) but asymmetrically in the row direction with respect to the axis (X1–X2 or X3–X4). Thanks to this structure, at the connection (i.e., the intermediate conductive layer 23) between the other semiconductor region of the transfer MISFET Qt and the complementary data line DL, the two power supply voltage lines 26P are by-passed only in one direction (at the upper side) so that the one power supply voltage line 26P (or the other power supply voltage line 26P) is arranged between the connection and the load MISFET Qp1 (or between the connection and the load MISFET Qp2). As a result, the occupied area of the memory cell MC between the connection and the load MISFET Qp1 can be reduced to an extent corresponding to the absence of the one power supply voltage line 26P to improve the degree of integration of the SRAM 1. Incidentally, this effect can likewise be attained even in case the load MISFET Qp of the memory cell MC is replaced by a loading high-resistance element.

Of the capacity elements C arranged in the aforementioned memory cell MC, the capacity element C arranged over the drive MISFET Qd1 has its second electrode 23 (or conductive layer 23) causing one power supply voltage line 26P to bypass another upper memory cell MC in the aforementioned connection (i.e., the intermediate conductive layer 23) thereby to reduce the gap between the connection and the load MISFET Qp1, so that the plane shape can be reduced to an extent corresponding to the reduced size. On the other hand, the second electrode 23 (and the conductive layer 23) of the capacity element C arranged over the drive MISFET Qd2 of the memory cell MC causes the other power supply voltage line 26P to bypass the memory cell MC at the connection (or the intermediate conductive layer 23) and to pass the gap between the connection and the load MISFET Qp2 so that the plane shape is augmented to an extent corresponding to the passage of the other power supply voltage line 26P. In short, the power supply voltage line 26P never fails to extends over the memory cell MC with a view to improving the degree of integration. With reference to the plane shape of the second electrode 23 (and the conductive layer 23) of the capacity element C arranged over the drive MISFET Qd2, or at the side for the power supply voltage line 26P to bypass over the memory cell MC, the plane shape of the second electrode 23 (and the conductive layer 23) of the capacity element C arranged over the drive MISFET Qd1 is reduced. As a result, all the second electrodes 23 (and the conductive layers 23) of the capacity elements C of the memory cells MC are determined by the plane shape of the second electrodes 23 arranged over the drive MISFETs Qd2, in case they are arranged symmetrically with the row direction (or the axis X1–X2 or X3–X4), so that the occupied area of the memory cells MC is augmented. By the asymmetric arrangement in the row direction to correspond to the arrangement of the power supply voltage lines 26P, however, the occupied area of the memory cells MC can be reduced to an extent corresponding to the reduction in the plane shape of the second electrodes 23 over the drive MISFET Qd1.

(A-16): the individual gate electrodes 23 (i.e., the second electrode 23 of the capacity element C and the conductive layer 23) of the load MISFETs Qp1 and Qp2 of the memory cell MC of the aforementioned structure (A-15) have their plane shapes made symmetric in the column direction but asymmetric in the row direction. Thanks to this structure, of the two load MISFETs Qp of the memory cell MC, the gate electrodes 23 (i.e., the second gate electrode 23 and the conductive layer 23) of the load MISFET Qp2 can have their plan shapes reduced so that the occupied area of the memory cell MC can be reduced according to this reduction to improve the degree of integration of the SRAM 1.

The other semiconductor region (18) of the transfer MISFET Qt of the memory cell MC is connected with the complementary data line (DL) 33, as shown in FIGS. 8, 9, 14 and 20. The one transfer MISFET Qt1 of the memory cell MC is connected with the first data line (DL1) 33 of the complementary data line 33. The other transfer MISFET Qt2 is connected with the second data line (DL2) of the complementary data line 33. The connection between the other semiconductor region of the transfer MISFET Qt and the complementary data line 33 is achieved through the intermediate conductive layers 23 and 29 laminated sequentially from the lower to upper layers and a buried electrode 32.

The intermediate conductive layer 23 is formed over the inter-layer insulating film 21, as shown in FIGS. 8, 9, 12 and 18. This intermediate conductive layer 23 is partially connected in the region defined by the side wall spacer 16 with the other semiconductor region (18) of the transfer MISFET Qt through the connection hole 22 formed in the inter-layer insulating film 21. The connection hole 22 is formed to have a larger (toward the gate electrode 13) opening size than that of the region defined by the side wall spacer 16. This side wall spacer 16 is formed in self-alignment in the side wall of the gate electrode 13 of the transfer MISFET Qt, as has been described hereinbefore. In short, the intermediate conductive layer 23 is partially connected with the other semiconductor region of the transfer MISFET Qt in a position determined by the side wall spacer 16 and in self-alignment therewith. The other portion of the intermediate conductive layer 23 is extracted to above the inter-layer insulating film 21 to an extent corresponding to the masking excess size of the fabrication process of the intermediate conductive layer 23 and the overlying intermediate conductive layer 29. This intermediate conductive layer 23 absorbs the masking offset, if any, in the fabrication process for forming the other semiconductor region of the transfer MISFET Qt and the intermediate conductive layer 29 and can apparently connect the intermediate conductive layer 29 in self-alignment with the other semiconductor region of the transfer MISFET Qt.

The intermediate conductive layer 23 is formed of the conductive layer identical to those of the gate electrode 23 of the load MISFET Qp, the second electrode 23 of the capacity element C and the conductive layer 23. In short, the intermediate conductive layer 23 is formed of the polycrystalline silicon film which is formed at the gate material forming step of the third layer and which is doped with an n-type impurity for reducing the resistance.

The intermediate conductive layer 29 is formed over an inter-layer insulating film 27, as shown in FIGS. 8, 9, 14 and 20. This intermediate conductive layer 29 has its one end connected with the intermediate conductive layer 23 through a connection hole 28 formed in the inter-layer insulating film 27. The intermediate conductive layer 23 is connected with the other semiconductor region of the transfer MISFET Qt, as has been described hereinbefore. The other end of the intermediate conductive layer 29 is extracted in the column direction and connected with the buried electrode 32 which is buried in a connection hole 31 formed in an inter-layer insulating film 30. The buried electrode 32 in turn is connected with the complementary data line 33.

The intermediate conductive layer 29 having its one end connected with the other semiconductor region of the transfer MISFET Qt1 is extracted in the column direction to below the first data line (DL1) 33 of the complementary data lines 33 extending in the row direction over the other semiconductor region of the transfer MISFET Qt2 and is connected with the first data line 33 in its extracted region. Likewise, the intermediate conductive layer 29 having its one end connected with the other semiconductor region of the transfer MISFET Qt2 is extracted in the column direction to below the second data line (DL2) 33 of the complementary data lines 33 extending in the row direction over the other semiconductor region of the transfer MISFIT Qt1 and is connected with the second data line 33 in its extracted region. In short, the intermediate conductive layer 29 constitutes the cross wiring structure, in which the transfer MISFETs Qt1 and Qt2 of the memory cell MC and the first data line 33 and the second data line 33 extending in the reverse position in the column direction are connected.

The intermediate conductive layer 29 is formed of a metal film such as a tungsten (W) film having a high melting point, which is formed at the metal material forming step of the first layer in the fabrication process, as will be described hereinafter. This W film has a lower specific resistance than those of the foregoing polycrystalline silicon film and the metal silicide film having the high melting point.

The inter-layer insulating film 27 underlying the intermediate conductive layer 29 is constructed of a composite film which is formed by laminating a silicon oxide film 27A and a BPSG (i.e., Boron-doped Phospho-Silicate Glass) film 27B sequentially. The BPSG film 27B overlying the inter-layer insulating film 27 is subjected to the glass flow to have its surface flattened.

The buried electrode 32 is selectively formed over the intermediate conductive layer 29 in the connection hole 31 formed in the inter-layer insulating film 30. Thus, the buried electrode 32 absorbs the steep step to be formed by the connection hole 31, so that it can prevent the breakage failures of the overlying complementary data line 33.

The inter-layer insulating film 30 is constructed, as shown in FIG. 9, to have a three-layered structure which is formed by laminating a deposited silicon oxide film 30A, an applied silicon oxide film 30B and a deposited silicon oxide film 30C sequentially. The lower silicon oxide film 30A and the upper silicon oxide film 30C are deposited by the plasma CVD method using tetra ethoxy silane (i.e., TEOS) gases as its source gases, as will be described hereinafter. The lower silicon oxide film 30A is deposited over the stepped shape of the ground to have a uniform film thickness so that any overhang is hardly formed especially over the recess of the stepped shape of the ground. In other words, the lower silicon oxide film 30A can reduce the cavity based on the overhang shape. The intermediate silicon oxide film 30B is formed by applying the spin-on-glass (i.e., SOG), by baking it and by etching (or etching back) the whole surface. The intermediate silicon oxide film 30B thus formed is formed (or left) concentrically over the stepped portion of the surface of the lower silicon oxide film 30A to flatten the surface of the inter-layer insulating film 30. The intermediate silicon oxide film 30B is basically formed over the stepped portion of the surface of the lower silicon oxide film 30A, excepting the region of the connection hole 31 connecting the aforementioned intermediate conductive layer 29 and complementary data line 33. In other words, the complementary data line (of aluminum alloy) 33 can be prevented from being corroded even with the moisture contained in the intermediate silicon oxide film 30B. The upper silicon oxide film 30C covers the surface of the intermediate silicon oxide film 30B so that it can prevent deterioration of the quality of the silicon oxide film 30B.

The complementary data line (DL) 33 is formed over the inter-layer insulating film 30, as shown in FIG. 9. This complementary data line 33 is connected with the buried electrode 32 which is buried in the connection hole 31. The complementary data line 33 is formed at the metal material forming step of the second layer of the fabrication process. The complementary data line 33 is constructed of the two-layered structure which is formed by laminating a barrier metal film 33A and an aluminum alloy film 33B sequentially. The barrier metal film 33A basically prevents the so-called "alloy spike" by preventing the mutual diffusions of both the silicon (Si) of the other semiconductor region (18) of the transfer MISFET Qt and the intermediate conductive layer 23 and the aluminum (Al) of the aluminum alloy film 33B. On the other hand, the barrier metal film 33A is made of a metal material having an excellent bondability to the underlying buried electrode 32. The barrier metal film 33A is formed of a TiW film, for example. The aluminum alloy film 33B has a lower resistance than those of the polycrystalline silicon film, the refractory metal film and the refractory metal silicide film. The aluminum alloy film 33B is made of aluminum containing additional Cu and Si. The additive Cu basically has an action to improve the electromigration withstand voltage. The other additive Si basically has an action to prevent the alloy spike. Moreover, the complementary data line 33 may either have its aluminum alloy film 33B replaced by an aluminum film or be formed of a single-layered aluminum alloy film by eliminating the lower barrier metal film 33A.

Figure 20:
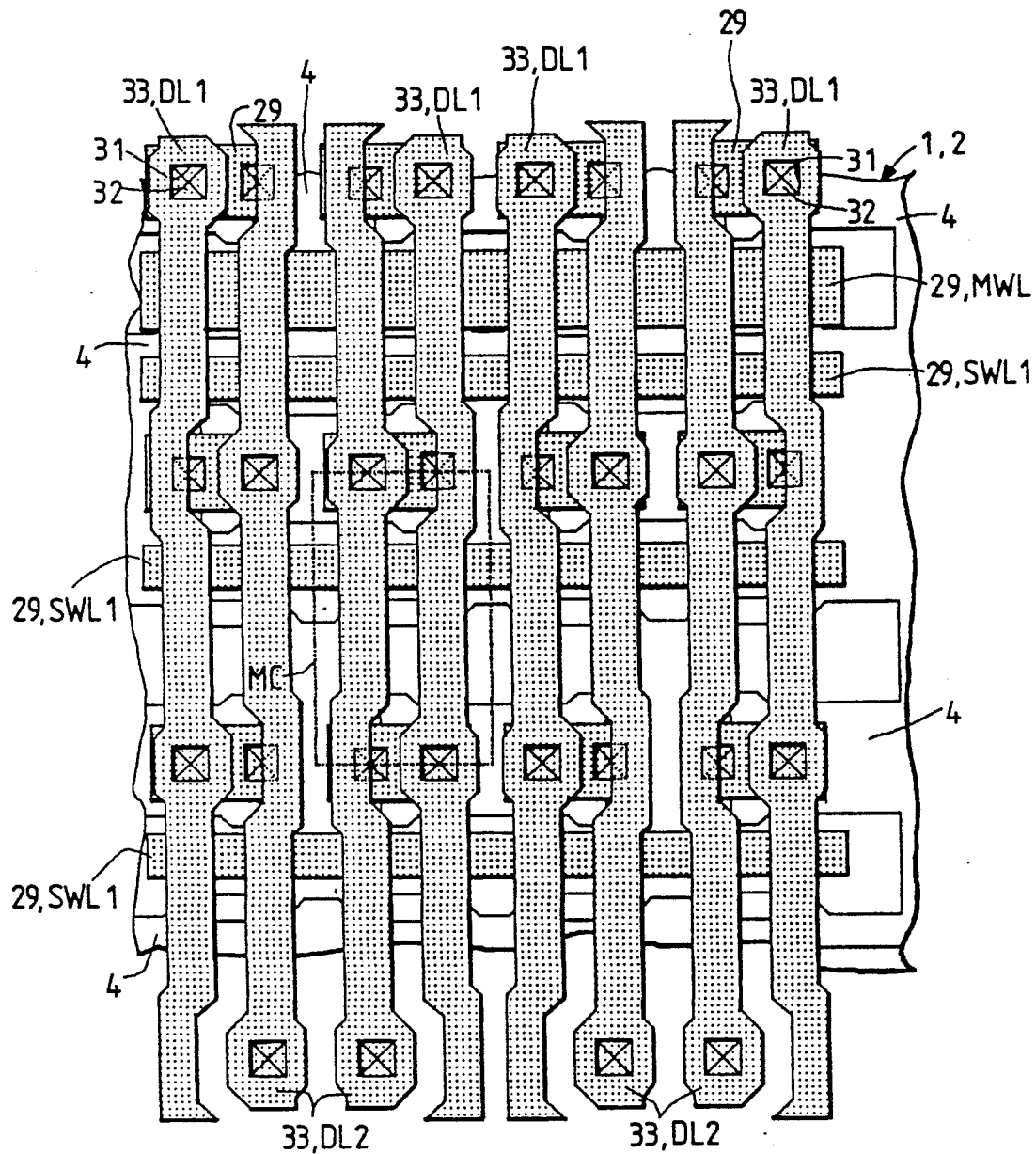

The complementary data line 33 is extended in the row direction over the memory cell MC, as shown in FIGS. 8 and 20. One first data line (DL1) 33 of the complementary data lines 33 is extended in the row direction over the drive MISFET Qd1, the transfer MISFET Qt2 and the load MISFET Qp2 of the memory cell MC. The other second data line (DL2) 33 is extended in the row direction over the drive MISFET Qd2, the transfer MISFET Qt1 and the load MISFET Qp1 of the memory cell MC. In short, the first data line 33 and second data line 33 of the complementary data lines 33 are extended in the row direction at a spacing from and generally in parallel with each other.

In the memory cell MC, as shown in FIGS. 8 and 20, the plane shapes of the complementary data lines 33 of the memory cells MC arrayed in the column direction are arranged symmetrically with respect to the axis Y1-Y3 or Y2-Y4. The plane shapes of the complementary data lines 33 of the memory cells MC arrayed in the row direction are arranged symmetrically with respect to the axis X1-X2 or X3-X4.

(B-10): In the SRAM 1 having its memory cell MC composed of the transfer MISFETs Qt, over which are extended the complementary data lines (DL) 33 to be connected with the other semiconductor region (18) of the transfer MISFET Qt, the first one data line (DL1) 33 of the complementary data lines 33 extended over the other transfer MISFET Qt2 is connected through the intermediate conductive layer 29 with the other semiconductor region (18) of the one transfer MISFET Qt1 of the memory cell MC, and the other second data line (DL2) 33 of the complementary data lines 33 extending over the one transfer MISFET Qt1 is connected through the intermediate conductive layer 29 with the other semiconductor region of the other transfer MISFET Qt2. Thanks to this structure, the array of the transfer MISFET Qt of the memory cell MC and the array of the complementary data line are reversed, and the intermediate conductive layer 33 is extended to an extent corresponding to the reversed distance thereby to elongate the connection distance between the other semiconductor region of the transfer MISFET Qt and the complementary data line 33. As a result, the mutual diffusion between the silicon of the other semiconductor region of the transfer MISFET Qt and the metal (e.g., the Al of the aluminum alloy film 33B) of the complementary data line 33 can be prevented to improve the electric reliability of the SRAM 1 such as the prevention of the alloy spike.

(B-11): The complementary data lines 33 of the aforementioned structure (B-10) are formed of the laminated structure of the barrier metal film (of TiW, for example) 33A and the aluminum alloy film 33B, and the intermediate conductive layer 29 is formed of the refractory metal film (W). Thanks to this structure, the aluminum alloy film 33B has a lower specific resistance than those of the other refractory metal film and the polycrystalline silicon film so that it can reduce the resistance of the complementary data line 33. As a result, the data transmission speed through the complementary data line 33 is accelerated to speed up the operations of the SRAM 1. At the same time, the refractory metal film of the intermediate conductive layer 29 has the barrier properties so that it can prevent the aforementioned alloy spike better.

Over the memory cell MC, as shown in FIGS. 8, 9, 14 and 20, there are arranged main word lines (MWL) 29 and sub-word lines (SWL1) 29. These main word lines (MWL) 29 and sub-ward lines (SWL1) 29 are formed of a conductive layer (i.e., a refractory metal film formed at the metal material forming step of the first layer) identical to that of the aforementioned intermediate conductive layer 29. In other words, the main word lines 29 and the sub-word lines 29 are formed in the layer between the word lines (WL) 13 and the complementary data lines 33. These main word lines 29 and the sub-word lines 29 are arranged between the intermediate conductive layer 29 connected with the transfer MISFET Qt1 of the memory cell MC and the intermediate conductive layer 29 connected with the transfer MISFET Qt2. The main word lines 29 and the sub-word lines 29 are extended in the column direction at a spacing from each other and generally in parallel with the memory cell array MAY.

As shown in FIGS. 1, 2 and 4, each main word line (MWL) 29 is arranged for the four (or 4 [bits]) memory cells MC which are arrayed in the row direction. Since this main word line (MWL) 29 is extended over the totally sixteen memory cell arrays MAY of the four memory blocks MB, it is formed to have a larger wiring width size than that of the sub-word line 29 with a view to reducing the resistance.

As shown in FIGS. 2 and 4, each sub-word line (SWL1) 29 is arranged for one of the memory cells MC which are arrayed in the row direction in the memory cell array MAY arranged in the memory block MB at the side close to the word decoder circuit WDEC. This sub-word line 29 is formed to have a smaller wiring width size than that of the main word line 29 because it is made as short as to extend over one memory cell array MAY and shorter than the main word line 29.

The main word line 29 and the sub-word line 29 are individually arranged by making use of the empty region (as large as to arranged two wiring lines), which is formed from the identical conductive layer shared between the reference voltage line (Vss) 13 to be connected with the memory cell MC and the word line (WL) 13 and extending the reference voltage line 13. In other words, the memory cell MC can extend in the column direction not only the word line (WL) 13 and the reference voltage line 13 but also the two word lines: the main word line 29 used by the divided word line system and the sub-word line 29 used by the double word line system.

(A-10): The first word line (WL1) 13 and the second word line WL2) 13 of the aforementioned structure (A-9) are formed of an identical conductive layer, and the main word line (MWL) 29, the first sub-word line (SWL1) 29 and the second sub-work line (SWL2) 29 are formed of an identical conductive layer different from that of the first word line 13 and the second word line 13 and are made of a material having a lower specific resistance than that of the first word line 13 and the second word line 13. Thanks to this structure, the three kinds of word lines, i.e., the main word line 29, the sub-word line 29 and the word line 13 are formed of the two-layered conductive layer so that the number of conductive layers can be reduced to simplify the multilayered wiring structure of the SRAM 1. At the same time, the individual specific resistances of the main word line 29 and the sub-word line 29 determining the operating speed are reduced to accelerate the individual charge and discharge rates so that the operating speed of the SRAM 1 can be accelerated.

(A-11): In the SRAM 1 having its memory cell MC arranged in a cross region between the word line 13 and the reference voltage line (Vss) 13 extended in one direction and the complementary data line 33 extended in a second direction crossing the first direction: the reference voltage line 13 is formed of the conductive layer identical to that of the word line (WL) 13; the first data line (DL1) 33 and the second data line (DL2) 33 of the complementary data line 33 are formed of the identical conductive layer which is different from that of the word line 13 and the reference voltage line 13; and the identical conductive layer between the word line 13 and reference voltage line 13 and the complementary data line 33 is formed with two word lines: the main word line (MWL) 29 extended in the first direction identical to that of the word line 13 and reference voltage line 13 and used by adopting the divided word line system: and the sub-word line (SWL) 29 used by adopting the double word line system. Thanks to this structure, the reference voltage line 13 is formed of the conductive layer identical to that of the word line 13 to establish such a vacant region in the conductive layer having the reference voltage line 13 extended therein as to extent at least two wiring lines. As a result, the degree of integration of the SRAM 1 can be improved to an extent corresponding to the occupied area for extending the two word lines, i.e., the main word line 29 and the sub-word line 29. In other words, the main word line 29 and the sub-ward line 29 can be extended in the memory cell array MAY without increasing the occupied area so that the divided word line system and the double word line system can be simultaneously adopted in the SRAM 1.

All over surface (excepting the region or external terminals BP) of the substrate including the complementary data lines 33 of the memory cell MC is formed with a final passivation (or protective) film 34. This final passivation film 34 is constructed, although not show in detail, of a three-layered structure which is formed by laminating a silicon oxide film, a silicon nitride film and a resin film sequentially.

The lower silicon oxide film of the final passivation film 34 is formed by the CVD method using tetra ethoxy silane (TEOS) gases as its source gases. In short, the lower silicon oxide film prevent formation of cavities in the overlying silicon nitride film. This intermediate silicon nitride film is formed by the plasma CVD method. This intermediate silicon nitride film has an action to enhance the moisture resistance. The upper resin film is formed of a polyimide region, for example. This resin film shields the α-rays, which are released from a radioactive element contained in a small quantity in the resin-sealed portion of the resin-sealed type semiconductor device, so that it can improve the α-ray soft error withstand voltage of the SRAM 1. Moreover, the resin film causes its filler contained in the resin-sealed portion to prevent any cracking in the interlayer film such as the final passivation film 34.

The peripheral circuit of the SRAM 1 is constructed of the CMOS, as shown in FIG. 21 (presenting a sectional diagram of the essential portion).

The n-channel MISFET Qn of this CMOS is formed over the principal surface of the active region of the p⁻-type well region 2 within the region which is defined by the element separating insulating film 4 and the p-channel stopper region 5. In short, the n-channel MISFET Qn is composed mainly of the p⁻-type well region 2, the gate insulating film 12, the gate electrode 13, the source region and the drain region. The gate electrode 13 is formed of the conductive layer identical to the gate electrode 13 of the transfer MISFET Qt of the aforementioned memory cell MC. The source region and the drain region are individually formed of the lightly doped n-type semiconductor region 17 and the heavily doped n⁺-type semiconductor region 18. In short, the n-channel MISFET Qn of the peripheral circuit is formed to have the LDD structure like the transfer MISFET Qt of the memory cell MC.

The n-channel MISFET Qn adopting the LDD structure can reduce the number of hot carriers, as has been described hereinbefore, so that it can prevent the aging fluctuations of the threshold voltage. Moreover, this n-channel MISFET Qn has its gate electrode 13 formed of a laminated conductive layer having a lower specific resistance than that of the polycrystalline silicon film such as the gate electrode 7 of the drive MISFET Qd, so that it can accelerate the operating speed.

The n⁺-type semiconductor region 18 forming the source region and drain region of the n-channel MISFET Qn is connected with a wiring line 29. This wiring line 29 is formed of the conductive layer identical to that of the intermediate conductive layer 29 arranged in the memory cell MC, the main word line 29 and the sub-word line 29. The wiring line 29 is connected with the n⁺-type semiconductor region 18 through the connection holes 28 which are formed in the inter-layer insulating films 27, 24 and 21. The wiring line 29 is further connected with an overlying wiring line 33 through the buried electrode 32 which is buried in the connection hole 31 formed in the inter-layer insulating film 30. The buried electrode 32 is formed of the conductive layer identical to that of the buried electrode 32 formed in the memory cell MC. The wiring line 33 is formed of the conductive layer identical to that of the complementary data line 33 arranged in the memory cell MC.

The p-channel MISFET Qp of the CMOS is formed over the principal surface of the active region of the n⁻-type well region 3 within the region which is defined by the element separating insulating film 4. In short, the p-channel MISFET Qp is composed mainly of the n⁻-type well region 3, the gate insulating film 12, the gate electrode 13, the source region and the drain region. The n⁻-type well region constitutes the channel forming region. The gate electrode 13 is formed, like the aforementioned n-channel MISFET Qn, of the conductive layer identical to that of the gate electrode 13 of the transfer MISFET Qt. The source region and the drain region are individually formed of the lightly doped p-type semiconductor region 19 and the heavily doped p⁺-type semiconductor region 20. The lightly doped p-type semiconductor region 19 is formed, like the n-channel MISFET Qn, between the heavily doped p⁺-type semiconductor region 20 and the channel forming region. In short, the p-channel MISFET Qp is constructed to have the LDD structure. Likewise, the p-channel MISFET Qp adopting the LDD structure can prevent the aging fluctuations of the threshold voltage. Moreover, the p-channel MISFET Qp can accelerate the operating speed because the gate electrode 13 has a low specific resistance.

The p⁺-type semiconductor region 20 forming the source region and drain region of the p-channel MISFET Qp is connected with the wiring line 29. This wiring line 29 is connected with the overlying wiring line 33 through the buried electrode 32.

The region of the CMOS of this peripheral circuit is formed with the final passivation film 34 like the region of the memory cell array MAY.

(D-3): In the SRAM having its memory cell MC composed of the transfer MISFET Qt to be controlled with a word line and the drive MISFET Qd and its peripheral circuit composed of the MISFET (or the CMOS in the present embodiment) for controlling the data writing, holding and reading operations of the memory cell MC, the gate electrode 13 of the transfer MISFET Qt and the word line 13 to be connected with the former are made of a material having a lower specific resistance than that of the gate electrode 7 of the drive MISFET Qd, and the MISFETs (Qn and Qp) of the peripheral circuit have their gate electrodes 13 made of the conductive layer identical to that of the gate electrode 13 of the transfer MISFET Qt. Thanks to this structure, the resistances of the gate electrode 13 of the transfer MISFET Qt of the memory cell MC and the word line 13 can be reduced to speed up the data writing and reading operations of the memory cell MC so that the operating speed of the SRAM 1 can be accelerated. At the same time, the resistances of the gate electrodes 13 of the MISFETs (Qn and Qp) of the peripheral circuit can be reduced to accelerate the operating speed of the MISFETs (Qn and Qp) thereby to accelerate the operating speed of the SRAM 1.

As shown in FIG. 6, the clamping MISFET Qn1 of the electrostatic breakdown preventing circuit 1, which is arranged between the input stage circuit II of the peripheral circuit of the external terminals BP, is constructed to have the structure identical to that of the drive MISFET Qd of the memory cell MC, although not specifically in section. In short, the clamping MISFET Qn1 is composed of the p⁻-type well region 2, the gate insulating film 6, the gate electrode the source region and the drain region. These source region and drain region are individually formed of the lightly doped n-type semiconductor region 10 and the heavily doped n⁺-type semiconductor region 11. In other words, the clamping MISFET Qn1 is constructed to have the double diffusion drain (i.e., DDD) structure.

As has been described hereinbefore, the SRAM 1 adopts the n-channel MISFETs of the two kinds of structures in the memory cell MC: the LDD structure in the transfer MISFET Qt; and the double diffusion drain (DDD) structure in the drive MISFET Qd. Of these two kinds of n-channel MISFETs, the n-channel MISFET Qn of the peripheral circuit adopts the LDD structure with a view to accelerating the operating speed and preventing the fluctuations of the threshold voltage. On the other hand, the clamping MISFET Qn1 of the electrostatic breakdown preventing circuit I adopts the double diffusion drain structure of the two kinds of structures with a view to improving the electrostatic breakdown voltage. In the present embodiment, the electrostatic breakdown voltage of the n-channel MISFET Qn of the peripheral circuit adopting the LDD structure is about 30 [V]. On the other hand, the electrostatic breakdown voltage of the clamping MISFET Qn1 of the electrostatic breakdown preventing circuit I adopting the double diffusion drain structure is about 150 [V].

The protective resistance element R of the electrostatic breakdown preventing circuit I is constructed of the conductive layer 13 which is formed at the gate material forming step of the second layer, although not shown. As has been described hereinbefore, the conductive layer 13 is formed of the laminated structure of the polycrystalline silicon film 13A and the refractory metal silicide film 13B and has a thicker film than those of other gate materials so that it can increase the current capacity of the protective resistance element R. In other words, the protective resistance film R is hardly cut even in case an excessive current flows therethrough.

Moreover, the protective resistance element R can also be formed of the thick third layer of the four gate layers (7, 13, 23 and 26). Still moreover, the protective resistance element R may also be formed of a laminated structure which is prepared by laminating two or more of the aforementioned four gate layers. Furthermore, the protective resistance element R may also be formed as the so-called "diffusion layer resistance element" having the structure identical to either the source or drain region of the clamping MISFET Qn1 or the n-channel MISFET Qn.

As shown in FIG. 7, the clamping MISFETs Qn4 and Qn5 of the electrostatic breakdown preventing circuit III, which is arranged between the output stage circuit IV of the peripheral circuit and the external terminals BP, are individually constructed to have the double diffusion drain (DDD) structure like the electrostatic breakdown preventing circuit I. These clamping MISFETs Qn4 and Qn5 adopting the double diffusion drain structure can improve the electrostatic breakdown voltage.

The bipolar transistor BiT of the electrostatic breakdown preventing circuit III is formed into the npn type, as has been described hereinbefore. This bipolar transistor BiT has its n-type emitter region formed of the n⁺-type semiconductor region 18 or the source region and drain region of the transfer MISFET Qt. On the other hand, the n-type emitter region is formed of the n⁺-type semiconductor region 11 or the source region and drain region of the drive MISFET Qd. The p-type base region is formed of the p⁻-type well region 2. The n-type collector region is formed of the n⁻-type semiconductor substrate 1. In other words, the bipolar transistor BiT can be formed by the fabrication process identical to the n-channel MISFET Qn.

Each of the output n-channel MISFETs Qn2 and Qn3 of the output stage circuit IV is constructed to have the double diffusion drain structure like each of the electrostatic breakage preventing circuits I and III. These output n-channel MISFETs Qn2 and Qn3 adopting the double diffusion drain structure can improve the electrostatic breakdown voltage. Likewise, the n-channel MISFET Qn6 of the output stage circuit IV is constructed to have the double diffusion drain structure. The MISFET Qn adopting the double diffusion drain structure is indicated, as enclosed by broken lines at the input stage side in FIG. 6 and at the output stage side in FIG. 7.

(D-1): In the SRAM 1 wherein the electrostatic breakdown preventing circuit (I or III) composed of the clamping MISFET Qn (Qn1, or Qn4 and Qn5) is arranged between the external terminal BP and the input-/output circuit (II or IV) composed of the MISFETs (Qn and Qp) and wherein the memory cell MC is composed of the drive MISFET Qd and the transfer MISFET Qt: the transfer MISFET Qt of the memory cell MC is constructed to have the LDD structure; the drive MISFET Qd is constructed to have the double diffusion drain structure; and either the drain region (or the source region) to be connected directly with the external terminal BP of the clamping MISFET Qn of the electrostatic breakdown preventing circuit (I or III) or the drain region (or the source region of Qn3) of the output n-channel MISFET Qn2 of the output stage circuit IV is constructed to have the double diffusion drain structure. Thanks to this structure, like the aforementioned structure (B-5), the mutual conductance of the drive MISFET Qd of the memory cell MC can be made higher than that of the transfer MISFET Qt to increase the effective $\beta$ ratio. As a result, the occupied area of the drive MISFET Qd can be reduced to reduce the occupied area of the memory cell MC thereby to improve the degree of integration of the SRAM 1. At the same time, the pn junction withstand voltage at the drain region of the MISFET Qn of the electrostatic breakdown preventing circuit (I or III) can be made higher than that of the LDD structure so that the electrostatic breakdown voltage of the electrostatic breakdown preventing circuit (I or III) can be raised to prevent the electrostatic breakdown of the SRAM 1. Moreover, the effective $\beta$ ratio of the memory cell MC can be increased to improve the stability of the data stored in the data storage node region of the memory cell MC. As a result, the malfunctions of the memory cell MC can be reduced to improve the operational reliability of the SRAM 1.

(D-4): The transfer MISFET Qt of the memory cell MC of the aforementioned structure (D-3) and the MISFETs (Qn and Qp) of the peripheral circuit are constructed to have the LDD structure, and the drive MISFET Qd of the memory cell MC is constructed to have the double diffusion drain structure. Thanks to this structure, in addition to the effect of the aforementioned structure (D-1), the MISFETs (Qn and Qp) having the LDD structure of the peripheral circuit can make the intensity of the electric field in the vicinity of the drain region weaker than that of the drive MISFET Qd having the double diffusion drain structure so that they can reduce the number of hot carriers. As a result, the aging fluctuations of the threshold voltage of the MISFETs of the peripheral circuit can be reduced to improve the electric reliability of the SRAM 1.

Figure 22:
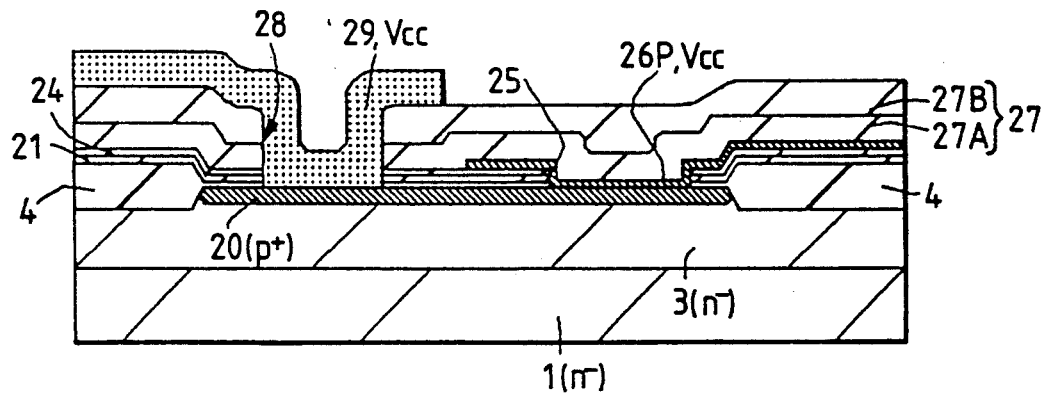

The power supply voltage line (Vcc) 26P, as shown in FIGS. 8, 9, 13 and 19, is connected in the region of the peripheral circuit with the power supply wiring line 33. The power supply voltage line 26P is arranged over the memory cell MC and extended in the column direction in the memory cell array MAY so that it is connected with the power supply voltage wiring line 33 in the region of the X-decoder circuit XDEC shown in FIG. 1. This connection structure is shown in FIG. 22 (presenting a sectional diagram of the essential portion.

The end portion of the power supply voltage line 26P extending in the column direction in the memory cell array MAY and the power supply voltage wiring line 33 are connected with each other through a p$^+$-type semiconductor region 20 and the power supply intermediate wiring line 29. The connection between the power supply voltage line 26P and one end of the p$^+$-type semiconductor region 20 are achieved through the connection holes 25 which are formed in the interlayer insulating films 21 and 24. The other end of the p$^+$-type semiconductor region 20 connected with the power supply voltage line 26P is connected with the power supply intermediate wiring line 29 through the connection hole 28 which is formed in the inter-layer insulating film 27 and so on. This power supply intermediate wiring line 29 is connected with the overlying power supply voltage wiring line 33 through the connection hole 31 which is formed in the inter-layer insulating film 30. In short, the power supply voltage line 26P is once connected with the underlying p$^+$-type semiconductor region 20 and is extracted to the region other than the connected portion by the p$^+$-type semiconductor region 20. This p$^+$-type semiconductor region 20 of the extracted region is connected with the power supply intermediate wiring line 29, through which the power supply voltage line 26P is connected with the power supply voltage wiring line 33. The p$^+$-type semiconductor region 20 has such a conduction type as will not form the pn junction in the connection with the power supply voltage line 26P (i.e., the polycrystalline silicon film doped with the p-type impurity). The p$^+$-type semiconductor region 20 is formed the conductive layer identical to that of the p$^+$-type semiconductor region 20 of each of the source region and drain region of the p-channel MISFET Qp of the peripheral circuit. The power supply intermediate wiring line 29 is formed of the conductive layer identical to that of the intermediate conductive layer 29 arranged in the memory cell MC, the main word line 29, the sub-word line 29 and the wiring line 29 of the peripheral circuit. The power supply voltage wiring line 33 is a major power supply trunk for supplying the power supply voltage Vcc to each of the peripheral circuits or the memory block LMB from the external terminal BP, although not shown. The power supply voltage wiring line 33 is formed of the conductive layer identical to that of the complementary data line 33 extending in the memory cell array MAY and the wiring line 33 of the peripheral circuit.

The power supply voltage line 26P is formed of the conductive layer identical to that of the n-channel forming region 26N of the load MISFET Qp of the memory cell MC, as has been described herein-before, and is made thin because it reduces the leakage current at the n-channel forming region 26N. In short, according to this connection structure, the connection hole 28 to be formed in the inter-layer insulating film 27 is formed over the region of the power supply voltage line 26P. In case the power supply intermediate conductive layer 29 is connected directly with the power supply voltage line 26P through that connection hole 28, it is possible to prevent the power supply voltage line 26P from coming out at the time of (dry) etching for forming the connection hole 28. In case the power supply voltage line 26P comes out, the connection area between it and the power supply intermediate conductive layer 29 is drastically reduced to augment the resistance, or connection failures arise between the power supply voltage line 26P and the power supply intermediate conductive layer 29.

Next, the specific fabrication method of the aforementioned SRAM 1 will be briefly described with reference to FIGS. 23 to 32 (presenting sectional diagrams of the essential portion of the memory cell MC at the individual fabrication steps).

[Well Forming Step]

First of all, the n$^-$-type semiconductor substrate 1 of single crystal silicon is prepared.

Next, the n$^-$-type semiconductor substrate 1 is formed over its principal surface with the silicon oxide film. This silicon oxide film is formed by the thermal oxidation, for example, to have a thickness of about 40 to 50 [nm].

Next, in the n$^-$-type semiconductor substrate 1, the p$^-$-type well region forming region is formed over its principal surface with the silicon nitride film through the aforementioned silicon oxide film. The silicon nitride film thus formed is used as the impurity introducing mask and the oxidation resisting mask. The silicon nitride film is deposited by the CVD (i.e., chemical vapor deposition) method to have a thickness of about 40 to 60 [nm]. After this deposition, the silicon nitride film is finished by patterning it by the photolithography technology.

Next, the silicon nitride film is used as the impurity introduction mask to dope the principal surface of the region of the n⁻-type semiconductor substrate 1 for forming the n⁻-type well region with an n-type impurity. This n-type impurity is exemplified by phosphor (P). This phosphor P is introduced to have a concentration of about $10^{13}$ [atoms/cm$^2$] by the ion implantation using an energy of about 120 to 130 [KeV]. The P is introduced into the principal surface of the n⁻-type semiconductor substrate 1 through the aforementioned silicon oxide film.

Next, the silicon oxide film, which is formed over the principal surface of the region of the n⁻-type semiconductor substrate 1 forming the n⁻-type well region, is grown. This growth of the silicon oxide film is performed by the thermal oxidation using the aforementioned silicon nitride film as the oxidation resisting mask. The silicon oxide film film is grown to have a thickness of about 130 to 140 [nm].

Next, the silicon nitride film is removed. And, the grown silicon oxide film is used as the impurity introduction mask to introduce a p-type impurity into the principal surface of the n⁻-type semiconductor substrate 1 forming the p-type well region. This p-type impurity used is exemplified by BF$_2$. This BF$_2$ is introduced to have a concentration of about $10^{12}$ to $10^{13}$ [atoms/cm$^2$] by the ion implantation using an energy of about 60 [KeV]. The BF$_2$ is introduced into the principal surface of the n⁻-type semiconductor substrate 1 through the aforementioned silicon oxide film.

Next, the p-type impurity and n-type impurity thus introduced into the principal surface of the n⁻-type semiconductor substrate 1 are individually extended and diffused to form the p⁻-type well region 2 with the p-type impurity and the n⁻-type well region 3 with the n-type impurity. The extended diffusions of the impurities are performed at a temperature of 1200° C., for example, for about 100 to 180 [min.]. The n⁻-type semiconductor substrate 1 having the twin well structure is finished by forming those p⁻-type well region 2 and the n⁻-type well region 3.

Step of Forming Element Separating Region

Next, the silicon oxide films are individually removed from the principal surface of the p⁻-type well region 2 of the n⁻-type semiconductor substrate 1 and the principal surface of the n⁻-type well region 3.

Next, new silicon oxide films are formed over the individual principal surfaces of the p⁻-type well region 2 and the n⁻-type well region 3. The silicon oxide film is formed by the thermal oxidation to have a thickness of about 10 to 15 [nm], for example.

Next, the regions of the p⁻-type well region 2 and the n⁻-type well region 3 forming the active regions are formed over their principal surfaces with the silicon nitride film. This silicon nitride film is used as the impurity introduction mask and the oxidation resisting mask. The silicon nitride film is deposited by the CVD method, for example, to have a thickness of about 100 to 150 [nm]. After this deposition, the silicon nitride film is finished by patterning it by the photolithography technology. At this patterning, i.e., at the time of etching off the silicon nitride film, this film is vertically etched to expose the inactive region to the outside. In this exposed inactive region, a new silicon oxide film is formed because the former silicon oxide film is removed wholly or partially from the inactive region. The new silicon oxide film is formed by the thermal oxidation, for example, to have a thickness of about 12 to 14 [nm]. The formation of this new silicon oxide film is intended to eliminate the etching damage at the time of the patterning and to prevent any contamination at the time of introducing the impurity.

In the forming region of the memory cell array MAY, the plane shape of the silicon nitride film is formed to have a ring shape (as dotted solid) corresponding to the plane shape of the active region shown in FIG. 15. In short, the plane shape of the silicon nitride film is formed to connect the totally eight MISFETs in series: the transfer MISFETs Qt and the drive MISFETs Qd of the four memory cells MC. In other words, the silicon nitride film has not any terminal end in the direction of extending the pattern but a ring shape of closing the pattern. This ringshaped silicon nitride film is staggered in the memory cell array MAY.

At the trailing end of the memory cell array MAY, moreover, the plane shape of the silicon nitride film is formed into a half ring, as shown in FIG. 15, to have the excess size L. At the terminal end of the memory cell array MAY, i.e., at the corner of the memory cell array MAY, the plane shape of the silicon nitride film is one quarter of the ring shape, i.e., the shape of letter "L", which is the plane shape of the active region of the transfer MISFET Qt and the drive MISFET Qd of the memory cell MC. This quarter ring shape of the silicon nitride film has two additional excess sizes L because it has a terminal end in any pattern extending direction.

Next, the silicon nitride film is used as the impurity introduction mask to dope the region of the p⁻-type well region 2 forming the inactive region (i.e., the element separating region) with a p-type impurity. The p-type impurity used is exemplified by BF$_2$. This BF$_2$ is introduced in a concentration of about $10^{12}$ to $10^{13}$ [atoms/cm$^2$] by the ion implantation using an energy of about 40 [KeV]. The BF$_2$ is introduced into the principal surface of the p⁻-type well region 2 through the aforementioned silicon oxide film.

Next, the aforementioned silicon nitride film is used as the oxidation resisting mask to grow the silicon oxide film film over the principal surfaces of the individual inactive regions of the p⁻-type well region 2 and the n⁻-type well region 3 thereby to form the element separating insulating film 4. This element separating insulating film 4 is formed of the silicon oxide film which is prepared by the thermal oxidation (or the selective thermal oxidation) to have a thickness of about 400 to 500 [nm].

In the memory cell array MAY, as has been described hereinbefore, the silicon nitride film to be used as the oxidation resisting mask for forming the element separating insulating film 4 has a ring shape in a top plan view. The boundary region at the inner frame and outer frame sides, i.e., between the active region and the inactive region of the silicon nitride film is supplied with oxygen at their principal surfaces of the active region of the p⁻-type well region 2 from the gap between the silicon nitride film and the p⁻-type well region 2. As a result, the silicon oxide film below the silicon nitride film grows to cause the so-called "bird's beak" at the end of the element separating insulating film 4. In the direction of extending the ring-shaped pattern of the silicon nitride film, on the contrary, the pattern has no trailing end and is closed. As a result, no oxygen is supplied to neither form the element separating insulating film 4 nor cause the bird' beak. In the boundary region between the active region and the inactive region, moreover, the pattern of the silicon nitride film is ring-shaped to make the bird's beak shorter than that of the case in which the pattern has a trailing end.

At the trailing end of the memory cell array MAY, on the other hand, the silicon nitride film to be used as the oxidation resisting mask for forming the element separating insulating film 4 is formed into the shape of a half ring having the excess size L. Since the boundary region between the inner frame and outer frame sides of the half ring of the silicon nitride film is supplied with oxygen, the silicon oxide film below the silicon nitride film grows to cause the bird's beak at the end of the element separating insulating film 4. Likewise, the trailing end (i.e., the outermost end of the memory cell array MAY, as indicated by dotted lines E) in the direction to extend the pattern of the half ring of the silicon nitride film is supplied with oxygen like the inner and outer frame sides, so that the element separating insulating film 4 is formed with the bird's beak. In case of the bird's beak caused, the plane shape of the active region of the memory cell MC located at the trailing end of the memory cell array MAY is shrunk to an extend corresponding to the caused bird's beak from the plane shape of the active region of the memory cell MC located at the central portion of the memory cell array MAY. Because of the formation of the excess size L, however, the shrinkage is resultantly offset. In other words, the excess size L is set equal to or more than the size of the bird's beak. Since, moreover, the plane shape of the active region of the memory cell MC located at the trailing end, i.e., the corner of the memory cell array MAY is formed with the excess size L, as has been described hereinbefore, it is made similar to that of the active region of the memory cell MC located at the central portion of the memory cell array MAY.

By the heat treatment step of forming the element separating insulating film 4, the p-type impurity introduced into the inactive region is extended and diffused to form the p-type channel stopper region 5.

(C-26): The process for fabricating the SRAM 1 having its memory cell MC composed of the transfer MISFET Qt and the drive MISFET Qd and formed over the principal surface in the active region defined by the element separating insulating film 4 formed in the inactive region of the p$^-$-type well region (or the substrate), comprises: the step of arraying the plurality of oxidation resisting masks (or the silicon nitride films) having the ring-shaped plane separately of one another and regularly over the principal surface of the p$^-$-type well region 2 to be formed with the active region; and the step of forming the element separating insulating film 4 over the principal surface of the p$^-$-type well region 2 for the inactive region by the selective oxidation method using the oxidation resisting masks. Thanks to this structure, the oxidation resisting mask having its planar shape formed into the ring has its boundary region between the active and inactive regions formed the inside and outside of the ring-shaped frame facing each other. In this boundary region, the occupied area of the active region is reduced on the basis of the bird's beak when the element separating insulating film 4 is to be formed by the selective oxidation method. However, the pattern is closed or has no terminal end in the direction in which the pattern other than the inside and outside of the ring-shaped frame of the oxidation resisting mask is extended, so that the boundary region does not exist. As a result, the decrease in the occupied area of the active region on the basis of the bird's beak can be reduced to reduce the size transformation of the pattern of the active region in the fabrication process of the SRAM 1 to an extent corresponding to that reduction. The reduction in the pattern size transformation makes the fine working possible to improve the degree of integration of the SRAM 1.

(C-27): The oxidation resisting masks of the aforementioned structure (C-26) are arrayed in the memory cell array MAY, over the principal surface of the p$^-$-type well region 2 for the active region at a spacing from each other and at an identical pitch in a first direction such that they are in a subsequent array in a second direction crossing the first direction at a spacing from each other, at an identical pitch in the first direction and at a displacement of one half pitch from the previous array. Thanks to this structure, the array of the oxidation resisting masks is staggered so that the gap sizes between the adjacent oxidation resisting masks in each of the first and second directions can be equalized and minimized to enhance the array density of the oxidation resisting masks. In other words, the occupied area of the element separating insulating film 4 or the area between the oxidation resisting masks can be reduced to improve the degree of integration of the SRAM 1.

(C-28): The memory cell MC of the aforementioned structure (C-27) is composed of the two transfer MISFETs Qt and the two drive MISFETs Qd, and the ring shape of the oxidation resisting masks (or the silicon nitride film) has totally four memory cells MC: two memory cells MC adjacent in the first direction and two memory cells MC adjacent in the second direction, in which the totally four transfer MISFETs Qt and the totally four drive MISFETs Qt each for each of the four memory cells MC are connected in series. Thanks to this structure, of the totally four memory cells MC adjoining in the first and second directions, one semiconductor region of each of the totally eight MISFETs, i.e,. the four transfer MISFETs Qt and the four drive MISFETs Qd can be made integral with the other semiconductor region of another MISFET and can be used together. As a result, the occupied area of the memory cell MC can be reduced to an extent corresponding to the semiconductor region used together, to improve the degree of integration of the SRAM 1.

(C-29): Of the oxidation resisting masks of the aforementioned structures (C-26) to (C-28) arrayed regularly, the oxidation resisting masks (or the silicon nitride film) arranged at the terminal end of the memory cell array MAY are formed of a portion of the ring formed on the basis of the layout rule (as shown by the dotted lines E in FIG. 15), whereas the oxidation resisting masks arranged at the terminal end are formed such that the boundary region from the inactive region in the direction of extending the ring-shaped pattern is made larger (to provide the excess size L) than the size corresponding to the bird's beak. Thanks to this structure, a spare size is left in advance in the oxidation resisting masks arrayed at the trailing end of the memory cell array MAY. In the fabrication process of the SRAM 1, therefore, the difference in the size transformations of the patterns between the active region at the central portion of the memory cell array MAY and the active regions at the trailing end of the memory cell array MAY can be reduced. In short, in the memory cell array MAY (including the central portion and the trailing ends), the electric characteristics of the memory cell MC can be uniformalized to improve the electric reliability of the SRAM 1.

After the element separating insulating film 4 and the p-type channel stopper region 5 have been removed, the silicon nitride film used as the oxidation resisting mask is removed.

Step of Forming First Gate Insulating Film

Next, the p⁻-type well region 2 and the n⁻-type well region 3 have their individual active regions cleared of the silicon oxide film from the principal surfaces. By this step of removing the silicon oxide film, the individual active regions of the p⁻-type well region 2 and the n⁻-type well region 3 have their principal surfaces exposed to the outside.

Next, a new silicon oxide film is formed over the principal surfaces of the individual active regions of the p⁻-type well region 2 and the n⁻-type well region 3. This silicon oxide film is formed mainly to prevent the contamination at the time of introducing the impurity and to eliminate the so-called "white ribbon" of the silicon nitride film at the end of the element separating insulating film 4, which can hardly be removed at the time of removing the aforementioned silicon nitride film. The silicon nitride film is formed by the thermal oxidation, for example, to have a thickness of about 18 to 20 [nm].

Next, the principal surfaces of the individual active regions of the p⁻-type well region 2 and the n⁻-type well region 3 are doped with an impurity for adjusting the threshold voltage. This impurity used for adjusting the threshold voltage is exemplified by a p-type impurity such as $BF_2$. This $BF_2$ is introduced in a concentration of about $2 \times 10^{12}$ to $3 \times 10^{12}$ [atom/cm$^2$] by the ion implantation using an energy of about 40 to 50 [KeV]. The $BF_2$ is introduced through the aforementioned silicon oxide film into the individual principal surfaces of the p⁻-type semiconductor substrate 2 and the n⁻-type well region 3.

Next, the p⁻-type well region 2 and the n⁻-type well region 3 have their individual active regions cleared of the silicon oxide film from the principal surfaces, to expose the individual active regions of the p⁻-type well region 2 and the n⁻-type well region 3 to the outside. After this, as shown in FIG. 23, the individual active regions of the p⁻-type well region 2 and the n⁻-type well region 3 have their principal surfaces formed with the gate insulating film 6. This gate insulating film 6 is formed to have a thickness of about 13 to 14 [nm] by the thermal oxidation. The gate insulating film 6 is used as the gate insulating film of the drive MISFET Qd and each of the MISFETs Qn of the electrostatic breakdown preventing circuits I and III and the output stage circuit IV.

Step of Forming First-Layered Gate Material

Next, the polycrystalline silicon film 7 is deposited all over the substrate including the gate insulating film 6. The polycrystalline silicon film 7 is formed at the gate material forming step of the first layer. The polycrystalline silicon film 7 is deposited by the CVD method and is formed of the so-called "doped polysilicon" which is doped with an impurity for reducing the resistance. The polycrystalline silicon film 7 is deposited by the CVD method using disilane ($Si_2H_6$) and phosphine ($PH_3$) as its source gases. In the present embodiment, for example, the CVD method is carried out under the conditions of: about 80 [sccm] of $Si_2H_6$ and about 90 [sccm] of $PH_3$ containing about 1 [%] of nitrogen ($N_2$) gases as the carrier gases, a temperature of about 500 to 520 [°C.], and a pressure of 0.8 [torrs]. Under these conditions, the polycrystalline silicon film (of doped polysilicon) 7 is produced on the basis of the following reaction formulas <1> to <3>:

$$2Si_2H_6 \rightarrow 2SiH_4 + 2SiH_2^* \qquad <1>;$$

$$2PH_3 \rightarrow 2P^* + 3H_2 \qquad <2>;$$

and

$$2SiH_2^* + 2P^* \rightarrow 2Si(P) + 2H_2 \qquad <3>.$$

In case of the present invention, the polycrystalline silicon film 7 is doped with an n-type impurity such as phosphor (P) in a concentration of about $10^{20}$ to $10^{21}$ [atoms/cm$^2$]. Moreover, the polycrystalline silicon film 7 is formed to have a relatively small thickness of about 100 [nm] in case it is used as the gate electrode of the MISFET and the first electrode of the capacity element C.

Figure 33:
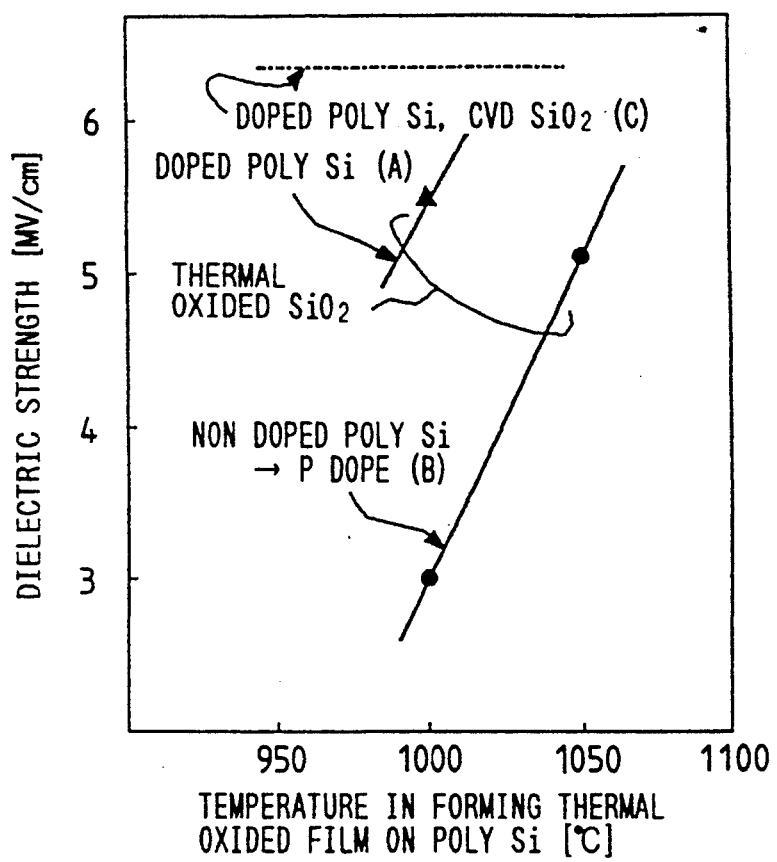
FIGS. 33 to 39 are graphs for explaining the effects of the present invention.

This polycrystalline silicon film 7 is used as the first electrode (7) of the capacity element, as has been described hereinbefore, and is formed thereover with the dielectric film (21). This dielectric film has its dielectric strength varied depending upon the method of forming the polycrystalline silicon film 7. FIG. 33 (presenting the dielectric strengths of insulating films prepared by different methods) plots the measured results of the dielectric strengths of the insulating films which are deposited over the polycrystalline silicon films deposited by two kinds of different methods. In FIG. 33, the abscissa indicates the temperature [°C.] for forming the thermal oxidized films to be formed over the polycrystalline silicon film. The ordinate indicates the dielectric strength [MV/cm] of the insulating film (or dielectric film). Data (A) indicates the dielectric strength of the silicon oxide film which is formed by the thermal oxidation over the polycrystalline silicon film (of doped poly-Si) deposited by the CVD method using the aforementioned $Si_2H_6$ as the source gases. Data (B) indicates the dielectric strength of the silicon oxide film which is formed by doping the polycrystalline silicon film (of non-doped poly-Si) deposited by the CVD method with P by the ion implantation and subsequently formed on the polycrystalline silicon film. Data (C) indicates the dielectric strength of the silicon oxide film which is deposited by the CVD method over the polycrystalline silicon film (of doped poly-Si) deposited by the CVD method using the $Si_2H_6$ as the source gases. The deposition temperature of the silicon oxide film deposited by the CVD method is about 800 [°C.].

In case the silicon oxide film is formed by the thermal oxidation at an equal production temperature, as seen from the results of measurement of FIG. 33, the silicon oxide film (A) deposited over the polycrystalline silicon film by the CVD method using the $Si_2H_6$ as the source gases has a higher dielectric strength than the silicon oxide film (B) formed over the polycrystalline silicon film doped with the P after the decosition. In case of the polycrystalline silicon film deposited by the CVD method using the $Si_2H_6$ as the source gases, the silicon oxide film (C) deposited by the CVD method has a higher dielectric strength than the silicon oxide film (A) formed by the thermal oxidation.

Figure 34:
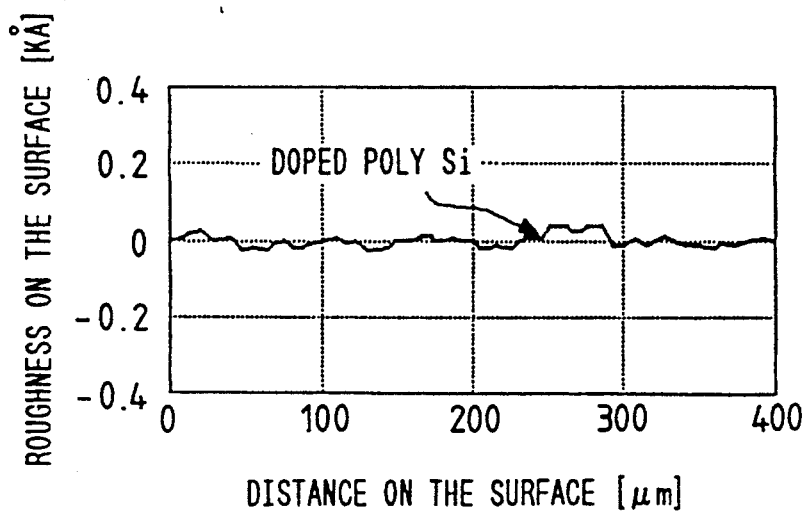
Figure 35:
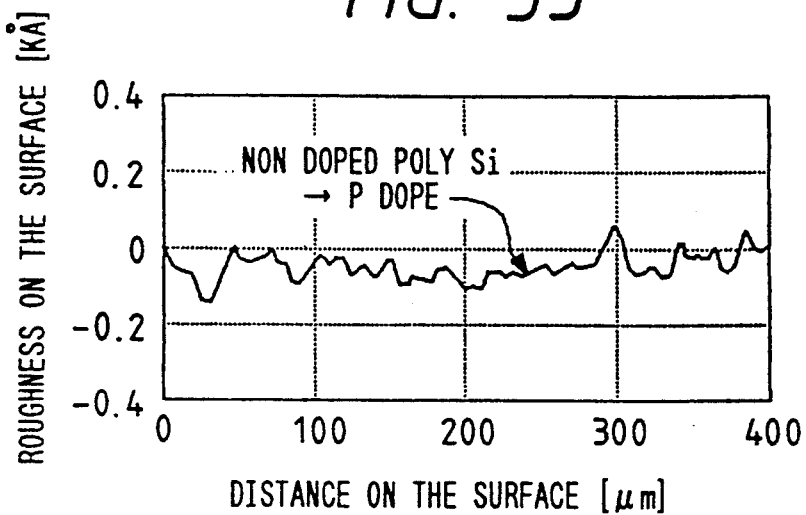

The aforementioned changes of the dielectric strength of the silicon oxide film are deduced to be based upon the surface state of the polycrystalline silicon film, as seen from the measurement results of FIGS. 34 and 35 (presenting the surface roughness of the polycrystalline silicone film). FIG. 34 plots the surface state of the polycrystalline silicon film which is deposited by the CVD method using the $Si_2H_6$ as the source gases. FIG. 35 plots the surface state of the polycrystalline silicon film which is doped with P after the deposition by the CVD method. In each of FIGS. 34 and 35, the abscissa indicates the distance [μm] on the surface of the polycrystalline silicon film, and the ordinate indicates the undulations (or roughness) [K Å] on the surface.

As seen from the measurement results of FIGS. 34 and 35, the surface of the polycrystalline silicon film, which is deposited by the CVD method using the $Si_2H_6$ as the source gases, has a higher flatness than the surface of the polycrystalline silicon film which is doped with the P after the deposition. Specifically, the polycrystalline silicon film, which is deposited by the CVD method using the $Si_2H_6$ as the source gases, has smaller undulations (or roughness) of the surface, as shown in FIG. 34, and can reduce the concentration of the electric field to improve the dielectric strength of the silicon oxide film formed over the polycrystalline silicon film by the thermal oxidation. In other words, the aforementioned capacity element C is enabled to improve the dielectric strength of the dielectric film by forming the first electrode (7) of the polycrystalline silicon film deposited by the CVD method using the $Si_2H_6$ as the source gases.

On the other hand, the silicon oxide film formed by the thermal oxidation contains crystal particles (or grains) having different plural crystal planes on the surface of the underlying polycrystalline silicon film, and has different growing rates on the individual crystal planes so that its thickness disperses. The silicon oxide film having dispersing thicknesses establishes, in case it is used as the dielectric film of the capacity element C, the concentration of electric field in the thin portion between the first electrode (7) and the second electrode (23) so that it has a lower dielectric strength than that of the silicon oxide film deposited by the CVD method, as shown in FIG. 33. In other words, the silicon oxide film deposited by the CVD method can be formed to have an uniform thickness along the ground shape over the polycrystalline silicon film so that it can reduce the concentration of the electric field, in case it is used as the dielectric film of the capacity element C, to improve the dielectric strength.

Figure 36:
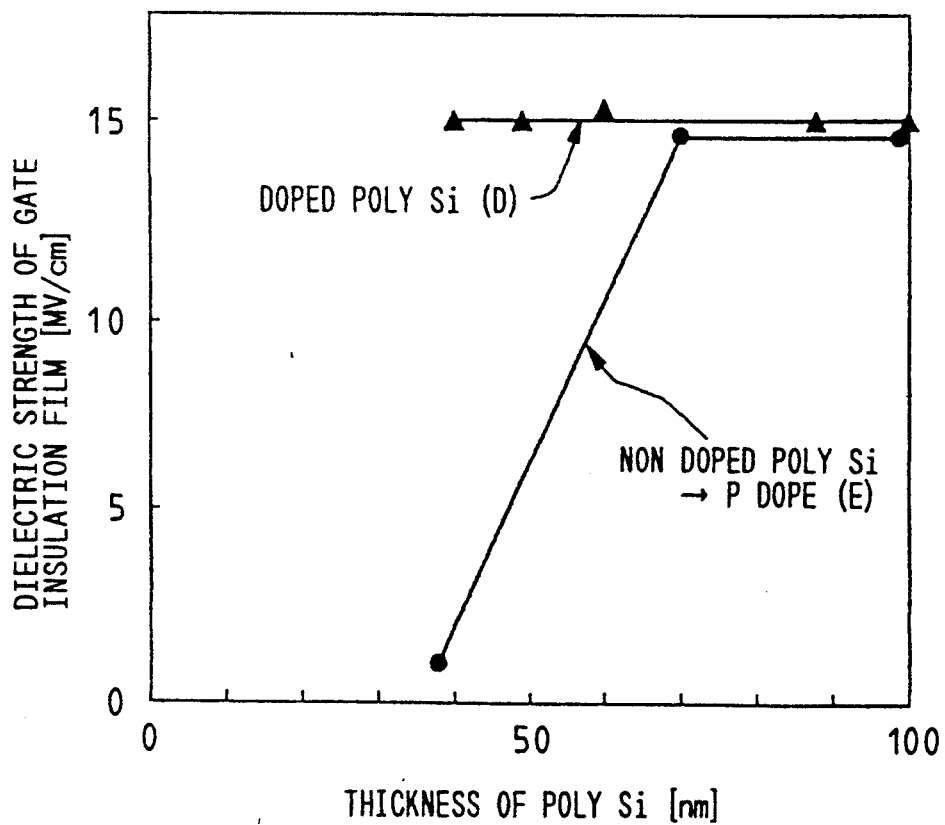

On the other hand, the polycrystalline silicon film changes the dielectric strength of the gate insulating film in dependence upon the forming method and the thickness of deposition, as shown in FIG. 36 (presenting the relation between the thickness of the polycrystalline silicon film and the dielectric strength of the gate insulating film). In FIG. 36, the abscissa indicates the thickness [nm] of the polycrystalline silicon film, and the ordinate indicates the dielectric strength [MV/cm] of the insulating film (i.e., the silicon oxide film: corresponds to the gate insulating film 6, for example) underlying the polycrystalline silicon film. Data (D) indicates the dielectric strength of the insulating film underlying the polycrystalline silicon film which is deposited by the CVD method using the $Si_2H_6$ as the source gases. Data (E) indicates the dielectric strength of the insulating film underlying the polycrystalline silicon film which is doped with the P after the deposition.

As indicated by the data (E) of FIG. 36, the insulating film underlying the polycrystalline silicon film doped with the P after the deposition has its dielectric strength not deteriorated, in case the polycrystalline silicon film has a thickness exceeding 70 [nm], but abruptly deteriorated in case the film thickness is no more than 70 [nm]. As indicated by the data (D), on the contrary, the insulating film underlying the polycrystalline silicon film (of doped polysilicon) deposited by the CVD method using the $Si_2H_6$ as the source gases has its dielectric strength hardly deteriorated even if the polycrystalline silicon film has a thickness no more than 70 [nm]. In other words, this polycrystalline silicon film is freed from having its underlying insulating film (e.g., the gate insulating film 6) deteriorated in the dielectric strength so that it can be formed to have a thickness as small as 70 [nm] or less. On the other hand, the polycrystalline silicon film has its surface flatness determined and deteriorated (to have irregular film thicknesses), if the thickness comes close to the size of the crystal particles, by the shape of the crystal particles so that it is liable to have breakage failures and unable to be used as the conductive layer. Thus, the polycrystalline silicon film is formed to have a thickness of about 10 [nm] or more.

Another process of doping the polycrystalline silicon film with an impurity is accomplished by forming phospho-silicate glass over the surface of the polycrystalline silicon film (of non-doped polysilicon) deposited by the CVD method and by coping the polycrystalline silicon film with the P contained in the phospho-silicate glass by the thermal diffusion. This impurity introduction method uses hydrofluoric acid for removing the aforementioned phospho-silicate glass film. The aforementioned polycrystalline silicon film deposited by the CVD method using the $Si_2H_6$ as the source gases abolishes the use of hydrofluoric acid for removing the phospho-silicate glass and can form a denser film than that of the polycrystalline silicon film deposited by another method so that it can prevent the deterioration of the dielectric strength of the underlying insulating film (e.g., the gate insulating film 6) due to the oozing of the hydrofluoric acid into the film.

For the reasoning thus far described, the polycrystalline silicon film 7 formed at the gate material forming step of the first layer can retain the dielectric strength of the upper or lower insulating film to an extent not to deteriorate the operating speed, in case it is used as the gate electrode of the MISFETs, so that it can be made as thin as about 100 [nm] to flatten the upper layer.

The polycrystalline silicon film 7 is subjected to a heat treatment after it has been formed at the gate material forming step of the first layer. This heat treatment is accomplished in the nitrogen ($N_2$) gases, for example, at a temperature of 700 to 950 [° C.] for about 8 to 12 [min.] to activate the P introduced into the polycrystalline silicon film 7 and to stabilize the film quality.

Next, an insulating film 8A is formed all over the substrate including the polycrystalline silicon film 7. This insulating film 8A is used mainly as the oxidation resisting mask at the thermal oxidation step for forming the gate insulating film (12) of the transfer MISFET Qt, as will be described hereinafter. The insulating film 8A is formed of the silicon nitride film deposited by the CVD method. This silicon nitride film is formed to have a thickness of 3 [nm] or more because it cannot be used as the oxidation preventing mask in case its thickness is less than 3 [nm]. On the other hand, the silicon nitride film is formed to have a thickness of 10 [nm] or less so as to suppress the growth of the step shape and to flatten the upper layer. In short, the silicon nitride film is formed to have a thickness of 3 to 10 [nm], e.g., 8 [nm] in the present embodiment.

Next, the insulating film 8 is formed all over the substrate including the insulating film 8A. The insulating film 8 electrically isolates the underlying polycrystalline silicon film 7 and the overlying conductive layer (13). The insulating film 8 is formed of the silicon oxide film which is deposited by the CVD method using inorganic silane ($SiH_4$ or $SiH_2Cl_2$) as the source gases and the nitrogen oxide ($N_2O$) gases as the carrier gases. The silicon oxide film is deposited at a temperature of about 800 [°C.]. The insulating film 8 is formed to have a thickness of about 120 to 140 [nm].

Next, the insulating films 8 and 8A and the polycrystalline silicon film 7 are sequentially patterned to form the gate electrode 7 of the polycrystalline silicon film 7, as shown in FIG. 24. The patterning is carried out by the photolithography technology using the anisotropic etching of the RIE, for example. The gate electrode 7 is constructed as the gate electrode of the drive MISFET Qd. Moreover, the gate electrode 7 is used as the gate electrode of each of the clamping MISFET Qn1 of the electrostatic breakdown preventing circuit I, the clamping MISFETs Qn4 and Qn5 of the electrostatic breakage preventing circuit III, the outputting n-channel MISFETs Qn2 and Qn3 of the output stage circuit IV, and the n-channel MISFET Qn6. [Step of Forming First Source Region and Drain Region]

Next, the gate electrode 7 and the insulating film 8 are formed on their side walls with the side wall spacer 9. This side spacer 9 is formed by depositing the silicon oxide film all over the substrate including the insulating film 8 and by etching the whole surface of the silicon oxide film to an extent corresponding to the deposited film thickness. The silicon oxide film is formed like before to have a thickness of 140 to 160 [nm], for example, by depositing the CVD method using inorganic silane gases as the source gases. The etching uses the anisotropic etching such as the RIE (i.e., Reactive Ion Etching).

Next, at the etching time of forming the side wall spacer 9, the individual active regions of the $p^-$-type well region 2 and the $n^-$-type well region 3 have their principal surfaces exposed to the outside at the regions other than those formed with the gate electrode 7 and the side wall spacer 9. As a result, the exposed regions are formed with the silicon oxide film (although not designated at reference numeral). This silicon oxide film is used mainly to prevent the contamination at the time of introducing the impurity and to prevent the damage of the principal surfaces of the active regions at the time of introducing the impurity. The silicon oxide film is formed to have a thickness of about 10 [nm] by the thermal oxidation, for example.

Next, an impurity introduction mask 40 is formed in the regions (expecting the region for forming the double diffusion drain structure) to be formed with the transfer MISFET Qt of the memory cell array MAY and the n-channel MISFET Qn and the p-channel MISFET Qp of the peripheral circuit. In the memory cell array MAY, the impurity introduction mask 40 is formed outside of the region which is enclosed by single-dotted lines, as designated at DDD in FIG. 10. The impurity introduction mask 40 is formed of a photo resist film which is formed by the photolithography technology, for example.

Next, the impurity introduction mask 40 is used to dope the principal surface of the $p^-$-type well region 2 with two kinds of n-type impurities in the region for forming the drive MISFET Qd of the memory cell array MAY. These two kinds of n-type impurities are also introduced at the identical fabrication step into the principal surface of the $p^-$-type well region 2 in the regions for forming the n-channel MISFETs Qn adopting the double diffusion drain structure of the electrostatic breakdown preventing circuits I and III and the output stage circuit IV. One of the n-type impurities used is exemplified by P, and the other used is exemplified by As having a lower diffusion rate than that of P. This P is introduced in a concentration of about $10^{14}$ [atoms/$cm^2$] by the ion implantation using an energy of about 30 [KeV]. The As is introduced in a concentration of about $10^{14}$ [atoms/$cm^2$] by the ion implantation using an energy of about 40 [KeV]. At the time of introducing the P and As, not only the impurity introduction mask 40 but also the side wall spacer formed on the side wall of the gate electrode 7 is used as the impurity introduction mask.

After the introduction of the P and As, the impurity introduction mask 40 is removed.

Figure 25:
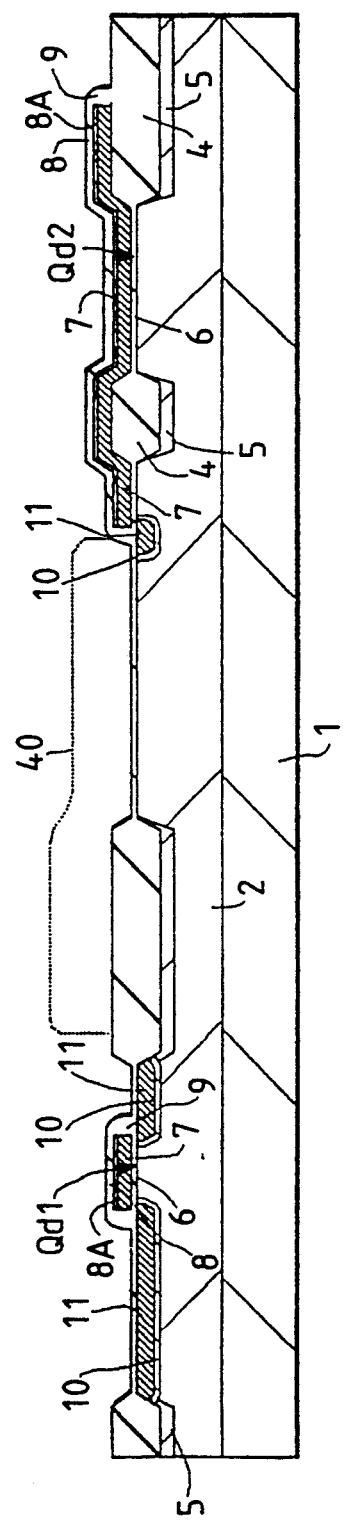

Next, the two kinds of n-type impurities P and As are individually extended diffused to form the n-type semiconductor region 10 lightly doped with P and the $n^+$-type semiconductor region 11 heavily doped with As, as shown in FIG. 25. These n-type semiconductor region 10 and $n^+$-type semiconductor region 11 form the double diffusion drain structure because their individual n-type impurities have different diffusion rates. These n-type semiconductor region 10 and $n^+$-type semiconductor region 11 individually use the side wall spacer 9 as the impurity introduction mask so that the diffusion to the channel forming region is determined by the side wall spacer 9 in the region for forming the drive MISFET Qd. In other words, the n-type semiconductor region 10 and the $n^+$-type semiconductor region 11 can individually reduce the diffusion to the channel forming region to an extend corresponding to the thickness of the side wall spacer 9, as compared with the case in which the gate electrode 7 is used as the impurity introduction mask. This reduction of the diffusion to the channel forming region can retain the effective gate length size (or channel length size) of the drive MISFET Qd to prevent the short channel effect of the drive MISFET Qd.

By the step of forming the n-type semiconductor region 10 and the $n^+$-type semiconductor region 11 individually, the drive MISFET Qd adopting the double diffusion drain structure of the memory cell MC is completed in the memory cell array MAY. By the identical fabrication step, moreover, the MISFETs Qn1 to Qn6 adopting the double diffusion drain structure of the electrostatic breakage preventing circuits I and III and the output stage circuit IV are completed.

(D-2): The process for fabricating the SRAM 1 comprising: the electrostatic breakdown preventing circuits (I and III) composed of the MISFETs (Qn1, Qn4 and Qn5) and arranged between the external terminal BP and the input/output circuits (II and III) composed of the MISFETs (INC, Qn2, Qn3, Qn6 and OUTC); and the memory cell MC composed of the drive MISFET Qd and the transfer MISFET Qt. The process comprises: the step of forming the drive MISFET Qd of the memory cell MC, the MISFETs (Qn1, Qn4 and Qn5) having the drain region (or the source region 10 or 11)

to be connected directly with the external terminals BP of the electrostatic breakdown circuits (I and III) or the MISFETs (Qn2, Qn3 and Qn6) having the drain region (or the source region 10 or 11) to be connected directly with the external terminal BP of the input/output circuit (IV); and the step of forming the transfer MISFET Qd of the memory cell MC. Thanks to this structure, the MISFETs (Qn1, Qn4 and Qn5) of the electrostatic breakdown preventing circuits (I and III) or the MISFETs (Qn2, Qn3 and Qn6) of the input/output circuit (IV) can be formed at the step identical to that of forming the drive MISFET Qd adopting the double diffusion drain structure of the memory cell MC. As a result, the number of steps of fabricating the SRAM 1 can be reduced to an extent corresponding to the step of forming the MISFETs of the electrostatic breakdown preventing circuits or the MISFETs of the input/output circuit.

Step of Forming Second Gate Insulating Film

Next, in the individual regions forming the transfer MISFET Qt of the memory cell array MAY and the n-channel MISFET Qn and the p-channel MISFET Qp of the peripheral circuit, the individual active regions of the p⁻-type well region 2 and the n⁻-type well region 3 have their principal surfaces doped with the threshold voltage adjusting impurity. The threshold voltage adjusting impurity used is a p-type impurity such as $BF_2$. This $BF_2$ is introduced in a concentration of about $10^{12}$ [atoms/cm$^2$] by the ion implantation using an energy of about 40 [KeV]. The $BF_2$ is introduced into the individual principal surfaces of the p⁻-type well region 2 and the n⁻-type well region 3 through a silicon oxide film which is formed over the principal surface of the active region, although not designated at any reference letter.

Next, in the individual regions forming the transfer MISFET Qt of the memory cell array MAY and the n-channel MISFET Qn and the p-channel MISFET Qp of the peripheral circuit, the individual active regions of the p⁻-type well region 2 and the n⁻-type well region 3 have their principal surfaces cleared of the silicon oxide film and exposed to the outside.

Next, the gate insulating film 12 is formed over the principal surfaces of the individual active regions of the p⁻-type well region 2 and the n⁻-type well region 3 thus exposed. The gate insulating film 12 is formed to have a thickness of about 13 to 14 [nm] by the thermal oxidation. The gate insulating film 12 is used as the gate insulating film of each of the transfer MISFET Qt of the memory cell array MAY and the n-channel MISFET Qn and the p-channel MISFET Qp of the peripheral circuit.

At the thermal oxidation step of forming the gate insulating film 12, the gate electrode 7 of the drive MISFET Qd (like the other MISFETs Qn1 to Qn6) has its upper surface portion coated with the insulating film 8A, which is used as the oxidation resisting mask. The gate electrode 7 is coated with the insulating film (or the silicon oxide film) 8 and the side wall spacer 9 but is oxidized in case it is not provided with the insulating film 8A, because it is supplied with oxygen at the thermal oxidation step. This oxidation has a faster oxidation rate (i.e., more abruptly oxidized) at the surface portion of the gate electrode 7 than that of the upper corner 8B (i.e., the region enclosed by dotted lines in FIG. 26) of the gate electrode 7 so that the surface portion has its silicon corroded more than at the corner 8B to peel up the corner 8B of the gate electrode 7. In other words, over the surface portion of the gate electrode 7, there is grown a silicon oxide film which has a larger and indefinite thickness that that over the corner 8B. In short, the insulating film (or the silicon nitride film) 8A formed over the gate electrode 7 can reduced the peeling of the gate electrode 7.

Step of Forming Second-Layered Gate Material

Next, the polycrystalline silicon film 13A is deposited all over the substrate including the gate insulating film 12. The polycrystalline silicon film 13A is formed by the gate material forming step of the second layer. Like the polycrystalline silicon film 7, the polycrystalline silicon film 13A is deposited by the CVD method using $Si_2H_6$ and $PH_3$ as the source gases. In case of the present embodiment, the polycrystalline silicon film 13A is doped with P in a concentration of about $10^{20}$ to $10^{21}$ [atoms/cm$^2$]. As has been described hereinbefore, the polycrystalline silicon film 13A can improve the dielectric strength of the underlying insulating film, i.e., the gate insulating film 12 and can reduce the substantial specific resistance as the second-layered gate material with a later-described refractory metal silicide film (13B). As a result, the polycrystalline silicon film 13A can be formed as thin as 70 [nm] or less, which has been impossible for a polycrystalline silicon film doped with P after the deposition. Specifically, the polycrystalline silicon film 13A is formed to have a small thickness of about 10 to 100 [nm] because it requires such a film thickness of 10 [nm] or more as will not be influenced in its uniformity by the crystal grains.

Next, the polycrystalline silicon film 13A is subjected to a heat treatment. This heat treatment is carried out in the nitrogen gases, for example, at a temperature of 700 to 950 [°C.] for 15 to 25 [min.] to activate the P introduced into the polycrystalline silicon film 13A and to stabilize the film quality.

Next, the polycrystalline silicon film 13A and the underlying gate insulating film 12 are sequentially removed from the source regions (10 and 11) of the drive MISFET Qd of the memory cell MC of the memory cell array MAY to form the connection hole 14. This connection hole 14 is formed by the anisotropic etching such as the RIE using the photo resist film (or the etching mask) formed by the photolithography technology. The connection hole 14 connects the source region of the drive MISFET Qd and the reference voltage line (13). After the clean gate insulating film 12 has been formed, the polycrystalline silicon film 13A is formed directly over the gate insulating film 12, and the connection hole 14 is then formed. As a result, the photo resist film formed with the connection hole 14 takes no direct contact with the gate insulating film 12. In short, the step of forming the connection hole 14 is freed from deteriorating the dielectric strength of the gate insulating film 12 because the gate insulating film 12 is not contaminated even if the photo resist film is formed and peeled. Next, the metal silicide film 13B having a high melting point is formed all over the surface of the substrate including the polycrystalline silicon film 13. The refractory metal silicide film 13B is formed at the gate material forming step of the second layer. The refractory metal silicide film 13B is partially connected with the source region of the drive MISFET Qd through the connection hole 14. The refractory metal silicide film 13B is formed of the $WSi_2$ which is deposited by the CVD method or the sputtering method. The $WSi_2$ is a highly stable gate material for the mass production. The refractory metal silicide film 13B has a lower specific resistance than the polycrystalline silicon film 13A so that it is made to have a relatively small thickness of about 80 to 100 [nm] so as to suppress the growth of the step shape of the upper layer.

Next, the insulating film 15 is formed all over the surface of the substrate including the refractory metal silicide film 13B. This insulating film 15 is made to have a larger thickness such as 200 to 300 [nm] than the insulating film 8 overlying the gate electrode 7. Specifically, the insulating film 15 is given such a thickness as will be left over the gate electrode (13), even if the insulating film 8 over the gate electrode 7 is etched off, to insulate the gate electrode (13) and the overlying conductive layer (23). The insulating film 15 is formed of the silicon oxide film which is deposited by the CVD method using organic silane ($Si(OC_2H_5)_4$) as the source gases at a high temperature (e.g., 700 to 850 [°C]) and under a low pressure (e.g., 1.0 [torr]).

Figure 26:
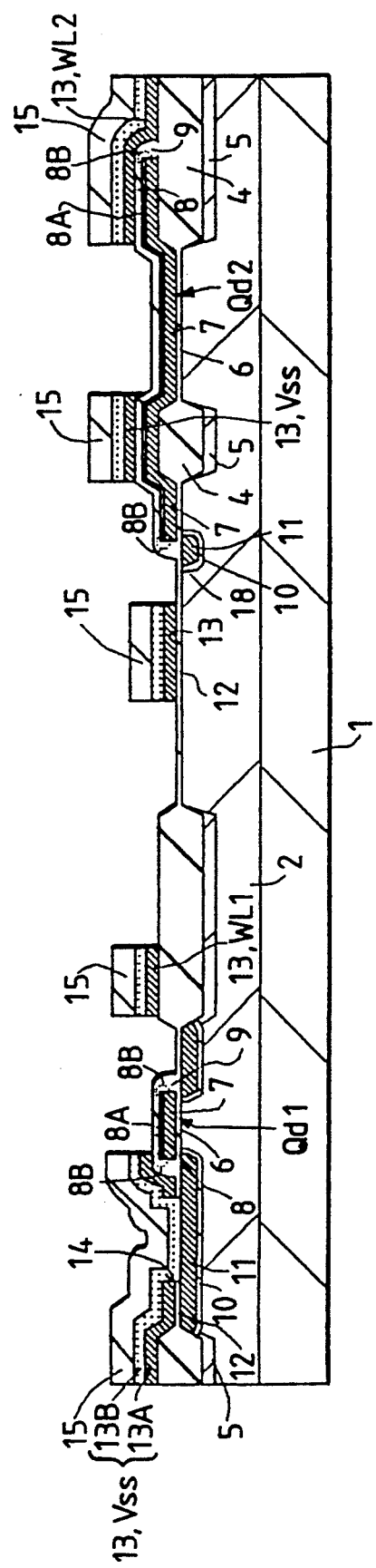

Next, the insulating film 15, the refractory metal silicide film 13B and the polycrystalline silicon film 13A as shown FIG. 26 are sequentially patterned to form the gate electrode 13 of the laminated structure composed of the polycrystalline silicon film 13A and the refractory metal silicide film 13B. The gate electrode 13 is used as the gate electrode of each of the transfer MISFET Qt of the memory cell MC and the n-channel MISFET Qn and p-channel MISFET Qp of the peripheral circuit. At the fabrication step identical to that of forming the gate electrode 13, moreover, the word line (WL) 13 and the reference voltage line (Vss) 13 are individually formed. The patterning is carried out by the anisotropic etching such as the RIE using the etching mask which is formed by the photolithography technology.

Step of Forming Second Source Region and Drain Region

Next, in the regions for forming the transfer MISFET Qt of the memory cell MC of the memory cell array MAY and the n-channel MISFET Qn of the peripheral circuit, the principal surface of the active region of the $p^-$-type well region 2 is doped with an n-type impurity. This n-type impurity is introduced to form the lightly doped n-type semiconductor region (17) having the LDD structure and is exemplified by the P which has a gentler concentration gradient than that of the As so as to weaken the field intensity in the vicinity of the drain region. The P is introduced in a concentration of about $1 \times 10^{13}$ [atoms/cm$^2$] by the ion implantation using an energy of about 30 [KeV]. The P is introduced in self-alignment with the gate electrode 13 by using the gate electrode 13 as the impurity introduction mask.

Figure 27:
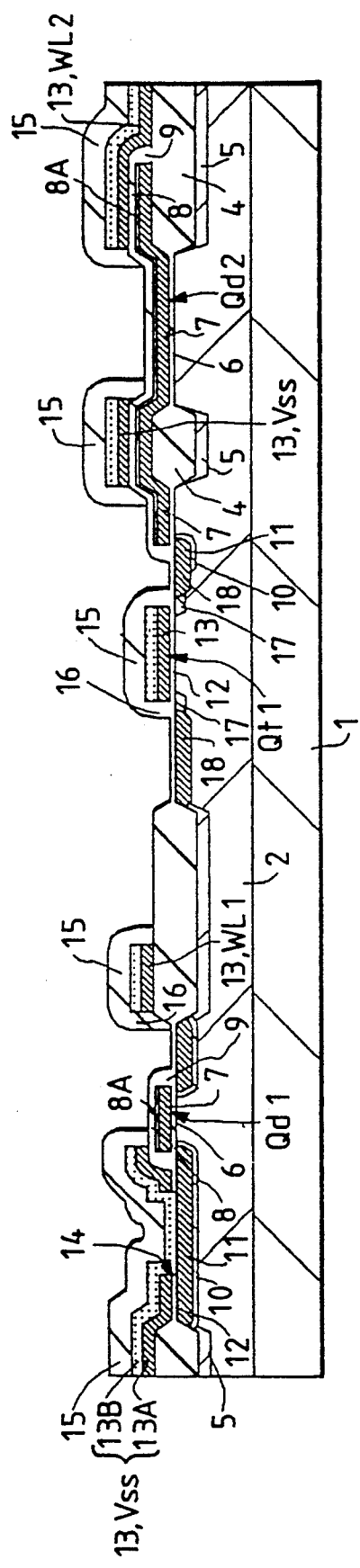

After this, the P is extended and diffused by a heat treatment to form the n-type semiconductor region 17 (as shown in FIG. 27). The heat treatment is carried out in argon (Ar) gas, for example, at a high temperature of 900 to 1,000 [°C.] for about 20 [min]. As a result of this heat treatment, the n-type semiconductor region 17 has its diffusion increased to the regions for forming the individual channels of the transfer MISFET Qt and the n-channel MISFET Qn so that it has a superposition of a size of about 0.5 [μm] or more with the gate electrode 13 after the end of the fabrication process. Since the n-type semiconductor region 17 is subjected to a heavier heat treatment than the highly doped $n^+$-type semiconductor regions (18) of the later-described transfer MISFET Qt and n-channel MISFET Qn, it takes a larger diffusion ration than that of the $n^+$-type semiconductor region (18).

Figure 37:
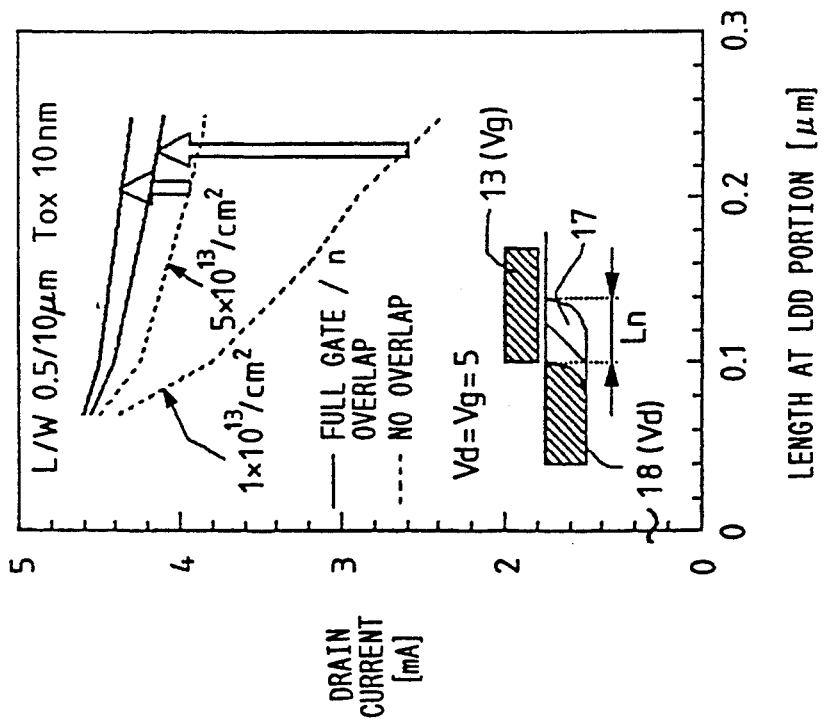

As seen from the measurement results of FIG. 37 (presenting the relations between the length of the LDD portion and the drain current), the drain current increases with an increase in the superposition between the aforementioned n-type semiconductor region (or the LDD portion) 17 and the gate electrode 13. In FIG. 37, the abscissa indicates the length Ln [μm] in the gate length direction of the n-type semiconductor region (or the LDD portion) 17. The ordinate indicates the drain current [mA]. The n-channel MISFET having the LDD structure and used for the measurements in FIG. 37 has a ratio of the gate length L/the gate width W of 0.5 [μm]/10 [μm]. Moreover, the gate insulating film (or the silicon oxide film) has a thickness of 10 [nm] and both a drain voltage Vd and a gate voltage Vg at 5 [V]. The n-type semiconductor region 17 uses an impurity concentration of $1 \times 10^{13}$ [atom/cm$^2$] and $5 \times 10^{13}$ [atoms/cm$^2$]. Moreover, the drain current is measured for the cases in which the n-type semiconductor region 17 and the gate electrode 13 are superposed or not. As seen from the measurement results of FIG. 37, in any case of impurity concentrations, the parasitic resistance in the gate length direction of the n-type semiconductor region 17 is increased the more to reduce the drain current for the larger length Ln of the n-type semiconductor region 17. In any case of impurity concentrations, however, the n-type semiconductor region 17 has its parasitic resistance reduced by the field effect from the gate electrode 13, if it is superposed with the gate electrode 13, to increase the drain current. This increase in the drain current is large especially in case the impurity concentration of the n-type semiconductor region 17 is $1 \times 10^{13}$ [atoms/cm$^2$].

Figure 38:
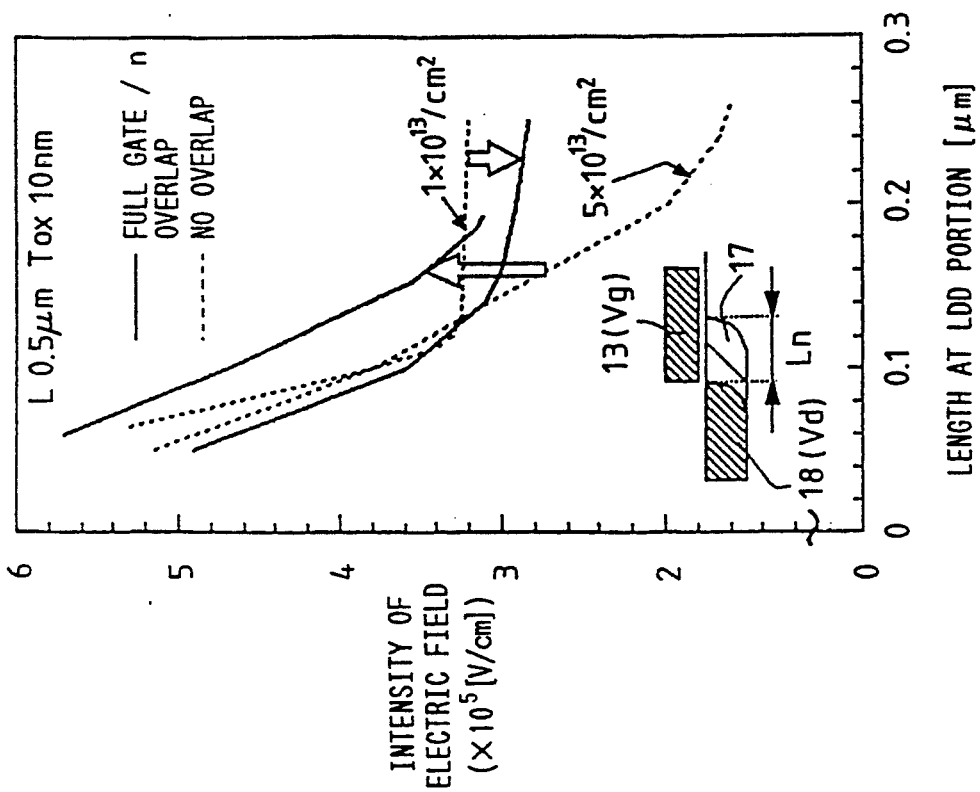

As seen from the measurement results of FIG. 38 (presenting the relations between the length at the LDD portion and the intensity of electric field), the field intensity is reduced if the superposition between the n-type semiconductor region (or the LDD portion) 17 and the gate electrode 17 increases. In FIG. 38, the abscissa indicates the length Ln [μm] in the gate direction of the n-type semiconductor region 17. The ordinate indicates the intensity of electric field ($\times 10$ [V/cm]). The n-channel MISFET adopting the LDD structure and used for the measurements shown in FIG. 38 is made under the conditions similar to those of the one used for the measurements shown in FIG. 37. In case the n-type semiconductor region 17 has an impurity concentration of $5 \times 10^{13}$ [atoms/cm$^2$], as seen from the measurement results of FIG. 38, the field intensity is reduced as the length Ln of the n-type semiconductor region 17 is enlarged. If, however, the n-type semiconductor region 17 and the gate electrode 13 are superposed, the field intensity is increased. In case the n-type semiconductor region 17 has an impurity concentration of $1 \times 10^{13}$ [atoms/cm$^2$], on the other hand, the field intensity is likewise reduced, if the length Ln of the n-type semiconductor region 17 is enlarged, and is further reduced if the n-type semiconductor region 17 and the gate electrode 13 are superposed. This effect for reducing the field intensity is attained when the length Ln of the n-type semiconductor region 17 exceeds 0.1 [μm] or so. In the present embodiment, the n-type semiconductor region 17 is formed to have a length Ln within such a region of about 0.5 [μm] or more as can stabilize the field strength at a substantially constant level even if the length Ln of the n-type semiconductor region 17 changes more or less. Moreover, the n-type semiconductor region 17 enlarges its length Ln to such an extent that the short channel effect will not prominently appear.

On the basis of the aforementioned measurement results of FIGS. 37 and 38, each of the transfer MISFET Qt and the n-channel MISFET Qn adopting the aforementioned LDD structure have their gate electrode 13 and n-type semiconductor region 17 superposed to improve the mutual conductance (gm) positively thereby to increase the drain current. Moreover, the transfer MISFET Qt and n-channel MISFET Qn adopting the LDD structure have their n-type semiconductor region 17 doped with an impurity in a concentration of about $1 \times 10^{13}$ [atoms/cm$^2$] to enlarge the length Ln of the n-type semiconductor region 17. At the same time, this n-type semiconductor region 17 is superposed with the gate electrode 13 to reduce the intensity of electric field. This reduction in the field intensity can reduce the number of hot carriers in the vicinity of the drain region so that it can reduce the aging fluctuations of the individual threshold voltages of the transfer MISFET Qt and n-channel MISFET Qn adopting the LDD structure.

Next, in the region for forming the p-channel MISFET Qp of the peripheral circuit, the active region of the n$^-$-type well region has its principal surface doped with a p-type impurity. This p-type impurity is introduced to form a lightly doped n-type semiconductor region (19) having the LDD structure. The p-type impurity used is exemplified by BF$_2$. The BF$_2$ is introduced in a concentration of about $10^{12}$ to $10^{13}$ [atoms/cm$^2$] by the ion implantation using an energy of about 40 [KeV]. The BF$_2$ is introduced in self-alignment with the gate electrode 13 which is used as the impurity introduction mask. By the introduction of this p-type impurity, the p-type semiconductor region (19) is formed (as shown in FIG. 21). Since the p-type impurity has a higher diffusion rate than the n-type impurity, the p-type semiconductor region 19 can form a sufficient superposition with the gate electrode 13 even if it is not subjected to any heat treatment.

Next, the side wall of each of the aforementioned gate electrode 13 and insulating film 15 is formed with the side wall spacer 16. This side wall spacer 16 is formed by depositing the silicon oxide film all over the surface of the substrate including the insulating film 15 and by etching the whole surface of the silicon oxide film to an extent corresponding to the thickness of the deposited film. The silicon oxide film is deposited like before to form a thickness of about 200 [nm] by the CVD method using inorganic silane gases as the source gases. The etching used is exemplified by the anisotropic etching such as the RIE.

Next, at the etching time for forming the side wall spacer 16, the individual active regions of the p$^-$-type well region 2 and the n$^-$-type well region 3 have their principal surfaces exposed to the outside excepting the regions formed with the gate electrode 7 and the side wall spacer 16, to form the silicon oxide film (although not designated at reference characters) in the exposed regions. The silicon oxide film thus formed is used mainly to prevent the contamination at the time of impurity introduction and the damage of the principal surfaces of the active regions due to the impurity introduction. The silicon oxide film is formed to have a thickness of about 10 [nm] by the thermal oxidation, for example.

Next, in the individual regions for forming the transfer MISFET Qt1 of the memory cell MC of the memory cell array MAY and the n-channel MISFET Qn of the peripheral circuit, the active region of the p$^-$-type well region 2 has its principal surface doped with an n-type impurity. This n-type impurity used is exemplified by the As having a lower diffusion rate than the P with a view to reducing the pn junction depth. The As is introduced in a concentration of about $10^{15}$ to $10^{16}$ [atoms/cm$^2$] by the ion implantation using an energy of about 30 to 50 [KeV]. The As is introduced in self-alignment with the gate electrode 13 and the side wall spacer 16 by using these gate electrode 13 and side wall spacer 16 as the impurity introduction masks.

Next, in the region for forming the p-channel MISFET Qp of the peripheral circuit, the active region of the n$^-$-type well region 3 has its principal surface doped with a p-type impurity. The p-type impurity used is exemplified by BF$_2$. This BF$_2$ is introduced in a concentration of about $10^{15}$ to $10^{16}$ [atoms/cm$^2$] by the ion implantation using an energy of about 30 [KeV]. The BF$_2$ is introduced in self-alignment with the gate electrode 13 and the side wall spacer 16 by using these gate electrode 13 and side wall spacer 16 as the impurity introduction masks.

After this, the n-type impurity is subjected to a heat treatment to form the n$^+$-type semiconductor region 18 and is extended and diffused to form the p$^+$-type semiconductor region 20. The heat treatment is accomplished in nitrogen gases, for example, at a high temperature of 900 to 1,000 [°C.] for about 1 to 3 [min.]. The aforementioned n$^+$-type semiconductor region 18 is used as the source region and the drain region. By the step of forming the n$^+$-type semiconductor region 18, as shown in FIG. 27, in the memory cell array MAY, the transfer MISFET Qt adopting the LDD structure of the memory cell MC is completed, and the n-channel MISFET Qn adopting the LDD structure of the peripheral circuit shown in FIG. 21 is completed. By the step of forming the aforementioned p$^+$-type semiconductor region 20, moreover, the p-channel MISFET Qp adopting the LDD structure shown in FIG. 21 is completed.

(C-1): The process for fabricating the SRAM 1 having its memory cell MC composed of the transfer MISFET Qt and the drive MISFET Qd, comprises: the step of forming the gate electrode 7 through the gate insulating film 6 over the principal surface of the p$^+$-type well region (or the substrate) 2 to be formed with the drive MISFET Qd; the step of forming the drive MISFET Qd having the double diffused drain structure by doping the principal surface of the p$^+$-type for the drive MISFET Qd, in self-alignment with the gate electrode 7, with two kinds of impurities (P and As) of the conduction type reverse to that of the p$^+$-type well region 2 and having different diffusion rates; the step of forming the gate electrode 13 through the gate insulating film 12 over the principal surface of the p$^+$-type well region 2 for the drive MISFET Qd of the double diffused drain structure; the step of doping the principal surface of the p$^+$-type well region 2 for the transfer MISFET Qt, in self-alignment with the gate electrode 13, with the impurity (P) of the conduction type reverse to that of the p$^+$-type well region 2 and having the low concentration; the step of forming the side wall spacer 16 on and in self-alignment with the side wall of the gate electrode 13; and the step of forming the transfer MISFET Qt of the LDD structure by doping the principal surface of the p+-type well region 2 for the transfer MISFET Qt, in self-alignment with the side wall spacer 16, with an impurity having the conduction type reverse to that of the p+-type well region 2 and having the high concentration. Thanks to this structure, the number of masks (by using totally three masks) is reduced by one from the case, in which the transfer MISFET Qt and the drive MISFET Qd are constructed to have the LDD structure for coping with the hot carriers by using totally four masks, by giving the drive MISFET Qd the double diffused drain structure for coping with the hot carriers and increasing the unit conductance. As a result, the number of steps for fabricating the SRAM 1 can be reduced. Moreover, the gate insulating film 6 of the drive MISFET Qd and the gate insulating film 12 of the transfer MISFET Qt are formed at different steps so that the individual thicknesses of the gate insulating films can be optimized independently of each other. For example, in case the thickness of the gate insulating film 6 of the drive MISFET Qd is made smaller than that of the gate insulating film 12 of the transfer MISFET Qt, the unit conductance of the drive MISFET Qd can be increased to attain the $\beta$ ratio of the memory cell MC.

(C-2): The reference voltage line Vss (Vss) 13 formed at the fabrication step identical to that of the gate electrode 13 of the transfer MISFET Qt is connected with the source region of the double diffused drain structure of the drive MISFET Qd of the aforementioned structure (C-1). Thanks to this structure, in addition to the aforementioned effect, the semiconductor region (i.e., the semiconductor region for extracting the reference voltage Vss) underlying the reference voltage line 13 for connecting the reference voltage line 13 and the source region (11) of the drive MISFET Qd can be formed at the step of forming the semiconductor regions (10 and 11) of the double diffused drain structure of the drive MISFET Qd. As a result, the number of steps of fabricating the SRAM 1 can be reduced to an extent corresponding to the step of forming the connecting semiconductor region.

(C-3): The step of the aforementioned structure (C-1) for forming the drive MISFET Qd of the double diffused drain structure forms, after the gate electrode 7, the side wall spacer 9 on and in self-alignment with the side wall of the gate electrode 7, and dopes the gate electrode 7 with two kinds of n-type impurities (P and As) different in the diffusion rates in the self-alignment with the gate electrode 7. Thanks to this structure, the run-around (or the diffusion) of the semiconductor regions (10 and 11) of the drive MISFET Qd to the channel forming region can be reduced to an extent corresponding to the film thickness of the side wall spacer 9. As a result, the gate length size of the drive MISFET Qd can be retained to reduce the occupied area of the drive MISFET Qd while preventing the short channel effect, so that the occupied area of the memory cell MC can be reduced to improve the degree of integration of the SRAM 1.

(C-4): The step of forming the transfer MISFET Qt adopting the LDD structure: introduces the impurity (P) of low concentration, after the gate electrode 13 has been formed; subjects the introduced n-type impurity to the heat treatment (e.g., annealing) for extending and diffusing the n-type impurity (to form the n-type semiconductor region 17); subsequently forms the side wall spacer 16; and then introduces the impurity (As) of high concentration. Thanks to this structure, the amount of diffusion into the channel forming region of the n-type semiconductor region 17 formed by doping the LDD structure of the transfer MISFET Qt lightly with the n-type impurity can be increased by adding the heat treatment. As a result, the superposition (or overlap) between the gate electrode 13 of the transfer MISFET Qt and the n-type semiconductor region 17 formed by the light doping of the n-type impurity can be increased to weaken the intensity of the electric field to be generated in the vicinity of the drain region. As a result, the number of the hot carriers produced can be reduced to reduce the degradation of the aging threshold voltage of the transfer MISFET Qt thereby to improve the electric reliability of the SRAM 1.

(C-5): The process for fabricating the SRAM 1 having its memory cell MC composed of the transfer MISFET Qt controlled by the word line (WL) 13 and the drive MISFET Qd connected with the reference voltage line (Vss) 13, comprises: the step of forming the gate electrode 7 of the drive MISFET Qd of the memory cell MC; and the step of forming the gate electrode 13 of the transfer MISFET Qt of the memory cell MC over the gate electrode 7 and the word line 13 and the reference voltage line 13 in the layer identical to that of the gate electrode 13. Thanks to this structure, the word line 13 and the reference voltage line 13 are formed at the step of forming the gate electrode 13 of the transfer MISFET Qt of the memory cell MC. As a result, the number of steps of fabricating the SRAM 1 can be reduced to an extent corresponding to that step of forming the word line 13 and the reference voltage line 13.

(C - 12): The process for fabricating the SRAM 1 having the memory cell MC, in which the word line (WL) 13 is integrated with the gate electrode 13 of the transfer MISFET Qt, comprises: the step of forming the gate insulating film 12 over the principal surface of the p+-type well region (or the substrate) 2 to be formed with the transfer MISFET Qt of the memory cell MC; the step of forming the polycrystalline silicon film (of the doped polysilicon) 13A deposited by the CVD method all over the substrate including the gate insulating film 12 and doped with the impurity for reducing the resistance during the deposition; the step of depositing the film 13B of the metal silicide ($WSi_2$) having the high melting point all over the substrate including the polycrystalline silicon film 13A; and the step of forming the gate electrode 13 of the transfer MISFET Qt and the word line 13 connected integrally with the former over the gate insulating film 12, from the residual polycrystalline silicon film 13A and the metal silicide film 13B of high melting point, by patterning the metal silicide film 13B of high melting point and the polycrystalline silicon film 13A. Thanks to this structure, the polycrystalline silicon film 13A underlying the gate electrode 13 of the transfer MISFET Qt is doped with the n-type impurity (P) during the deposition but abolishes the thermal diffusion of P after the deposition and accordingly the use of hydrofluoric acid for removing the phosphor glass film to be formed on the surface of the polycrystalline silicon film by the thermal diffusion, and the polycrystalline silicon film (of doped polysilicon) 13A to be doped with the n-type impurity during the deposition can be made denser than the polycrystalline silicon film (of non-doped polysilicon) having no impurity introduced during the deposition, to reduce the degradation of that breakdown voltage of the gate insulating film 12, which might otherwise be caused by the soaking the hydrofluoric acid into the polycrystalline silicon film. As a result, the resistance can be reduced to reduce the thickness of the polycrystalline silicon film 13A underlying the two-layered word line 13 for accelerating the operating speed of the SRAM 1 so that the total thickness of the word line 13 can be reduced to flatten the underlying surface of the conductive layer (e.g., the complementary data line DL) to be arranged over the word line 13.

(C - 13): The polycrystalline silicon film 13A of the aforementioned structure (C - 12) below the gate electrode 13 of the transfer MISFET Qt and the word line (WL) 13 connected with the former is deposited by the CVD method using $Si_2H_6$ and $PH_3$ as its source gases. Thanks to this structure, the surface of the polycrystalline silicon film 13A at the side of the gate insulating film 12 can be flattened to prevent the electric field from being concentrated between the $p^+$-type well region 2 and the gate electrode 13 thereby to reduce the deterioration of the dielectric strength of the gate insulating film 12 of the transfer MISFET Qt.

(C - 14): The polycrystalline silicon film 13A of the aforementioned structure (C - 12) or (C - 13) below the gate electrode 13 of the transfer MISFET Qt and the word line 13 connected with the former is formed to have the thickness within a range of 30 [nm] to 70 [nm]. Thanks to this structure, thickness of the gate electrode 13 of the transfer MISFET Qt can be reduced, and the degradation of the dielectric strength of the gate insulating film 12 can be reduced.

(C - 15): The process for fabricating the SRAM 1 having its memory cell MC composed of the transfer MISFET Qt and the drive MISFET Qd having its source region (11) connected with the reference voltage line (Vss) 13, comprises: the step of forming the drive MISFET Qd by forming not only the gate electrode 7 over the principal surface of the $p^+$-type well region (or the substrate) 2 to be formed with the drive MISFET Qd but also the source region and the drain region (11) over the principal surface; the step of forming the gate insulating film 12 over the principal surface of the $p^+$-type well region 2 to be formed with the transfer MISFET Qt; the step of depositing the polycrystalline silicon film 13A all over the surface of the substrate including the gate insulating film 12; the step of forming the connection hole 14 by sequentially removing the polycrystalline silicon film 13A over the source region (11) of the drive MISFET Qd and the gate insulating film 12 underlying the polycrystalline silicon film 13A; the step of forming the film 13B of the metal silicide having the high melting point, which is to be connected with the source region (11) of the drive MISFET Qd through the connection hole 14, all over the surface of the substrate including the polycrystalline silicon film 13A; and the step of forming not only the gate electrode 13 of the polycrystalline silicon film 13A and the refractory metal silicide film 13B having the high melting point over the gate insulating film 12 but also the reference voltage line 13 connected with the source region of the drive MISFET Qd. Thanks to this structure, the gate insulating film 12 of the transfer MISFET Qt is formed and then covered directly with the polycrystalline silicon film 13A. After this, the polycrystalline silicon film 13A and the underlying gate insulating film 12 are removed to form the connection hole 14 in the surface of the source region (11) of the drive MISFET Qd. As a result, the photo resist mask for forming that connection hole 14 can be kept away from direct contact with the gate insulating film 12 of the transfer MISFET Qt to reduce the contamination or degradation of the dielectric strength of the gate insulating film 12 of the transfer MISFET Qt.

(B-6): The transfer MISFET Qt adopting the LDD structure of the memory cell MC of the aforementioned structure (B-5) is made such that the diffusion (i.e., the superposition between the gate electrode 13 and the n-type semiconductor region 17 or the length Ln of the n-type semiconductor region 17) of the lightly doped n-type semiconductor region 17 from the end of the gate electrode 13 to the channel forming region is set within a range of 0.5 [μm] or more and free from the short channel effect. Thanks to this structure, the superposition (or overlap) between the gate electrode 13 of the transfer MISFET Qt and the lightly doped n-type semiconductor region (i.e., the LDD region) 17 can be increased to weaken the intensity of the electric field to be generated in the vicinity of the drain region. As a result, the amount of hot carriers to be generated can be reduced to reduce the degradation of the aging threshold voltage of the transfer MISFET Qt thereby to improve the electric reliability of the SRAM 1.

(D-5): The process for fabricating the SRAM 1 having its memory cell MC composed of the transfer MISFET Qt to be controlled with the word line (WL) 13 and the drive MISFET Qd and its peripheral circuit composed of the MISFET for controlling the data writing, holding and reading operations of the memory cell MC, comprises: the step of forming the drive MISFET Qd of the memory cell MC; and the step of forming the transfer MISFET Qt of the memory cell MC and the n-channel MISFET Qn (or the p-channel MISFET Qp) of the peripheral circuit. Thanks to this structure, the step of forming the transfer MISFET Qt of the memory cell MC can form the n-channel MISFET of the peripheral circuit so that the number of steps of fabricating the SRAM 1 can be reduced to an extent corresponding to the step of forming the n-channel MISFET Qn of the peripheral circuit.

Step of Forming Third-Layered Gate Material

Next, the substrate is etched all over its surface to mainly remove the insulating films 8 and 8A which are formed over the gate electrode 7 of the drive MISFET Qd of the memory cell MC of the memory cell array MAY. The removal of those insulating films 8 and 8A is carried out by using the insulating film 15, which is formed over the gate electrode 13, the word line 13 and the reference voltage line 13, and the side wall spacer 16 as its etching masks (or by being regulated by the masks). In other words, there are left unetched the insulating films 8 and 8A which are formed below the gate electrode 13, the word line 13 and the reference voltage line 13. The removal of the insulating films 8 and 8A is intended mainly to expose to the outside the surface of the gate electrode 7 of the drive MISFET Qd1 for forming the first electrode 7 of the capacity element C of the memory cell MC. On the other hand, the insulating film 8 and the insulating film 15 are formed, in the present embodiment, of the silicon oxide films having substantially identical etching rates, but the insulating film 15 to be used as the etching mask is made thicker than the insulating film 8 so that it is left unetched even if the insulating film 8 is removed. At the time of etching the insulating film 8, the underlying insulating film (or the silicon nitride film) 8A has a different etching rate so that it is used as an etching stopper layer. In short, the etching controllability of the insulating film 8 can be improved by forming the insulating film 8A, which is to be used as the etching stopper layer, below the insulating film 8.

(C-16): The process for fabricating the SRAM 1 having the memory cell MC composed of the transfer MISFET Qt and the drive MISFET Qd, comprises: the step of forming the gate insulating film 6 over the principal surface of the region of the $p^+$-type well region (or the substrate) 2 to be formed with the drive MISFET Qd; the step of forming the polycrystalline silicon film 7 and the insulating film (or the silicon nitride film) 8A as the oxidation resisting mask, and the insulating film (or the silicon oxide film) 8 sequentially all over the surface of the substrate including the surface of the gate insulating film 6; the step of forming the gate electrode 7 of the drive MISFET Qd from the silicon film by patterning the insulating film 8, the insulating film 8A and the polycrystalline silicon film 7 sequentially according to the substantially identical pattern; the step of forming the side wall spacer (or the silicon oxide film) 9 on the side wall of the gate electrode 7; the step of forming the gate insulating film 12 by the thermal oxidation method over the principal surface of the $p^+$-type well region 2 to be formed with the transfer MISFET Qt; the step of forming the gate electrode 13 of the transfer MISFET Qt over the gate insulating film 12; and the step of removing the insulating film 8 and the insulating film 8A sequentially from the gate electrode 7 by etching all over the surface of the substrate. Thanks to this structure, the insulating film (or the silicon nitride film; the oxidation resisting mask) 8A over the gate electrode 7 can reduce the phenomenon that the gate electrode 7 of the drive MISFET Qd has its end portion peeled up at the thermal oxidation step for forming the gate insulating film 12 on the basis of the phenomenon that the oxidation rate of the corner portions 8B is lower than that of the surface portion of the gate electrode 7 of the drive MISFET Qd. As a result, the thickness of the insulating film (or the silicon oxide film) 8 over the gate electrode 7 can be uniformalized to reduce the etching at the step of removing the insulating film 8. At this step of removing the insulating film 8, moreover, the insulating film (or the silicon nitride film) 8A over the gate electrode 7 can be used as the etching stopper film to avoid the short or excessive etching thereby to improve the etching controllability. At the thermal oxidation step of forming the gate insulating film 12, still moreover, the insulating film (or the silicon nitride film) 8A over the gate electrode 7 can be used as the thermal oxidation resisting mask to reduce the growth of the crystal particles of the polycrystalline silicon film at the surface portion of the gate electrode 7 thereby to flatten the surface of the gate electrode 7. This flattening of the surface of the gate electrode 7 indicates possibility of flattening the surface of the first electrode 7 of the capacity element C.

Next, the insulating film 21 is formed all over the substrate including the exposed surface of the gate electrode 7. This insulating film 21 thus formed used mainly as the dielectric film 21 of the capacity element C of the memory cell MC. The insulating film 21 is formed of a silicon oxide film which is deposited by the CVD method and capable of improving the dielectric strength, as seen from the measurement results of FIG. 33. Since the first electrode 7 of the capacity element C is deposited by the CVD method using the $Si_2H_6$ as its source gases and can flatten the surface, as shown in FIG. 34, the insulating film 21 can improve the breakdown strength to reduce its film thickness. Moreover, the insulating film 21 is formed of the single-layered silicon oxide film having a small thickness. The insulating film 21 is formed to have a film thickness as small as about 40 [nm].

Next, the insulating film 21 and the underlying insulating film are removed from the one semiconductor region (18) and other semiconductor region (18) of the transfer MISFET Qt of the memory cell MC, to form the connection holes 22. The connection hole 22 thus formed over the one semiconductor region of the transfer MISFET Qt is formed to connect the one semiconductor region (18), the drain region (11) of the drive MISFET Qd, the gate electrode 7 and the second electrode (23) of the capacity element C. The connection hole 22 formed over the other semiconductor region of the transfer MISFET Qt is formed to connect the other semiconductor region and the intermediate conductive layer (23). The latter connection hole 22 formed over the insulating film 21 is made to have a larger opening size at the side of the gate electrode 13 than at the side wall spacer 16 disposed at the side wall of the gate electrode 13 of the transfer MISFET Qt. In other words, the side wall spacer 16 is exposed to the inside of the connection hole 22 formed over the insulating film 21, and the substantial opening size of the connection hole 22 over the other semiconductor region (18) is regulated by the side wall spacer 16. As a result, the substantial opening position of the connection hole 22 at the side of the gate electrode 13 is regulated in self-alignment with the gate electrode 13.

Next, the polycrystalline silicon film 23 is deposited all over the substrate including the insulating film 21 for forming the aforemention dielectric film. This polycrystalline silicon film 23 is formed at the gate material forming step of the third layer. The polycrystalline silicon film 23 is partially connected though the connection holes 22 with the semiconductor region of the transfer MISFET Qt and the drain region and gate electrode 7 of the drive MISFET Qd. The polycrystalline silicon film 23 is used as each of the gate electrode (23) of the load MISFET Qp, and the second electrode (23), conductive layer (23) and intermediate layer (23) of the capacity element C. Especially, the polycrystalline silicon film 23 is used as the gate electrode (23) of the load MISFET Qp and the second electrode (23) of the capacity element C so that it is deposited (as the doped polysilicon) like before by the CVD method using the $Si_2H_6$ and the $PH_3$. The polycrystalline silicon film 23 is formed to have a thickness as small as 60 to 80 [nm], for example, and a P concentration of about $10^{20}$ to $10^{21}$ [atoms/cm$^2$] so as to suppress the stepwise growth of the upper layer.

After this, a heat treatment is accomplished to activate the P introduced into the polycrystalline silicon film 23. This heat treatment is carried out in the nitrogen gases at a high temperature of about 700 to 900 [°C.] for about 20 [min.].

Figure 28:
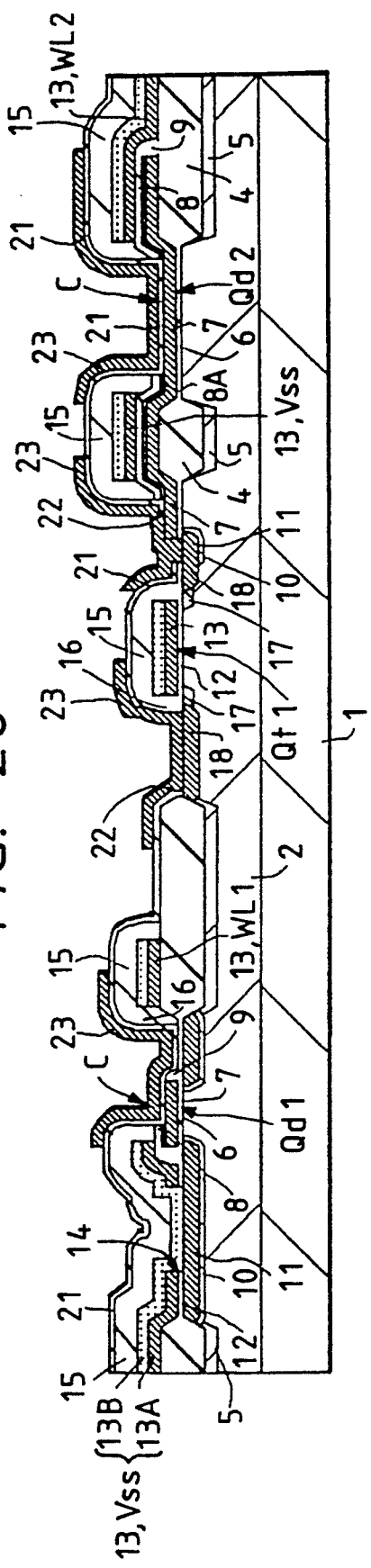

Next, the polycrystalline silicon film 23 is patterned to form the gate electrode 23 of the load MISFET Qp, and the second electrode 23, the conductive layer 23 and the intermediate conductive layer 23 of the capacity element C, as shown in FIG. 28. The patterning of the polycrystalline silicon film 23 is carried out by using the etching mask formed by the photolithography technology, for example, and the anisotropic etching such as the RIE.

By the step of forming the second electrode 23, there is completed the capacity element C which is sequentially laminated with the first electrode 7, the dielectric film 21 and the second electrode 23.

(C-6): In the process for fabricating the SRAM 1 having its memory cell MC arranged with the capacity element C which uses the gate electrode 7 of the drive MISFET Qd as its first electrode 7 and has its second electrode 23 formed over the first electrode 7 and connected with the data storage node region through the dielectric film 21, the first electrode 7 or the second electrode 23 is formed of the polycrystalline silicon film (or the doped polysilicon film) which is deposited by the CVD method and doped with the impurity for reducing the resistance during the deposition. Thanks to this structure, the surface of the polycrystalline silicon film at the side to contact with the dielectric film 21, i.e., the upper surface of the first electrode 7 or the lower surface of the second electrode 23 can be made flatter than the polycrystalline silicon film which has its resistance dropped as a result of doping with the impurity after it has been deposited by the CVD method. As a result, the electric field to be generated between the first and second electrodes 7 and 23 of the capacity element C can be prevented from being concentrated, to improve the dielectric strength of the dielectric film 21 of the capacity element C thereby to improve the electric reliability of the SRAM 1. Since, moreover, the dielectric strength of the dielectric film 21 of the capacity element C can be improved, the dielectric film 21 can be thinned to increase the charge to be stored in the capacity element C. As a result, the size of the capacity element C can be reduced to reduce the occupied area of the memory cell MC thereby to improve the degree of integration of the SRAM 1. Since, still moreover, the charge to be stored in the capacity element C can be increased, the data holding stability of the memory cell MC can be improved to raise the breakdown voltage of the α ray soft errors.

(C-7): In the process for fabricating the SRAM 1 having its memory cell MC arranged with the capacity element C which uses the gate electrode 7 of the drive MISFET Qd as its first electrode 7 and has its second electrode 23 formed over the first electrode 7 and connected with the data storage node through the dielectric film 21, the first electrode 7 or the second electrode 23 is formed of the polycrystalline silicon film 23 deposited by the CVD method using $Si_2H_6$ and $PH_3$ as its source gases. Thanks to this structure, the surface of the polycrystalline silicon film at the side to contact with the dielectric film 21, i.e., the upper surface of the first or second electrode can be flattened more than the polycrystalline silicon film (merely of the doped polysilicon) deposited merely by the CVD method. As a result, the effects obtainable are similar to those of the aforementioned structure (C-6).

(C-8): The process for fabricating the SRAM 1 having its memory cell MC arranged with the capacity element C which uses the gate electrode 7 of the drive MISFET Qd as its first electrode 7 and has its second electrode 23 formed over the first electrode 7 and connected with the data storage node through the dielectric film 21, comprises: the step of forming the first electrode 7 of the polycrystalline silicon film 23 deposited by the CVD method; and the step of forming the dielectric film 21 of the silicon oxide film deposited over the first electrode 7 by the CVD method. Thanks to this structure, unlike the case in which the dielectric film is formed of the silicon oxide film formed by the thermal oxidation method on the surface of the polycrystalline silicon film acting as the first electrode 7, the silicon oxide film can be deposited independently of the crystal plane (in which the plurality of different crystal planes are present to have different growing rates of thermal oxidation) of the crystal particles (or grains) of the surface of the underlying polycrystalline silicon film so that the thickness of the silicon oxide film, i.e., the dielectric film 21 can be uniformalized. As a result, the dielectric strength of the dielectric film 21 can be improved while preventing the electric field from being concentrated between the first electrode 7 and the second electrode 23, to improve the electric reliability of the SRAM 1. Like the effects of the aforementioned structure (C-6), moreover, the size of the capacity element C can be reduced to reduce the occupied area of the memory cell MC thereby to improve the degree of integration of the SRAM 1. Still moreover, the data holding stability of the memory cell MC can be improved to raise the breakdown voltage of the α ray soft errors.

(C-9): The first electrode 7 or the second electrode 23 is formed of either the polycrystalline silicon film deposited by the CVD method and doped with the impurity for reducing the resistance during the deposition or the polycrystalline silicon film 23 deposited by the CVD method using the $Si_2H_6$ and $PH_3$. Thanks to this structure, the effects of the aforementioned structure (C-8) can be attained in addition to the effects of the aforementioned structure (C-6) or (C-7).

(C-10): The process for fabricating the SRAM 1 having its memory cell MC composed of the capacity element C, in which the drain region (11) of the first drive MISFET Qd and the gate electrode 7 of the second drive MISFET Qd are connected with the one semiconductor region (18) of the transfer MISFET Qt, in which the gate electrode 7 is connected with the gate electrode 7 of the first drive MISFET Qd, and in which the second electrode 23 is connected with the drain region of the first drive MISFET Qd, comprises: the step of forming the first drive MISFET Qd and the second drive MISFET Qd and the first electrode 7 of the capacity element C from the gate electrode 7 of the first drive MISFET Qd; the step of forming the transfer MISFET Qt having its one semiconductor region connected with the drain region of the first drive MISFET Qd; and the step of forming the second electrode 23 of the capacity element C over the first electrode 7 of the capacity element C through the dielectric film 21 and connecting the one semiconductor region of the transfer MISFET Qt and the gate electrode 7 of the second drive MISFET Qd by the conductive layer 23 of the (extracted) portion of the second electrode 23. Thanks to this structure, the first electrode 7 of the capacity element C is formed of the gate electrode 7 of the first drive MISFET Qd so that the number of steps of fabricating the SRAM 1 can be reduced to an extent corresponding to the step of forming the first electrode 7. At the same time, the one semiconductor region of the transfer MISFET Qt and the gate electrode 7 of the second drive MISFET Qd are connected at the step of forming the second electrode 23 of the capacity element C (by using the conductive layer identical to that of the second electrode 23) so that the number of steps of fabricating the SRAM 1 can be reduced to an extent corresponding to the step of connecting the two.

(C-11): The first electrode 7 or the second electrode 23 of the capacity element C is formed of either the polycrystalline silicon film (of doped polysilicon) 23 deposited by the CVD method using the $Si_2H_6$ and $PH_3$ as its source gases or the polycrystalline silicon film (of doped polysilicon) deposited by the CVD method and doped with the impurity for reducing the resistance during the deposition. Thanks to this structure, the effects of the aforementioned structure (C-6) or (C-7) can be attained in addition to the effects of the aforementioned structure (C-10).

(C-17): The first gate electrode 7 of the drive MISFET Qd of the aforementioned structure (C-6) is used as the first electrode 7 of the capacity element C, and the second electrode 23 of the capacity element C is formed through the dielectric film 21 over the first gate electrode 7 having the insulating film (or the silicon oxide film) 8 and the insulating film (or the silicon nitride film) 8A removed. Thanks to this structure, the surface of the first gate electrode 7, i.e., the first electrode 7 of the capacity element C is coated with the first insulating film (or the silicon nitride film) 8A at the thermal oxidation step and is flattened so that the concentration of the electric field between the first electrode 7 and the second electrode 23 of the capacity element C can be reduced to improve the dielectric strength of the dielectric film 21 of the capacity element C.

(C-18): The process for fabricating the SRAM 1 having its memory cell MC, in which the gate electrode 7 of the drive MISFET Qd is connected with the one semiconductor region (18) of the transfer MISFET Qt, comprises: the step of forming the first gate electrode 7 over the principal surface of the $p^-$-type well region (substrate) 2 for the drive MISFET Qd and the insulating film 8 over the first gate electrode 7; the step of forming not only both the gate electrode 13 over the principal surface of the $p^-$-type well region 2 for the transfer MISFET Qt and the insulating film 15 having the larger thickness than that of the insulating film 15 over the gate electrode 13 but also the one semiconductor region (18) over the principal surface for the transfer MISFET Qt; the step of forming the connection hole 22 for exposing at least the portion of the surface of the one semiconductor region of the transfer MISFET Qt by removing the portion of the insulating film 8 from the gate electrode 7 of the drive MISFET Qd; and the step of connecting the one semiconductor region (18) of the transfer MISFET Qt and the gate electrode 7 of the drive MISFET Qd through the connection hole 22 with the conductive layer 23 which is formed over the gate electrode 7 and the gate electrode 13. Thanks to this structure, the thickness of the insulating film 15 over the gate electrode 13 of the transfer MISFET Qt can be made larger than that of the insulating film 8 over the gate electrode 7 of the drive MISFET Qd to leave the insulating film 15 over the gate electrode 13 at the time of forming the connection hole 22. As a result, the gate electrode 13 and the conductive layer 23 can be prevented from being short-circuited, to improve the yield of the fabrication process of the SRAM 1.

(C-19): The process for fabricating the SRAM 1 in which the gate electrode 7 of the drive MISFET Qd is connected with the one semiconductor region (18) of the transfer MISFET Qt and in which the data line (DL: 33) is connected with the other semiconductor region (18) of the transfer MISFET Qt of the memory cell MC, comprises: the step of forming the gate electrode 7 over the principal surface of the $p^-$-type well region (or the substrate) 2 to be formed with the drive MISFET Qd; the step of forming both the gate electrode 13 above the gate electrode 7 over the principal surface of the $p^-$-type well region 2 for the transfer MISFET Qt and the one semiconductor region and the other semiconductor region (18) over the principal surface for the transfer MISFET Qt; the step of connecting the one semiconductor region of the transfer MISFET Qt and the gate electrode 7 of the drive MISFET Qd individually through the conductive layer 23 formed above the gate electrode 7 and the gate electrode 13, and forming the intermediate layer 23 in the layer identical to the conductive layer 23 and over the other semiconductor region of the transfer MISFET Qt; and the step of connecting the data line (DL: 33) with the other semiconductor region of the transfer MISFET Qt through the intermediate layer 23. Thanks to this structure, the intermediate conductive layer 23 can be formed at the step of forming the conductive layer 23 for connecting the one semiconductor region of the transfer MISFET Qt and the gate electrode 7 of the drive MISFET Qd. As a result, the number of steps of fabricating the SRAM 1 can be reduced to an extent corresponding to the step of forming that intermediate conductive layer 23. Since, moreover, the conductive layer 23 is formed of the conductive layer identical to that of the second electrode 23 of the capacity element C and the gate electrode 23 of the load MISFET Qp, the number of steps of fabricating the SRAM 1 can be reduced to an extent corresponding to the step of forming that conductive layer 23.

Step of Forming Third Gate Insulating Film

The insulating film 24 is formed all over the surface of the substrate including the individual upper portions of the gate electrode 23, the second electrode 23, the conductive layer 23 and the intermediate conductive layer 23. The insulating film 24 isolates the underlying conductive layer such as the gate electrode 23 and the overlying conductive layer (26) electrically and is used as the gate insulating film 24 of the load MISFET Qp. The insulating film 24 is formed, like the dielectric film 21 or the like of the aforementioned capacity element C, of the silicon oxide film which is deposited by the CVD method using the inorganic silane gases as its source gases. The insulating film 24 is formed to have a thickness of about 20 [nm] or more so as to retain the dielectric strength and is used as the gate insulating film 24 of the load MISFET Qp. For this use, the insulating film 24 is formed to have a thickness of about 50 [nm] or less so as to retain the conductive (or ON) characteristics. In the present embodiment, the insulating film 24 is formed to have a thickness of 35 to 45 [nm], for example.

Step of Fourth-Layered Gate Material

Next, the connection hole 25 is formed in the insulating film 24 over the conductive layer 23 of the memory cell MC of the memory cell array MAY. The connection hole 25 is formed to connect the underlying conductive layer 23 and the overlying conductive layer (26, or actually the n-channel forming region 26N of the load MISFET Qp).

Next, the polycrystalline silicon film 26 is formed all over the substrate including the insulating film 24. This polycrystalline silicon film 26 is formed at the gate material forming step of the fourth layer. The polycrystalline silicon film 26 forms the n-channel forming region (26N), the source region (26P) and the power supply voltage line (Vcc: 26P) of the load MISFET Qp. The polycrystalline silicon film 26 is formed, unlike the aforementioned polycrystalline silicon films 7, 13A and 23, of the so-called "non-doped polysilicon" which is deposited by the CVD method using the $Si_2H_6$ as its source gases. The polycrystalline silicon film 26 is formed to have a thickness as small as 40 [nm], for example.

Figure 39:
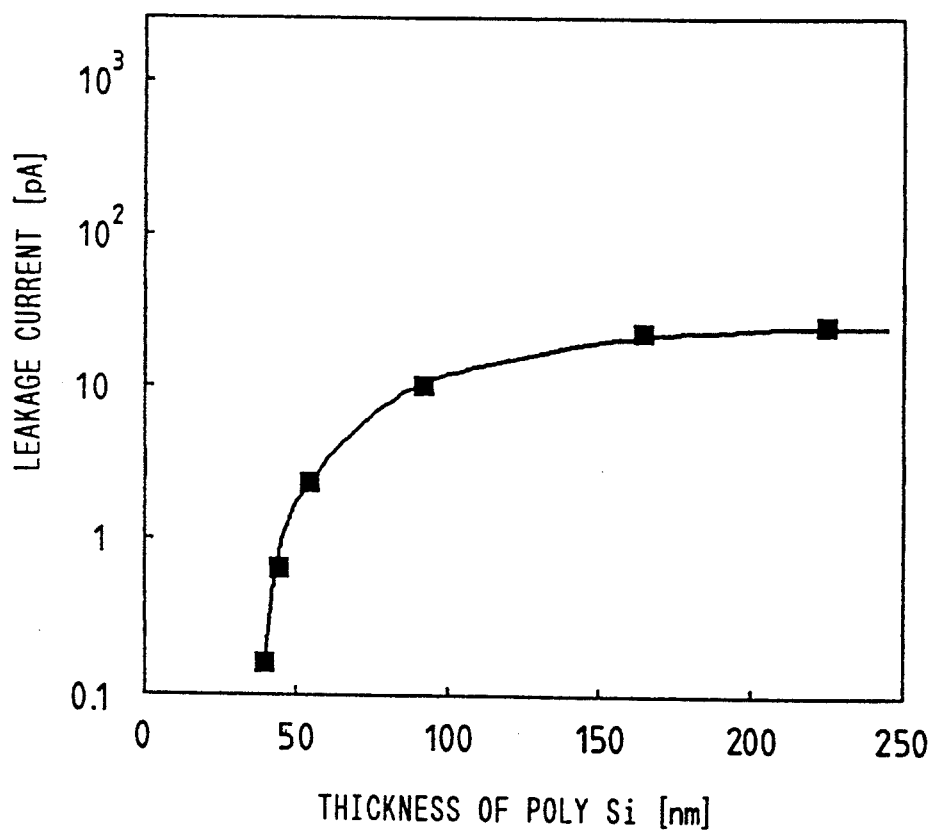

The polycrystalline silicon film 26 is formed to have such a thickness of 30 [nm] or more that the crystal grains exert no influence upon the uniformity, as has been described hereinbefore. On the other hand, the polycrystalline silicon film 26 is formed to have a thickness of 50 [nm] or less, as shown in FIG. 39 (presenting the dependency of the leakage current upon the film thickness), so as to reduce the leakage current as the load MISFET Qp. In FIG. 39, the abscissa indicates the thickness [nm] of the polycrystalline silicon film, and the ordinate indicates the leakage current [pA]. As seen from FIG. 39, the polycrystalline silicon film can reduce the leakage current abruptly for a thickness of less than about 50 [nm].

Step of Forming Third Source Region and Drain Region

Next, an insulating film is formed over the polycrystalline silicon film 26, although not shown. The insulating film is formed to prevent the contamination at the time of impurity introduction and to soften the damage of the surface. The insulating film is formed of a silicon oxide film, which is prepared by the thermal oxidation, for example, to have a thickness as small as about 4 to 6 [nm].

Next, the polycrystalline silicon film 26 is doped all over its surface with the impurity for adjusting the threshold voltage. This impurity used is exemplified by the n-type impurity such as phosphorus (P). This P is introduced to change the threshold voltage of the load MISFET Qp into the enhancement type. The threshold voltage of the enhancement type is attained in an impurity concentration of about $10^{17}$ to $10^{18}$ [atoms/cm$^2$]. Therefore, the P is introduced in a concentration of about $10^{12}$ to $10^{13}$ [atoms/cm$^2$] by the ion implantation using an energy of about 30 [KeV]. In case the impurity concentration of the P introduced into the polycrystalline silicon film exceeds $10^{18}$ [atoms/cm$^2$], the polycrystalline silicon film has its threshold voltage raised (in its absolute value) so that it is used as a high-resistance element. In other words, the load MISFET Qp has its data holding characteristics deteriorated, when inconductive (OFF), because what can supply the power supply voltage Vcc to the data storage node region of the memory cell MC is the electric current corresponding to the leakage current of the n-channel forming region (26N). If, on the other hand, the impurity concentration of the P to be introduced into the polycrystalline silicon film is further increased to raise the threshold voltage, the leakage current increases. This increase in the leakage current obstructs the power construction. The n-channel forming region 26N is formed at the step of introducing the threshold voltage adjusting impurity.

Next, the p-type impurity is introduced into the aforementioned polycrystalline silicon film 26 in the regions of the load MISFET Qp of the memory cell MC of the memory cell array MAY for forming the source region (26P) and the power supply voltage line (Vcc: 26P). The p-type impurity used is exemplified by $BF_2$ and is introduced into the region which is enclosed by doubledotted lines, as indicated at 26p in FIG. 13. The $BF_2$ is introduced in a concentration of about $10^{14}$ [atoms/cm$^2$] by the ion implantation using an energy of about 30 [KeV]. At the time of introducing the p-type impurity, the photo resist film formed by the photolithography technology is used as the impurity introduction mask.

Figure 29:
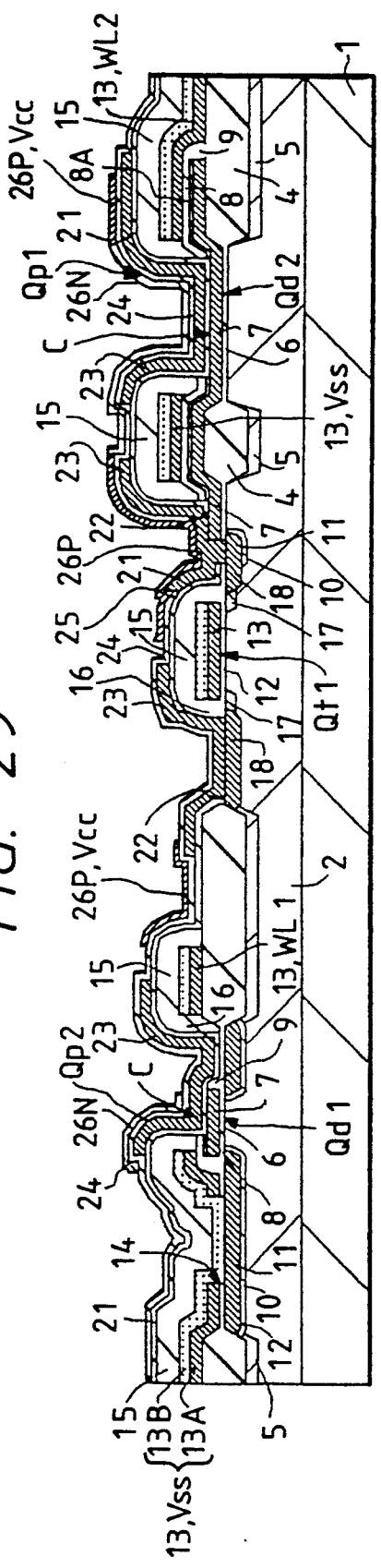

Next, the aforementioned polycrystalline silicon film 26 is patterned to form the n-channel forming region 26N, the source region 26P and the power supply voltage line 26P individually. This patterning of the polycrystalline silicon film 26 is carried out by the anisotropic etching such as the RIE using the etching mask which is formed by the photolithography technology, for example. When the n-channel forming region 26N and the source region 26P are formed, the load MISFET Qp of the memory cell MC is completed, as shown in FIG. 29. At the completion of this load MISFET Qp, the memory cell MC is completed. On the other hand, the aforementioned power supply voltage line 26P is connected through the connection hole with the p+-type well region 20 in the region (e.g., the region of the X-decoder circuit XDEC) of the peripheral circuit, as shown in FIG. 22. This p+-type well region 20 is formed at the fabrication step identical to that of the source region and the drain region (20) of the p-channel MISFET Qp of the peripheral circuit.

(B-9): In the SRAM 1 having the memory cell MC composed of the load MISFET Qp which has its n-channel channel forming region 26N and source region 26P (and drain region) formed of the polycrystalline silicon film 26 deposited by the CVD method, the load MISFET Qp of the memory cell MC has its n-channel forming region (of non-doped polysilicon) doped with the n-type impurity having the conduction type reverse to the channel conduction type (i.e., the p type). Thanks to this structure, the controls of the conduction and inconduction (ON and OFF) of the load MISFET Qp of the memory cell MC can be ensured by enlarging the threshold voltage of the load MISFET Qp in its absolute value and by setting the threshold voltage in the enhancement type. As a result, the supply of the power supply voltage Vcc from the power supply voltage line (Vcc) 26 to the data storage node region of the memory cell MC can be ensured to hold the data stably. At the same time, the supply of the useless current (i.e., the leakage current) can be reduced to reduce the standby current flow of the SRAM 1 adopting the battery backup system.

(C-20): The process for fabricating the SRAM 1 having its memory cell MC composed of the drive MISFET Qd and the load MISFET Qp, comprises: the step of forming the gate electrode 7, the source region and the drain region (11) of the drive MISFET Qd over the principal surface of the p−-type well region (substrate) 2 to be formed with the drive MISFET Qd of the memory cell MC; the step of forming the gate electrode 23 of the load MISFET Qp through the dielectric film 21 over the gate electrode 7 of the drive MISFET Qd, and connecting the gate electrode 23 with the drain region (11) of the drive MISFET Qd; and the step of forming the channel forming region 26N, the source region (and the drain region) 26P through the gate insulating film 24 over the gate electrode 23 of the load MISFET Qp. Thanks to this structure, the first electrode 7 of the capacity element C to be inserted between the data storage node regions can be formed at the step of forming the gate electrode 7 of the drive MISFET Qd, and the second electrode 23 of the capacity element C can be formed at the step of forming the gate electrode 23 of the load MISFET Qp. As a result, the number of steps of fabricating the SRAM 1 can be reduced to an extent corresponding to the step of forming the capacity element C. Since, moreover, the load MISFET Qp and the capacity element C are superposed over the drive MISFET Qd of the memory cell MC, the occupied area of the memory cell MC can be reduced to an extent corresponding to the superposition thereby to improve the degree of integration of the SRAM 1.

(C-21): The gate electrode 23 of the load MISFET Qp of the aforementioned structure (C-20) is formed of either the polycrystalline silicon film (of doped polysilicon) deposited by the CVD method using the $Si_2H_6$ as its source gases or the polycrystalline silicon film (of doped polysilicon) deposited by the CVD method and doped with the impurity for reducing the resistance during the deposition. Thanks to this structure, the surface of the polycrystalline silicon film 23 at the side to contact with the gate insulating film 24, i.e., the upper surface of the gate electrode 23 can be made flatter than the polycrystalline silicon film which has its resistance reduced by doping with the impurity after having been deposited (with the non-doped polysilicon) by the CVD method. As a result, the concentration of the electric field to be generated between the gate electrode 23 of the load MISFET Qp and the n-channel forming region 26N (or the source region 26P) can be prevented to improve the dielectric strength of the gate insulating film 24 thereby to reduce the thickness of the gate insulating film 24 of the load MISFET Qp. The gate insulating film 24 of the load MISFET Qp thus thinned can improve the electric characteristics (or the ON characteristics).

(C-22): The n-channel forming region 26N of the load MISFET Qp of the aforementioned structure (C-21) is formed to have the film thickness within a range of 30 [nm] to 50 [nm]. Thanks to this structure, the leakage current in the n-channel forming region 26P of the load MISFET Qp can be remarkably reduced to reduce the useless current to be supplied from the power source Vcc to the data storage node region of the memory cell MC so that the standby current of the SRAM 1 adopting the battery backup system can be reduced.

(C-23): The gate insulating film 24 of the load MISFET Qp of the aforementioned structure (C-21) is formed of the silicon oxide film deposited by the CVD method. Thanks to this structure, the surface of the gate electrode 23 of the load MISFET Qp at the side of the gate insulating film 24 can be flattened to improve the dielectric strength of the gate insulating film 24 thereby to reduce the thickness of the gate insulating film 24. As a result, the electric characteristics of the load MISFET Qp can be improved.

(C-24): The gate insulating film 24 of the load MISFET Qp of the aforementioned structure (C-23) is formed to have the film thickness within a range of 30 [nm] to 50 [nm]. Thanks to this structure, the gate insulating film 24 of the load MISFET Qp can be thinned to improve the electric characteristics of the load MISFET Qp.

Step of First-Layered Metal Wiring Line

Next, the inter-layer insulating film 27 is formed all over the substrate including the aforementioned memory cell MC. This inter-layer insulating film 27 is constructed to have the two-layered laminated structure which is formed by laminating the silicon oxide film 27A and the BPSG film 27B sequentially. The lower silicon oxide film 27A is formed to prevent the B and P contained in the upper BPSG film 27B from individually leaking to the lower layer. The silicon oxide film 27A is deposited by the CVD method using the Si-$(OC_2H_5)_4$, for example, as its source gases at a high temperature (e.g., 600 to 800 [°C.] and under a low pressure (e.g., 1.0 [torr]). The silicon oxide film 27A is formed to have a thickness of 140 to 160 [nm], for example.

The upper BPSG film 27B is formed to suppress the growth of the step shape of the upper layer by flattening the surface. The BPSG film 27B is deposited by the CVD method using the inorganic silane (e.g., $SiH_4$) mainly as its source gases. This BPSG film 27B is deposited to have a thickness of 280 to 320 [nm], for example, and is subjected to the glass flow to have its surface flattened. This glass flow is carried out in the nitrogen gases, for example, at a high temperature of 800 to 900 [°C.] for about 10 [min.].

Next, the connection hole 28 is formed in the aforementioned inter-layer insulating film 27. The connection hole 28 is formed over the intermediate conductive layer 23 which is formed over the other semiconductor region (18) of the transfer MISFET Qt of the memory cell MC in the memory cell array MAY. The connection hole 28 is formed by the anisotropic etching such as the RIE using the etching mask formed by the photolithography technology. The connection hole 28 is further formed, as shown in FIG. 21, over the $n^+$-type semiconductor region 18 of the n-channel MISFET Qn of the peripheral circuit, the $p^+$-type semiconductor region 20 of the p-channel MISFETs Qp and so on. The connection hole 28 is further formed over the $p^+$-type semiconductor region 20 at the connection portion of the power supply voltage line 26P of the peripheral circuit shown in FIG. 22.

Next, the metal film 29 having the high melting point is formed all over the surface of the substrate including the aforementioned inter-layer insulating film 27. This refractory metal film 29 is formed at the metal wiring forming step of the first layer. The refractory metal film 29 is formed of the tungsten (W) film which is deposited by the sputtering point, for example. This W film has an excellent step coverage at the step-shaped portion, in case it is deposited by the CVD method, but is liable to be peeled off from the surface of the inter-layer insulating film 27. The W film thus deposited by the sputtering method has not only an advantage that its bondability at the surface of the inter-layer insulating film 27 is high but also disadvantages that its step coverage is weak and that the internal stress is augmented if the film thickness is large. Therefore, the SRAM 1 of the present embodiment flattens the inter-layer insulating film 27 underlying the W film (by the glass flow using the BPSG film 27B) by making use of the advantage of the high bondability of the W film to cope with the step coverage and thins the W film to cope with the internal stress. The W film is formed to have a small thickness of 280 to 320 [nm], for example, as the metal wiring line.

Figure 30:
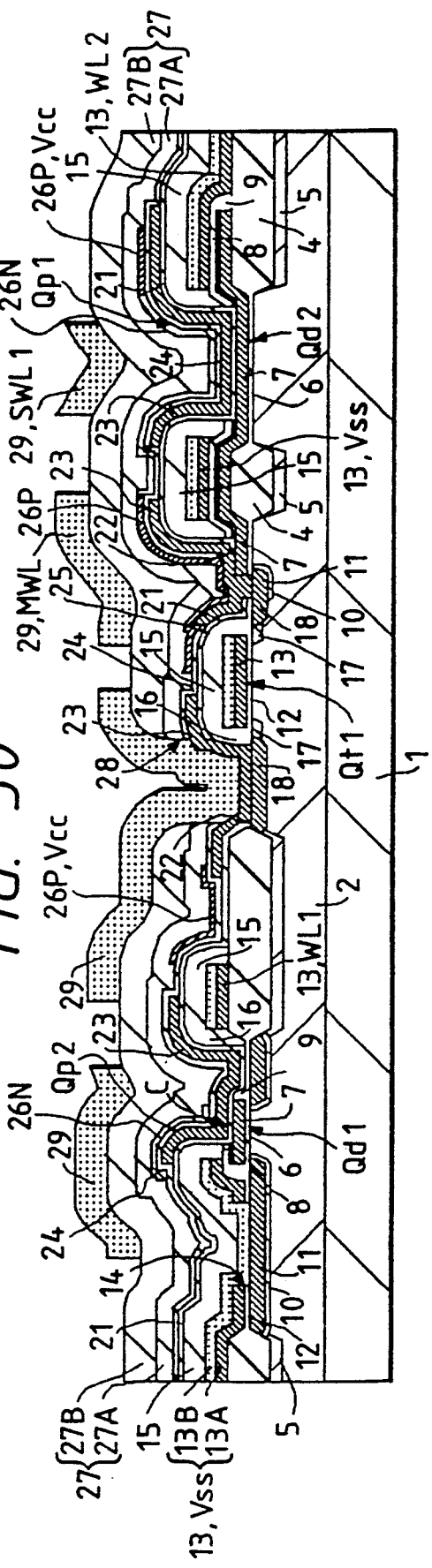

Next, the aforementioned refractory metal film 29 is patterned to form the main word line (MWL) 29, the sub-word line (SWL) 29 and the intermediate conductive layer 29 individually in the memory cell array MAY, as shown in FIG. 30. The intermediate conductive layer 29 is partially connected through the connection hole 28 with the underlying intermediate conductive layer 23. This intermediate conductive layer 23 is connected with the other semiconductor region (18) of the transfer MISFET Qt of the memory cell MC. As shown in FIG. 21, moreover, the wiring line 29 is formed in the peripheral circuit. The power supply intermediate wiring line (Vcc) 29 is further formed in the peripheral circuit shown in FIG. 22. The power supply intermediate wiring line 29 is once connected through the connection hole 28 with the p+-type semiconductor region 20 and then through this p+-type semiconductor region 20 with the power supply voltage line 26P extending over the memory cell array MAY. The patterning of the aforementioned refractory metal film 29 is carried out by the anisotropic etching using the etching mask which is formed by the photolithography technology, for example.

(A-12): The main word line (MWL) 29 and the sub-word line (SWL) 29 of the aforementioned structure (A-11) are individually formed of the refractory metal film (or the W film) and deposited by the sputtering method, and the inter-layer insulating films 27 underlying the main word line 29 and the sub-word line 29 are formed of the BPSG film (or the silicon oxide film) 27B flattened by the glass flow. Thanks to this structure, the refractory metal film and deposited by the sputtering method has the higher bondability to the underlying inter-layer insulating film 27 than that deposited by the CVD method so that the main word line 29 and the sub-word line 29 can be individually prevented from being separated. At the same time, the underlying inter-layer insulating film 27 is flattened so that the individual step coverages of the main word line 29 and the sub-word line 29 can be improved to prevent the individual breakage failures of the main word line 29 and the sub-word line 29. On the other hand, the refractory metal film 29 thus deposited by the sputtering method is formed to have a thickness as small as about 280 to 320 [nm] to reduce the internal stress.

(D-6): The process for fabricating the SRAM 1 in which the power supply wiring line 26P for supplying the electric power voltage Vcc to the memory cell Vcc is connected in the peripheral portion of the memory cell array MAY with the power supply intermediate wiring line 29 formed above the power supply voltage line 26P through the inter-layer insulating film 27, comprises: the step of forming the p+-type semiconductor region 20 in the peripheral portion of the memory cell array MAY over the n−-type well region (or the substrate) 3; the step of forming the interlayer insulating films 21 and 24 all over the substrate including the p+-type semiconductor region 20; the step of forming the connection hole 25 by removing the region of the portion of the p+-type semiconductor region 20 of the inter-layer insulating films 21 and 24; the step of forming such a power supply voltage line 26 over the inter-layer insulating film 24 as to be connected with the region of the portion of the p+-type semiconductor region 20 through the connection hole 25; the step of forming the inter-layer insulating film 27 all over the surface of the substrate including the power supply voltage line 26P; the step of forming the connection hole 28 by removing the region of the other portion of the p+-type semiconductor region 20 of the inter-layer insulating films 21 and 24; and the step of forming such a power supply intermediate wiring line 29 over the inter-layer insulating film 27 as to be connected with the region of the other portion of the p+-type semiconductor region 20 through the connection hole 28. Thanks to this structure, the connection hole 28 is formed not over the power supply voltage line 26P but over the p+-type semiconductor region 20 in the region different from the power supply voltage line 26P (in which the p+-type semiconductor region 20 is formed as the buffer layer for forming the connection hole 28) so that the through failure of the power supply voltage line 26P due to the over-etching can be prevented for the connection hole 28, to improve the fabrication yield of the SRAM 1. Incidentally, in this connection structure, not only the p+-type semiconductor region 20 but also the conductive layer (e.g., 23, 13, 7 or their laminated films) below the power supply voltage line 26P may be interposed between the power supply voltage line 26P and the power supply intermediate wiring line 29. Since, however, the power supply voltage line 26 is made to have the p type, that conductive layer is made to have the p type, in case it is formed of the polycrystalline silicon film, so that no pn junction may be established. Moreover, the conductive layer may also be formed of a refractory metal film which is freed from the pn junction.

(D-7): The step of forming the p+-type semiconductor region 20 of the aforementioned structure (D-6) is identical to the step of forming the source region and drain region (20) of the p-channel MISFET Qp of the peripheral circuit arranged in the peripheral region of the memory cell array MAY. Thanks to this structure, the p+-type semiconductor region 20 can be formed at the step identical to that of forming the source region and drain region of the p-channel MISFET Qp of the peripheral circuit so that the number of steps of fabricating the SRAM 1 can be reduced to an extent corresponding to the step of forming the p+-type semiconductor region 20.

Step of Forming Buried Electrode

Next, the inter-layer insulating film 30 is formed all over the surface of the substrate including the individual upper portions of the aforementioned main word line 29, sub-word line 29 and intermediate conductive layer 20. The inter-layer insulating film 30 is formed to have a three-layered laminated structure which is made by laminating the silicon oxide film 30A, the silicon oxide film 30B and the silicon oxide film 30C sequentially.

The lower silicon oxide film 30A is deposited by the plasma CVD method using the tetra ethoxy silane gases (TEOS: $Si(OC_2H_5)_4$) as its source gases. The silicon oxide film 30A can have a uniform thickness at its flat and stepped portions. In case, for example, the main word line 29 and the sub-word line 29 have their intermediate recess (corresponding to the minimum wiring gap) buried to have its surface flattened, the silicon oxide film 30A hardly has the overhang shape so that it is freed from the so-called "formation of cavity". The silicon oxide film 30A is formed to have a thickness of 400 [nm], i.e., one half or more of the minimum wiring gap with a view to flatten its surface by burying the aforementioned minimum wiring gap.

The intermediate silicon oxide film 30B is applied to have a thickness of about 200 [nm], for example, by the spin-on-glass method and is baked until it is etched all over its surface. This silicon oxide film 30B is formed mainly to flatten the surface of the inter-layer insulating film 30. The aforementioned whole surface etching is carried under the condition that the silicon oxide film 30B is left not at its connections with the underlying conductive layer (29) and the overlying conductive layer (33) but at the stepped portion.

The upper silicon oxide film 30C is deposited like the lower silicon oxide film 30A by the plasma CVD method using the tetra ethoxy silane gases as its source gases. This silicon oxide film 30C is formed to have a thickness of 400 [nm], for example. The silicon oxide film 30C is formed to retain the film thickness as the inter-layer insulating film 30 and to coat the intermediate silicon oxide film 30B thereby to prevent the film quality of the intermediate silicon oxide film 30B from being deteriorated.

Next, the connection hole 31 is formed in the aforementioned inter-layer insulating film 30. The connection hole 31 is formed by the anisotropic etching such as the RIE using the etching mask which is formed by the photolithography technology, for example.

Figure 31:
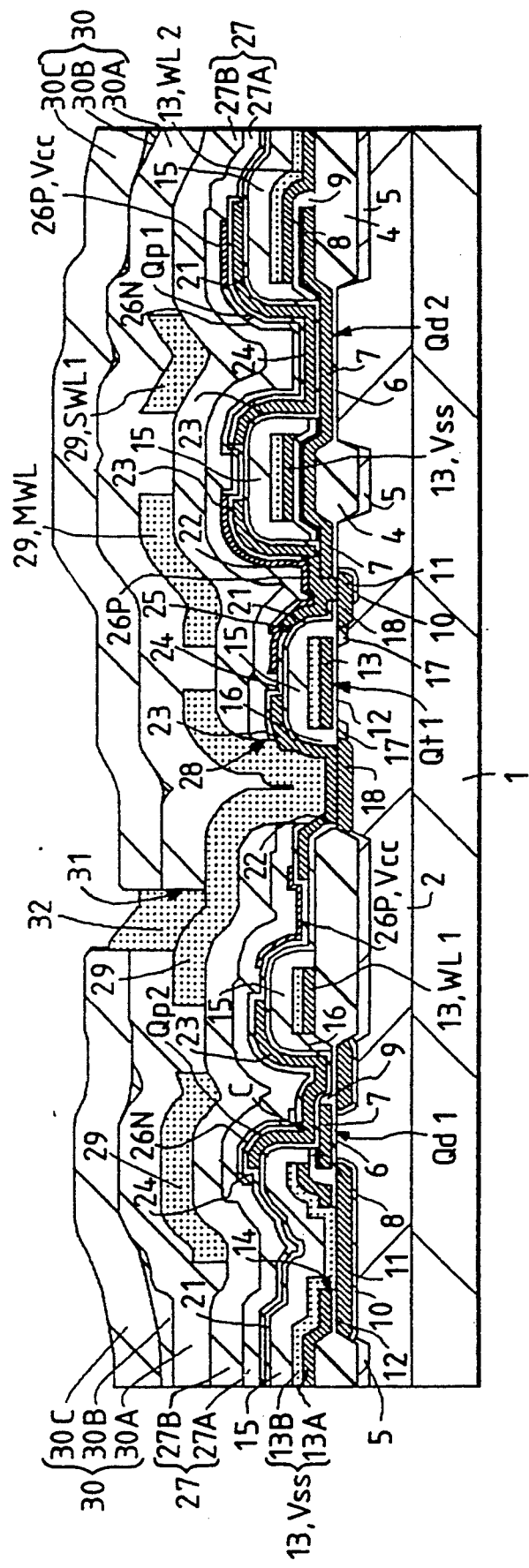

Next, the buried electrode 32 is formed in the aforementioned connection hole 31, as shown FIG. 31. Since the surface of the refractory metal film of the intermediate conductive layer 29 is exposed to the inside of the connection hole 31, the buried electrode 32 is formed over the surface of that refractory metal film. The buried electrode 32 is formed of the W film which is deposited by the selective CVD method, for example.

Step of Forming Second-Layered Metal Wiring Line

Figure 32:
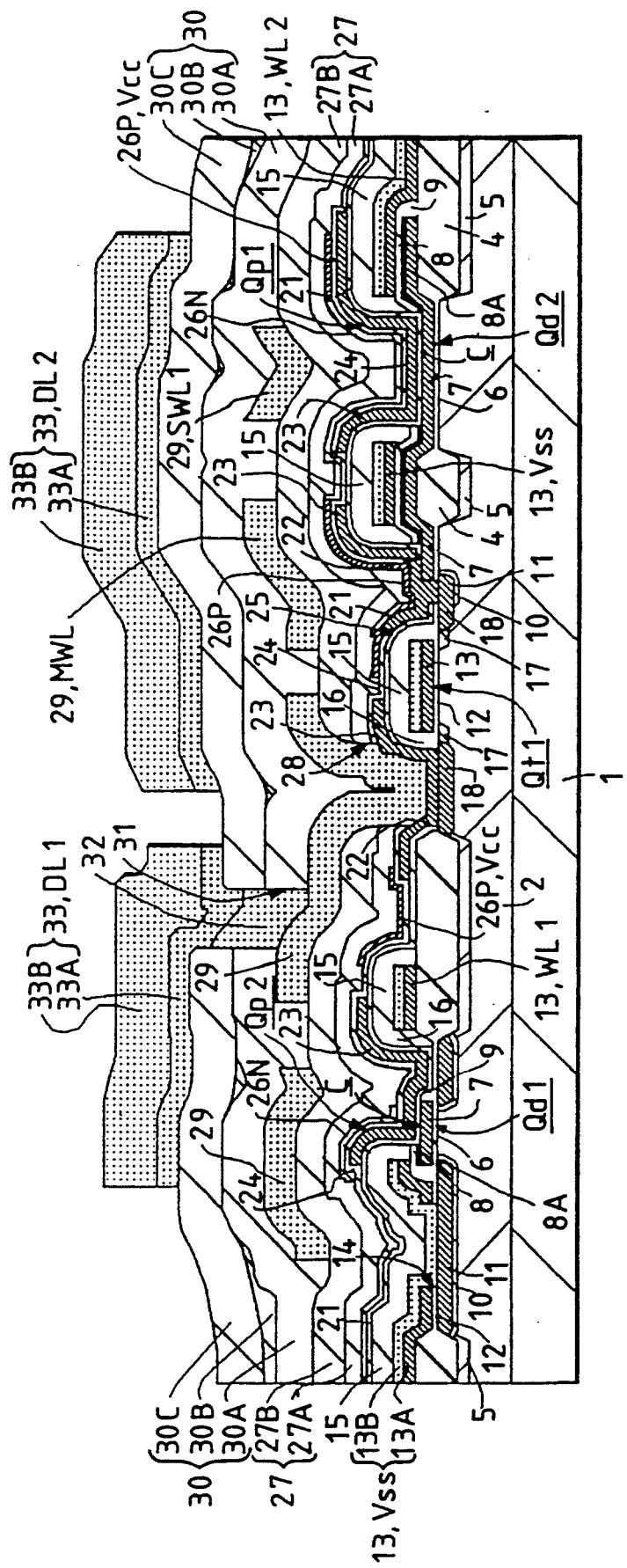

Next, the memory cell array MAY is formed with the complementary data line (DL) 33 over the aforementioned inter-layer insulating film 30, as shown in FIG. 32. As shown in FIG. 21, on the other hand, the wiring line 33 is formed over the inter-layer insulating film 30. The complementary data line 33 (and the wiring line 33) is formed at the step of forming the second-layered metal wiring line. The complementary data line 33 is connected with the underlying intermediate conductive layer 29 through the buried electrode 32 buried in the connection hole 31. The complementary data line 33 is constructed to have the two-layered laminated structure which is formed by laminating the barrier metal film 33A and the aluminum alloy film 33B sequentially. The lower barrier metal film 33A is formed of the TiW film which is deposited by the sputtering method, for example, to have a thickness of about 180 to 220 [nm]. The upper aluminum alloy film 33B is formed of the aluminum, to which the Cu or Si is added, to have a thickness of about 700 to 900 [nm].

(C-25): The process for fabricating the SRAM 1 having the multi-layered wiring structure in which the upper wiring line (33) is formed above the lower wiring line (29) through the inter-layer insulating film 30, comprises: the step of forming the first wiring line and the second wiring line (29) as the lower wiring line over the substrate at the predetermined gap from each other; the step of depositing the lower silicon oxide film 30A having the thickness of one half or more of the gap between the first and second wiring lines of the lower wiring line (29) all over the substrate including the lower wiring line (29) by using the plasma CVD method using the tetra ethoxy silane as its source gates; the step of applying the silicon oxide film 30B all over the surface of the substrate including the silicon oxide film 30A by the spin-on-glass method and then baking the silicon oxide film 30B; the step of etching all over the surface of the silicon oxide film 30B to remove the silicon oxide film 30B from the first and second wiring lines of the lower wiring line (29) while leaving the same in the other regions; the step of depositing the upper silicon oxide film 30C by the CVD method all over the surface of the substrate including the silicon oxide film 30B thus left; the step of forming the connection hole 31 by removing the first wiring line or the second wiring line (29) of the silicon oxide films 30A, 30B and 30C; and the step of forming such an upper wiring line (33) over the upper silicon oxide film 30C as to be connected with the first wiring line or the second wiring line (29) through the connection hole 31. Thanks to this structure, the film thicknesses at the flat and stepped portions of the silicon oxide film 30A can be uniformalized to reduce the cavity which might otherwise be formed in the region between the first and second wiring lines of the lower wiring line (29) on the basis of the overhang shape of the silicon oxide film 30A. As a result, the insulation failures of the inter-layer insulating film 30 such as the extension of the cavity at the time of etching the whole surface of the silicon oxide film 30B can be reduced to improve the fabrication yield of the SRAM 1. Moreover, the surface of the silicon oxide film 30C can be flattened by leveling the steep step shape of the surface of the silicon oxide film 30A with the silicon oxide film 30B. As a result, the breakage failures of the upper wiring line (33) can be reduced to improve the fabrication yield of the SRAM 1. Since, still moreover, the silicon oxide film 30B is not left in the connection hole 31 between the lower wiring line (29) and the upper wiring line (33) by the whole surface etching, the upper wiring line (33) can be prevented from being corroded by the moisture contained in the silicon oxide film 30B, to improve the fabrication yield of the SRAM 1. Furthermore, the silicon oxide film 30B has its lower layer coated with the silicon oxide film 30A and its upper layer coated with the silicon oxide film 30C to reduce the absorption of the moisture of the silicon oxide film 30B so that the film quality of the silicon oxide film 30B can be improved. As a result, the silicon oxide film 30B can be prevented from being cracked, to improve the fabrication yield of the SRAM 1.

Step of Forming Final Passivation Film

Next, the final passivation film 34 is formed all over the surface of the substrate including the complementary data line 33, as shown in FIGS. 1 and 21. This final passivation film 34 is constructed to have the three-layered laminated structure which is formed by laminating the silicon oxide film, the silicon nitride film and the resin film sequentially.

The lower silicon oxide film is deposited by the plasma CVD method which is enabled to form a uniform film thickness by using the tetra ethoxy silane gases as its source gases. Since, moreover, the lower silicon oxide film is formed after the aluminum alloy film 33B of the complementary data line 33 has been formed, there is used the aforementioned CVD method which can be used at a low temperature such as about 400 [°C.] or less. This lower silicon oxide film is formed to have a thickness of about 400 [nm], for example.

The intermediate silicon oxide film is formed mainly to improve the moisture resistance. This intermediate silicon oxide film is deposited by the plasma CVD method, for example, to have a thickness of 1.0 to 1.4 [$\mu$m].

The upper resin film is formed of the polyimide resin film, for example, mainly to shield the $\alpha$ rays. This upper resin film is formed to have a thickness of 2.2 to 2.4 [$\mu$m], for example.

The SRAM 1 of the present embodiment is completed by a series of these fabrication processes.

The effects to be obtained by the representatives of the present invention to be disclosed in the present embodiment will be described in brief in the following:

(1) The degree of integration of the semiconductor integrated circuit device having the SRAM can be improved;

(2) The operations of the semiconductor integrated circuit device having the SRAM can be speeded up;

(3) The reliability of the operations of the semiconductor integrated circuit device having the SRAM can be improved;

(4) The power consumption of the semiconductor integrated circuit device having the SRAM can be reduced;

(5) The soft error withstand voltage of the semiconductor integrated circuit device having the SRAM can be improved;

(6) The electric reliability of the semiconductor integrated circuit device having the SRAM can be improved;

(7) The electrostatic breakdown voltage of the semiconductor integrated circuit device having the SRAM can be improved;

(8) The yield of the fabrication process of the semiconductor integrated circuit device having the SRAM can be improved;

(9) The number of steps of the fabrication process of the semiconductor integrated circuit device having the SRAM can be reduced; and

(10) The two of the foregoing effects (1) to (9) can be simultaneously achieved.

Embodiment II

The present embodiment II is a second one of the present invention, in which the semiconductor integrated circuit device having two word lines led in a common memory cell, as disclosed in the foregoing embodiment I, is equipped with an auxiliary word line made of a metal wiring layer.

First of all, the summary of the present embodiment will be described in the following. We have investigated the stability of the semiconductor integrated circuit device having two word lines led in the common memory cell disclosed in the foregoing embodiment I, when the reading and writing operations are accomplished at a high speed. Our investigations have revealed the following problem: Since the word signal lines led in the common memory cell are two (i.e., WL1 and WL2), malfunctions arise at the time of a high-speed access to drop the stability of the operations for the high-speed access in case of a time difference in the operation between one storage node and the other storage node.

The reasoning for this problem will be described in the following.

Generally speaking, the aforementioned word lines are formed over the memory cell so that they are wired to cover a variety of steps. Depending upon the wiring method, the individual word lines have different shapes.

The wiring material used is made of polysilicon and is prepared by the CVD method using silane gases as its main material. The CVD method decomposes the silane to deposit Si and is generally exemplified by the plasma CVD under a low temperature or the hot CVD for the decomposition.

In this case, the deposition thickness is made smaller at the stepped portion by about 10 to several tens % that at the flat portion, as has been described hereinbefore. This structure never fails to establish a resistance difference between the two portions unless the two word lines pass over completely identical steps.

On the other hand, the metal layer is deposited all over the surface of the integrated circuit device by the aforementioned evaporation method and is then shaped to have a predetermined wiring width by the well-known photolithography. At this time, the portions to be left as the wiring lines are patterned with the photo resist material, and this patterning accuracy is also different in dependence upon the step shape of the ground. Specifically, the exposing light coming from the alignment device for the patterning is reflected or diffracted at the step portion of the periphery so that it exerts influences upon the photo resist portion of the portion to be formed with the wiring lines. This disperses the wiring line width in the subsequent dry etching.

In case the wiring lines are to be thus formed over the memory cell, their thickness and width are dispersed by their underlying steps. This never fails to establish a difference between the resistances of the two wiring lines to be formed.

Figure 40:
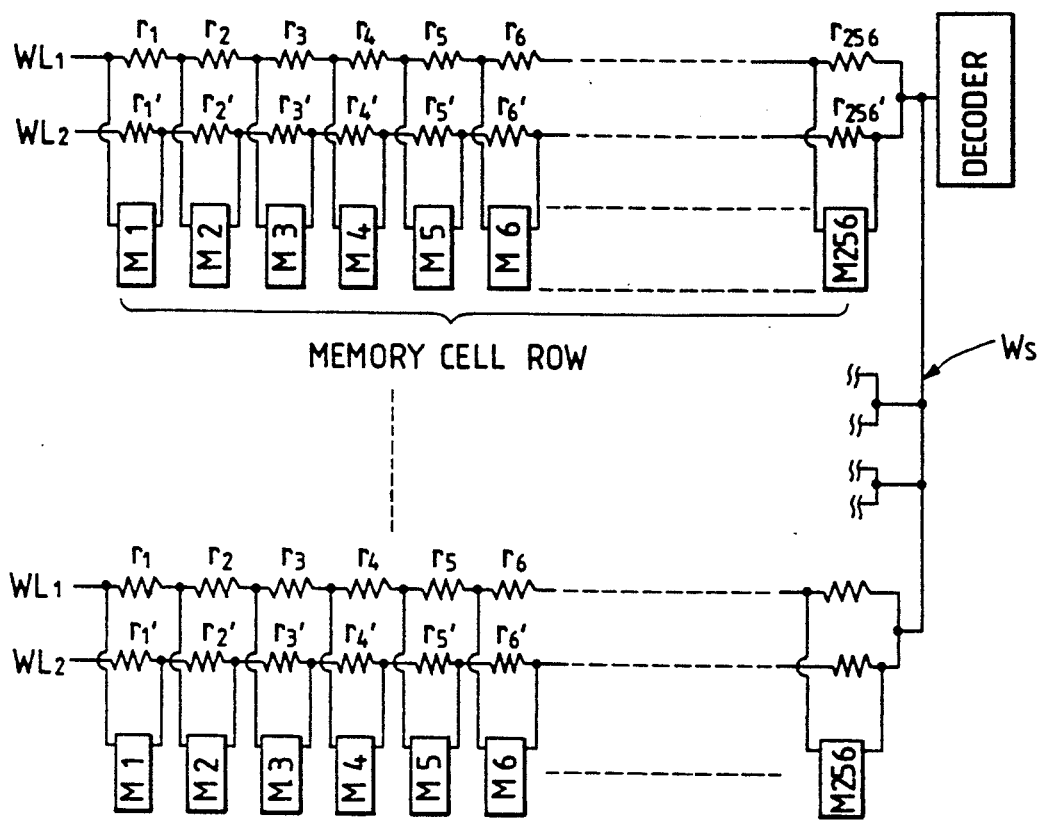
FIG. 40 is a diagram for explaining the operations of a second embodiment of the present invention.

FIG. 40 is a diagram for explaining this resistance difference and shows one memory cell group (or mat) but omits the wiring capacity. Here, the wiring resistors on the WL1 between the memories are designated at $r_1$, $r_2$, $r_3$, and the wiring resistors on the WL 2 between memory cells are designated $r_1'$, $r_2'$, - - -, and $r_{256}'$. If $r_1 > r_1'$ in one memory cell, this wiring line is formed in an identical position in any memory cell. Then, it seems that the resistance difference between the word line WL1 and the other word line WL2 becomes the larger for the larger number n (e.g., n=256 in FIG. 5) of memory cells to a portion in which the two word lines are connected to each other. Specifically, in case an n number of resistors are connected if $r_1 - r_1' = \Delta r$, $(r_1 + r_2 + - - - + r_n) - (r_1' + r_2' + - - - + r_n') = n \cdot \Delta r$ at the terminal end. If, at this time, the wiring capacity C is identical for the WL1 and WL2, it is understood that the access time difference (or the C·R product) is $n \cdot c \cdot \Delta r$. In one mat of the memory cell, generally speaking, 128 or 256 wiring resistors are arranged in one mat (in the transverse direction (or row)) of the memory cell so that the difference is as large as 128 or 256 times. Incidentally, FIG. 40 shows the case of 256 wiring resistors.

In the present embodiment II, therefore, there is provided a structure which is enabled to improve the electric reliability by reducing such malfunctions in the identical memory cell as might be caused by having a pair of different word lines in the high-sped access static RAM.

According to the present embodiment II, there is provided a semiconductor integrated circuit device comprising a memory cell of flip-flop type composed of two drive MOS transistors, two transfer MOS transistors, two load elements and a storage node, wherein, in a memory cell array having two gate wiring lines of the two transfer MOS transistors connected with different word lines, these different word lines are connected for each predetermined memory cell with one auxiliary word line.

According to this structure, the memory cells are connected at a frequency of one for several bits with the auxiliary word lines so that they are at an equal potential at that point. This remarkably reduces the value n of the access time difference $n \cdot c \cdot \Delta r$ so that the malfunctions in the common memory cell can be eliminated to improve the electric reliability.

Figure 41:
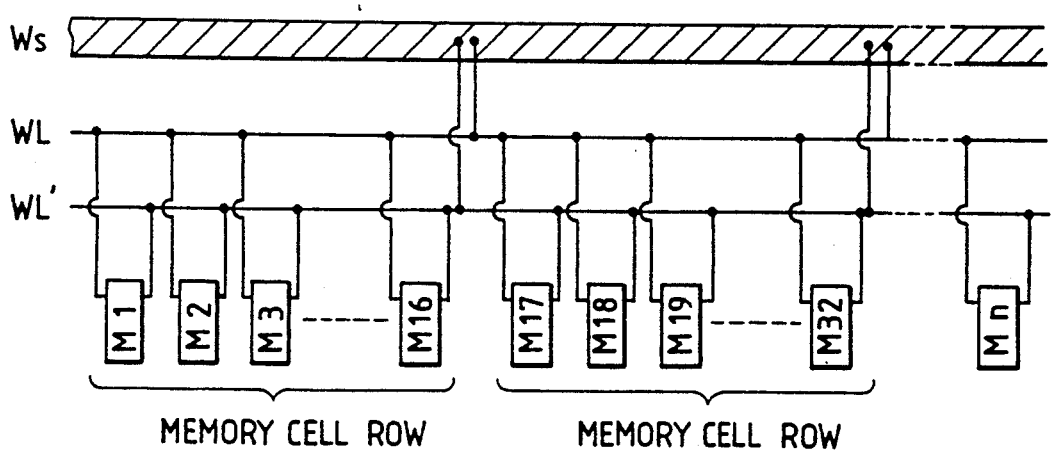
FIG. 41 is a connection diagram showing the circuit of the second embodiment.

The semiconductor integrated circuit device of the present embodiment II will be specifically described in the following with reference to FIGS. 41, 42, 43, 44 and 45. FIG. 41 is a connection diagram showing a circuit in one memory cell group (or mat), and FIG. 42 is a diagram showing a specific example of the layout of the connections.

Here are omitted the data lines DL and $\overline{DL}$ for conveniences of description. First of all, as shown in FIG. 41, individual memory cells $M_1$ to $M_n$ have their individual two internal transfer gates connected with the two word lines WL1 and WL2. Next, these word lines WL1 and WL2 are connected with auxiliary word lines Wss for every memory cells of 16 bits. The auxiliary word lines Wss are connected, although not shown, with the main word line for feeding the signals from the decoder circuits to the plural mats. Here, the word lines WL1 and WL2 are made of the polysilicon which is also used to make the gate electrodes of the transfer MOS transistor. And, the auxiliary word lines is made of a metal wiring layer (e.g., a metal wiring layer which is composed mainly of tunsgsten (W) or aluminum (Al)) so as to reduce the resistance.

Figure 42A:
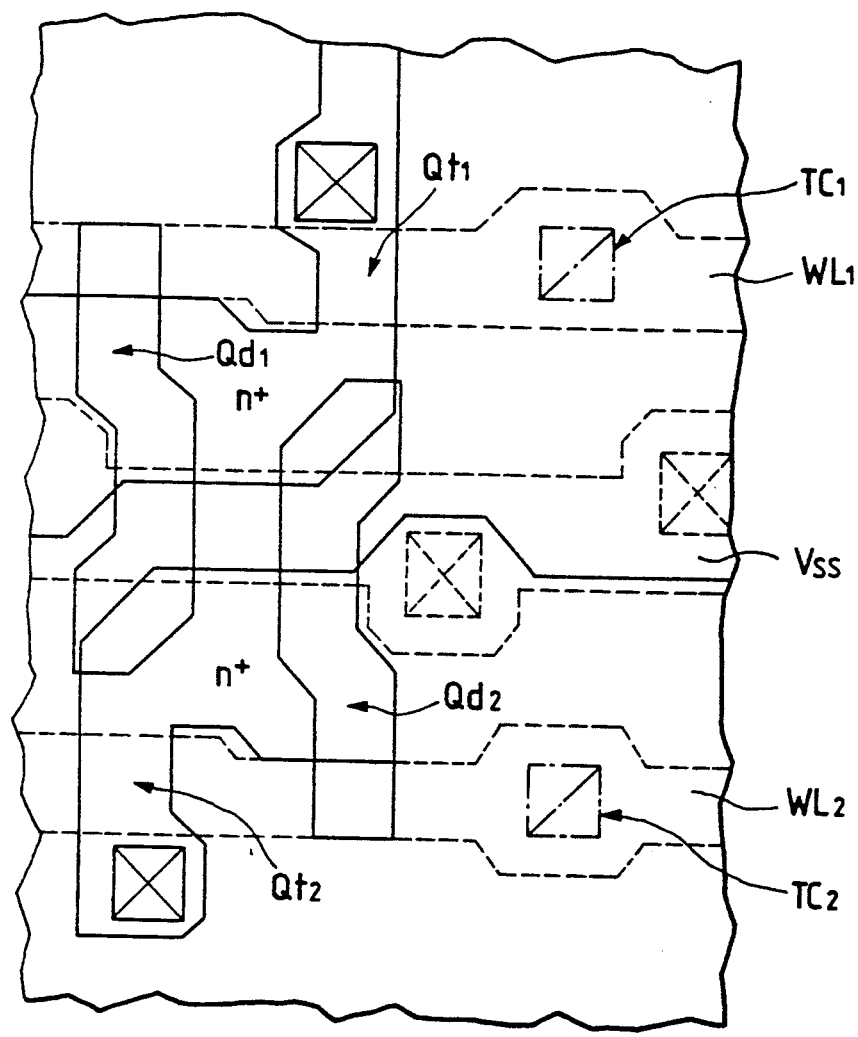
FIGS. 42($a$) and 42($b$) is a layout showing an element in case
Figure 42B:
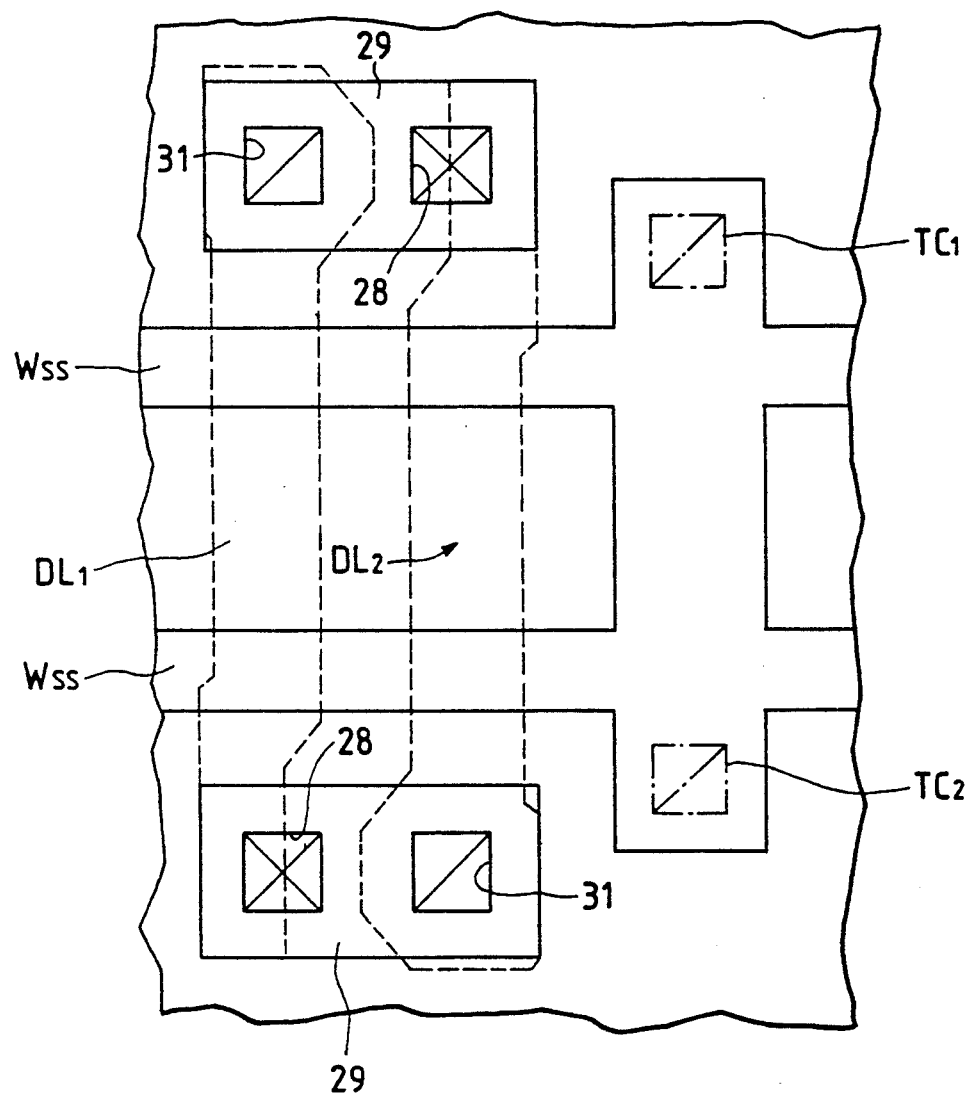

The example of the specific layout of the circuit thus far described will be described in connection with a portion M16 of FIG. 41 with reference to FIGS. 42(a) and 42(b). The detail of the layout content is substantially identical to that of the foregoing embodiment I, and the description to be made hereinafter is restricted to the content relating to the present embodiment II. Incidentally, FIGS. 42(a) and 42(b) correspond to FIGS. 11 and 14 of the foregoing embodiment I, respectively.

A transfer MOS transistor $Qt_1$ has its gate made of a second-layered polysilicon into the word line WL1 and extended from an adjacent memory cell (M15) and is connected, after having passed the gate of the transistor $Qt_1$, with the auxiliary word line Wss, which is made of a metal material for acting as the first metal wiring layer, through a (through hole contact hole) TC1 which is opened in an inter-layer insulating film between the polysilicon and the first metal wiring layer formed at the step of forming the first-layered metal wiring line. Likewise, the transistor $Qt_2$ also has its gate made of the second-layered polysilicon into the word line WL2 and is connected, after having passed the transistor $Qt_2$, with the auxiliary word line Wss, which is made of the first metal wiring layer made of a metal material, through a hole TC2 which is opened in the inter-layer insulating film. This auxiliary word line Wss is formed, for example, over the memory cell of the foregoing embodiment I, in which no main word line MWL is extended. In other words, the auxiliary word line Wss is the metal wiring layer which is identical to the main word line MWL formed at the first-layered metal wiring line forming step.

Incidentally, the first metal wiring layer may be formed of a metal wiring layer made of Al.

As has been apparent from the description thus far made, according to the present embodiment II, the word lines WL1 and WL2 are connected at every 16 bits (i.e., for every sixteen memory cells M) with the auxiliary word line Wss which is made of the metal material or a low-resistance material. As a result, the difference between the resistances applied to the word lines WL1 and WL2 is not so high that the inverters in the common memory cell can be kept away from any malfunction. Moreover, the fabrication step for practicing the present embodiment II can be identical to the step of the embodiment I so that the malfunctions can be eliminated to improve the fabrication yield and the electric reliability.

Figure 43:
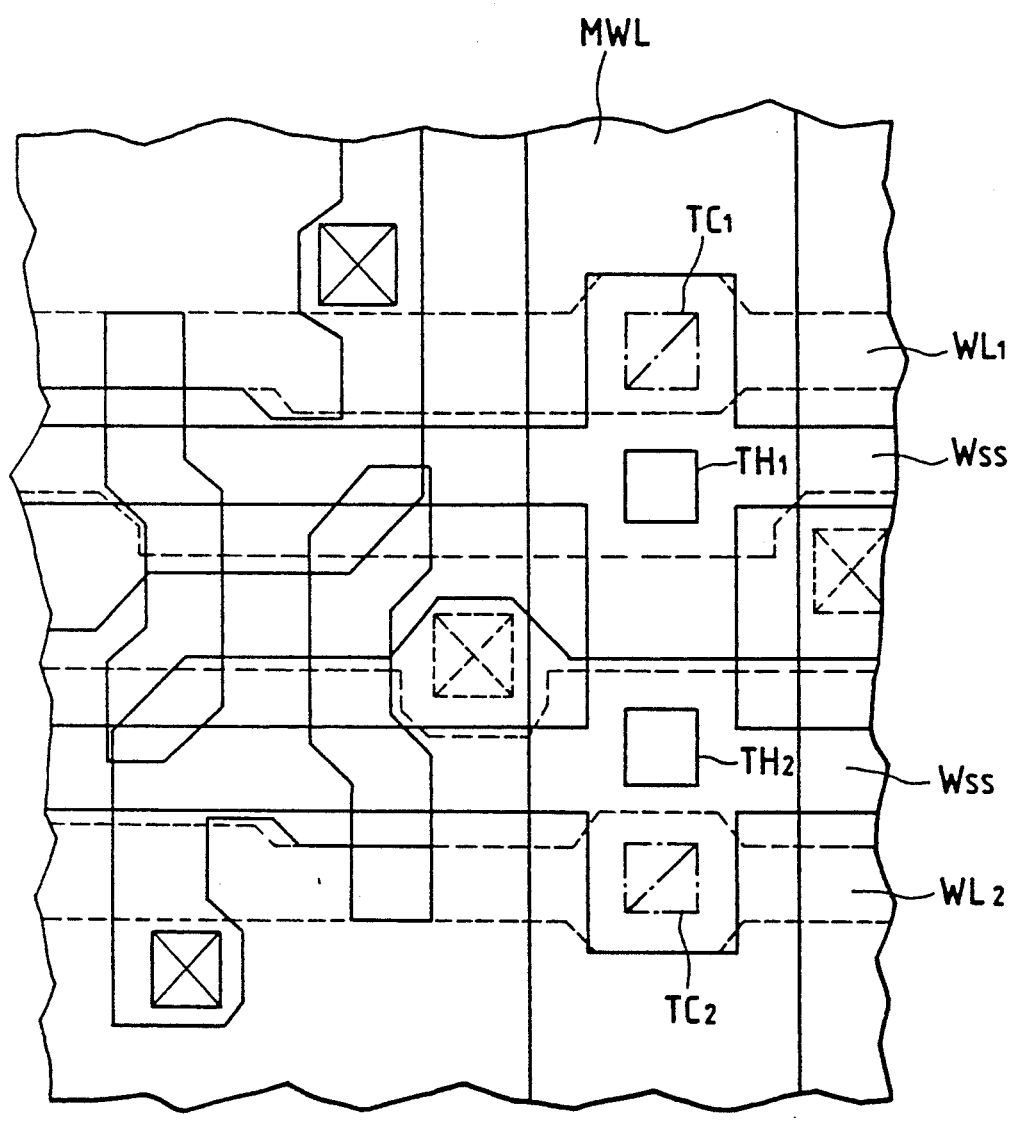
FIG. 43 is a diagram showing a modification of the second embodiment.

Another example of the present embodiment II will be described with reference to FIG. 43. The structure of the memory cells, the word lines WL1 and WL2, the auxiliary word line Wss, and the connection holes TC1 and TC2 between the WL and the Wss are identical to those of FIG. 42. Here will be described the method of reducing the delay of access due to the wiring lines by connecting the Wss with a low-resistance wiring material.

After the formation of the first-layered metal wiring line for the Wss of FIG. 42, an inter-layer insulating film is formed all over the chip, and though holes TH1 and TH2 are opened by the photolithography. After this, the second-layered metal wiring layer is formed to form a predetermined wiring line MW1 by the photolithography. This wiring line MWL is formed by the method of selecting a material having a lower resistance than that of the Wss, the method of enlarging the width or the method of enlarging the thickness, all of which are determined according to the optimum parameters for designing the device.

Here will be made comparisons the case, in which the connection frequency between the WL1 and WL2 and the auxiliary word lines is one for 256 bits, and the case in which the connection frequency is one for 16 bits.

(1) Let the case of one for 256 bits be considered at first:

Let it be assumed that the power supply voltage V = 5 and that the wiring capacity of the polysilicon formed over the memory cell be about $2 \times 10^{-15}$ F/bit. Then, the cell of 128 bits is given a capacity of $2.56 \times 10^{-13}$ F by the connection of one for 256 bits. Hence, the current at this time is expressed by:

$$i = Q/t = C \cdot V/t,$$

wherein t designates the access time of the memory cell. If this element is an LSI accessible for 15 ns, then:

$$i = 2.56 \times 10^{-13} \times 5/15 \times 10^{-9}$$
$$\approx 0.85 \times 10^{-4} A.$$

Generally speaking, on the other hand, the resistance of the polysilicon is excessively high. If this polysilicon is used for the wiring, it is the current practice to reduce the resistance by laying its silicide (WSi) over or below the polysilicon. In the present embodiment II, the resistance of the word line is set at $\rho s = 20$ $\Omega/\square$ by underlaying the WSi. And, the wiring width is set at 0.6 $\mu$m. Here are the dispersion in the plane working accuracy due to the difference in the step shape and the dispersion in the thickness due to the difference in the run-around at the stepped portion, as has been described hereinbefore. Hence, the worst case is examined by considering the dispersion of ±5% into the wiring width and the dispersion of ±10% into the thickness. Then, the resistance is $\rho s$ between the WL1 and WL2, and the WL1 has a resistance of 24 $\Omega/\square$ whereas the WL2 has a resistance 16 $\Omega/\square$ for the average value of 20 $\Omega/\square$. Likewise, the WL2 has a wiring width of 0.66 $\mu$m when the WL1 has a wiring width of 0.54 $\mu$m for an average value of 0.6 μm. Hence, the worst case of the resistance is the resistance of the WL1:

$$R_{max} = \rho s_{max} \times 1/\omega_{min},$$

Figure 44:
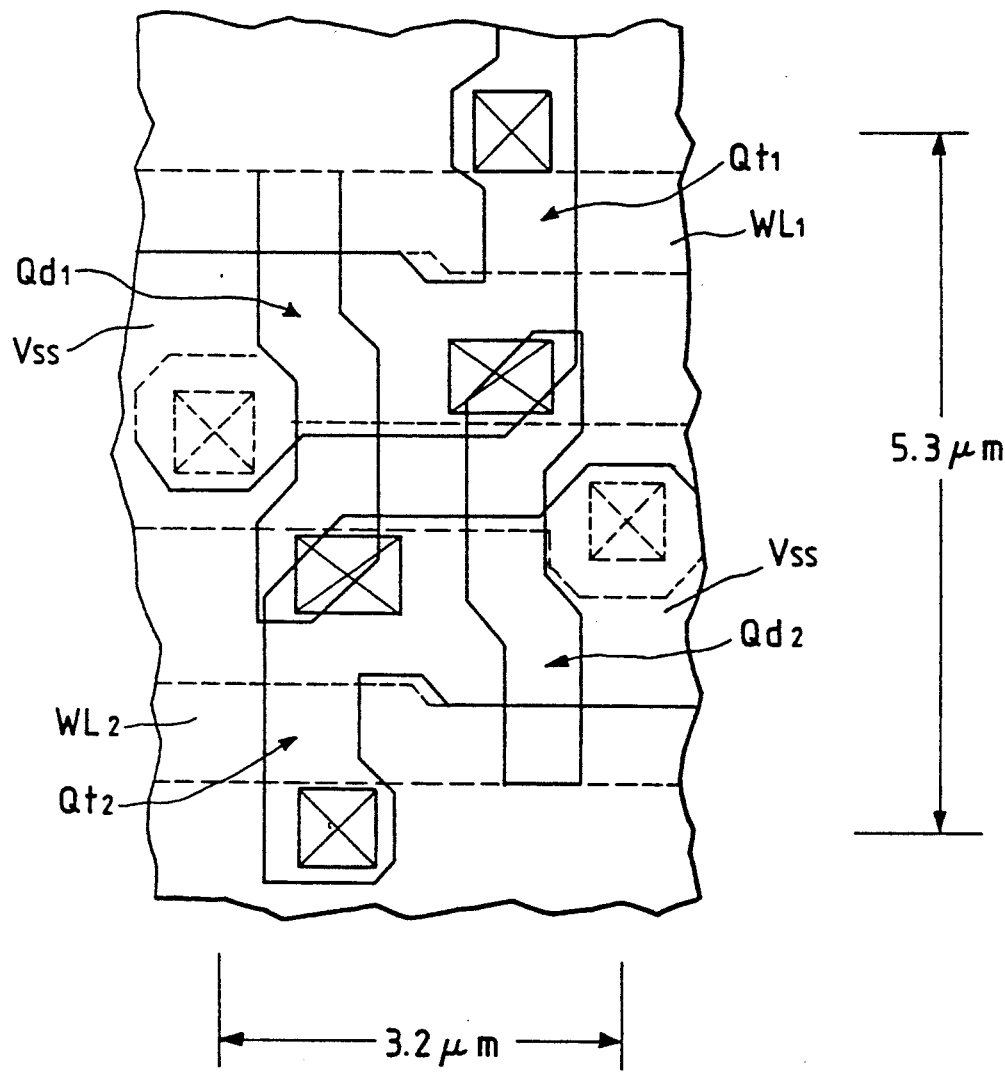
FIG. 44 is a layout showing the element of the second embodiment.

(wherein l is expressed by the length of one memory cell x the bit number with the assumption that the length of the memory cell in the word line direction be 3.2 μm, as shown in FIG. 44), $$R_{max} = 24 \times 3.2 \times 10^{-4} \times 128/0.54 \times 10^{-4}$$
$$\approx 18.2 \, k\Omega.$$

Likewise, the minimum case of the resistance of the WL2:

$$R_{min} = 16 \times 3.2 \times 10^{-4} \times 128/0.66 \times 10^{-4}$$
$$\approx 9.9 \, k\Omega.$$

The voltage drops when the preceding current i flows this resistor,
in case of the WL1:

$$\Delta V = 0.85 \times 10^{-4} \times 1.82 \times 10^{4}$$
$$\approx 1.55 \, V; \text{ and}$$

in case of the WL2:

$$\Delta V = 0.85 \times 10^{-4} \times 9.9 \times 10^{4}$$
$$\approx 0.84 \, V.$$

(2) Let the case of one for 16 bits be then considered:
Likewise, the power supply voltage is 5 V, and the capacity is $2 \times 10^{-5}$ F/bit. Since a memory of 8 bits at one side is added by the connection of one for 16 bits, the wiring capacity C is $16 \times 10^{-15}$ F:

$$i = 16 \times 10^{-5} \times 5/15 \times 10^{-9}$$
$$\approx 5.3 \times 10^{-6} \, A.$$

The resistance of the WL1:

$$R_{max} = 24 \times 3.2 \times 10^{-4} \times 8/0.54 \times 10^{-4}$$
$$\approx 1140 \, \Omega.$$

The resistance of the WL2:

$$R_{min} = 16 \times 3.2 \times 10^{-4} \times 8/0.66 \times 10^{-4}$$
$$\approx 620 \, \Omega.$$

Hence, the voltage drops of the two,
in case of the WL1:

$$\Delta V = 5.3 \times 10^{-6} \times 1.14 \times 10^{3}$$
$$\approx 6 \times 10^{-3} \, V; \text{ and}$$

in case of the WL2:

$$\Delta V = 5.3 \times 10^{-6} \times 6.2 \times 10^{2}$$
$$\approx 3.3 \times 10^{-3} \, V.$$

In case of (1) of one for 256 bits, as is now apparent from the calculations thus far made, a difference of $1.55 - 0.84 = 0.71$ V is made between the WL1 and WL2 for the reference power supply voltage of 5 V. In case of one for 16 bits, on the contrary, the difference between the WL1 and WL2 is as small as $6 \times 10^{-3} - 3.3 \times 10^{-3} = 2.7 \times 10^{-3}$.

Generally speaking, the more malfunctions (or called the "soft error") due to the resistance to the radioactive rays occur for the higher voltage drop. It is experimentally said that the percentage of the soft errors rises by about one order for the voltage drop of 1 V. It follows that a different of about one order of the soft errors is established in the common memory cell in case of one for 256 bits.

As is now apparent from the description thus far made, the difference in the voltage drop between the two word lines can be suppressed to several mV at most even if the memory is constructed to require the two different word lines in the common memory cell. As a result, the malfunctions can be reduced in the common memory cell to provide a stable structure.

Figure 45:
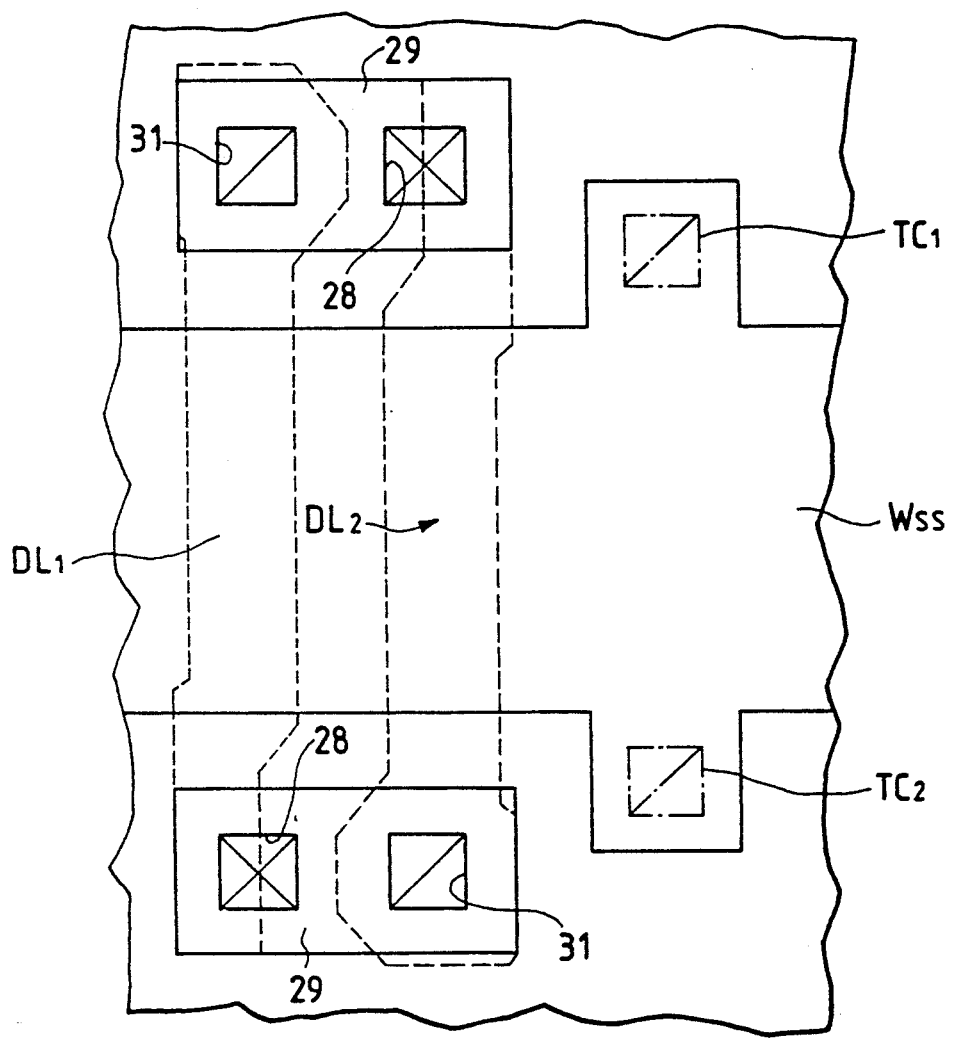
FIG. 45 is a diagram showing another modification of the second embodiment.

The frequency of connecting the word line W1 and the auxiliary word line Wss is one for 16 bits in the description thus far made, but may be 32 bits, 64 bits 128 bits or more. Despite of this modification, however, the more malfunctions will occur for the smaller connection frequency and for the less connections, as has been apparent from the foregoing description. On the other hand, the material for the wiring line is the polysilicon for the word line WL and the W for the auxiliary word line but should not be limited thereto. For example, the word line WL may be made of Al, Mo, Ta, Ti, Cu or a silicide, and the auxiliary word line may likewise be made of Al, Mo, Ta, Ti, Cu or another of the various silicide materials. In short, the wiring lines can be made of a conductive material or in the future a superconductive material. In the description thus far made, on the other hand, the WL1 and WL2 to be connected with the auxiliary line Wss is for only one row of memory cells but should not be limited thereto. The WL1 and WL2 may naturally be for a plurality of rows. As shown in FIG. 45, the auxiliary word line Wss may be formed to cover the memory cell. Then, the resistance of the auxiliary word line Wss can be further reduced to ensure the high-speed access.

The description thus far made is based on the standpoint of the soft errors due to the resistance to the radioactive rays. The standpoint will be changed in the following into the delay in the difference between the wiring capacities of the WL1 and WL2.

In the foregoing cases, the capacity C added to the wiring line is conveniently calculated with the assumption of the unchanged $2 \times 10^{-15}$ F even if the wiring width is changed $\pm 5\%$. Despite of this fact, however, the difference in the capacity cannot be ignored in case the difference between the two speeds (or accesses) is to be discussed. Then, the capacity is reduced by 5% for the reduction of the wiring width of 5%, so that the capacity of one cell is $1.9 \times 10^{-15}$ F. (1) The delay due to the C.R product in case of the frequency of one for 256 bits between the WL1 and Wss is:

$$18.2\times10^3\times1.9\times10^{-15}\times128=4.43\times10^{-9}\text{ sec.}$$

At the side of the other WL2, the wiring width is increased by 5%, and the capacity is also increased by 5% so that the capacity for one cell is $2.1\times10^{-15}$ F. Hence, the delay at this time is:

$$9.9\times10^3\times2.1\times10^{-15}\times128=2.66\times10^{-9}\text{ sec.}$$

(2) Next, the case of the present embodiment II of one for 16 bits will be examined:

Like the case (1), the delay at the side of the WL1:

$$1.14\times10^3\times1.9\times10^{-15}\times8=1.7\times10^{-11}\text{ sec.}$$

The delay at the side of the other WL2:

$$6.2\times10^2\times2.1\times10^{-15}\times8=1.0\times10^{-11}\text{ sec.}$$

As is now apparent from the foregoing results, in case (1) of one for 256 bits, the difference of about 1.8 ns is between the WL1 and WL2 sides and reaches as high as about 10% in the high-speed memory LSI in which the access time of the whole circuit is 10 to 20 ns at most. This will make it understandable how unstable the circuit is. On the other hand, the delay difference between the two in case of one for 16 bits is about 0.007 ns at most, which could almost be ignored to make the effectiveness of the present embodiment II understandable.

In the memory cell having two word lines (of poly-Si), according to the present embodiment II, the two word lines are connected at the predetermined frequency with the metal wiring line with a view to eliminating the unbalance inbetween, so that the two word potentials are equalized and reduced.

Thus, thanks to the two-step structure in which the two word lines are shorted and connected with the low-resistance wiring line, the malfunctions can be prevented to improve the reliability.

Although our invention has been specifically described in connection with the foregoing embodiments, it should not be limited thereto but can naturally modified in various manners without departing from its gist.

For example, the present invention can be applied to not only the SRAM but also another semiconductor storage device such as the DRAM (i.e., Dynamic RAM) or the ROM (i.e., Read Only Memory).

The present invention can be further applied to a semiconductor integrated circuit device having the SRAM, such as the one-chip microcomputer having the SRAM packaged therein or the gate array.

What is claimed is:

1. A semiconductor memory device comprising:
   a semiconductor substrate;
   element isolation films formed in said semiconductor substrate;
   active regions formed on said semiconductor substrate, said active regions being defined by said element isolation films;
   first and second semiconductor strips formed on said element isolation films and over said active regions, each of said first and second semiconductor strips extending in a first direction and having first and second end portions which are separated from each other in said first direction, said first end portions of said first and second semiconductor strips being formed on said element isolation films;
   memory cells each including first and second transfer MISFETs and cross-coupled first and second inverter circuits, said first inverter circuit having a first drive MISFET and a load element connected in series, said second inverter circuit having a second drive MISFET and a load element connected in series,
   each of said first and second drive MISFETs having a drain region in said semiconductor substrate, wherein a part of said first semiconductor strip between said first and second end portions of said first semiconductor strip is formed integrally with a gate electrode of said first drive MISFET, and said second end portion of said first semiconductor strip is electrically connected to said drain region of said second drive MISFET,
   wherein a part of said second semiconductor strip between said first and second end portions of said second semiconductor strip is formed integrally with a gate electrode of said second drive MISFET, and said second end portion of said second semiconductor strip is electrically connected to said drain region of said first drive MISFET; and
   first and second selecting lines extending in parallel over said semiconductor substrate, said first and second selecting lines extending in a second direction substantially perpendicular to said first direction, wherein each of said memory cells is coupled to both a first and a second selecting line, and wherein gate electrodes of said first and second transfer MISFETs are formed integrally with said first and second selecting lines, respectively,
   wherein said first selecting lines extend over said first end portions of said second semiconductor strips, and wherein said second selecting lines extend over said first end portions of said first semiconductor strips.

2. A semiconductor memory device according to claim 1, wherein said first end portions of said first and second semiconductor strips are positioned between said first and second selecting lines which are coupled to the same memory cell.

3. A semiconductor memory device according to claim 2, wherein said first end portions of said first and second semiconductor strips are positioned between said first and second selecting lines which are coupled to the same memory cell.

4. A semiconductor memory device according to claim 2, wherein said first and second transfer MISFETs have source and drain regions in said semiconductor substrate, and wherein one of said source and drain regions of said first transfer MISFET is formed integrally with said drain region of said second drive MISFET, one of said source and drain regions of said second transfer MISFET is formed integrally with said drain region of said first drive MISFET, and said drain region of said first drive MISFET is separated from that of said second drive MISFET by said element isolation film.

5. A semiconductor memory device according to claim 2, wherein said first and second selecting lines are formed of a semiconductor layer which is higher level layer than that of said first and second semiconductor strips.

6. A semiconductor memroy device according to claim 1, wherein a gate length direction of said first and second transfer MISFETs extends in a direction substantially perpendicular to a gate length direction of said first and second drive MISFETs.

7. A semiconductor memory device according to claim 1, further comprising:

ground potential lines extending in said second direction over said semiconductor substrate and over said first and second semiconductor strips, wherein each said ground potential line is formed with the same conductive layer as that of said first and second selecting lines, wherein each said ground potential line is arranged between said first and second selecting lines which are coupled to the same memory cells, and wherein said ground potential lines are electrically connected to source regions of said first and second drive MISFETs.

8. A semiconductor device comprising:
a semiconductor substrate;
element isolation films formed in said semiconductor substrate;
active regions formed on said semiconductor substrate, said active regions being defined by said element isolation films;
first and second semiconductor strips formed on said element isolation films and over said active regions, each of said first and second semiconductor strips extending in a first direction and having first and second end portions which are separated from each other in said first direction, said first end portions of said first and second semiconductor strips being formed on said element isolation films;
memory cells of a static random access memory, each of which includes first and second transfer MISFETs and crosscoupled first and second inverter circuits, said first inverter circuit having a first drive MISFET and a load element connected in series, said second inverter circuit having a second drive MISFET and a load element connected in series,
each of said first and second drive MISFETs having a drain region in said semiconductor substrate,
wherein a part of said first semiconductor strip between said first and second end portions of said first semiconductor strip is formed integrally with a gate electrode of said first drive MISFETs, and said second end portion of said first semiconductor strip is electrically connected to said drain region of said second drive MISFET,
wherein a part of said second semiconductor strip between said first and second end portions of said second semiconductor strip is formed integrally with a gate electrode of said second drive MISFET, and said second end portion of said second semiconductor strip is electrically connected to said drain region of said first drive MISFET,
wherein a gate length direction of said first and second transfer MISFETs extends in a direction substantially perpendicular to a gate length direction of said first and second drive MISFETs;
first and second selecting lines extending in parallel over said semiconductor substrate, said first and second selecting lines extending in a second direction substantially perpendicular to said first direction, wherein each of said memory cells is coupled to both a first selecting line and a second selecting line, and wherein gate electrodes of said first and second transfer MISFETs are formed integrally with said first and second selecting lines, respectively,
wherein said first selecting lines are separated from said second end portions of said first semiconductor strips, and wherein said second selecting lines are separated from said second end portions of said second semiconductor strips, and
wherein said first and second selecting lines are formed of a semiconductor layer which is a higher level layer than that of said first and second semiconductor strips; and
an insulating film formed on said first and second semiconductor strips, wherein said first selecting lines extend over said first end portions of said second semiconductor strips and on said insulating film, and wherein said second selecting lines extend over said first end portions of said first semiconductor strips and on said insulating film.

9. A semiconductor device according to claim 8, further comprising:

ground potential lines extending in said second direction over said semiconductor substrate and over said first and second semiconductor strips, each of said ground potential lines being formed with the same conductive layer as that of said first and second selecting lines, wherein each said ground potential line is arranged between said first and second selecting lines which are coupled to the same memory cell, wherein said ground potential lines are electrically connected to source regions of said first and second drive MISFETs.

10. A semiconductor memory device according to claim 1, wherein said memory cells are formed in said active regions.

11. A semiconductor device according to claim 8, wherein said memory cells are formed in said active regions.

* * * * *